US011907157B2

(12) United States Patent
Master et al.

(10) Patent No.: US 11,907,157 B2
(45) **Date of Patent: *Feb. 20, 2024**

(54) RECONFIGURABLE PROCESSOR CIRCUIT ARCHITECTURE

(71) Applicant: Cornami, Inc., Dallas, TX (US)

(72) Inventors: Paul L. Master, Sunnyvale, CA (US); Steven K. Knapp, Soquel, CA (US); Raymond J. Andraka, North Kings Town, RI (US); Alexei Beliaev, Campbell, CA (US); Martin A. Franz, Sunnyvale, CA (US); Rene Meessen, San Francisco, CA (US); Frederick Curtis Furtek, Menlo Park, CA (US)

(73) Assignee: Cornami, Inc., Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/092,247

(22) Filed: Dec. 31, 2022

(65) Prior Publication Data

US 2023/0153265 A1 May 18, 2023

Related U.S. Application Data

(63) Continuation of application No. 17/967,173, filed on Oct. 17, 2022, which is a continuation of application
(Continued)

(51) Int. Cl.
*G06F 21/44* (2013.01)
*G06F 15/78* (2006.01)
(Continued)

(52) U.S. Cl.
CPC ................ *G06F 15/80* (2013.01); *G06F 5/01* (2013.01); *G06F 7/487* (2013.01); *G06F 7/50* (2013.01);
(Continued)

(58) Field of Classification Search
None
See application file for complete search history.

(56) References Cited

U.S. PATENT DOCUMENTS 5,442,797 A 8/1995 Casavant et al.
5,524,154 A * 6/1996 Bergland ................ H04L 49/00 398/45

(Continued)

FOREIGN PATENT DOCUMENTS

EP 2441013 B1 8/2014
WO WO2010142987 A1 12/2010

OTHER PUBLICATIONS

Notification of Transmittal of the International Search Report and Written Opinion of the International Searching Authority, or the Declaration for International Application No. PCT/US2020/050069, dated Jan. 7, 2021, pp. 1-16.

(Continued)

*Primary Examiner* — Hyun Nam
(74) *Attorney, Agent, or Firm* — Nancy R. Gamburd; Gamburd Law Group LLC

(57) ABSTRACT

A representative reconfigurable processing circuit and a reconfigurable arithmetic circuit are disclosed, each of which may include input reordering queues; a multiplier shifter and combiner network coupled to the input reordering queues; an accumulator circuit; and a control logic circuit, along with a processor and various interconnection networks. A representative reconfigurable arithmetic circuit has a plurality of operating modes, such as floating point and integer arithmetic modes, logical manipulation modes, Boolean logic, shift, rotate, conditional operations, and format conversion, and is configurable for a wide variety of multiplication modes. Dedicated routing connecting multiplier adder trees allows multiple reconfigurable arithmetic circuits to be reconfigurably combined, in pair or quad
(Continued)

configurations, for larger adders, complex multiplies and general sum of products use, for example.

32 Claims, 56 Drawing Sheets

Related U.S. Application Data

No. 17/015,973, filed on Sep. 9, 2020, now Pat. No. 11,494,331.

(60) Provisional application No. 62/899,025, filed on Sep. 11, 2019, provisional application No. 62/898,452, filed on Sep. 10, 2019.

(51) Int. Cl.

| | |
|---|---|
| ***G06F 15/80*** | (2006.01) |
| ***G06F 7/523*** | (2006.01) |
| ***G06F 7/50*** | (2006.01) |
| ***H03K 19/21*** | (2006.01) |
| ***G06F 9/48*** | (2006.01) |
| ***G06F 9/54*** | (2006.01) |
| ***G06F 5/01*** | (2006.01) |
| ***G06F 9/30*** | (2018.01) |
| ***G06F 7/487*** | (2006.01) |
| ***G06F 7/52*** | (2006.01) |
| ***G06F 7/544*** | (2006.01) |
| ***G06F 9/38*** | (2018.01) |

(52) U.S. Cl.

CPC ................ *G06F 7/52* (2013.01); *G06F 7/523* (2013.01); *G06F 7/5443* (2013.01); *G06F 9/30098* (2013.01); *G06F 9/3856* (2023.08); *G06F 9/4881* (2013.01); *G06F 9/54* (2013.01); *H03K 19/21* (2013.01); *G06F 2207/382* (2013.01)

(56) References Cited

U.S. PATENT DOCUMENTS 5,574,672 A * 11/1996 Briggs ...................... G06F 7/57 708/628
5,646,877 A 7/1997 Mahant-Shetti et al.
5,892,962 A 4/1999 Cloutier
5,969,975 A 10/1999 Glass et al.
6,732,354 B2 5/2004 Ebeling et al.
6,775,685 B1 * 8/2004 Wood ........................ G06F 7/49 708/606
6,836,839 B2 12/2004 Master et al.
6,986,021 B2 1/2006 Master et al.
7,013,321 B2 3/2006 Saulsbury
7,200,837 B2 4/2007 Stevens
7,225,323 B2 5/2007 Siu et al.
7,263,602 B2 8/2007 Schmit
7,325,123 B2 1/2008 Master et al.
7,353,516 B2 4/2008 Heidari-Bateni et al.
7,403,981 B2 7/2008 Master et al.
7,478,031 B2 1/2009 Master et al.
7,590,839 B2 9/2009 Van Der Veen
7,635,987 B1 12/2009 Agarwal
7,971,172 B1 6/2011 Pugh et al.
7,987,338 B2 7/2011 Doerr et al.
8,108,653 B2 1/2012 Lerner et al.
8,390,325 B2 3/2013 Box et al.
8,456,191 B2 6/2013 Kelem et al.
8,495,125 B2 7/2013 Catherwood et al.
8,527,572 B1 9/2013 Young et al.
9,083,740 B1 * 7/2015 Ma ........................ H04L 63/145
9,665,397 B2 * 5/2017 Scheuermann ....... G06F 3/0659
10,073,700 B2 * 9/2018 Furtek ................... G06F 9/5033
11,360,870 B2 * 6/2022 Iacaruso ............. G06F 11/0754
11,361,073 B2 * 6/2022 Koide ..................... G06F 21/44
11,361,102 B2 * 6/2022 Cheng ..................... G06F 21/44
11,494,331 B2 * 11/2022 Master ...................... G06F 5/01
2002/0156998 A1 10/2002 Casselman
2004/0172439 A1 9/2004 Lin
2005/0174270 A1 * 8/2005 Koo ........................ H03M 7/42 341/67
2006/0136930 A1 6/2006 Kaler et al.
2008/0140745 A1 * 6/2008 Lyuh ......................... G06F 7/57 708/209
2009/0083518 A1 * 3/2009 Glew .................... G06F 9/3844 712/30
2009/0193239 A1 7/2009 Hanai et al.
2009/0290632 A1 * 11/2009 Wegener ................ H03M 7/30 375/240
2010/0268862 A1 10/2010 Park et al.
2011/0202145 A1 8/2011 Shah et al.
2011/0254760 A1 * 10/2011 Lloyd ................... A63F 13/235 702/89
2012/0131288 A1 * 5/2012 Box .................... G06F 12/0646 711/E12.001
2013/0138913 A1 5/2013 Box et al.
2015/0154024 A1 6/2015 Anderson et al.
2015/0317190 A1 11/2015 Ebcioglu et al.
2017/0123792 A1 5/2017 Rozario et al.
2017/0123795 A1 5/2017 Chen et al.
2017/0161214 A1 6/2017 Dobbs et al.
2017/0286117 A1 * 10/2017 Mohapatra ............ G06F 9/3836
2018/0089140 A1 3/2018 Metzgen
2018/0181172 A1 6/2018 Johnsen et al.
2019/0042244 A1 2/2019 Henry et al.
2019/0108346 A1 4/2019 Jennings
2019/0155574 A1 5/2019 Langhammer et al.
2019/0171604 A1 6/2019 Brewer
2019/0303327 A1 10/2019 Brewer
2020/0044670 A1 * 2/2020 Beck ........................ H04B 7/04
2021/0072954 A1 * 3/2021 Andraka ................... G06F 7/52
2021/0073171 A1 * 3/2021 Master .................... G06F 7/523
2022/0188644 A1 * 6/2022 Zoldi ..................... G06N 3/045
2023/0055513 A1 * 2/2023 Master .................. G06F 9/4881
2023/0153265 A1 * 5/2023 Master ...................... G06F 7/52 712/10

OTHER PUBLICATIONS

Notification of Transmittal of the International Search Report and Written Opinion of the International Searching Authority, or the Declaration for International Application No. PCT/US2020/050058, dated Dec. 22, 2020, pp. 1-17.

Francis, R.S et al., Self Scheduling and Execution Threads, Parallel and Distributed Processing, 1990; Proceedings of the Second IEEE Symposium, Dallas, TX, USA, Dec. 9-13, 1990, IEEE Computer Society Dec. 9, 1990, pp. 586-590.

Theobald, K.B. et al. Superconducting Processors for HTMT: issues and challenges, Frontiers of Massively Parallel Computation 1999, The Seventh Symposium, Annapolis, MD, USA, Feb. 21-25, IEEE Computer Society Feb. 21, 1999, pp. 260-267.

Baumgarte, V. et al., PACT XPP—A Self-Reconfigurable Data Processing Architecture, Journal of Supercomputing, vol. 26, Jan. 1, 2003, pp. 167-184.

Khawam, Sami et al., The Reconfigurable Instruction Cell Array, IEEE Transactions on Very Large Scale Integration (VLSI) Systems, vol. 16, No. 1, Jan. 2008, pp. 75-85.

Huang, Zhining et al., The Design of Dynamically Reconfigurable Datapath Coprocessors, ACM Transactions on Embedded Computing Systems, vol. 3, No. 2, May 2004, pp. 361-384.

Hida, Itaru et al., A High Performance and Energy Efficient Microprocessor with a Novel Restricted Dynamically Configurable Accelerator, Circuits and Systems, vol. 8, pp. 134-147.2017.

* cited by examiner

| | X(8:0) | X(17:9) | X(26:18) | X(35:27) | X(44:36) | X(53:45) |
|---|---|---|---|---|---|---|
| Y(53:45) | 2+3 | 3+3 | 4+3 | 2+6 | 3+6 | 4+6 |
| Y(44:36) | 1+3 | 2+3 | 3+3 | 1+6 | 2+6 | 3+6 |
| Y(35:27) | 0+3 | 1+3 | 2+3 | 0+6 | 1+6 | 2+6 |
| Y(26:18) | 2 | 3 | 4 | 2+3 | 3+3 | 4+3 |
| Y(17:8) | 1 | 2 | 3 | 1+3 | 2+3 | 3+3 |
| Y(8:0) | 0 | 1 | 2 | 0+3 | 1+3 | 2+3 |

FIG. 25

| | FIRST LAYER | | | | SECOND LAYER | | RESULT BIT RANGE |
|---|---|---|---|---|---|---|---|
| | LANE 3 | LANE 2 | LANE 1 | LANE 0 | LANE 3-2 | LANE 1-0 | |
| DOT4 INT | -32 | 0 | -32 | 0 | -64 | 0 | 33-0 |
| DOT4 FP QTR TO QTR | E4-8 | E4+24 | E4-8 | E4+24 | 0 | +64 | 97-80 |
| DOT4 FP QTR TO HALF | E4-16 | E4+16 | E4-16 | E4+16 | 0 | +64 | 97-80 |
| DOT2 INT | -16 | 0 | -16 | 0 | -64 | 0 | 32-0 |
| DOT2 FP HALF | E5-6 | E5+10 | E5-6 | E5+10 | 0 | +64 | 97-80 |
| SIMD4 INT | 0 | 0 | 0 | 0 | 0 | 0 | |
| SIMD4 FP QTR | E4+8 | E4+8 | E4+8 | E4+8 | 0 | 0 | |
| SIMD2 INT | -16 | 0 | -16 | 0 | 0 | 0 | |
| SIMD2 FP HALF | E5-6 | E5+10 | E5-6 | E5+10 | 0 | 0 | |
| SIMD2 BFLOAT | ZERO | E5+16 | SIGN | E5+16 | 0 | 0 | 95-80; 31-16 |
| SIMD2 BFLT DOT 0,0 | ZERO | E5+16 | SIGN | E5+16 | -64 | 0 | 31-16 |
| SIMD2 BFLT DOT 32,0 | ZERO | E5-16 | SIGN | E5+16 | -64 | 0 | 31-16 |
| SIMD2 BFLT DOT 0,32 | ZERO | E5+16 | SIGN | E5-16 | -64 | 0 | 31-16 |
| SIMD2 BFLT DOT 32,32 | ZERO | E5-16 | SIGN | E5-16 | -64 | 0 | 31-16 |
| SIMD2 BFLT DOT 64+,0 | ZERO | ZERO | SIGN | E5+16 | -64 | 0 | 31-16 |
| SIMD2 BFLT DOT 64+,32 | ZERO | ZERO | SIGN | E5-16 | -64 | 0 | 31-16 |
| SIMD2 BFLT DOT 64+,64+ | ZERO | ZERO | SIGN | ZERO | -64 | 0 | 31-16 |
| SIMD2 BFLT DOT 32,64+ | ZERO | E5-16 | SIGN | ZERO | -64 | 0 | 31-16 |
| SIMD2 BFLT DOT 0,64+ | ZERO | E5+16 | SIGN | ZERO | -64 | 0 | 31-16 |
| SINGLE | ZERO | E5+16 | <<0 | E5+16 | 0 | +32 | 95-48 |
| SINGLE >>32 | ZERO | E5+16 | <<0 | E5+16 | -32 | 0 | 63-16 |
| SINGLE >>64 | ZERO | E5+16 | E5-32 | ZERO | -64 | 0 | 31-0 |
| SINGLE >>96 | ZERO | E5-16 | ZERO | ZERO | -64 | 0 | |
| INT | -16 | 0 | -16 | 0 | -32 | 0 | 63-0 |
| INT 32 EXT | 0 | +16 | 0 | +16 | -32 | 0 | 63-0 |
| CPLX 4 INT | -32 | 0 | -32 | 0 | 0 | 0 | |
| CPLX 4 FP QTR TO QTR | -32 | 0 | -32 | 0 | 0 | 0 | |
| CPLX 4 FP QTR TO HALF | -32 | 0 | -32 | 0 | 0 | 0 | |
| DOUBLE | E5-4 | 0 | E5-4 | 0 | 0 | +32 | 97-44 |
| DOUBLE >>32 | E5-4 | 0 | E5-4 | 0 | -32 | 0 | 65-12 |
| DOUBLE >>64 | E5-4 | 0 | E5-4 | ZERO | -64 | -32 | 65-12 |
| DOUBLE >>96 | E5-4 | ZERO | ZERO | ZERO | -96 | 0 | 65-12 |
| INT64 HI | +16 | +32 | -16 | 0 | 0 | +64 | 127-64 |
| INT64 MID | -16 | 0 | -16 | 0 | 0 | +32 | 95-32 |
| INT64 LO | -16 | 0 | -16 | 0 | -32 | 0 | 63-0 |
| SHIFT RANGE | -32:27 | -16:41 | -32:27 | -16:41 | | | |

FIG. 31

| MODE | EXT ENA | INPUT MASK/HIDDEN BIT | SIGN EXT | SHIFT SRC | SHIFT DIST | SHIFT BIAS | FLOATING POINT ALIGN | SHIFT SHARING | LANE MASK | NEGATE /INVERT | ROTATE /SHIFT | ROTATE WIDTH | ARITH/ LOGIC | LOGIC WINDOW | LANE 3 EXP MASK | LANE 1 EXP MASK |
|---|---|---|---|---|---|---|---|---|---|---|---|---|---|---|---|---|
| DOUBLE | 1 | 0000 0000 FFF0 0000<br>0000 0000 0010 0000 | 00000 | EXP | EXP | ln0:3*8+43+32,<br>LANE 4+43 | DOUBLE | 33333 | OFF | x | SHIFT | x | ARITH | x | 11 | x |
| SINGLE | 0 | FFFF FFFF FF00 0000<br>0000 0000 0100 0000 | 00000 | EXP | EXP | LANE*8+72 | SINGLE | x3333 | OFF | x | SHIFT | x | ARITH | x | 8 | x |
| HALF | 0 | FFFF FFFF FC00 FC00<br>0000 0000 0400 0400 | 00000 | EXP | EXP | (LANE MOD2)*8+<br>(LANE/2)*64+21 | NO | x3311 | 2 | x | SHIFT | x | ARITH | x | 5 | 5 |
| QUARTER | 0 | FFFF FFFF F8F8 F8F8<br>0000 0000 0808 0808 | 00000 | EXP | EXP | LANE*32+12 | NO | x3210 | 4 | x | SHIFT | x | ARITH | x | 4 | 4 |
| BFLOAT | 0 | FFFF FFFF FF00 FF00<br>0000 0000 0100 0100 | 00000 | EXP | EXP | (LANE MOD2)*8+<br>(LANE/2)*64+24 | DOUBLE+<br>SINGLE | x3311 | 2 | x | SHIFT | x | ARITH | x | 8 | 8 |
| UNSIGNED INT64 | 1 | 0000 0000 0000 0000<br>0000 0000 0000 0000 | 00000 | c/x7 | C/X | LANE*8 | NO | x3333 | OFF | x | cfg | 64 | x | 64 | x | x |
| UNSIGNED INT32 | 0 | FFFF FFFF 0000 0000<br>0000 0000 0000 0000 | 00000 | c/x6 | C/X | LANE*8 | NO | x3333 | OFF | x | cfg | 32 | x | 32 | x | x |
| UNSIGNED INT16 | 0 | FFFF FFFF 0000 0000<br>0000 0000 0000 0000 | 00000 | c/x5 | C/X | (LANE MOD2)*8+<br>LANE/2)*64 | NO | x3311 | 2 | x | cfg | 16 | x | 16 | x | x |
| UNSIGNED INT8 | 0 | FFFF FFFF 0000 0000<br>0000 0000 0000 0000 | 00000 | c/x4 | C/X | LANE*32 | NO | x3210 | 4 | x | cfg | 8 | x | 8 | x | x |
| SIGNED INT64 | 1 | 0000 0000 0000 0000<br>0000 0000 0000 0000 | 10000 | c/x7 | C/X | LANE*8 | NO | x3333 | OFF | x | cfg | 64 | x | 64 | x | x |
| SIGNED INT32 | 0 | FFFF FFFF 0000 0000<br>0000 0000 0000 0000 | 01000 | c/x6 | C/X | LANE*8 | NO | x3333 | OFF | x | cfg | 32 | x | 32 | x | x |
| SIGNED INT16 | 0 | FFFF FFFF 0000 0000<br>0000 0000 0000 0000 | 01010 | c/x5 | C/X | (LANE MOD2)*8+<br>(LANE/2)*64 | NO | x3311 | 2 | x | cfg | 16 | x | 16 | x | x |
| SIGNED INT8 | 0 | FFFF FFFF 0000 0000<br>0000 0000 0000 0000 | 01111 | c/x4 | C/X | LANE*32 | NO | x3210 | 4 | x | cfg | 8 | x | 8 | x | x |
| LANE REASSIGN | 0 | 0000 0000 0000 0000<br>0000 0000 0000 0000 | 00000 | c/x7 | C/X | 0 | NO | x3210 | OFF | 0 | SHIFT | x | LOGICAL | 8 | x | x |

FIG. 33

| OUTPUT | UNSIGNED INT TO LOGIC UNIT AND COMPARE | | | | INTEGER TO ADDER/ACCUMULATOR | | | | FLOATING POINT TO ADDER/ACCUMULATOR | | | | |
|---|---|---|---|---|---|---|---|---|---|---|---|---|---|
| POSITION | SIMD4 | SIMD2 | 32 BIT | 64 BIT | SIMD4 INT | SIMD2 INT | INT 32/27 | INT64 | DOUBLE | SINGLE | HALF | QUARTER | BFLOAT10 |
| 127-124 | | | | 63-60 | | | | | | | | | |
| 123-120 | | | | 59-56 | | | | | | | | | |
| 119-116 | | | | 55-52 | | | | | | | | | |
| 115-112 | | | | 51-48 | | | | | | | | | |
| 111-108 | 31-28 | | | 47-44 | | | | | | | | 27-24 | |
| 107-104 | 27-24 | | | 43-40 | | | | | | | | | |
| 103-100 | 31-28 | | | 39-36 | 31-28 | | | | | | | | |
| 99-96 | 27-24 | | | 35-32 | 27-24 | | | | | | | | |
| 95-92 | | 31-28 | | 31-28 | | | | | 52-49 | 23-20 | 26--23 | | 23-20 |
| 91-88 | | 27-24 | | 27-24 | | | | | 48-45 | 19-16 | 22--19 | | 19-16 |
| 87-84 | | 23-20 | | 23-20 | | | | | 44-41 | 15-12 | 18--16 | | |
| 83-80 | | 19-16 | | 19-16 | | | | | 40-37 | 11--8 | | | |
| 79-76 | 23-20 | 31-28 | | 15-12 | | 31-28 | | | 36-33 | 7--4 | | 19-16 | |
| 75-72 | 19-16 | 27-24 | | 11--8 | | 27-24 | | | 32-29 | 3--0 | | | |
| 71-68 | 23-20 | 23-20 | | 7--4 | 23-20 | 23-20 | | | 28-25 | | | | |
| 67-64 | 19-16 | 19-16 | | 3--0 | 19-16 | 19-16 | | | 24-21 | | | | |
| 63-60 | | | 31-28 | 63-60 | | | | 63-60 | 20-17 | | | | |
| 59-56 | | | 27-24 | 59-56 | | | | 59-56 | 16-13 | | | | |
| 55-52 | | | 23-20 | 55-52 | | | | 55-52 | 12--9 | | | | |
| 51-48 | | | 19-16 | 51-48 | | | | 51-48 | 8--5 | | | | |
| 47-44 | 15-12 | | 15-12 | 47-44 | | | | 47-44 | 4--1 | | | 11--8 | |
| 43-40 | 11--8 | | 11--8 | 43-40 | | | | 43-40 | 0--0 | | | | |
| 39-36 | 15-12 | | 7--4 | 39-36 | 15-12 | | | 39-36 | | | | | |
| 35-32 | 11--8 | | 3--0 | 35-32 | 11--8 | | | 35-32 | | | | | |
| 31-28 | | 15-12 | 31-28 | 31-28 | | | 31-28 | 31-28 | | | 10--7 | | 7--4 |
| 27-24 | | 11--8 | 27-24 | 27-24 | | | 27-24 | 27-24 | | | 6--3 | | 3--0 |
| 23-20 | | 7--4 | 23-20 | 23-20 | | | 23-20 | 23-20 | | | 2--0 | | |
| 19-16 | | 3--0 | 19-16 | 19-16 | | | 19-16 | 19-16 | | | | | |
| 15--12 | 7--4 | 15--12 | 15--12 | 15--12 | | 15--12 | 15--12 | 15--12 | | | | 3--0 | |
| 11--8 | 3--0 | 11--8 | 11--8 | 11--8 | | 11--8 | 11--8 | 11--8 | | | | | |
| 7--4 | 7--4 | 7--4 | 7--4 | 7--4 | 7--4 | 7--4 | 7--4 | 7--4 | | | | | |
| 3--0 | 3--0 | 3--0 | 3--0 | 3--0 | 3--0 | 3--0 | 3--0 | 3--0 | | | | | |
| | LANE*32 | LANE*64 | | | LANE*32+ | LANE*64+ | | | | | LANE*64+ | LANE*32+ | LANE*64+ |
| SHIFT | +0:15 | +0:31 | +0:63 | +0:127 | 0:23 | 0:47 | 0+0:127 | 0+0:127 | E5+43 | E5+72 | E5+21 | E4+12 | E5+24 |

320

RECONFIGURABLE PROCESSOR CIRCUIT ARCHITECTURE

CROSS-REFERENCE TO RELATED APPLICATIONS

This application is a continuation of and claims the benefit of and priority to U.S. patent application Ser. No. 17/967,173, filed Oct. 17, 2022, titled "Reconfigurable Processor Circuit Architecture", which is a continuation of and claims the benefit of and priority to U.S. patent application Ser. No. 17/015,973, filed Sep. 9, 2020 and issued Nov. 8, 2022 as U.S. Pat. No. 11,494,331, titled "Reconfigurable Processor Circuit Architecture", which is a nonprovisional of and claims the benefit of and priority to U.S. Provisional Patent Application No. 62/898,452, filed Sep. 10, 2019, titled "Reconfigurable Arithmetic Engine", and which is a nonprovisional of and claims the benefit of and priority to U.S. Provisional Patent Application No. 62/899,025, filed Sep. 11, 2019, titled "Reconfigurable Processor Circuit Architecture with an Array of Fractal Cores", which are commonly assigned herewith, and all of which are hereby incorporated herein by reference in their entireties with the same full force and effect as if set forth in their entireties herein.

FIELD OF THE INVENTION

The present invention relates generally to configurable and reconfigurable computing circuitry, and more specifically to a configurable and reconfigurable arithmetic engine having electronic circuitry for arithmetic and logical computations.

BACKGROUND

Many existing computing systems have reached significant limits for computation processing capabilities, such as insufficient speed of computation for mathematically intensive applications, such as involving neural network computations, digital currencies, blockchain, and so on. In addition, many existing computing systems have excessive energy (or power) consumption, and associated heat dissipation. For example, existing computing solutions have become increasingly inadequate as the need for advanced computing technologies grows, such as to accommodate artificial intelligence, neural networking, encryption, decryption, and other significant computing applications.

Accordingly, there is an ongoing need for a computing architecture capable of providing high performance and energy efficient solutions for mathematically intensive applications, such as involving artificial intelligence, neural network computations, digital currencies, blockchain, encryption, decryption, computation of Fast Fourier Transforms (FFTs), and machine learning, for example and without limitation.

In addition, there is an ongoing need for a configurable and reconfigurable computing architecture capable of being configured for any of these various applications. Such a configurable and reconfigurable computing architecture should be readily scalable, such as to millions of processing cores, should have low latency, should be computationally and energy efficient, should be capable of processing streaming data in real time, should be reconfigurable to optimize the computing hardware for a selected application, and should be capable of massively parallel processing.

Numerous other advantages and features of the present invention will become readily apparent from the following detailed description of the invention and the embodiments thereof, from the claims and from the accompanying drawings.

SUMMARY OF THE INVENTION

As discussed in greater detail below, the representative apparatus, system and method provide for a computing architecture capable of providing high performance and energy efficient solutions for mathematically intensive applications, such as involving artificial intelligence, neural network computations, digital currencies, encryption, decryption, blockchain, computation of Fast Fourier Transforms (FFTs), and machine learning, for example and without limitation.

In addition, the reconfigurable processor disclosed herein, as an apparatus and system, is capable of being configured for any of these various applications, with several such examples illustrated and discussed in greater detail below. Such a reconfigurable processor is readily scalable, such as to millions of computational cores, has low latency, is computationally and energy efficient, is capable of processing streaming data in real time, is reconfigurable to optimize the computing hardware for a selected application, and is capable of massively parallel processing. For example, on a single chip, a plurality of the reconfigurable processors may also be arrayed and connected, using an interconnection network, to provide hundreds to thousands of computational cores per chip. In turn, a plurality of such chips may be arrayed and connected on a circuit board, resulting in thousands to millions of computational cores per board. Any selected number of computational cores may be implemented in reconfigurable processor, and any number of reconfigurable processors may be implemented on a single integrated circuit, and any number of such integrated circuits may be implemented on a circuit board. As such, the reconfigurable processor having an array of computational cores is scalable to any selected degree (subject to other constraints, however, such as routing and heat dissipation, for example and without limitation).

In a representative embodiment, a reconfigurable arithmetic circuit comprises: input reordering queues; a multiplier shifter and combiner network coupled to the input reordering queues; an accumulator circuit; and at least one control logic circuit coupled to the multiplier shifter and combiner network and to the accumulator circuit.

In a representative embodiment, such a reconfigurable arithmetic circuit may further comprise: a configurable multiplier having a plurality of operating modes, the configurable multiplier coupled to the input reordering queues and to the multiplier shifter and combiner network, the plurality of operating modes comprising a fixed point operating mode and a floating point operating mode, wherein the configurable multiplier has a native operating mode of a 27×27 unsigned multiplier further configurable to process signed inputs. For example, the configurable multiplier may be further configurable to become four 8×8 multipliers, two 16×16 single-instruction multiple-data (SIMD) multipliers, one 32×32 multiplier and one 54×54 multiplier. For example, the configurable multiplier may be further configurable to reassign one or more partial products to become the 32×32 multiplier.

In a representative embodiment, the multiplier shifter and combiner network may comprise: a shifter circuit; and a plurality of series-coupled adder circuits coupled to the shifter circuit. In a representative embodiment, the multiplier shifter and combiner network may be adapted to shift a multiplier product to convert a floating point product to a product having a radix-32 exponent. In a representative embodiment, the multiplier shifter and combiner network may be adapted to sum a plurality of single-instruction multiple-data (SIMD) products to form a SIMD dot product.

In a representative embodiment, such a reconfigurable arithmetic circuit may further comprise: a configurable interconnection network selectively coupling the multiplier shifter and combiner network to one or more adjacent reconfigurable arithmetic circuits to perform single cycle 32×32 and 54×54 multiplication, single precision 24×24 multiplication, and single-instruction multiple-data (SIMD) dot products.

In a representative embodiment, the input reordering queues are adapted to store a plurality of inputs, and the input reordering queues further comprise: input reordering logic circuitry adapted to reorder a sequence of the plurality of inputs, and to adjust a sign bit for negate and absolute value functions. In a representative embodiment, the input reordering logic circuitry may be further adapted to de-interleave I (in phase) and Q (quadrature) data inputs and odd and even data inputs.

In a representative embodiment, such a reconfigurable arithmetic circuit may further comprise output reorder queues coupled to receive and reorder outputs from a plurality of reconfigurable arithmetic circuits. In a representative embodiment, the accumulator circuit may be a single-clock cycle fixed and floating point accumulator having a 128 bit carry-save format.

In a representative embodiment, the reconfigurable arithmetic circuit has a plurality of inputs, the plurality of inputs comprising a first, X input; a second, Y input, and a third, Z input, and wherein the at least one control logic circuit comprises one or more circuits selected from the group consisting of: a compare circuit; a Boolean logic circuit; a Z input shifter; an exponent logic circuit; an add, saturate and round circuit; and combinations thereof.

In a representative embodiment, the Z input shifter may be adapted to shift a floating point Z-input value to a radix-32 exponent value, to shift by multiples of 32 bits to match a scaling of multiplier sum outputs, and has a plurality of integer modes in which the Z input shifter is used as a shifter or rotator with 64, 32, 2×16 and 4×8 bit shift or rotate modes.

In a representative embodiment, the Boolean logic circuit may comprise an AND-OR-INVERT logic unit adapted to perform AND, NAND, OR, NOR, XOR, XNOR, and selector operations on 32 bit integer inputs.

In a representative embodiment, the compare circuit may be adapted to extract a minimum or maximum data value from an input data stream, an index from the input data stream, and is further adapted to compare two input data streams. In a representative embodiment, the compare circuit may be adapted to swap two input data streams and to put the minimum of the two input data streams on a first output and the maximum of the two input data streams on a second output. In a representative embodiment, the compare circuit may be adapted to perform data steering, to generate address sequences, and to generate comparison flags for equality, greater than and less than.

A plurality of reconfigurable arithmetic circuits arranged in an array is also disclosed, with a representative embodiment of each reconfigurable arithmetic circuit, of the plurality of reconfigurable arithmetic circuits, comprising: input reordering queues adapted to store a plurality of inputs, the input reordering queues further comprising input reordering logic circuitry adapted to reorder a sequence of the plurality of inputs of the reconfigurable arithmetic circuit and an adjacent reconfigurable arithmetic circuit of the plurality of reconfigurable arithmetic circuits; a multiplier shifter and combiner network coupled to the input reordering queues; an accumulator circuit; at least one control logic circuit coupled to the multiplier shifter and combiner network and to the accumulator circuit; and output reorder queues coupled to receive and reorder outputs from the reconfigurable arithmetic circuit and the adjacent reconfigurable arithmetic circuit of the plurality of reconfigurable arithmetic circuits.

In a representative embodiment, such an array of reconfigurable arithmetic circuits may further comprise a configurable interconnection network coupled to the multiplier shifter and combiner network to merge the plurality of reconfigurable arithmetic circuits to perform double precision multiply-adds, single precision single cycle complex multiply, FFT butterfly, exponent resolution, multiply-accumulate, and logic operations. For example, the configurable interconnection network may comprise a plurality of direct connections to link adjacent reconfigurable arithmetic circuits of the plurality of reconfigurable arithmetic circuits as a pair configuration of reconfigurable arithmetic circuits and as a quad configuration of reconfigurable arithmetic circuits.

In a representative embodiment, in such an array of reconfigurable arithmetic circuits, a single reconfigurable arithmetic circuit may be adapted to perform at least two mathematical computation or functions selected from the group consisting of: one IEEE single or integer 27×27 multiply per cycle; two parallel IEEE half precision, 16-bit brain floating point ("BFLOAT") (BLOAT16), or 16-bit integer for signed and unsigned 16-bit integer values (INT16) multiplies per cycle; four parallel IEEE quarter precision or 8-bit integer for signed and unsigned 8-bit integer values (INT8) multiplies per cycle; sum of two parallel IEEE half precision, BFLOAT16 or INT16 multiplies per cycle; sum of four parallel IEEE quarter precision or 8-bit integer for signed and unsigned 8-bit integer values (INT8) multiplies per cycle; one quarter-precision or INT8 complex multiply per cycle; fused add; accumulation; 64, 32, 2×16 or 4×8 bit shifts by any number of bits; 64, 32, 2×16 or 4×8 bit rotate by any number of bits; 32-bit bitwise Boolean logic; compare, minimum or maximum of a data stream; two operand sort; and combinations thereof.

In a representative embodiment, in such an array of reconfigurable arithmetic circuits, two adjacent linked reconfigurable arithmetic circuits having the pair configuration may be adapted to perform at least two mathematical computation or functions selected from the group consisting of: one 32-bit integer for signed and unsigned 32-bit integer values (INT32) multiply per cycle; one 64-bit integer for signed and unsigned 64-bit integer values (INT64) multiply in a 4 cycle sequence using the accumulator circuit to add four 32×32 partial products; sum of two IEEE single precision or two 24-bit integer for signed and unsigned 24-bit integer values (INT24) multiplies per cycle; sum of four parallel IEEE half precision, 16-bit brain floating point ("BFLOAT") (BLOAT16) or 16-bit integer for signed and unsigned 16-bit integer values (INT16) multiplies per cycle; sum of eight parallel IEEE quarter precision or 8-bit integer for signed and unsigned 8-bit integer values (INT8) multiplies per cycle; one half-precision or INT16 complex multiply per cycle; four multiplies and two adds; fused add; accumulation; and combinations thereof.

In a representative embodiment, in such an array of reconfigurable arithmetic circuits, four linked reconfigurable arithmetic circuits having the quad configuration may be adapted to perform at least two mathematical computation or functions selected from the group consisting of: two 64-bit integer for signed and unsigned 64-bit integer values (INT64) multiplies in four cycles; two 32-bit integer for signed and unsigned 32-bit integer values (INT32) multiplies per cycle; sum of two INT32 multiplies per cycle; sum of four IEEE single precision or 24-bit integer for signed and unsigned 24-bit integer values (INT24) per cycle; sum of eight parallel IEEE half precision, 16-bit brain floating point ("BFLOAT") (BLOAT16) or 16-bit integer for signed and unsigned 16-bit integer values (INT16) multiplies per cycle; sum of sixteen parallel IEEE quarter precision or 8-bit integer for signed and unsigned 8-bit integer values (INT8) multiplies per cycle; one single precision or 24-bit integer for signed and unsigned 24-bit integer values (INT24) complex multiply per cycle; fused add; accumulation; and combinations thereof.

In a representative embodiment, in such an array of reconfigurable arithmetic circuits, each reconfigurable arithmetic circuit, of the plurality of reconfigurable arithmetic circuits, may further comprise: a configurable multiplier having a plurality of operating modes, the configurable multiplier coupled to the input reordering queues and to the multiplier shifter and combiner network; the plurality of operating modes comprising a fixed point operating mode and a floating point operating mode, wherein the configurable multiplier has a native operating mode of a 27×27 unsigned multiplier further configurable to process signed inputs. For example, the configurable multiplier may be further configurable to become four 8×8 multipliers, two 16×16 single-instruction multiple-data (SIMD) multipliers, one 32×32 multiplier and one 54×54 multiplier. For example, the configurable multiplier may be further configurable to reassign one or more partial products to become a 32×32 multiplier.

In a representative embodiment, in such an array of reconfigurable arithmetic circuits, the multiplier shifter and combiner network may comprise: a shifter circuit; and a plurality of series-coupled adder circuits coupled to the shifter circuit. For example, the multiplier shifter and combiner network may be adapted to shift a multiplier product to convert a floating point product to a product having a radix-32 exponent; and to sum a plurality of single-instruction multiple-data (SIMD) products to form a SIMD dot product. In a representative embodiment, in such an array of reconfigurable arithmetic circuits, the multiplier shifter and combiner network may further comprise: a plurality of direct connections coupling the multiplier shifter and combiner network to one or more multiplier shifter and combiner networks of adjacent reconfigurable arithmetic circuits of the plurality of reconfigurable arithmetic circuits to perform single cycle 32×32 and 54×54 multiplication, single precision 24×24 multiplication, and single-instruction multiple-data (SIMD) dot products.

In a representative embodiment, in such an array of reconfigurable arithmetic circuits, the multiplier shifter-combiner network may be adapted to add products from another reconfigurable arithmetic circuit in a pair configuration of reconfigurable arithmetic circuits and to generate a sum of products from another half of a reconfigurable arithmetic circuit quad configuration of reconfigurable arithmetic circuits. For example, the multiplier shifter-combiner network is adapted to additionally shift by multiples of 32 bits to match scaling of a Z input and inputs from the other reconfigurable arithmetic circuits in the quad configuration in order to sum the products.

In a representative embodiment, a reconfigurable arithmetic circuit may comprise: a plurality of data inputs, the plurality of data inputs comprising a first, X data input; a second, Y data input, and a third, Z data input; a plurality of data outputs; output reorder queues coupled to the plurality of data outputs to receive and reorder output data; input reordering queues coupled to the plurality of data inputs and adapted to store input data, the input reordering queues further comprising input reordering logic circuitry adapted to reorder a sequence of the input data; a configurable multiplier coupled to the input reordering queues, the configurable multiplier having a plurality of operating modes, the plurality of operating modes comprising a fixed point operating mode and a floating point operating mode, wherein the configurable multiplier has a native operating mode of a 27×27 unsigned multiplier further configurable to process signed inputs, and further configurable to become four 8×8 multipliers, two 16×16 single-instruction multiple-data (SIMD) multipliers, one 32×32 multiplier and one 54×54 multiplier; a multiplier shifter and combiner network coupled to the configurable multiplier, the multiplier shifter and combiner network comprising: a shifter circuit; a plurality of series-coupled adder circuits coupled to the shifter circuit; and a plurality of direct connections coupling the multiplier shifter and combiner network to one or more adjacent reconfigurable arithmetic circuits to perform single cycle 32×32 and 54×54 multiplication, single precision/24×24 multiplication, and single-instruction multiple-data (SIMD) dot products; a single-clock cycle fixed and floating point carry-save accumulator circuit; and a plurality of control logic circuits coupled to the multiplier shifter and combiner network and to the accumulator circuit, the plurality of control logic circuits comprising: a compare circuit adapted to extract a minimum or maximum data value from an input data stream, an index from the input data stream, and is further adapted to compare two input data streams, to swap the two input data streams to put the minimum of the two input data streams on a first output and the maximum of the two input data streams on a second output, to perform data steering, to generate address sequences, and to generate comparison flags for equality, greater than and less than; a Boolean logic circuit comprising an AND-OR-INVERT logic unit adapted to perform AND, NAND, OR, NOR, XOR, XNOR, and selector operations on 32 bit integer inputs; a Z input shifter adapted to shift a floating point Z-input value to a radix-32 exponent value, to shift by multiples of 32 bits to match a scaling of multiplier sum outputs, and has a plurality of integer modes in which the Z input shifter is used as a shifter or rotator with 64, 32, 2×16 and 4×8 bit shift or rotate modes; an exponent logic circuit; and an add, saturate and round circuit.

A reconfigurable processor circuit is also disclosed, with a representative embodiment comprising: a first interconnection network; a processor coupled to the first interconnection network; and a plurality of computational cores arranged in an array, the plurality of computational cores coupled to the first interconnection network and to a second interconnection network directly coupling adjacent computational cores of the plurality of computational cores, each computational core comprising: a memory circuit; and a reconfigurable arithmetic circuit comprising: input reordering queues; a multiplier shifter and combiner network coupled to the input reordering queues; an accumulator circuit; and at least one control logic circuit coupled to the multiplier shifter and combiner network and to the accumulator circuit.

In a representative embodiment, the reconfigurable arithmetic circuit may further comprise: a configurable multiplier having a plurality of operating modes, the configurable multiplier coupled to the input reordering queues and to the multiplier shifter and combiner network, the plurality of operating modes comprising a fixed point operating mode and a floating point operating mode, wherein the configurable multiplier has a native operating mode of a 27×27 unsigned multiplier further configurable to process signed inputs.

In a representative embodiment, the reconfigurable processor circuit may further comprise: a third interconnection network selectively coupling the multiplier shifter and combiner network to one or more adjacent reconfigurable arithmetic circuits to perform single cycle 32×32 and 54×54 multiplication, single precision 24×24 multiplication, and single-instruction multiple-data (SIMD) dot products.

In a representative embodiment, the configurable multiplier is further configurable to become four 8×8 multipliers, two 16×16 single-instruction multiple-data (SIMD) multipliers, one 32×32 multiplier and one 54×54 multiplier.

In a representative embodiment, each computational core of the plurality of computational cores may further comprise: a plurality of input multiplexers coupled to the reconfigurable arithmetic circuit, to the first interconnection network and to the second interconnection network; a plurality of input registers, each input register coupled to a corresponding input multiplexer of the plurality of input multiplexers; a plurality of output multiplexers coupled to the reconfigurable arithmetic circuit, each output multiplexer coupled to a corresponding input register of the plurality of input registers; and a plurality of output registers, each output register coupled to a corresponding output multiplexer of the plurality of output multiplexers, to the first interconnection network and to the second interconnection network.

In a representative embodiment, each computational core of the plurality of computational cores may further comprise: a plurality of zeros decompression circuits, each zeros decompression circuit coupled to a corresponding input multiplexer of the plurality of input multiplexers; and a plurality of zeros compression circuits, each zeros compression circuit coupled to a corresponding output multiplexer of the plurality of output multiplexers.

In a representative embodiment, a number of data packets having all zeros in a data payload is encoded as a suffix in a next data packet having a nonzero data payload.

In a representative embodiment, the first interconnection network may be a hierarchical network having a fat tree configuration and comprises a plurality of data routing circuits.

In a representative embodiment, the reconfigurable processor circuit is adapted to perform any and all RISC-V processor instructions using the processor and the plurality of computational cores.

In another representative embodiment, a reconfigurable processor circuit may comprise: a first interconnection network; a processor coupled to the first interconnection network; and plurality of computational cores arranged in an array, the plurality of computational cores coupled to the first interconnection network and to a second interconnection network directly coupling adjacent computational cores of the plurality of computational cores, each computational core comprising: a memory circuit; and a reconfigurable arithmetic circuit comprising: input reordering queues adapted to store a plurality of inputs, the input reordering queues further comprising input reordering logic circuitry adapted to reorder a sequence of the plurality of inputs of the reconfigurable arithmetic circuit and an adjacent reconfigurable arithmetic circuit of the plurality of computational cores; a configurable multiplier having a plurality of operating modes, the configurable multiplier coupled to the input reordering queues, the plurality of operating modes comprising a fixed point operating mode and a floating point operating mode, wherein the configurable multiplier has a native operating mode of a 27×27 unsigned multiplier further configurable to process signed inputs, and wherein the configurable multiplier is further configurable to become four 8×8 multipliers, two 16×16 single-instruction multiple-data (SIMD) multipliers, one 32×32 multiplier and one 54×54 multiplier; a multiplier shifter and combiner network coupled to the configurable multiplier, the multiplier shifter and combiner network comprising: a shifter circuit; and a plurality of series-coupled adder circuits coupled to the shifter circuit; an accumulator circuit; at least one control logic circuit coupled to the multiplier shifter and combiner network and to the accumulator circuit; and output reorder queues coupled to receive and reorder outputs from the reconfigurable arithmetic circuit and the adjacent reconfigurable arithmetic circuit of the plurality of computational cores.

In another representative embodiment, a reconfigurable processor circuit may comprise: a first interconnection network; a processor coupled to the first interconnection network; and a plurality of computational cores arranged in an array, the plurality of computational cores coupled to the first interconnection network and to a second interconnection network directly coupling adjacent computational cores of the plurality of computational cores, each computational core comprising: a plurality of input multiplexers coupled to the first interconnection network and to the second interconnection network; a plurality of input registers, each input register coupled to a corresponding input multiplexer of the plurality of input multiplexers; a plurality of output multiplexers, each output multiplexer coupled to a corresponding input register of the plurality of input registers; a plurality of output registers, each output register coupled to a corresponding output multiplexer of the plurality of output multiplexers, to the first interconnection network and to the second interconnection network; a plurality of zeros decompression circuits, each zeros decompression circuit coupled to a corresponding input multiplexer of the plurality of input multiplexers; a plurality of zeros compression circuits, each zeros compression circuit coupled to a corresponding output multiplexer of the plurality of output multiplexers; a memory circuit; and a reconfigurable arithmetic circuit coupled to the memory circuit, to the plurality of input registers, and to the plurality of output multiplexers, the reconfigurable arithmetic circuit comprising: input reordering queues adapted to store a plurality of inputs, the input reordering queues further comprising input reordering logic circuitry adapted to reorder a sequence of the plurality of inputs of the reconfigurable arithmetic circuit and an adjacent reconfigurable arithmetic circuit of the plurality of computational cores; a configurable multiplier having a plurality of operating modes, the configurable multiplier coupled to the input reordering queues, the plurality of operating modes comprising a fixed point operating mode and a floating point operating mode, wherein the configurable multiplier has a native operating mode of a 27×27 unsigned multiplier further configurable to process signed inputs, and wherein the configurable multiplier is further configurable to become four 8×8 multipliers, two 16×16 single-instruction multiple-data (SIMD) multipliers, one 32×32 multiplier and one 54×54 multiplier; a multiplier shifter and combiner network coupled to the configurable multiplier, the multiplier shifter and combiner network comprising: a shifter circuit; and a plurality of series-coupled adder circuits coupled to the shifter circuit; an accumulator circuit; at least one control logic circuit coupled to the multiplier shifter and combiner network and to the accumulator circuit; output reorder queues coupled to receive and reorder outputs from the reconfigurable arithmetic circuit and the adjacent reconfigurable arithmetic circuit of the plurality of computational cores; and a third interconnection network selectively coupling the multiplier shifter and combiner network to one or more adjacent reconfigurable arithmetic circuits to perform single cycle 32×32 and 54×54 multiplication, single precision 24×24 multiplication, and single-instruction multiple-data (SIMD) dot products.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which: Figure (or "FIG.") 1 is a block diagram of a reconfigurable processor having an array of fractal cores.

Figure (or "FIG.") 2 is a high-level block diagram of a fractal core and a RAE circuit.

Figure (or "FIG.") 3 is a block diagram of an array of fractal cores showing a plurality of direct connections between adjacent fractal cores.

Figures 4, 4A:
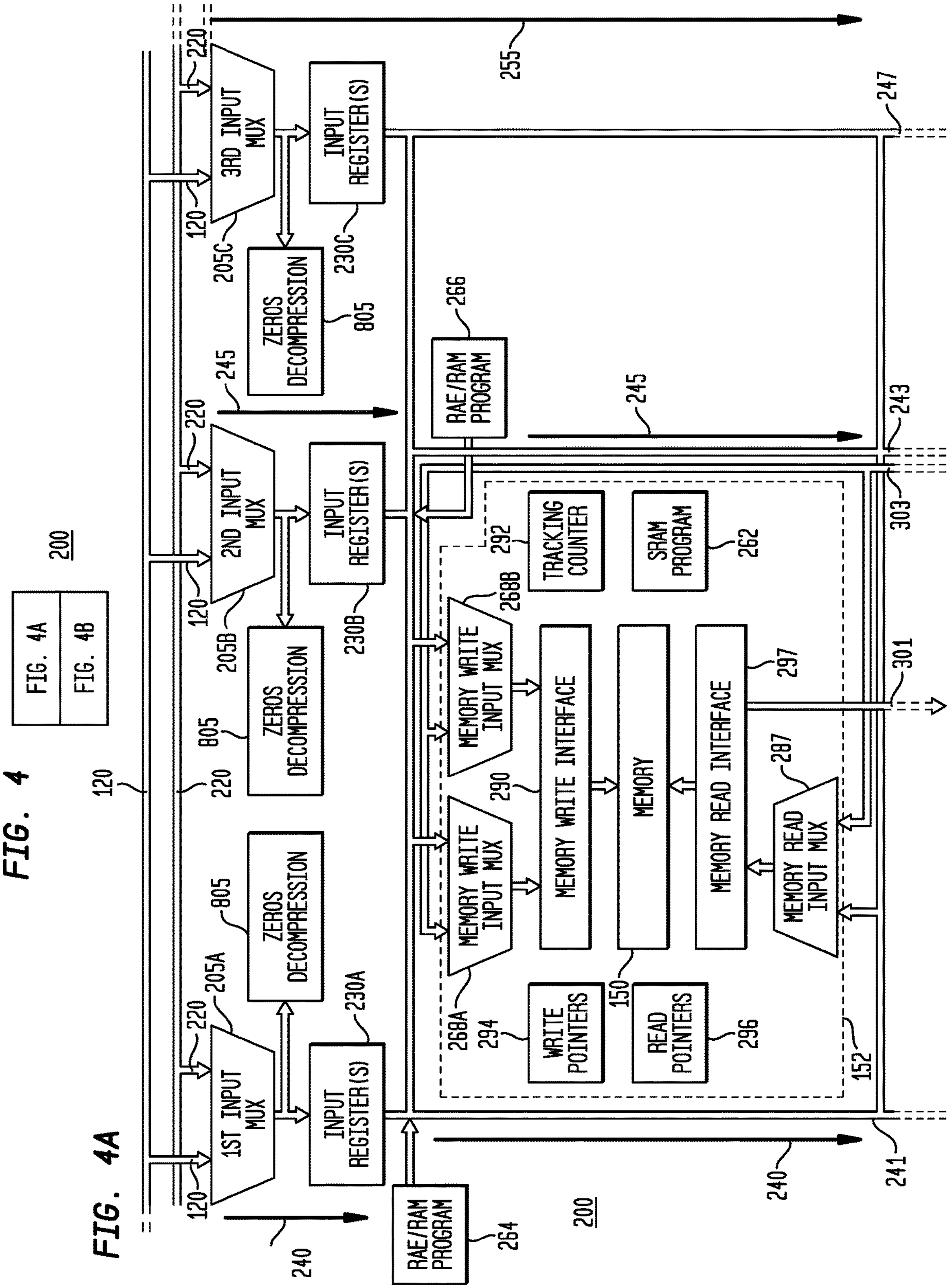
Figure 4B:
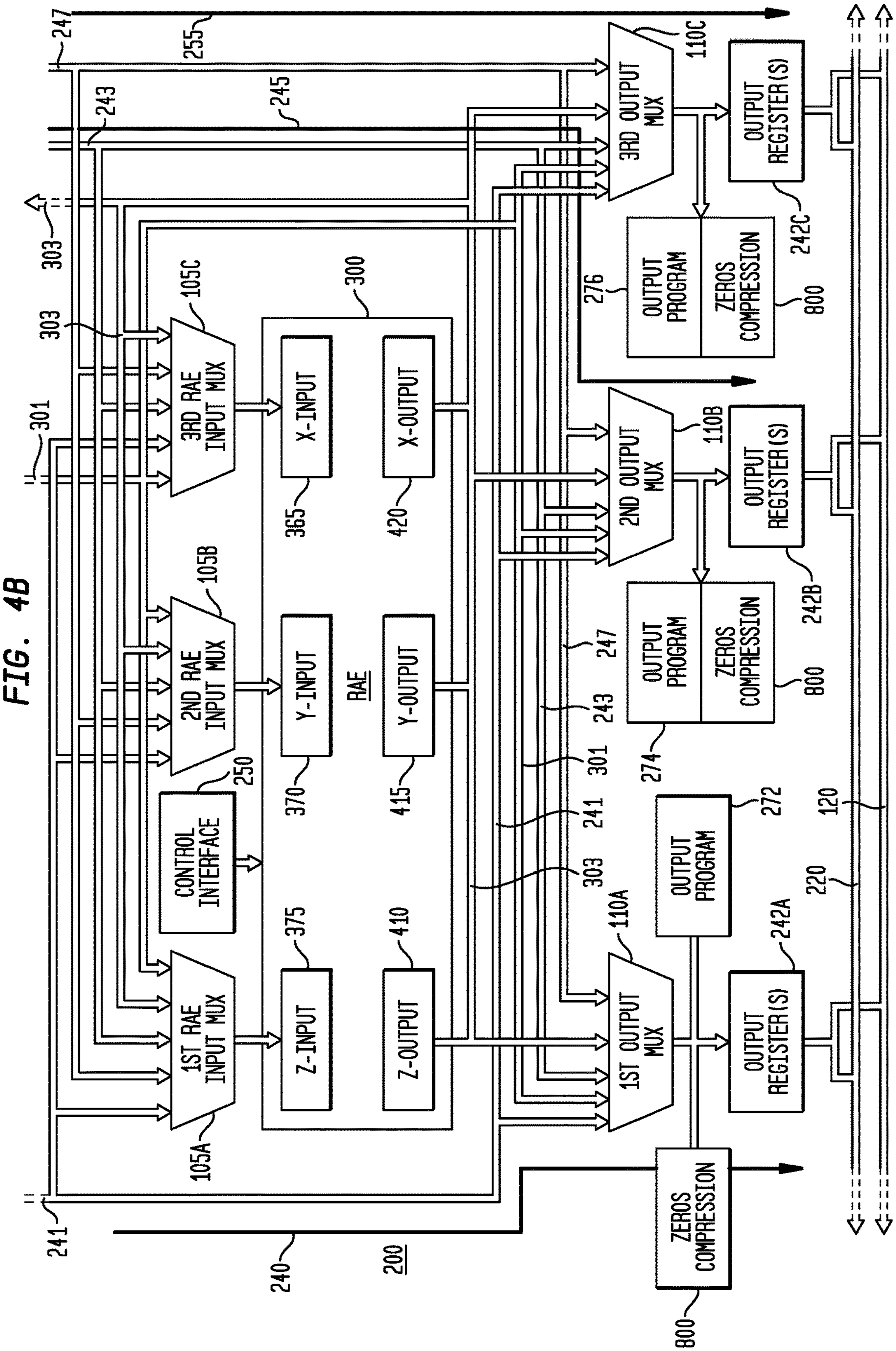

Figures (or "FIGS.") 4, 4A and 4B (with FIG. 4 divided into FIGS. 4A and 4B, and FIGS. 4, 4A and 4B collectively referred to as FIG. 4) are detailed block diagrams of a fractal core.

Figure (or "FIG.") 5 is a block diagram illustrating an exemplary or representative first embodiment of a reconfigurable arithmetic engine ("RAE") circuit.

Figure (or "FIG.") 5A is a high-level block diagram illustrating an exemplary or representative second embodiment of a RAE circuit.

Figure (or "FIG.") 6 is a high-level block diagram illustrating a plurality of exemplary or representative RAE circuits with dedicated connections.

Figure (or "FIG.") 7 illustrates a RAE multiplier in a native 27×27 configuration connected as 24×24.

Figure (or "FIG.") 8 illustrates using a 32×32 multiplier as two 16×16 SIMD multipliers.

Figure (or "FIG.") 9 illustrates modification of 27×27 multiplier for two 16×16 SIMD multipliers.

Figure (or "FIG.") 10 illustrates the structure of a multiplier with movable partial product.

Figure (or "FIG.") 11 illustrates using a pruned 32×32 multiplier as four 8×8 SIMD multipliers.

Figure (or "FIG.") 12 illustrates a 32×32 multiply formed by a shifted sum of two RAE multipliers, one of which is modified.

Figure (or "FIG.") 13 illustrates a 54×54 multiply formed by the shifted sums of four unmodified RAE multipliers.

Figure (or "FIG.") 14 illustrates a signed correction circuit for signed multiplication using an unsigned multiplier.

Figure (or "FIG.") 15 illustrates the alignment of inputs, sign corrections, and outputs for each signed integer mode.

Figure (or "FIG.") 16 illustrates a signed correction circuit which can also perform selective negation.

Figure (or "FIG.") 17 is a dot diagram for 27×27 multiplier with pruned 32 bit SIMD extension.

Figure (or "FIG.") 18 is a rearranged dot diagram with first layer Dadda adders.

Figure (or "FIG.") 19 is a dot diagram of a second layer Dadda tree for a flexible multiplier.

Figure (or "FIG.") 20 is a dot diagram of a third layer Dadda tree for flexible multiplier.

Figure (or "FIG.") 21 is a dot diagram of remaining layers of Dadda tree for flexible multiplier.

Figure (or "FIG.") 22 illustrates an equivalent circuit to 4:2 compressor and segment of layer 5 showing use of 4:2 compressors to perform layer 5 and layer 6 in one stage.

Figure (or "FIG.") 23 is a logic and block diagram of a post-multiply multiplier shifter-combiner network 310.

Figure (or "FIG.") 24 illustrates multiplier product alignment to the accumulator by mode.

Figure (or "FIG.") 25 is a chart illustrating a post-multiply shift by mode.

Figure (or "FIG.") 26 is a block diagram illustrating lane shift and first compressor circuit detail.

Figure (or "FIG.") 27 is a block diagram illustrating added logic to 4:2 compressor for lane carry blocking.

Figure (or "FIG.") 28 is a block diagram illustrating a first alternative embodiment of the multiplier shift-combiner network.

Figure (or "FIG.") 29 is a block diagram illustrating a second alternative embodiment of the multiplier shift-combiner network.

Figure (or "FIG.") 30 is a block diagram illustrating Z-input rotate/shift logic data path.

Figure (or "FIG.") 31 is a chart illustrating the Z-input shifter configuration by mode.

Figure (or "FIG.") 32 is a block diagram illustrating shift network construction.

Figure (or "FIG.") 33 illustrates bit alignment by mode for Z input logic.

Figure (or "FIG.") 34 is a block diagram illustrating floating point format conversion to radix32 from IEEE single precision.

Figure (or "FIG.") 35 is a block diagram illustrating an exponent logic circuit. Figure (or "FIG.") 36 is a block diagram illustrating excess shift logic for the Z-shifter and multiplier shifter-combiner network.

Figure (or "FIG.") 37 is a block diagram illustrating 3 bit index to 8 bit bar circuit with 2 input×fanout-2 (2×2) gates. 1's are buffers.

Figure (or "FIG.") 38 is a block diagram illustrating a tally circuit for converting XOR difference of bars to index using full adders.

Figure (or "FIG.") 39 is a block diagram illustrating 8 bit bar to 3 bit index circuit with 2 input×fanout-2 (2×2) gates.

Figure (or "FIG.") 40 is a block diagram illustrating multiplier and shift/combiner exponent logic.

Figure (or "FIG.") 41 is a block diagram illustrating Z-input exponent logic.

Figure (or "FIG.") 42 is a block diagram illustrating an accumulator.

Figure (or "FIG.") 43 is a circuit diagram illustrating an accumulator.

Figure (or "FIG.") 44 is a circuit diagram illustrating a leading signs and N*32 shifts circuit.

Figure (or "FIG.") 45 is a circuit diagram illustrating a tally to bar circuit structure with depth Log2(n) with logic added for SIMD split.

Figure (or "FIG.") 46 is a circuit diagram illustrating a Boolean logic stage.

Figure (or "FIG.") 47 is a high-level circuit and block diagram illustrating a min/max sort and compare circuit.

Figure (or "FIG.") 48 is a detailed circuit and block diagram illustrating a comparator of a min/max sort and compare circuit.

Figure (or "FIG.") 49 is a circuit diagram illustrating a decoder circuit.

Figure (or "FIG.") 50 is a detailed circuit and block diagram illustrating a streaming min/max with index application using a compare circuit.

Figure (or "FIG.") 51 is a detailed circuit and block diagram illustrating a two input sort application using a compare circuit.

Figure (or "FIG.") 52 is a detailed circuit and block diagram illustrating a data substitution application using a compare circuit.

Figure (or "FIG.") 53 is a detailed circuit and block diagram illustrating a threshold with hysteresis application using a compare circuit.

Figure (or "FIG.") 54 is a detailed circuit and block diagram illustrating a flag triggered event application using a compare circuit.

Figure (or "FIG.") 55 is a detailed circuit and block diagram illustrating a threshold triggered event application using a compare circuit.

Figure (or "FIG.") 56 is a detailed circuit and block diagram illustrating a data steering application using a compare circuit.

Figure (or "FIG.") 57 is a detailed circuit and block diagram illustrating a modulo N counting application using a compare circuit.

Figure (or "FIG.") 58 is a block diagram illustrating a derivation of corner-turn address.

Figure (or "FIG.") 59 is a block diagram illustrating a derivation of FFT bit-reverse corner-turn address.

Figure (or "FIG.") 60 is a detailed circuit and block diagram illustrating a logic circuit structure for a RAE input reorder queue.

Figure (or "FIG.") 61 is a detailed circuit and block diagram illustrating a sequencer logic circuit structure for input and output reorder queue.

Figure (or "FIG.") 62 illustrates a combination of FFTs using a mixed radix algorithm.

Figure (or "FIG.") 63 is a detailed circuit and block diagram illustrating a RAE pair for execution of a radix 2 FFT kernel.

Figure (or "FIG.") 64 is a detailed circuit and block diagram illustrating a RAE 300 pair configured for a complete rotator.

Figure (or "FIG.") 65 is a detailed circuit and block diagram illustrating a RAE circuit quad for execution of a radix 4 FFT (butterfly) kernel.

Figure (or "FIG.") 66 is a detailed circuit and block diagram illustrating multiple RAE 300 cascaded pairs for execution of an FFT kernel.

Figure (or "FIG.") 67 is a diagram illustrating a string matching use case.

Figure (or "FIG.") 68 is a diagram of a representative data packet utilized with the reconfigurable processor.

Figure (or "FIG.") 69 is a diagram of representative data payload types utilized in a data packet.

Figure (or "FIG.") 70 is a block and circuit diagram of a routing controller.

Figure (or "FIG.") 71 is a block diagram of a suffix control circuit.

Figure (or "FIG.") 72 is a block and circuit diagram of a zeros compression circuit.

Figure (or "FIG.") 73 is a diagram of a representative zeros compression data packet sequence.

Figure (or "FIG.") 74 is a block and circuit diagram of a zeros decompression circuit.

DETAILED DESCRIPTION OF REPRESENTATIVE EMBODIMENTS

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

1. Reconfigurable Processor 100

Figure 1:
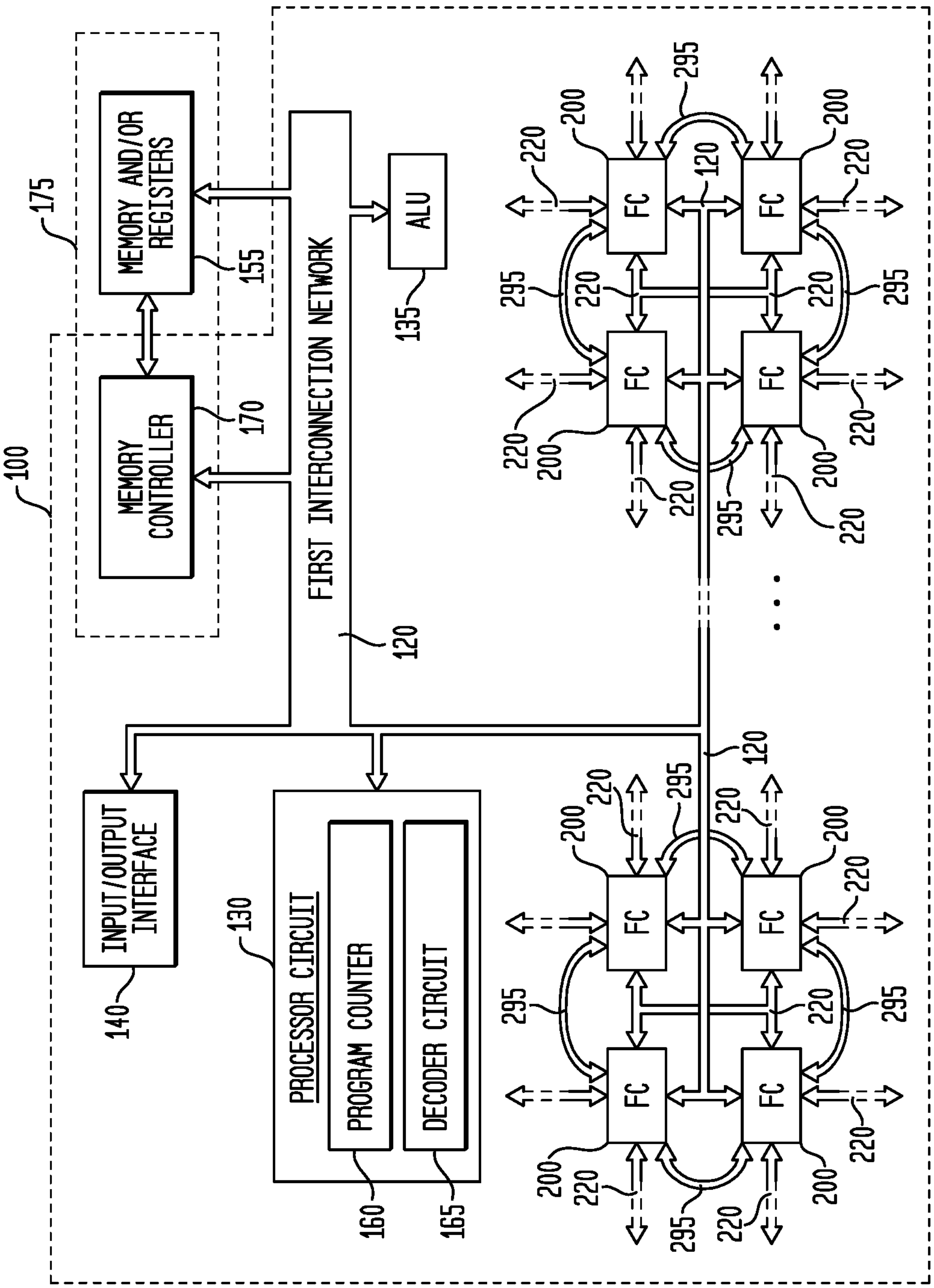
Figure 2:
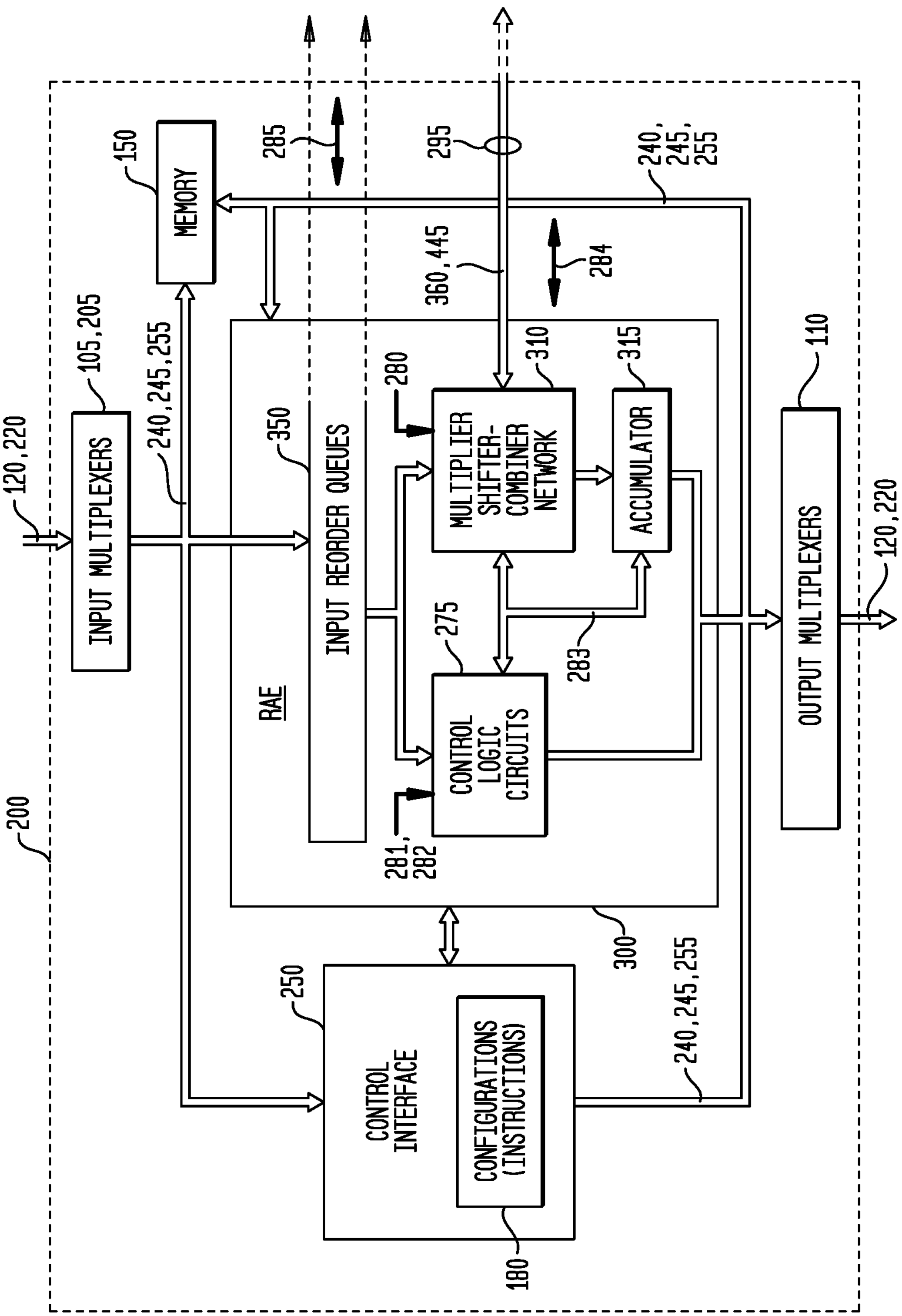
Figure 3:
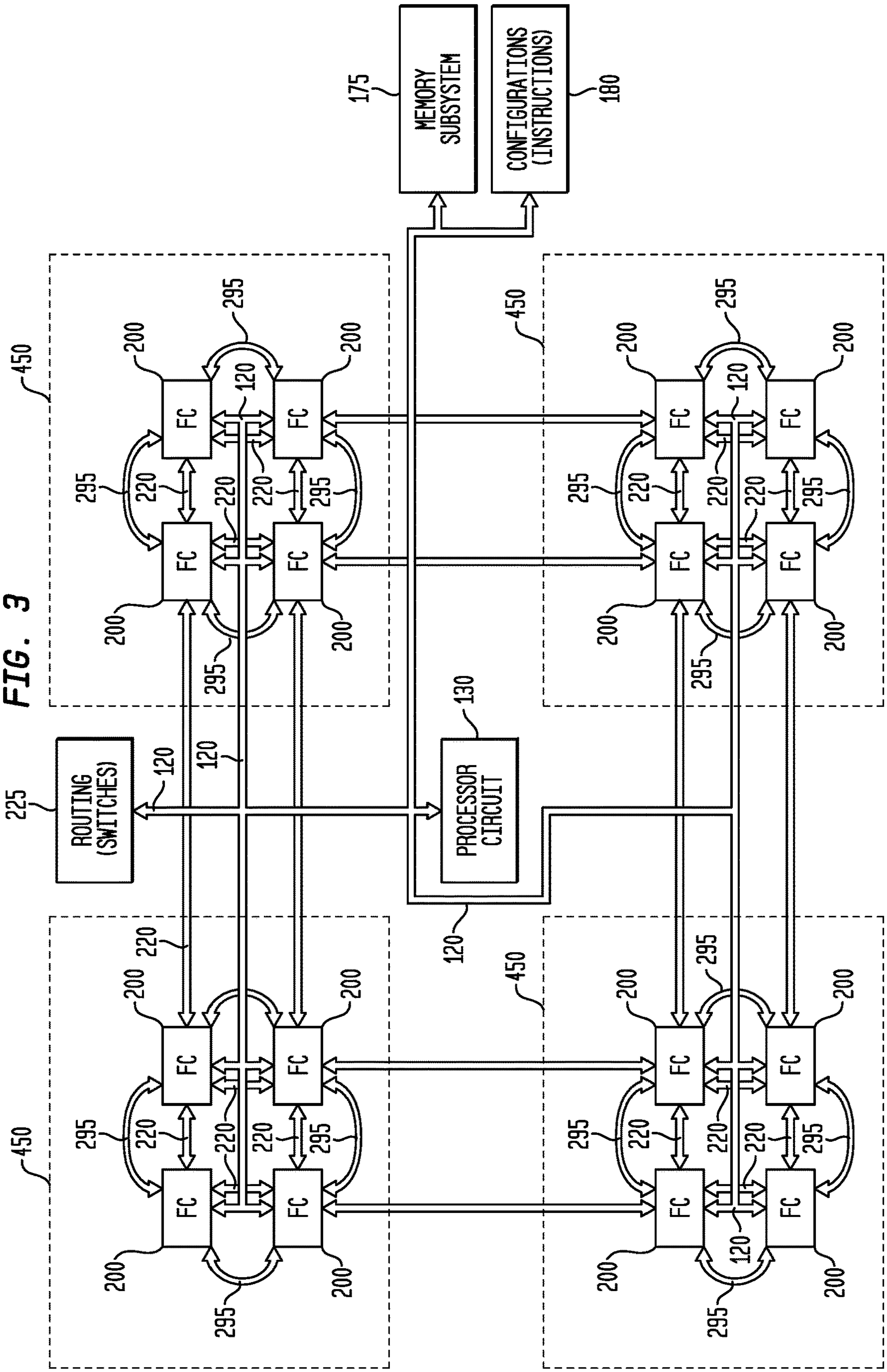

FIG. 1 is a block diagram of a reconfigurable processor 100 having an array of fractal cores 200. FIG. 2 is a high-level block diagram of a fractal core 200 and a RAE circuit 300. FIG. 3 is a block diagram of an array of fractal cores 200 showing the second interconnection network 220 forming a plurality of direct connections between adjacent computational cores 200. FIG. 4 is a detailed block diagram of a fractal core 200. Referring to FIGS. 1-4, a reconfigurable processor 100, such as an integrated circuit or chip, comprises a processor circuit 130, and a plurality of computational (or "fractal") cores 200 (i.e., computational core circuitry, which may be abbreviated as "FC" in the Figures and also referred to herein as a "fractal core" 200). The plurality of computational (fractal) cores 200 are typically arranged in an array and are coupled to the processor circuit 130 via a first interconnection network 120, which has a plurality of routing (switching) circuits 225 and other connections, typically hierarchical (such as implemented as a fat tree, for example and without limitation, and all such interconnection networks are considered equivalent and within the scope of the disclosure). A second interconnection network 220 is also illustrated, which provides a plurality of direct, unrouted or unswitched connections between and among the inputs and outputs of adjacent (e.g., nearest neighbor) computational cores 200, illustrated as North (N), South (S), East (E), and West (W) connections of the second interconnection network 220. The first interconnection network 120 has multiple levels, for data packet routing among the array of computational cores 200, while the second interconnection network 220 provides a plurality of direct connections between and among the various computational cores 200, and is described in greater detail below. The formats for various data packets, including the location of bits for a suffix, are illustrated and discussed below with reference to FIGS. 68 and 69.

The processor circuit 130 may be implemented or embodied as a general purpose processor (e.g., a RISC-V processor) or may be more limited and may comprise control logic circuitry, such as various computational logic and state machines for processing C code. For example, the processor circuit 130 may be implemented as computational logic and one or more state machines (e.g., a highly "stripped down" RISC-V processor, in which components such as multipliers and/or dividers have been omitted or removed). The processor circuit 130 typically includes a program counter ("PC") 160, an instruction decoder 165, and various state machines and other control logic circuits for processing C code which is not being processed by the fractal cores 200, such as recursive C code. The computational cores 200 are referred to as "fractal" cores because they are self-similar, and the reconfigurable processor 100 has been "fractured" into a plurality of fractal, computational cores 200 which collectively function not only as an overall reconfigurable processor but also as a massively parallel, reconfigurable accelerator integrated circuit. The reconfigurable processor 100 also includes an input/output interface 140 for off chip and other network communications, an optional arithmetic logic unit ("ALU") 135, an optional memory controller 170 and an optional memory (and/or registers) 155. The optional memory controller 170 and/or an optional memory (and/or registers) 155 may also be provided as a memory subsystem 175 (illustrated in FIG. 3). The reconfigurable processor 100, for example, can not only replace a RISC-V processor in its entirety, but also provide massive computational acceleration.

The reconfigurable processor 100 provides high performance and energy efficient solutions for mathematically intensive applications, such as involving artificial intelligence, neural network computations, digital currencies, encryption, decryption, blockchain, computation of Fast Fourier Transforms (FFTs), and machine learning, for example and without limitation.

In addition, the reconfigurable processor 100 is capable of being configured for any of these various applications, with several such examples illustrated and discussed in greater detail below. Such a reconfigurable processor 100 is readily scalable, such as to millions of computational cores 200, has low latency, is computationally and energy efficient, is capable of processing streaming data in real time, is reconfigurable to optimize the computing hardware for a selected application, and is capable of massively parallel processing. For example, on a single chip, a plurality of the reconfigurable processors 100 may also be arrayed and connected, using the interconnection network 120, to provide hundreds to thousands of computational cores 200 per chip. In turn, a plurality of such chips may be arrayed and connected on a circuit board, resulting in thousands to millions of computational cores 200 per board. Any selected number of computational cores 200 may be implemented in reconfigurable processor 100, and any number of reconfigurable processors 100 may be implemented on a single integrated circuit, and any number of such integrated circuits may be implemented on a circuit board. As such, the reconfigurable processor 100 having an array of computational cores 200 is scalable to any selected degree (subject to other constraints, however, such as routing and heat dissipation, for example and without limitation). In a representative embodiment, such as illustrated in FIG. 3, sixteen computational cores 200 are implemented per processor circuit 130, for each reconfigurable processor 100, which reconfigurable processors 100 in turn are tiled across an IC, for example and without limitation.

2. Computational Core 200

Referring to FIG. 2, a computational core 200 comprises a reconfigurable arithmetic circuit 300 referred to as a reconfigurable arithmetic engine 300 or reconfigurable arithmetic engine circuit 300 (referred to herein as a "RAE" 300 or RAE circuit 300). The RAE circuit 300 is coupled to a first plurality of input multiplexers 205 (generally through the RAE input multiplexers 105) and to the plurality of output multiplexers 110. The first plurality of input multiplexers 205 and the plurality of output multiplexers 110 are coupled to the first interconnection network 120 and to the second interconnection network 220. The RAE circuit 300 is also coupled to a memory 150, and to an optional control interface circuit 250. The control interface circuit 250 may include a configuration store or memory 180 as an option, such as for storing configurations and/or instructions for the RAE circuit 300, may also include optional registers, an optional program counter and an optional instruction decoder, and as another option may include various state machines and other control logic circuits for processing C code, all for example and without limitation. The memory 150 may store operand data, and optionally may also store configurations or other instructions for the computational core 200 for execution by the RAE circuit 300. Alternatively, the configurations or other instructions for the computational core 200 for execution by the RAE 300 may be stored in registers (e.g., the configuration store or memory 180) which may be included in the control interface circuit 250. In a representative embodiment, as an option, the configuration store or memory 180 is distributed within the RAE circuit 300, as discussed below. A computational core 200 may also include other components, discussed with reference to FIG. 4. In a representative embodiment, the memory 150 is implemented using SRAM, for example and without limitation. A representative embodiment of a routing controller 820 utilized to provide data selection through the input multiplexers 205 and output multiplexers 110 is illustrated and discussed below with reference to FIG. 70.

The RAE circuit 300 is a data-flow architecture primarily designed to process streaming data with floating point or integer arithmetic and Boolean logic, including a variety of integer and floating point modes, including SIMD modes, and will execute upon receipt of the relevant data. It is augmented with comparison logic that can set exception flags, be used to gate data flow, or substitute data based on compare results. In addition, as discussed in greater detail below, RAE circuits 300 can be grouped in pairs, in groups of four (2 rows, 2 columns, illustrated in FIG. 6, for example and without limitation), and in groups greater than four RAE circuits 300, with special dedicated, selectable wired connections (busses) 360, 445 connecting the multiplier adder trees (of the multiplier shifter-combiner network 310) to allow RAE circuits 300 in a group to be combined for larger adders, complex multiplies and general sum of products use, for example and without limitation. All of the various busses referred to herein may be considered to be "N"-bits wide (for transmitting a corresponding variable number of bits of a data packet or control word) as may be necessary or desirable for the particular bus or interconnection network 120, 220, 295.

These dedicated, selectable wired connections (busses) 360, 445 between and among a plurality of RAE circuits 300 form a configurable, third interconnection network 295 to merge a plurality of RAE circuits 300 into RAE circuit pairs 400 and RAE circuit quads 450 to perform double precision multiply-adds, multiply-accumulate and logic operations, such as to use four linked RAE circuits 300 as a single precision single cycle complex multiply, or to perform a plurality of FFT butterfly operations, or for exponent resolution, for example and without limitation, with multiple other applications described below. The RAE circuit 300 is discussed in greater detail below with reference to FIGS. 2, 5 and 6.

Referring to FIG. 4, a computational core 200 comprises a RAE circuit 300 (illustrated in a simplified form in FIG. 4) and memory 150, and generally also input multiplexers 205 (and/or RAE input multiplexers 105), output multiplexers 110, and optionally a control interface 250 (which may also have a configuration store or memory 180 and the other components (such as an instruction decoder) mentioned above). The suffix (and/or conditional flag) input 380 and suffix (and/or conditional flag) output 405 of a RAE circuit 300 (illustrated in FIGS. 5 and 5A) are not illustrated separately in FIG. 4. In a representative embodiment, the input multiplexers 205 comprise a first input multiplexer 205A, a second input multiplexer 205B, and a third input multiplexer 205C, which are coupled to receive input from the first interconnection network 120 and the second interconnection network 220. Accordingly, each computational core 200 is coupled to receive data from each neighboring computational core 200 (via the direct connections of the second interconnection network 220) and from non-neighboring computational cores 200, the processor circuit 130 and other components (via the first interconnection network 120), all of which feed into each of the first, second, and third input multiplexers 205A, 205B, 205C, respectively. Dynamic selection control (not separately illustrated) for each of the first, second, and third input multiplexers 205A, 205B, 205C may be provided from the configurations and/or instructions, such as configurations which may be stored in the configuration store or memory 180. The outputs from each of the first, second, and third input multiplexers 205A, 205B, 205C may be register-staged before being provided to other components such as the memory 150, the second plurality of (RAE) input multiplexers 105 for the RAE circuit 300, or the output multiplexers 110, such as using corresponding input registers 230 (illustrated as input registers 230A, 230B, 230C), respectively, as illustrated in FIG. 4. The input registers 230 are typically double-buffered in representative embodiments.

In a representative embodiment, the computational core 200 also comprises a first output multiplexer 110A, a second output multiplexer 110B, and a third output multiplexer 110C, which are coupled to receive input from the RAE circuit 300, the memory 150, and the first, second, and third input multiplexers 205A, 205B, 205C, and to provide output to the first interconnection network 120 and the second interconnection network 220. Accordingly, each computational core 200 is coupled to provide data to each neighboring computational core 200 (via the direct connections of the second interconnection network 220) and to non-neighboring computational cores 200 and the processor circuit 130 (via the first interconnection network 120), all of which receive input from each of the first, second, and third output multiplexers 110A, 110B, 110C, respectively. Dynamic selection control (not separately illustrated) for each of the first, second, and third output multiplexers 110A, 110B, 110C may be provided from the configurations and/or instructions, such as configurations which may be stored in the configuration store or memory 180. The outputs from each of the first, second, and third output multiplexers 110A, 110B, 110C, respectively also may be register-staged before being provided to these other components, such as using corresponding output registers 242 (illustrated as output registers 242A, 242B, 242C), respectively, as illustrated in FIG. 4. The output registers 242 are typically double-buffered in representative embodiments.

In a representative embodiment, as illustrated in FIG. 4, there are a plurality of separate and independent data paths in a computational core 200, illustrated as a first ("left distributor") data path 240 (extending along bus 241), a second ("right distributor") data path 245 (extending along bus 243), and a third ("aggregator") data path 255 (extending along bus 247), each having separate and independent control from each other, such as through configurations or instructions which may be stored in the configuration store or memory 180. It should also be noted that within each computational core 200, each of these data paths includes one or more pass-through connection between each of the first, second, and third input multiplexers 205A, 205B, 205C, respectively, on the one hand, and each of the first, second, and third output multiplexers 110A, 110B, 110C, respectively, on the other hand. For example, data from the first input multiplexer 205A may be passed directly to any or all of the first, second, and third output multiplexers 110A, 110B, 110C, respectively; data from the second input multiplexer 205B may be passed directly to any or all of the first, second, and third output multiplexers 110A, 110B, 110C, respectively; and data from the third input multiplexer 205C may be passed directly to any or all of the first, second, and third output multiplexers 110A, 110B, 110C, respectively, etc. There are also several independent data paths within the RAE circuit 300 and another independent data path within the memory 150. All of these various data paths may be utilized in parallel for performing different computations concurrently, and separately and independently from each other. In a representative embodiment, the third ("aggregator") data path 255 is utilized to aggregate data from a plurality of sources, such as to generate a stream of output data packets or to interleave data from multiple sources, for example and without limitation. In addition, data from or within each of the first data path 240, a second data path 245, and a third data path 255 may be provided to each of the RAE circuit 300 (via RAE input multiplexers 105A, 105B, and 105C) and the memory 150, and data from each of the RAE circuit 300 and the memory 150 may be provided to each of the first data path 240, second data path 245, and third data path 255.

Configurations and programs (e.g., configurations, instructions and instruction sequences) may also be provided locally (and separately and independently) within the computational core 200, including within the memory 150 (e.g., SRAM program 262), rather than utilizing more centralized program or configuration storage (such as the configuration store or memory 180). For example, program stores (or memories) 264 and 266 are provided in each of the first data path 240 and the second data path 245 (and optionally the third data path 255 (not separately illustrated)), providing two separate programs for the RAE circuit 300, the memory 150, and the input selections of the RAE input multiplexers 105. Also for example, several output program stores (or memories) 272, 274, and 276 are provided respectively to each of the first, second, and third output multiplexers 110A, 110B, 110C, as part of the configurations or instructions for each of the first data path 240, second data path 245, and third data path 255, respectively. The first data path 240, second data path 245, and third data path 255 may also implement "zeros compression", in which comparatively long strings of zeros in the data stream are encoded for transmission (and thereby compressed) rather than transmitted directly.

Input data from any of the memory 150, first data path 240, second data path 245, and third data path 255 is provided via the RAE input multiplexers 105A, 105B, and 105C to the RAE circuit 300, and more specifically, respectively to a first ("X") input 365, a second ("Y") input 370, and a third ("Z") input 375 of the RAE circuit 300. Output results from the RAE circuit 300 are provided to the memory 150 (via bus 303), the first data path 240, second data path 245, and third data path 255 via a first ("X") output 420, a second ("Y") output 415, a third ("Z") output 410, provided to the output multiplexers 110 (via bus 303), and are also fed back into any of the various RAE inputs 365, 370, 375 via bus 303 and via RAE input multiplexers 105A, 105B, and 105C. Input data from any of the RAE circuit 300, the first data path 240, second data path 245, and third data path 255 is provided via the memory write (store or input) multiplexers 268 (illustrated as memory input multiplexers 268A and 268B) and RAM write interface 290 (of the RAE memory system 152) for storage to the memory 150, and data to be read from the memory 150 by any of the RAE circuit 300, the first data path 240, second data path 245, and third data path 255 may be selected using the memory read (or load) multiplexer 287 and provided (on bus 301) using RAM read interface 297 (of the RAE memory system 152), as illustrated. The RAE memory system 152 may also optionally include a tracking counter 292, write pointer store 294, and a read pointer store 296.

3. RAE Circuit 300, RAE Circuit Pair 400 and RAE Circuit Quad 450

Figure 5:
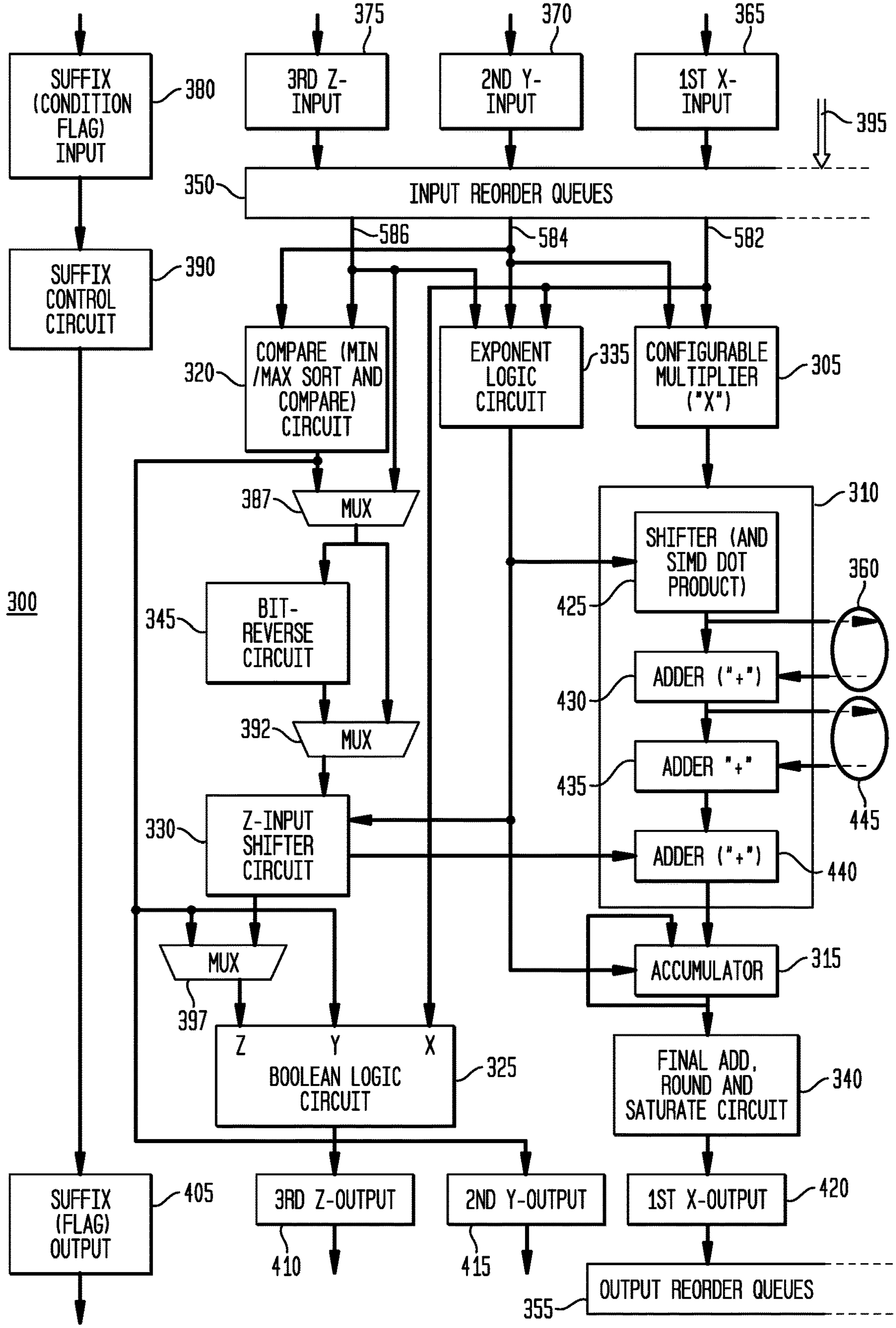
Figure 6:
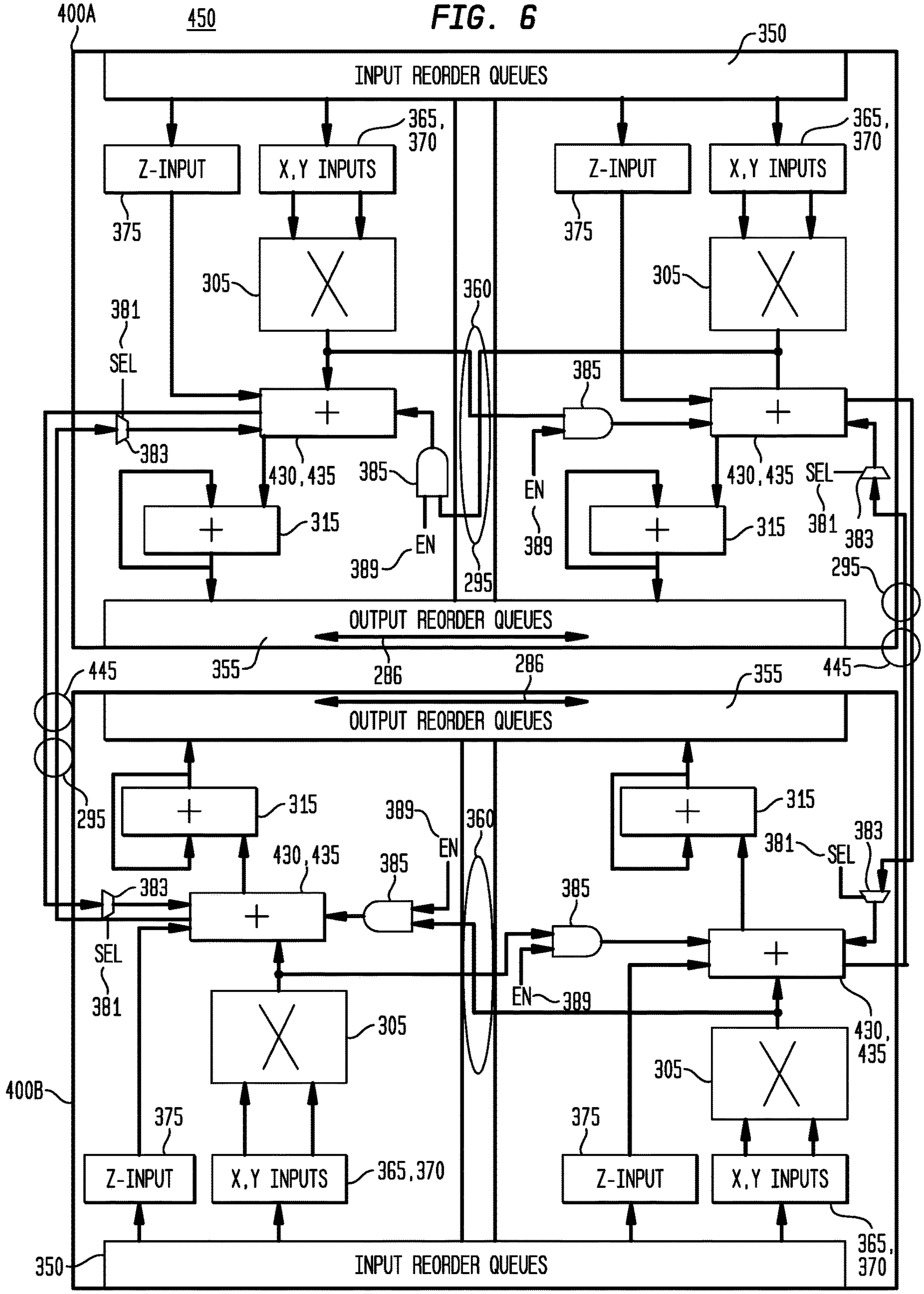

Referring to FIGS. 2, 5, and 6, a RAE circuit 300 comprises input reorder queues 350, a multiplier shifter-combiner network 310 (also referred to as a multiplier shifter and combiner network 310 or a shifter-combiner network 310), an accumulator 315, and one or more control logic circuits 275. The input reorder queues 350 are coupled to the data inputs (first ("X") input 365, a second ("Y") input 370, a third ("Z") input 375) (and to the data inputs of the adjacent RAE circuit 300 of a RAE circuit pair 400), and the input reorder queues 350 are coupled to the multiplier shifter-combiner network 310 and to the one or more control logic circuits 275, which in turn also couple to the accumulator 315. The multiplier shifter-combiner network 310 comprises a shifter circuit 425 and an adder tree comprising a plurality of series-coupled adders (in a carry-save configuration) 430, 435, 440, and as such, is capable of performing multiple modes of multiplication, in addition to shifting and addition (and is also utilized to compute single-instruction multiple-data ("SIMD") dot products). In a representative embodiment illustrated in FIG. 5, an additional (configurable) multiplier 305 may be and generally is included in the RAE circuit 300, either as a separate component or as part of the multiplier shifter-combiner network 310. The multiplier shifter-combiner network 310 is also coupled through dedicated communication lines 360, 445 (e.g., wiring) of the third interconnection network 295 to the multiplier shifter-combiner networks 310 of adjacent RAE circuits 300 (of a RAE circuit pair 400 and of a RAE circuit quad 450).

Multiple separate and independent data paths 280, 281, 282, 283 are utilized within a RAE circuit 300, with: a first data path 280 from the input reorder queues 350 through the multiplier shifter-combiner network 310; second and third data paths 281, 282 from the input reorder queues 350 through the control logic circuits 275; a fourth data path 283 from the control logic circuits 275 through the multiplier shifter-combiner network 310 and the accumulator 315; fifth, bidirectional data paths 284 through the third interconnection network 295 (communication lines 360, 445) between and among the multiplier shifter-combiner networks 310 of a first RAE circuit 300, a second RAE circuit 300 of its (first) RAE circuit pair 400 of the RAE circuit quad 450, and a third RAE circuit 300 of the other (second) RAE circuit pair 400 of the RAE circuit quad 450; an optional sixth data path 285 created by the sharing of input reorder queues 350 between adjacent RAE circuits 300 of a RAE circuit pair 400 and/or additional input communication lines 395 (illustrated in FIG. 5) received from an adjacent RAE circuit 300 of a RAE circuit pair 400; and (illustrated in FIG. 6), a seventh data path 286 created by the sharing of output reorder queues 355 between adjacent RAE circuits 300 of a RAE circuit pair 400. Using this plurality of separate and independent data paths, the various components of a RAE circuit 300 can each be performing, separately and independently, different computations, bit manipulations, logic functions, etc., providing for significant utilization of any and all resources within the RAE circuit 300. It should also be noted that any of the outputs (582, 584, 586) from the input reorder queues 350 may be provided to any of the various components of the RAE circuit 300, in addition to or in lieu of those illustrated in FIG. 5.

Figure 5A:
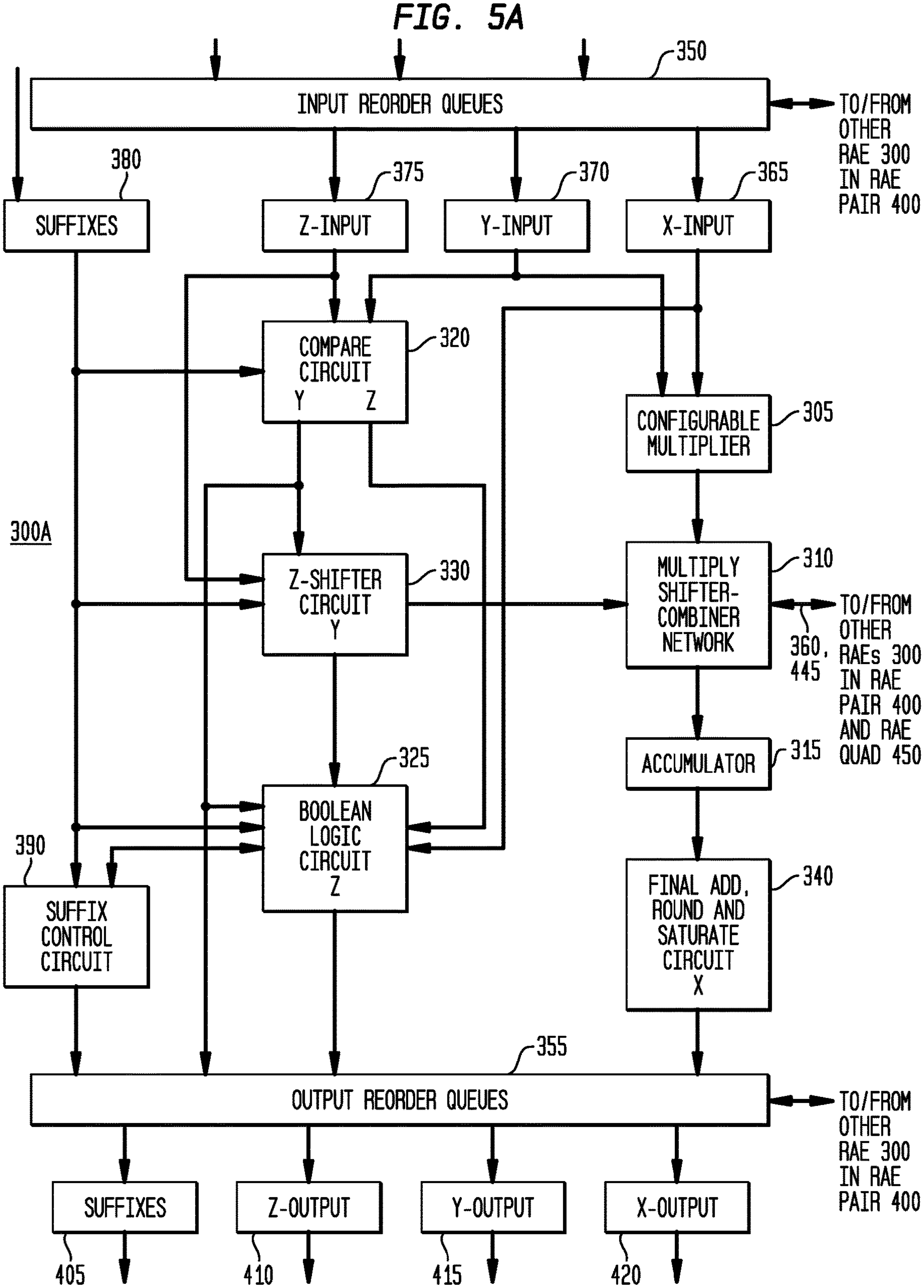

FIG. 5 is a block diagram illustrating an exemplary or representative first embodiment of a RAE circuit 300. FIG. 5A is a simplified, high-level block diagram illustrating a software programming view of an exemplary or representative second embodiment of a RAE circuit 300A, and it utilized to illustrate additional locations or circuit structures for the input reorder queues 350 and output reorder queues 355, and illustrate distribution of suffix information from the suffix (and/or conditional flag) input 380 and/or suffix control circuit 390. Although not illustrated in FIG. 5A, no components of the RAE circuit 300 are eliminated or removed in the RAE circuit 300A. The RAE circuit 300A is a variation of a RAE circuit 300 and differs from the RAE circuit 300 solely with regard to the arrangement (circuit location) of the input reorder queues 350 and the output reorder queues 355 as discussed above, and is otherwise implemented precisely the same as the RAE circuit 300, with identical components and identical functionality. Accordingly, unless otherwise specified, any reference to a RAE circuit 300 means and includes a RAE circuit 300A, and the RAE circuit 300A is otherwise not separately addressed herein.

Referring to FIGS. 5 and 5A, a RAE circuit 300 comprises input reorder queues 350; a multiplier shifter-combiner network 310 (which may include a multiplier 305); the configurable (or flexible) multiplier 305 (having a plurality of configurable operating modes) (when not included as part of the multiplier shifter-combiner network 310); an accumulator 315; optionally output reorder queues 355; and control logic circuits 275 comprising one or more of the following: (1) a min/max sort and compare circuit 320 (also referred to more generally as a "compare circuit" 320) (with "min" referring herein to "minimum" and "max" referring herein to "maximum"); (2) a Boolean logic circuit 325; (3) a Z-input shifter circuit 330; (4) an exponent logic circuit 335; (5) a suffix control circuit 390 (when optionally included in a RAE circuit 300); (6) a final add, saturate and round circuit 340; and (7) optionally, a bit reverse circuit 345. As an option, the RAE circuit 300 may additionally comprise various data steering components, such as a first data selection (steering) multiplexer 387, a second data selection (steering) multiplexer 392, and a third data selection (steering) multiplexer 397. The first multiplexer 387, second multiplexer 392, and third multiplexer 397 are configured using configurations and/or instructions for data routing selection within the RAE circuit 300. Also as shown in FIG. 4, the RAE circuit 300 generally includes a first ("X") input 365, a second ("Y") input 370, a third ("Z") input 375, a suffix (and/or conditional flag) input 380, and a first ("X") output 420, a second ("Y") output 415, a third ("Z") output 410, and a suffix (and/or conditional flag) output 405. The multiplier shifter-combiner network 310 comprises a shifter circuit 425 (which can also perform a single-instruction multiple-data ("SIMD") dot product) and a plurality of adders 430, 435, and 440 coupled in series to form an adder "tree". The multiplier shifter-combiner network 310 also includes dedicated communication lines 360 and 445, with communication lines 360 being selectively coupleable or connectable to another, adjacent RAE circuit 300 within a pair of RAE circuits 300, and communication lines 445 being selectively coupleable or connectable to another adjacent RAE circuit 300 in a RAE circuit quad 450, illustrated and discussed below with reference to FIG. 6.

It should also be noted that one or more of the circuits 320, 325, 330, 335, 340, and 345 comprising control logic circuits 275 may be combined or implemented in different ways, and not all are required to be included in the control logic circuits 275. For example and without limitation, the sorting of the compare circuit 320 could also be performed within the input reorder queues 350 or the Boolean logic circuit 325; and the bit reversing of the bit reverse circuit 345 could also be performed by the compare circuit 320, the Boolean logic circuit 325, or the input reorder queues 350.

As an option in a representative embodiment, the RAE circuit 300 is also coupled to the control interface circuit 250 or other configuration and/or instructions stores discussed above, for the various components to receive configurations, instructions, and/or other control words or bits and, in the interests of clarity, those separate connections are not separately illustrated in FIG. 5, it being understood that the multiplier 305, the multiplier shift combiner network 310, the accumulator 315, the min/max sort and compare circuit 320, the Boolean logic circuit 325, the Z-shifter circuit 330, the exponent logic circuit 335, the suffix control circuit 390, the final add, saturate and round circuit 340, the input reorder queues 350, the output reorder queues 355, and optionally, the bit reverse circuit 345, the first multiplexer 387, the second multiplexer 392, the third multiplexer 397, and the other multiplexers and configurable components, are all coupled to the control interface circuit 250 or other configuration and/or instructions stores to receive such configurations, instructions and/or other control, such as to select various operating modes and to route data within the RAE circuit 300 and among the RAE circuits 300.

In a representative embodiment, the multiplier 305 is implemented as a carry-save adder (e.g., comprising shift registers and adder circuits, not separately illustrated for the multiplier 305, but will be embodied similarly or identically to the shifter 425 and adder circuits 430, 435, 440 of the multiplier shifter-combiner network 310), but is configurable to have both fixed point and floating point modes. The various different configurations are accomplished and illustrated through the movement/rearrangement of the various partial products, which are then added together, using any type of carry-save adder as known or becomes known in the art, any and all of which are considered equivalent and within the scope of the disclosure. The multiplier 305 has a "native mode" as a 27×27 unsigned multiplier with extensions (added circuitry) to process signed inputs. The multiplier 305 is configurable and reconfigurable to become four 8×8 or two 16×16 SIMD multipliers. This is accomplished by reassigning some of the partial products to arrange the multiplier as a pruned 32×32 multiplier with the off-diagonal partial products removed. A third configuration of the multiplier 305 rearranges partial products so that the reconfigured multiplier 305 can be paired with a native mode multiplier 305 to form a 32×32 multiplier using two RAE circuits 300.

The multiplier 305 is followed by a multiplier shifter-combiner network 310 that shifts the product (output from the multiplier 305) to convert floating point products to a system with radix-32 exponents (using shifter 425). The multiplier shifter-combiner network 310 also is capable of summing the SIMD products to form a dot product. This multiplier shifter-combiner network 310 also adds the scaled third (Z) input to the product and can add products from the other RAE circuit 300 in a pair and sum of products from the adjacent RAE circuit 300 of a pair or the other half of a RAE circuit quad 450 using adders 430, 435, and 440. Additional shifting by multiples of 32 bits are done by the shifter 425 in order to match scaling of Z input and inputs from the other RAE circuits 300 in the RAE circuit quad 450 in order to sum the products when needed. The plurality of adders 430, 435, and 440 as a summing network (or "adder tree") allows adjacent RAE circuits 300 to be joined to perform single cycle 32×32 and 54×54 multiplies as well as single precision 24×24 and SIMD dot products of up to 4 terms (8 or 16 terms for SIMD modes).

The Z-input shifter 330 shifts floating point Z-input values to convert to a system with radix-32 exponents, and also shifts by multiples of 32 bits as needed to match the scaling of the multiplier sum outputs (of the multiplier shifter-combiner network 310). For integer modes, the Z-input shifter circuit 330 is used as a shifter or rotator with 64, 32, 2×16 and 4×8 bit shift/rotate modes.

The accumulator 315 is implemented as a single-clock cycle floating point accumulator. The accumulator 315 supports fixed and floating point multiply-accumulate for single lane and two floating point and 1, 2 or 4 lane INTEGER arguments. The accumulator 315 hardware is a 128 bit adder in carry-save format (and may be embodied as known carry-save accumulator), with additional floating point exponent controls for 128 and 64 bit segments (4 lane SIMD floating point is treated as integer in accumulator 315).

The Boolean logic circuit 325 includes an AND-OR-INVERT logic unit that ties to the Z input's floating point alignment shift network to perform AND, NAND, OR, NOR, XOR, XNOR, and selector operations on 32 bit INT inputs after shift/rotation of the Z input.

The min/max sort and compare circuit 320 is designed to extract minimum or maximum along with index from an input stream, or compare two input streams, swapping the streams to always put the minimum of the pair on one output and the maximum on the other output (a two argument sort). The min/max sort and compare circuit 320 also can produce comparison flags for equality, greater than and less than.

This min/max sort and compare circuit 320 supports SIMD operations so that multiple lanes can be independently sorted or have min or max extracted from a stream.

Input reordering using the input reorder queues 350 allows a history of up to 4 inputs to be re-sequenced and swapped between X and Z inputs (365, 375) in order to de-interleave I (in phase) and Q (quadrature) or odd/even samples, for example and without limitation. Additional logic selects the data source for X, Y, and Z inputs (365, 370 375) and the data sink for X, Y, and Z outputs (420, 415, 410). There is also added logic at key locations in the circuit to optionally adjust the sign bit for the negate and absolute value functions, and logic in the input selector for Y input to support conditional multiply based on sign of X. The input reorder queues 350 may be located between the inputs (365, 370 375, 380) and the other components of the RAE circuit 300 as illustrated in FIG. 5, or may be located between the input multiplexers 105 and the inputs (365, 370 375, 380) (as illustrated in FIG. 5A). The output reorder queues 355 are implemented similarly to the input reorder queues 350, as discussed in greater detail below. The output reorder queues 355 may be located between the output multiplexers 110 and the outputs (405, 410 415, 420) as illustrated in FIG. 5, or may be located between the outputs (405, 410 415, 420) and the other components of the RAE circuit 300 (as illustrated in FIG. 5A). The input reorder queues 350 and the output reorder queues 355 are typically shared between adjacent RAE circuits 300 of a RAE circuit pair 400. While the output reorder queues 355 are illustrated as sharing only X outputs 420 in another representative embodiment, all of the X, Y and Z outputs 420, 415, and 410 may also be shared using output reorder queues 355.

The suffix control circuit 390 is utilized for: (1) programming and control in applications (such as conditions, branching, etc.); and (2) lossless zeros compression and decompression. Some algorithms produce a large number of zero data values. These could be from ReLU operations in neural networks or due to sparse matrix operations, for example and without limitation. Multiplying a number by zero or adding zero to an accumulated value are essentially useless operations. Similarly, sending zero values between computational core 200 processing elements wastes bandwidth and power. As an option, the representative embodiments (computational core 200 and/or RAE circuit 300) may include a suffix control circuit 390 having the capability to compress and decompress data transfer by eliminating zeros in the data path, in addition to handling various flags (such as condition flags) or other conditions, generally utilizing the suffix bits. The suffix control circuit 390 is discussed in greater detail below.

In addition, as discussed in greater detail below, the suffix control circuit 390 may also be implemented in a distributed manner in the computational core 200, such as including zeros compression (using zeros compression circuit 800) as part of outputting data through the output multiplexers 110 and zeros decompression (using zeros decompression circuit 805) as part of inputting data through the input multiplexers 205, for example and without limitation.

FIG. 6 is a high-level block diagram illustrating a plurality of exemplary or representative RAE circuits 300 with dedicated connections 360, 445 of the third interconnection network 295, forming a RAE circuit "quad" 450 and two RAE circuit 300 pairs 400, illustrated as first RAE circuit pair 400A and second RAE circuit pair 400B (which together form the RAE circuit quad 450). Four neighboring RAE circuits 300 (in 2 rows, 2 columns) are linked by dedicated wiring 360, 445 of the third interconnection network 295 to allow them to be merged as a RAE circuit quad 450 to perform double precision multiply-adds, multiply-accumulate and logic operations. The merging also contains the connections to use the four linked RAE circuits 300 as a single precision single cycle complex multiply or FFT butterfly, wires for exponent resolution, and for negation based on sign of a neighboring RAE circuit 300. The RAE circuit pair 400 and RAE circuit quad 450 configurations are accomplished by selection between and among the dedicated wiring 360, 445 of the third interconnection network 295, such as by using one or more multiplexers 383 with selection ("SEL") signals 381 and/or the illustrated AND gates 385 with enable ("EN") signals 389, for example and without limitation.

In a representative embodiment, as an example, the RAE circuit 300 has three data path inputs, three data path outputs, and a control interface 250 used to set the RAE 300 function. There are also dedicated auxiliary data path and control connections 360, 445 of the third interconnection network 295 between the four RAE circuits 300 that make up a RAE circuit quad 450. Each data input and output comprises a 32 bit data word, a single bit data valid (AXI-4 stream tvalid), and a single bit marker to be used to mark first or last sample of a set (initialize accumulator, complete sum or max of a set, etc.). As an option, a ready signal may be output as flow control on input interfaces, and is an input on output interfaces to halt operation.

In a representative embodiment, the X and Z inputs (365, 375) each have a 4-deep reorder queue that can be bypassed, used for a set of constant registers that can be sequenced through up to 4 32 bit constant values, or programmed to re-sequence input data. The X and Z input reorder queues 350 includes a selection mux can also select the opposite input (X and Z each selects between 4 registers from Z and 4 from X or bypass. The input reorder queues 350 permit IQ interleave/deinterleave, FFT and complex multiply reordering for up to 4 samples in representative embodiments. In a representative embodiment, as an option, the Y input 370 does not have a cross connect to another input. Constants are loaded in via the input 370 prior to use. The Y input bypass select can be controlled by the sign of the X input for a conditional multiplicand to select between Y input and a constant value (or up to 4 sequenced constant values). The output at each RAE circuit 300 also has 4 deep output reorder queues 355 that can select and sequence any of 4 delay taps from the Z output of either of the two RAE circuits 300 in a pair. This reorder queue is implemented similarly to the one at the input to each RAE circuit 300, as discussed in greater detail below.

The RAE circuit 300 operates in several modes, such as operating as an ALU and many additional functions, for example and without limitation. These include a number of floating point and integer arithmetic modes, logical manipulation modes (Boolean logic and shift/rotate), conditional operations, and format conversion. Each RAE circuit quad 450 then effectively contains 4 ALUs that can be used independently or can be linked together using dedicated resources. A single ALU has a pipelined fused multiply-accumulate. The basic multiplier is 27×27 multiplier. Some of the partial products have gated inputs and/or summed outputs routed to two weights in the reduction tree to reconfigure multiplier 305 as: (1) 24×24 multiply by zeroing 3 most significant bits of each input; (2) L shaped partial product to complete a 32×32 multiplier when paired (added to) a second multiplier set as a 24×24 multiplier, and the outputs of the two multipliers 305 are summed to achieve a composite 32×32 multiplier constructed from two multipliers; and (3) a "pruned 32×32" where only the partials forming two 16×16 multipliers on the diagonal are present, for doing the SIMD multiplications.

A single RAE circuit 300 can do:

1. one IEEE single or on integer up to 27×27 multiply per cycle (pipelined);
2. two parallel IEEE half precision, BFLOAT16, or INT16 integer multiply per cycle (pipelined);
3. four parallel IEEE quarter or INT8 per cycle (pipelined);
4. sum of two parallel IEEE half, BFLOAT16 or INT16 multiply per cycle (pipelined);
5. sum of four parallel IEEE quarter or INT8 multiply per cycle (pipelined);
6. one quarter-precision or INT8 complex multiply per cycle (pipelined)—two complex inputs one complex out;
7. fused add with any of the above functions;
8. one IEEE double multiply in 4 cycles;
9. accumulation of any of the above;
10. 64, 32, 2×16 or 4×8 bit shift by any number of bits;
11. 64, 32, 2×16 or 4×8 bit rotate by any number of bits;
12. 32 bit bitwise boolean logic; and
13. compare, minimum or maximum in stream, 2 operand sort.

Two adjacent linked RAE circuits 300 together can additionally perform:

1. one INT32 multiply per cycle;
2. one INT64 multiply in a 4 cycle sequence (uses accumulator to add 4 32×32 partials);
3. sum of two IEEE singles or two INT24 multiplies per cycle;
4. sum of four parallel IEEE half, BFLOAT16 or INT16 multiply per cycle (pipelined);
5. sum of eight parallel IEEE quarter or INT8 multiply per cycle (pipelined);
6. one half-precision or INT16 complex multiply per cycle (pipelined)—two complex inputs one complex out, 4 multiplies and two adds;
7. fused add with any of the above functions; and
8. accumulation of any of the above.

The RAE circuit 300 arithmetic internally works at the precision of the multiplier output width or better for all modes to realize "fused multiply-add" or "fused multiply-accumulate" functions. Rounding occurs at the accumulator/adder final stage and shall be in accordance to IEEE-754 (2008) "round to nearest even" rounding mode. The RAE circuit 300 does not generate, nor process floating point exceptions. The compare logic may be used to detect and flag floating point exceptions (Infinities and NAN) in the incoming data, and the flags may be used to handle the exceptions at the cost of additional RAE circuits 300 when these conditions are important. There is no dedicated logic in the RAE circuit 300 for handling the exceptions. Denormals are treated as zero: when a zero exponent is present on an input, that input is interpreted as zero, regardless of the value of the mantissa.

The final add, saturate and round circuit 340 detects integer overflows and replaces the output by the maximum value of the same sign as the output would have been had there been no overflow. Overflow detection requires internal data path to be wide enough to accommodate the overflow without error, and then sensing the overflow in the output stage to replace the output with the saturated value.

A suffix (and/or conditional flag) output 405 is provided with a selector from internal sources set by configuration. The condition sources may include, for example, integer overflow, exponent overflow, exponent underflow non-zero, compare block flag, multiplier product sign, Z-shifter output sign, and accumulator sign. The selected condition flag has the appropriate pipeline delay registers to match the pipeline delay of the associated output. The condition flag output is wired to the other RAE's in the same quad, and to the FC sequencer in the same and sequencers in neighboring quads. A suffix (and/or conditional flag) input 380, which may come from another RAE circuit 300 or another system component, may be provided in addition to the data inputs. The suffix (and/or conditional flag) input 380 can control any of the following, for example, negation or zeroize of the multiplier output, negation or zeroize of Z-input shift logic outputs, compare counter reload/reset, and accumulator initialize.

Referring again to FIG. 6, the RAE circuits 300 can be grouped into RAE circuit pairs 400 which are further grouped into pairs of pairs, referred to as a RAE circuit quad 450. A pair of RAE circuits 300 are designed for use as a 32×32 multiply or a single cycle sum of products (useful also for half-complex multiplier). The RAE circuit quad 450 is designed to combine the four 27×27 multipliers into a 54×54 single cycle multiply to support double precision floating point. The tight coupling includes dedicated wiring 360, 445 to share the pre-accumulator sums of products and exponent information among the four RAE circuits 300. It also includes additional dedicated input wiring (not separately illustrated) to share inputs among the four RAE circuits 300, and for sharing condition flags to support conditional algorithms such as CORDIC and Newton-Rhapson. In addition, in a representative embodiment, adjacent RAE circuits 300 of a RAE circuit pair 400 can also share input reorder queues 350 and output reorder queues 355, allowing sharing, swapping, and substitution of inputs and outputs, respectively, all controlled by selectable configurations.

4. Multiplier 305

The multiplier 305 is formulated specifically to support 1, 2 and 4 lane SIMD operations for signed and unsigned fixed point as well as for floating point in double, single, half and quarter IEEE precisions as well as BFLOAT formats.

These formats require varying size multipliers, and ability to fracture the multiplier 305 to support the SIMD modes as well as combine it for higher order modes. The modes and associated multiplier sizes are summarized in Table 1. Additionally, the multiplier 305 allows for sum of products of the multipliers within a RAE circuit quad 450 to be performed within the multiplier tree, and for the multipliers 305 of the same RAE circuit quad 450 to be combined to create the less frequently used double precision and INT 32 multipliers in order to minimize ALU size for the most commonly used single precision use case.

TABLE 1

Multiplier Modes

| Mode | Multiplier required | Mode | implementation | Operations per Quad |
|---|---|---|---|---|
| IEEE double | 53 × 53 | Sign-mag | 54 × 54 4 RAEs | 1 per clock |
| IEEE single | 24 × 24 | Sign-mag | 27 × 27 | 4 per clock |
| IEEE half | Two 11 × 11 | Sign-mag | Two 16 × 16 | 8 per clock |
| IEEE quarter | Four 4 × 4 | Sign-mag | Four 8 × 8 | 16 per clock |
| BFLOAT16 | two 8 × 8 | Sign-mag | Two 16 × 16 | 8 per clock |

TABLE 1-continued

| Multiplier Modes | | | | |
|---|---|---|---|---|
| Mode | Multiplier required | Mode | implementation | Operations per Quad |
| INT64 | 64 × 64 | Signed/unsigned | 4 cycles using 32 × 32 and accumulator with shift | 2 per 4 clocks |
| INT32 | 32 × 32 | Signed/unsigned | 32 × 32 2 RAEs | 2 per clock |
| INT24 | 24 × 24 | Signed/unsigned | 24 × 24 1 RAE | 4 per clock |
| INT16 | 16 × 16 | Signed/unsigned | Two 18 × 18 | 8 per clock |
| INT8 | 8 × 8 | Signed/unsigned | Four 9 × 9 | 16 per clock |

The multiplier 305 data inputs come from the RAE circuit 300 X and Y inputs 365, 370 via the input reorder queues 350. That input reorder queues 350 include logic that has the capability of asserting constants, a sequence of up to 4 constants, or input data reordered up to 4 samples to the X input of the multiplier block. The Y input sign bit (bit 31) can control the X input to selectively replace the X input with a constant based on the value of the Y sign. The X and Y inputs are 32 bit signals interpreted in a variety of formats depending on mode. For floating point formats, the sign bit is always the leftmost bit in each SIMD lane, with the exponent in the next most significant bits. The hidden bit is the same bit as the least significant bit of the exponent, and is always forced to ‘1’ at the multiplier array input for floating point formats, as denormals are interpreted as zero. The remaining exponent bits and sign are masked and forced to ‘0’ at the multiplier array inputs for each floating point mode. The unsigned integer (uINT) modes pass all bits to the multiplier array except for the INT 24 bit mode, which masks the most significant byte of the input and forces ‘0’ into the 3 most significant bits of the multiplier array.

Signed integers mask the sign bit, forcing those bits to ‘0’ into the multiplier array, and the input sign bit value is passed to the multiplier output logic to apply sign correction. The formats are summarized in Table 2. No more than 27 of the bits from each input connect to the 27×27 multiplier array. The double, INT32, and INT64 modes are special cases that use more than one multiplier. For these cases, the input should be propagated to the involved RAEs. For the signed integer modes in these special cases, the most significant input segments are treated as signed and the others are unsigned in order to get the proper result. For the 64 bit signed int, the multiplication is a sequence of four 32 bit multiplications. The signing of the inputs in this case should be sequenced so that only the most significant half of each input is signed. The exponent and sign bits of both inputs are also connected to the exponent logic, which in turn controls negation.

TABLE 2

| Multiplier Input Formats by Mode | | | | | |
|---|---|---|---|---|---|
| Mode | Sign bits | Exponent | hidden | mantissa | notes |
| IEEE double[1] | H 31<br>L n/a | H: 30:20<br>L: n/a | H: 20<br>L: n/a | H = 19:0,<br>L = 31:27<br>L = 26:0 | 1 |
| IEEE single | 31 | 30:23 | 23 | 22:0 | |

TABLE 2-continued

| Multiplier Input Formats by Mode | | | | | |
|---|---|---|---|---|---|
| Mode | Sign bits | Exponent | hidden | mantissa | notes |
| IEEE half | 31, 15 | 30:26, 14:10 | 26, 10 | 25:16, 9:0 | |
| IEEE quarter | 31, 23, 15, 7 | 30:27, 22:19, 14:11, 6:3 | 27, 19, 10, 3 | 26:24, 18:16, 10:8, 2:0 | |
| BFLOAT16 | 31, 15 | 30:23, 14:7 | 23, 7 | 22:16, 6:0 | |
| uINT64[2] | n/a | n/a | n/a | | 2 |
| uINT32[3] | n/a | n/a | n/a | 31:0 | 3 |
| uINT24 | n/a | n/a | n/a | 23:0 | |
| uINT16 | n/a | n/a | n/a | 31:16, 15:0 | |
| uINT8 | n/a | n/a | n/a | 31:24, 23:16 15:8, 7:0 | |
| INT64 | * | n/a | n/a | * | 2 |
| INT32 | 31 | n/a | n/a | 30:0 | 3 |
| INT24 | 23 | n/a | n/a | 22:0 | |
| INT16 | 31, 15 | n/a | n/a | 30:16, 14:0 | |
| INT8 | 31, 23, 15, 7 | n/a | n/a | 30:24, 22:16, 14:8, 6:0 | |

Notes:
1. Double uses all 4 multipliers of Quad. The upper half of each 64 bit input is applied to one row or one column of the 2 × 2 array of RAE’s in the quad. Internal dedicated Quad wiring distributes the necessary bits to the other RAE in the row/column. Each combination of the 27 bit upper and lower halves of the mantissa are multiplied by one of the multipliers. The upper and lower 27 bits of the mantissa should be distributed accordingly.
2. Int64 uses pair of int32 multipliers and one accumulator to sequentially perform four 32 × 32 partial products in 4 clocks. For signed INT64, the logic should sequence the sign control on the inputs so that the most significant half input is signed and least significant half is unsigned.
3. INT32 uses two multiplies in the same RAE pair. The upper half uses a special mode. Both 32 bit inputs should be distributed to both RAE in the pair.

Each multiplier (X and Y) input has a signed control that individually designates an input as signed or unsigned. For floating point modes, the signed input should be ‘0’ to designate it as unsigned. This input should be capable of being sequenced to support the signed INT64 mode. The signed control applies the same to all SIMD lanes. The multiplier also has a negate input that negates the multiplier output when asserted. This control should be capable of being sequenced.

The configuration input sets the multiplier SIMD mode (which sets the appropriate carry block bits, and sets up the format for sign correction and negation addends), selects input masks. The configuration may also contain the settings for signed or unsigned, negate, absolute value and zero described above (these may be set elsewhere in configuration).

The multiplier product is a 64 bit 2’s complement product expressed as a pair of 64 bit vectors in carry-save form. The sum of those two vectors is the 2’s complement value of the product. The product is separated into four 16 bit lanes, two 32 bit lanes or a single 64 bit lane, depending on the mode. Signed SIMD modes apply the sign corrections separately for each lane and have carry blockers to prevent overflow into adjacent lanes. Each of the two multiplier inputs is accompanied by a data_valid_in bit. Those bits are AND’ed together and delayed to match the pipeline delay of the multiplier to become the data_valid_out from the multiplier.

The multiplier design is a 27×27 unsigned multiplier modified to rearrange product terms in order to realize 27×27 multiplication, a pruned 32×32 multiplier with only the two 16×16 partial products on the diagonal for SIMD use, and an shaped expansion to allow two multipliers summed together to perform a 32×32 multiply. Additionally, the unsigned multiplier has a correction added to the output to support use with signed two’s complement inputs. The output correction logic also converts sign-magnitude products to two's complement and provides a control to negate the multiplier output.

A. RAE Multiplier 305 in its Native 27×27 Mode

Figure 7:
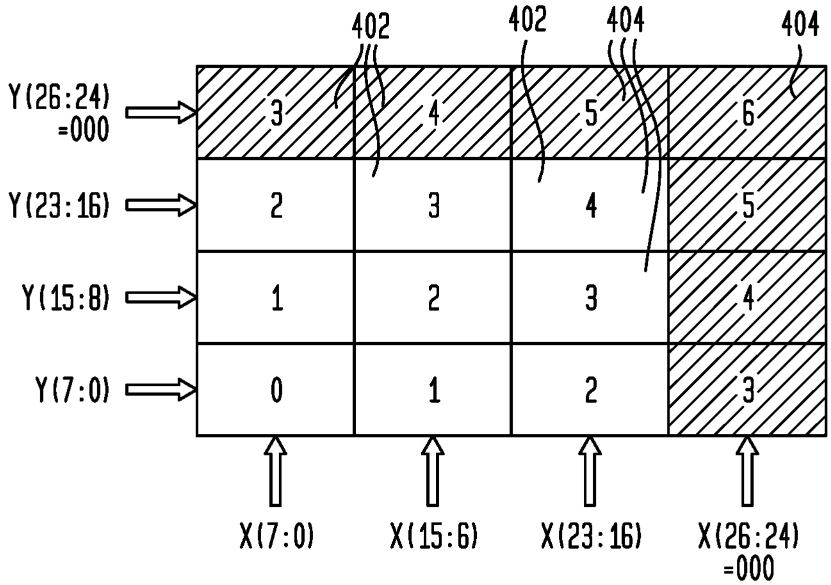

FIG. 7 shows the multiplier 305 in its native 27×27 mode. The blocks 402 represent virtual 8×8 partial products, with the numbers 404 in the blocks 402 representing the number of 8-bit left shifts applied to that partial product when summing the partial products. The shaded blocks on the top and right side of FIG. 0.7 are forced to zero for 24-bit mode. The X inputs along the bottom are broadcast to all cells in the column, and the Y inputs along the left side are broadcast to all cells in the row. It should be noted that this representation is for explanation only. The 24-bit mode is used for single precision floating point and for 24-bit integer mode. The 24-bit mode uses the 27-bit multiplier with the 3 most significant bits of each input forced to zero. Alternatively, the individual bit products corresponding the zeroed input bits may be forced to zero. The floating point format includes a sign bit in bit 31, and mantissa bits in bits 22:0. There is also a hidden bit which is a '1' unless the exponent is all zeros, in which case it is '0'. The input gating to the multiplier assigns input bits 42:0 on the X and Y inputs to bits 32:0 of the multiplier array, and if floating point forces bit 23 of each input to '1', and zero pads the upper 3 bits on each input of the 27×27 multiplier.

B. RAE Multiplier 305 in SIMD Modes

Figure 8:
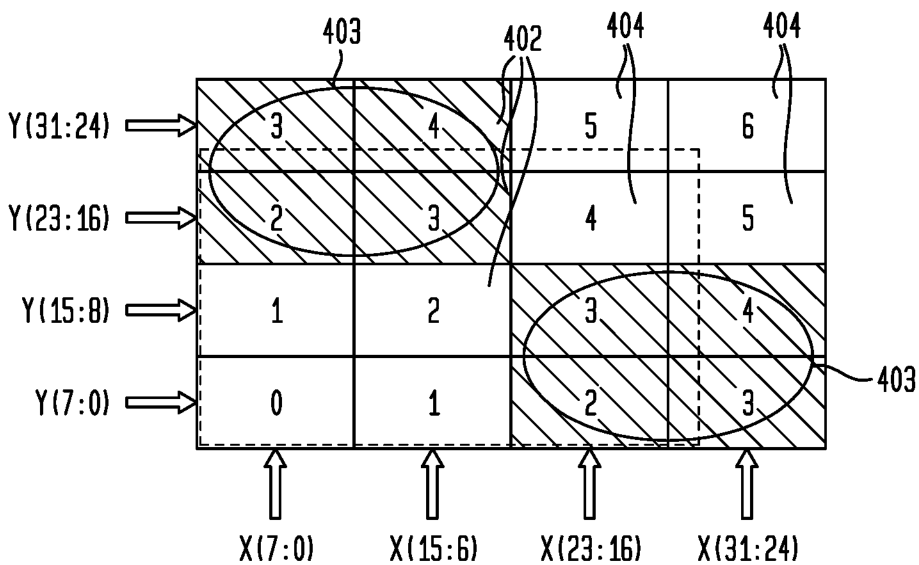

FIG. 8 illustrates using a 32×32 multiplier as two 16×16 SIMD multipliers. The partial products that are not on the diagonal in the partial product array are zeroed out, so that the remaining non-zeroed partial products all use independent subsets of the inputs, and the weighting of the cells in the native array ensure the products do not overlap in the array's output. Thus, one can use an otherwise unmodified unsigned multiplier as a group of arbitrarily sized smaller independent multipliers by zeroing out the partial products 403 off the diagonal as shown in FIG. 8. In the illustrated case, a 32×32 unsigned multiplier is used to perform two 16×16 multiplies. The 16 bit inputs and 32 bit products do not overlap as long as the multiply is unsigned. A similar strategy is used to perform four 8×8 unsigned multiplies with a 32×32 unsigned multiplier. It should be noted that the hardware for the zeroed out partial products need not be present for the SIMD operations. If they are present, they are disabled to prevent the resulting partial products from combining with the desired partial products.

Figure 9:
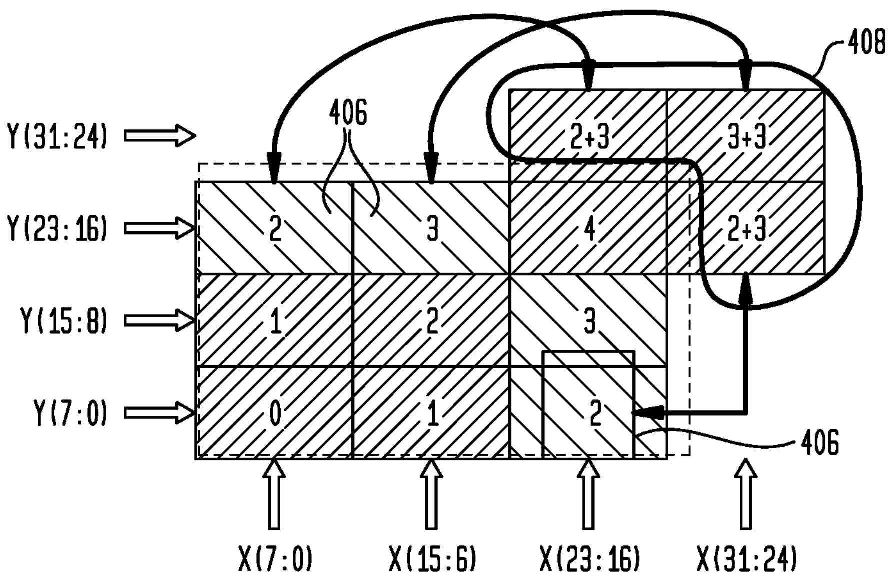

FIG. 9 illustrates modification of 27×27 multiplier for two 16×16 SIMD multipliers. The multiplier 305 is only 27×27 bits, so the upper right partial product shown in FIG. 8 is truncated to 11×11 instead of 16×16 (the dotted line shows the 27×27 multiplier size) using the unmodified 27×27 multiplier). Instead of adding an extension to the multiplier to augment for the upper SIMD product, the existing disabled partial products can be reassigned in order to achieve the pruned 32×32 multiplier suitable for the SIMD modes. The partial products, if judiciously selected, have the same weighting relative to one another in the extension as they had in the original multiplier. This permits the mobile partial products and the carry save tree under the transplanted partial products to be moved as an intact carry-save tree that is added to the main multiplier tree one level of carry-save adders above the output. The selection of the mobile partial products is shown in FIG. 9 by the shaded blocks (blocks 406 for location in 27×27, blocks 408 for SIMD position). Unshaded portions of the 27×27 multiplier inside the dotted line are disabled for SIMD mode. As illustrated, the division of the multiplier into 8×8 segments is for illustration only, with the actual multiplier having a 5×16 bit and a 11×5 bit sum of partial products that gets reassigned with a 24-bit left shift relative to its original location. The inputs to these partial product may also require a selector to reassign the input bits.

Alternatively, the 27×27 multiplier could be constructed with the SIMD extension always in place and just disabled for 27×27 use. This would eliminate the switching in the carry-save tree and reduce the selections at bit product inputs for slightly lower propagation delay, but at an increased gate count to account for the added bit partials and the carry save tree under them. Another option for the multiplier 305 design is to switch 8×8 blocks using the 24×24 multiplier as the base. This moves more 1-bit products, but the added expense in the carry save tree may be offset by the greater switching complexity due to non-zero bits 27:24 on both inputs.

Figure 10:
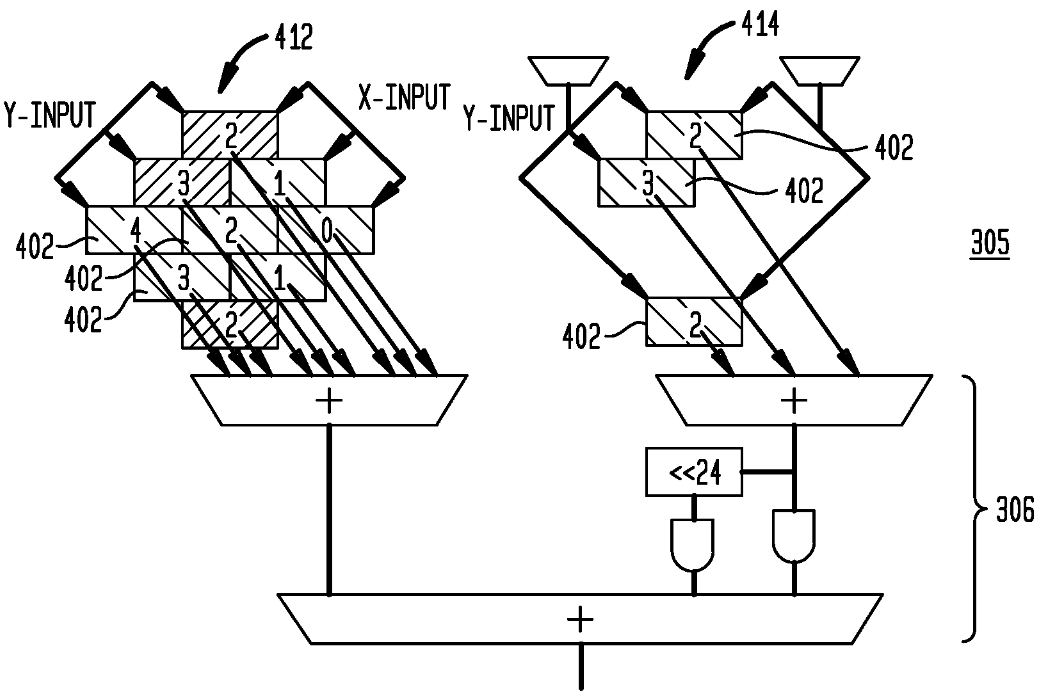

FIG. 10 illustrates the structure of a multiplier 305 with movable partial products. As illustrated in FIG. 10, the blocks 402 with numbers in them represent arrays of one bit partial products produced by the logical AND of one bit from each input. Those one bit products are added into the adder tree 306 with a power of two weight corresponding to the sum of the bit positions of the inputs. The 27×27 multiplier 305 is pruned to remove the one bit partial products that correspond to the mobile partials, as shown on the left side 412 of the illustration. The removed partial products are separately summed on the right side 414, and are added at the last layer of the carry save tree to the pruned 27×27 multiplier carry-save output. For 27×27 use, the added tree 306 retains its original weighting.

For SIMD pruned 32×32 use, the partitioned tree output is added with a wired shift 24 bits to the left of the original position. The inputs to the partitioned tree are selected between two possible bits depending on whether 27×27 or pruned 32×32 mode. The output of the adders shown in FIG. 10 is a pair of vectors whose sum is the product (carry-save format). The use of carry save format postpones the expensive carry propagation until the output from the ALU. FIG. 10 shows the concept for moving the partial products. For clarity, FIG. 10 shows 8×8 blocks of one bit partial products. The actual design has a 27×27 array of partial products, of which a 5×16 and an 11×5 area is removed and summed separately. The multiplier in SIMD mode is unsigned only. A correction is added at the multiplier 305 output for each SIMD lane when signed operation is selected, as described below.

Figure 11:
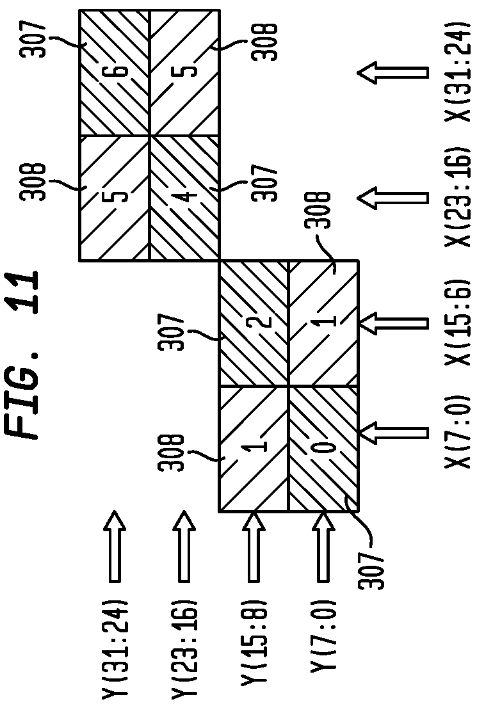

FIG. 11 illustrates using a pruned 32×32 multiplier as four 8×8 SIMD multipliers. The four lanes of 8×8 SIMD mode is a subset of the two lane 16×16 pruned 32×32 multiplier 305. That multiplier mode, describe above, has additional controls to disable four blocks of 8×8 bit-partial products 308 in order to arrive at four 8×8 multipliers 307 arranged on the diagonal of a pruned 32×32, as shown in FIG. 11. As with the 16 bit SIMD, the one bit partial products need to be gated to disable them so that they do not add to the product. The multiplier 305 in SIMD mode is unsigned only. A sign correction is added at the multiplier 305 output for each SIMD lane when signed operation is selected.

C. RAE Multipliers 305 in a 32×32 Mode

Figure 12:
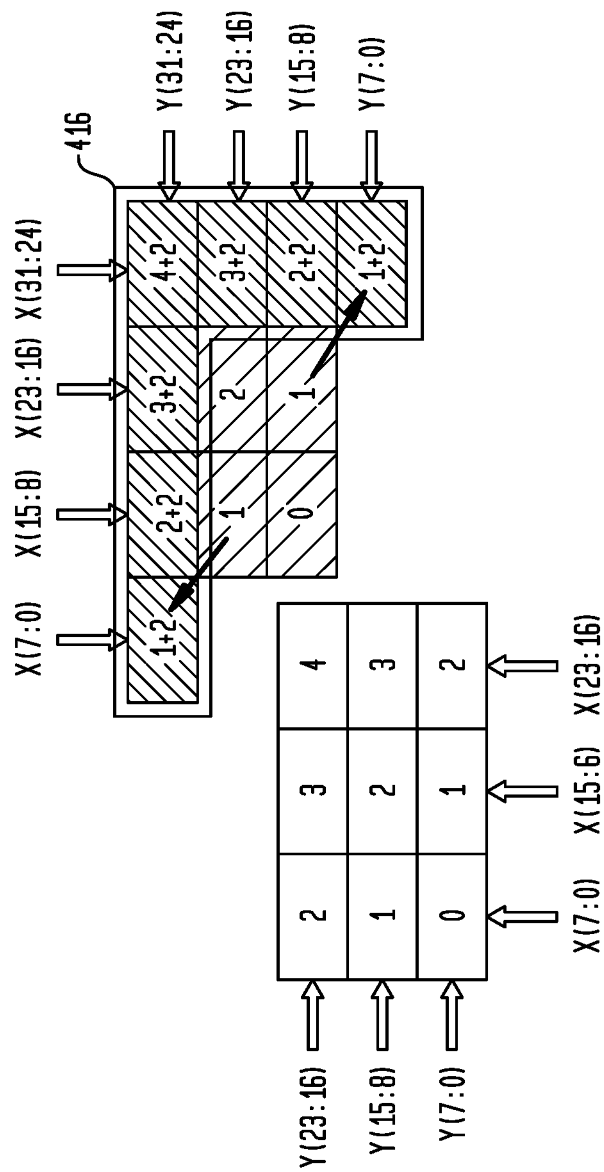

FIG. 12 illustrates a 32×32 multiply formed by a shifted sum of two RAE multipliers 305, one of which is modified. Two adjacent multipliers 305 are coupled to construct a single cycle pipelined 32×32 multiplier for use in INT32 and INT64 modes. The resulting 32×32 multiplier 305 works for both signed and unsigned modes, and is used for integer operations. The multiplier 305 is constructed using two multipliers 305 of a RAE circuit pair 400 configured for 24×24 (upper 3 bits on both forced to zero or partial products disabled). The lower order multiplier is the native 24×24 and accepts the low 24 bits of each of the X input 365 and Y input 370. The second multiplier 305 is modified to form an 'L' shaped partial product to extend the multiplier array by 8 bits at the top and right sides 416 as shown in FIG. 12.

The ends of the L legs are taken from the middle row first left column and bottom row center 8×8 blocks. These both have the same relative weight of 28 relative to the rest of the upper as the weight when they are relocated, so no modification is needed to the adder tree to change the relative weighting of those two 8×8 blocks of partial products. The inputs to those two blocks of 8×8 partial product multipliers no longer match the inputs to the physical column and row, so those inputs should be switched to connect the correct inputs to achieve the virtual shape. The remaining two partial products are unused, and are therefore disabled by zeroing at least one of the inputs to each bit partial product or by otherwise disabling those partial products in order to prevent unwanted addends into the product summation. The upper 'L' shaped partial product is left shifted by 16 bits relative to the lower multiplier's product. This shift is accomplished with a right shift of the lower product in the post-multiply shift/combiner logic where the products from the two RAE are summed. The Z-input 375 of the lower product is aligned properly to sum the Z input 375 with the 32×32 product. It should be noted that both of the 32-bit inputs are distributed to both RAE multipliers 305 in the pair. The dedicated wiring in a RAE circuit quad 450 will take care of providing the wires to interconnect the two RAE inputs and to sum the outputs. The 32×32 is more efficiently rendered by using the first 27×27 as a 24×24 (zero out upper 3 bits of each input) and then shifting 8×8 partials of a second 24×24 to form a 32×32 bit L. This uses the same partial subsets as the no-zeros between lanes partials, and uses a 16 bit shift on the extension to add to the lower 24×24. The 16 bit shift can then be accomplished in the existing mode shifts, eliminating the shift by 16 pair shift input.

D. RAE Multiplier 305 in a 54×54 Mode

Figures 13, 14:
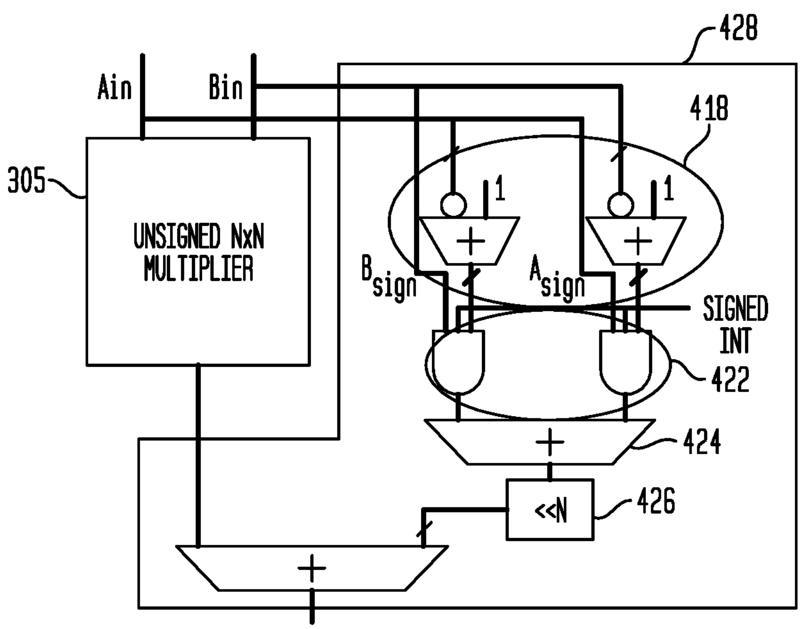

FIG. 13 illustrates a 54×54 multiply formed by the shifted sums of four unmodified RAE multipliers 305. A 53×53 bit unsigned multiplier 305 is required for the IEEE double precision mode. In this case, the four 27×27 multipliers 305 in a RAE circuit quad 450 are simply summed together with appropriate shifting of the sums, and reassignment of inputs. The summation adds the right multipliers with 3×9=27 bit left shift to the left multipliers, then adds that top sum, shifted by another 27 bits to the bottom sum to arrive at the 54×54 product, as shown in FIG. 13. It should be noted that the same Y input bits to the left multipliers should be distributed also the right ones, and that the same X inputs applied to the bottom row of multipliers should also be applied to the top row. The wiring within a RAE circuit quad 450 includes dedicated routing to make this possible.

E. 64-Bit Sequential Multiply and Sign Correction

The shift-combiner design coupled with the 128 bit accumulator permit 4 cycle sequential computation of the 64 bit multiply using two RAE circuits 300 as a 32 bit multiply-accumulate. The inputs and shift combiner's second layer is sequenced to compute the four 32×32 partial products and shift them by the appropriate amounts to sum them for the 128 bit result. The lower*lower partial product is not shifted, the upper*lower and lower*upper partials get left shifted by 32 bits, and the upper*upper partial product is left shifted by 64 bits before adding to the accumulated sum. The shifting is accomplished in the post-multiply shifter-combiner network 310, described below. The output requires a selector and/or shift register to capture, select and output 32 bit or 64 bit segments of the 128 bit product. For signed operation, only the upper half of each 64 bit input is signed, so each input to the multiplier has to be sequenced as signed for upper half and unsigned for lower half. The partial product sequence starts with the product of the lower halves of each input, and ends with the product of the upper halves of each. The signed control is sequenced with the sequence to only treat the upper half of each input as signed.

An additional consideration is the need to handle both signed and unsigned multiplication for all integer modes. It is a simple extension to the control logic to also support sign-magnitude integer representation. The floating point modes all use unsigned multipliers, as the data is represented in sign-magnitude format. For the floating point use cases, signs are just exclusive—OR'ed and passed around the multiplier and the multiplier itself is unsigned. The integer formats support both signed and unsigned integer inputs for each of the integer modes.

An unsigned multiplier does not correctly handle negative 2's complement multiplicands because it does not take into account the weighting of the most significant bit of each multiplicand, which is 2n−1 for unsigned data versus −2n−1 for signed operation. When summing the partial products, negative partial products need to be sign-extended to the width of the product and treated as negative in order to get the correct answer. There are multiplier optimizations such as Booth and Baugh-Wooley that involve some encoding tricks to avoid generating partial product terms for the extended sign in order to realize a signed multiplier.

In representative embodiments, the requirement to support SIMD operations and the design choice of separating the multiplier into partial products for the purpose of reducing hardware to support all the modes significantly complicates or completely breaks these signed multiplier schemes. One method is to perform a two's complement absolute value of each input retaining the sign to convert two's complement signed inputs to sign-magnitude form and feed that to the multipliers 305 without further manipulation, as that would permit using unsigned multiplication. The two's complement conversion is accomplished by inverting all the bits of the input (1's complement), and then adding 1 to it to produce the two's complement. The carry propagation due to the addition of the 1 adds a significant gate delay even for fast carry schemes, and for the fast schemes also incurs a large area penalty.

Representative embodiments use another approach which involves understanding the error that occurs when an unsigned multiplier 305 is used to multiply signed values, and then applying a correction for that error. The error that occurs is analyzed as follows. Consider a multiplication where multiplicand A is negative and B is not:

$$\begin{aligned} A \times_s B &= -((-A) \times_u B) \\ &= 2^{2n} - ((-A) \times_u B) \\ &= 2^{2n} - ((2^n - A) \times_u B) \\ &= 2^{2n} - 2^n \times B + A \times_u B \end{aligned}$$

The $2^n$ and $2^{2n}$ terms are the conversion to 2's complement notation for an n bit and 1n bit word respectively, and they are outside the modulo range for that number of bits, but are necessary to get to the correct bit representation of a 2's complement number. The $2^{2n}$ term in the last line of the analysis is ignored because it is outside the mod $2^{2n}$ result. The product $2^n$. B is the error term in the unsigned product that needs to be subtracted out in order to get the correct signed product, which is simply B shifted into the upper half of the product. Similarly if B is negative, there is a $-2^n$. A term missing from the product. A similar analysis shows that both inputs negative ends up with a correction that is the sum of these same A and B corrections (which also follows from linearity of the multiplication and distributive properties).

The subtraction is performed by adding the two's complement of the correction. Since the correction is additive and the multiplier output is a tree of adders, the correction can be applied at any point in the multiplier's adder tree rather than at the output. The correction logic depends only on the multiplier mode and on the inputs to the multiplier, so the correction value can be computed in a path parallel to the unsigned multiplier partial products, and the finished correction in carry-save format can be added at any convenient point in the adder tree.

FIG. 14 illustrates a signed correction circuit 428 for signed multiplication using an unsigned multiplier 305 and shows the logic to perform the sign correction as discussed. The two's complement is computed for each input by inverting all the input bits and adding 1 (418). The two's complements are each gated (422) by the sign bit of the opposite input and the gated corrections are summed (424), and the added to the upper half-product via a wired shift (426). The gating for the two's complement values in the diagram include a signed int control that disables the generation of the correction (forces zero) when asserted high so that the mode can be switched between signed and unsigned. In practice, the correction computation adders are moved together as an optimized tree and the gating is applied along with the inversion at the input to the correction logic.

For SIMD operations, each lane has its own sign correction circuit that uses only the input fields and signs for that lane, and the correction should not be allowed to propagate a carry into the next lane. This means at least one buffer bit or carry blocking logic is required between each SIMD lane. For this design, we choose to maintain lanes with multiples of 8 bits, so carry-blocking gating is used at the lane boundaries in order to avoid extra switching of the inputs that would be needed for guard bits on each lane. Without guard bits, carry blocking is applied at the stage where the correction is applied and to every subsequent stage. For this reason, this design postpones the correction until the output of the multiplier's carry-save tree.

Figure 15:
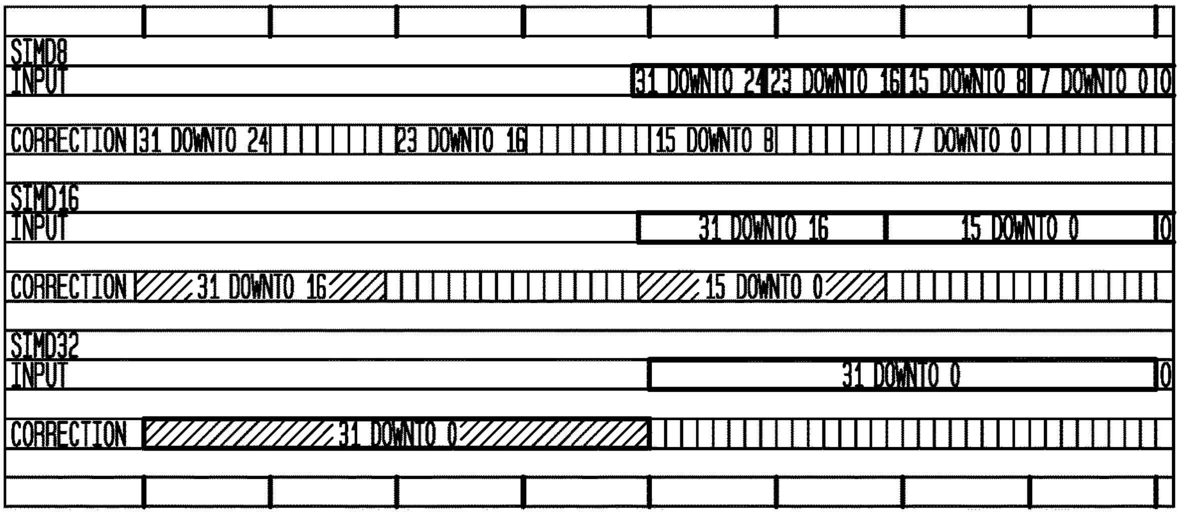

FIG. 15 illustrates the alignment of inputs, sign corrections, and outputs for each signed integer mode, i.e., the alignment of the input and sign correction relative to the output for each of the signed integer modes. Each lane's correction is independently computed from the other lanes. For the 32 bit signed multiplier, the correction is only applied to one of the multipliers (the alignment shown is for the correction applied to the low order multiplier), otherwise, the correction would be applied twice, at two different alignments.

Figure 16:
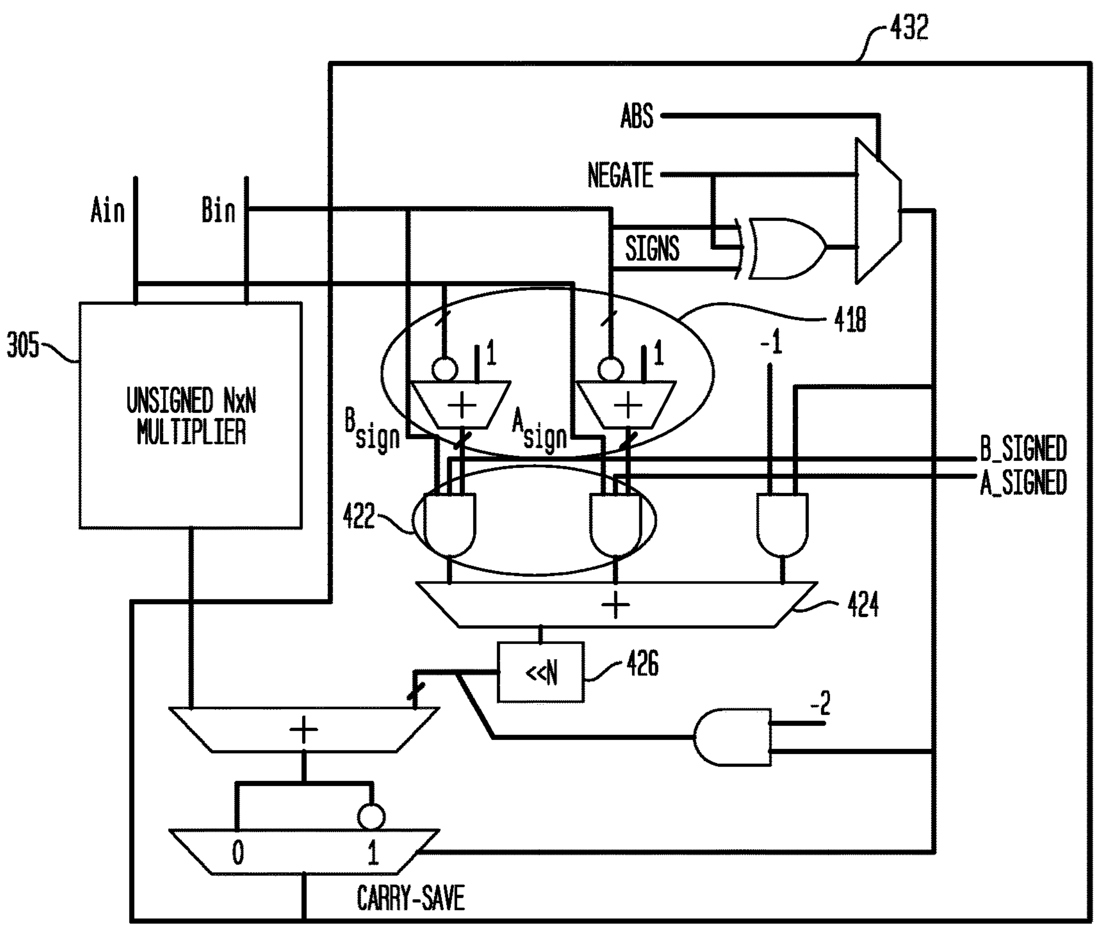

FIG. 16 illustrates a signed correction circuit 432 which can also perform selective negation. When working with floating point multiply-add, the number format generally has to be converted to two's complement form in order to perform the addition. Rather than adding a separate two's complement stage between the multiplier and the adders, we can selectively negate the product as a function of the floating point signs and a negate control by performing a two's complement on the product before the multiplier's output. The two's complement is done by inverting all the bits of the product and then adding 1 (418) or by subtracting one from the product and then inverting all of the bits. The latter suggests that we could augment the sign correction logic discussed above to selectively add negative 1 to the product at in the multiplier tree and then invert the finished product to achieve negation without affecting the propagation or gate count in the tree. In this case however, the multiplier has a carry-save output so that the sum of the two output vectors is the product.

In order to negate the product, both the sum and the carry outputs are negated: $-(C+S)=-C-S=\sim(C-1)+\sim(S-1)$. Thus before the output inversion, the modified product is $C+S-2$, hence we need to add $-2$ to the tree if we are to invert two vectors at the output. FIG. 16 shows the modification to the sign correction logic to include selective negation of the product. For floating point or sign-magnitude, the sign bits should be evaluated along with the negation control to determine if the multiplier output is negated or not. In that case, the output of the multiplier is always two's complement carry-save vectors. The upper half of the product gets the sign correction added to it, and the lower half correction is zero. With negation, the bottom half is $-2$, and the top half is sign extension plus the sign correction if 2's complement signed multiplier, so it is all '1' bits added to the multiplier sign correction. The negation control is expanded to include an absolute value control for the product. This simply forces the negate control to be the exclusive OR of the signs of the inputs when absolute value is selected.

When multipliers 305 are combined for the 36×36 or 54×54 modes, the two's complement is performed on the partial product of each RAE circuit 300, so no adjustment is required for summing the RAE products together other than making sure the negate control is the same for all multipliers involved.

The exponent(s) is (are) part of the 32 bit inputs when floating point operation is selected. For the floating point modes, the inputs to the multiplier 305 array corresponding to the exponent are masked to '0' except for the least significant bit of the exponent, which is forced to '1' as the hidden bit. De-normal inputs are interpreted as zero, and when detected force the data path to zero after the multiplier. The multiplier exponent processing (zero detection, summing and alignment shifting) occurs in the exponent logic 335. The details of the shift-combiner exponent logic 335 are discussed in below. The unmasked values of the exponent bits are passed to the multiplier-shift-combiner's exponent logic 335 unchanged.

The multiplier inputs require some switching to disable some partial products, and to reassign inputs for the 32 bit extension and SIMD expansion modes, and can be performed in the input reorder queues 350 or other switching circuits. The input logic also asserts the hidden bit in floating point modes.

F. Multiplier 305 Modes

There are three basic multiplier configurations: 27×27 multiply, pruned 32×32 for SIMD, and 32 bit extension. Additionally, there are subsets: 24×24 is a subset of 27×27 where the 3 msbs of each input are forced zero, 4 lane SIMD is a subset of 2 lane SIMD with four blocks of 8×8 bit partial products disabled and forced to zero. Floating point modes apply masks to the inputs to zero the bits associated with the sign and exponent. The SIMD configuration requires change weights of some partial products, accomplished by moving part of the adder tree as discussed above. All other configurations are handled strictly by switching inputs to groups of partial products.

The 27×27 multiplier 305 is the native mode for the multiplier 305 array. For this mode each 27 bit input to the multiplier is taken from the 27 least significant bits of the X and Y inputs or in the case of a double precision multiply, the inputs are from the 27 least significant inputs for lower product, and bits 53:27 for the upper product. Bit 53 is forced to 0, bit 52 is forced to '1' for the hidden bit. The switching for the doubles takes place before the multiplier 305.

The 24×24 mode inputs are the same as those for 27×27 except the three most significant bits of both the X and Y inputs are forced to zero making the effective multiplier an unsigned 24×24 multiplier. Table 3 shows the input assignments to each 8×8 subset of the multiplier. Each block represents the inputs to an 8×8 partial product of the lower 24 bits. The most significant 3 input bits to each 27 bit multiplier input are forced to zero in this mode.

TABLE 3

| 24 × 24 Multiplier Inputs | | | |
|---|---|---|---|
| X(7:0)<br>000 | X(15:8)<br>000 | X(23:16)<br>000 | 000<br>000 |
| X(7:0)<br>Y(23:16) | X(15:8)<br>Y(23:16) | X(23:16)<br>Y(23:16) | 000<br>Y(23:16) |
| X(7:0)<br>Y(15:8) | X(15:8)<br>Y(15:8) | X(23:16)<br>Y(15:8) | 000<br>Y(15:8) |
| X(7:0)<br>Y(7:0) | X(15:8)<br>Y(7:0) | X(23:16)<br>Y(7:0) | 000<br>Y(7:0) |

The 32-bit extension is the upper multiplier when two multipliers are combined to realize a 32×32 multiply. The lower multiplier is set to the 24×24 mode described above. The upper multiplier has the inputs to two of the virtual 8×8 partial products switched, and two more are zeroed to turn the multiplier into an L-shaped partial product corresponding to the eight most significant rows and columns of a 32×32 multiplier. The extension uses the most significant 24 bits of the X and Y input as input to the 24×24 array discussed above, but then replaces the partial inputs for the lower 16 bits on both inputs to force the lower diagonal to zero and the other two products to be most significant rows time the least significant 8 bits and vice-versa. Table 4 shows the inputs for each virtual 8×8 partial product that makes up the 24×24 array. The 3 most significant bits of each input to the 27×27 multiplier are forced to 0. The bold legends in Table 4 indicate inputs that are different from the normal 24×24 for this mode.

TABLE 4

| 32 × 32 Multiplier Extension | | | |
|---|---|---|---|
| X(7:0)<br>000 | X(15:8)<br>000 | X(23:16)<br>000 | 000<br>000 |
| X(15:8)<br>Y(31:24) | X(23:16)<br>Y(31:24) | X(31:24)<br>Y(31:24) | 000<br>Y(23:16) |
| X(7:0)<br>Y(31:24) | 0 | X(31:24)<br>Y(23:16) | 000<br>Y(15:8) |
| 0 | X(31:24)<br>Y(7:0) | X(31:24)<br>Y(15:8) | 000<br>Y(7:0) |

The SIMD modes change the weighting of 3 of the 8×8 partial product blocks by a common offset of 24 bits. The inputs for the virtual partial product corresponding to the 16 least significant bits of both input are the same as for the 24×24 multiplier 305, as is the 8×8 partial product corresponding to the 8 most significant bits of both inputs. The three mobile partial products require a reassignment of inputs; those shown with red legends are the same inputs used for the 32×32 extension mode. The legends in bold indicate input assignments unique to the SIMD modes. For the 4×8×8 SIMD mode, the gray shaded cells need to be forced to zero. Either one of the X or Y inputs can be forced to zero for just these partial products in order to zero out these virtual partial products for 8 bit SIMD.

TABLE 5

| Multiplier SIMP Mode Inputs | | | |
|---|---|---|---|
| X(7:0)<br>000 | X(15:8)<br>000 | X(23:16)<br>Y(26:24) | X(26:24)<br>Y(26:24) |
| X(23:16)<br>Y(31:27)&000 /0 | X(31:24)<br>Y(31:27)&000 | X(23:16)<br>Y(23:16) | X(26:24)<br>Y(23:16) |
| X(7:0)/0<br>Y(15:8) | X(15:8)<br>Y(15:8) | X(31:27)&000<br>0 & Y(26:24) | 000<br>Y(15:8) |
| X(7:0)<br>Y(7:0) | X(15:8)<br>Y(7:0)/0 | X(31:27)&000/<br>0<br>Y(23:16) | 000<br>Y(7:0) |

The above modes require at most a 3-input multiplexer for each multiplier input bit. The charts for each mode are combined into summary charts in Tables 6 and 7. Each block in Table 6 represents a virtual 8×8 partial product of a 24×24 multiplier 305. The most significant 3 bits into each of the multiplier inputs are forced to '0' to effectively shut off the most significant rows and columns of partial products except for 27 bit integer and double precision floating point modes. The top line in each partial product cell corresponds to the X and Y inputs for 24×24 mode, the middle line corresponds to 32 bit extension mode, and the bottom line of each cell corresponds to inputs for SIMD modes. The bolded cells are forced to zero for 8 bit SIMD. The /0 indicates which inputs are forced to zero for SIMD 8 mode. The '&0' indicates zero padding on right and '0&' indicates zero padding on left.

TABLE 6

| Multiplier Inputs Summary | | | | | | | |
|---|---|---|---|---|---|---|---|
| X(7:0) | Y(26:24)/0 | X(15:8) | Y(26:24)/0 | X(23:16) | Y(26:24)/0 | X(26:24)/0 | Y(26:24)/0 |
| X(7:0) | 000 | X(15:8) | 000 | X(23:16) | 000 | 000 | 000 |
| X(7:0) | 000 | X(31:24) | 000 | X(23:16) | Y(26:24) | X(26:24) | Y(26:24) |
| **X(7:0)** | **Y(23:16)** | X(15:8) | Y(23:16) | X(23:16) | Y(23:16) | X(26:24)/0 | Y(23:16) |
| **X(15:8)** | **Y(31:24)** | X(23:16) | Y(31:24) | X(31:24) | Y(31:24) | 000 | Y(23:16) |
| **X(23:16)** | **Y(31:27)&0/0** | X(31:24) | Y(31:27)&0 | X(23:16) | Y(23:16) | X(26:24) | Y(23:16) |
| **X(7:0)** | **Y(15:8)** | X(15:8) | Y(15:8) | X(23:16) | Y(15:8) | X(26:24)/0 | Y(15:8) |
| **X(7:0)** | **Y(31:24)** | 0 | | X(31:24) | Y(23:16)0& | 000 | Y(15:8) |
| **X(7:0)** | **Y(15:8)/0** | X(15:8) | Y(15:8) | X(31:27)&0/0 | Y(26:24) | 000 | Y(15:8) |

TABLE 6-continued

| Multiplier Inputs Summary | | | | | | | |
|---|---|---|---|---|---|---|---|
| X(7:0) | Y(7:0) | **X(15:8)** | **Y(7:0)** | **X(23:16)** | **Y(7:0)** | X(26:24)/0 | Y(7:0) |
| 0 | Y(7:0) | **X(31:24)** | **Y(7:0)** | **X(31:24)** | **Y(15:8)** | 000 | Y(7:0) |
| X(7:0) | | **X(15:8)** | **Y(7:0)/0** | **X(31:27)&0/0** | **Y(23:16)** | 000 | Y(7:0) |

TABLE 7

| Multiplier Inputs Summary with only 8 × 8 Cells | | | | | | | |
|---|---|---|---|---|---|---|---|
| X(7:0) | Y(26:24)/0 | X(15:8) | Y(26:24)/0 | X(23:16) | Y(26:24)/0 | X(26:24)/0 | Y(26:24)/0 |
| X(7:0) | 000 | X(15:8) | 000 | X(23:16) | 000 | 000 | 000 |
| X(7:0) | 000 | X(31:24) | 000 | X(23:16) | 000 | 000 | 000 |
| X(7:0) | Y(23:16) | X(15:8) | Y(23:16) | X(23:16) | Y(23:16) | X(26:24)/0 | Y(23:16) |
| X(15:8) | Y(31:24) | X(23:16) | Y(31:24) | X(31:24) | Y(31:24) | 000 | Y(23:16) |
| X(23:16) | Y(31:24)/0 | X(31:24) | Y(31:24) | X(23:16) | Y(23:16) | 000 | Y(23:16) |
| X(7:0) | Y(15:8) | X(15:8) | Y(15:8) | X(23:16) | Y(15:8) | X(26:24)/0 | Y(15:8) |
| X(7:0) | Y(31:24) | 0 | | X(31:24) | Y(23:16) | 000 | Y(15:8) |
| X(7:0)/0 | Y(15:8) | X(15:8) | Y(15:8) | X(31:24) | 0 | 000 | Y(15:8) |
| X(7:0) | Y(7:0) | X(15:8) | Y(7:0) | X(23:16) | Y(7:0) | X(26:24)/0 | Y(7:0) |
| 0 | | X(31:24) | Y(7:0) | X(31:24) | Y(15:8) | 000 | Y(7:0) |
| X(7:0) | Y(7:0) | X(15:8) | Y(7:0)/0 | X(31:24) | Y(23:16)/0 | 000 | Y(7:0) |

The floating point inputs un-hide the IEEE hidden bit. Since denormals are interpreted as zero by the ALU, the hidden bit can be always asserted when the corresponding floating point mode is selected. The data is forced to zero downstream when a zero exponent on either input is encountered. The hidden bits appropriate to the floating point should be asserted '1' on both the multiplier's X and Y inputs when the corresponding mode is selected. Otherwise the inputs are according to the multiplier configuration indicated above. The hidden bits are tabulated in Table 8. The hidden bit is forced 1 when the indicated mode is selected, otherwise the input tracks the inputs tabulated in the inputs summary above.

TABLE 8

| Floating Point hidden Bit Locations by Mode | |
|---|---|
| mode | Hidden bit(s) |
| double | 52 |
| single | 23 |
| half | 26, 10 |
| quarter | 27, 19, 11, 3 |
| bfloat | 23, 7 |

The conditional multiplicand operation is handled in the input reorder logic of the input reorder queues 350, which replaces the X input with a constant as a function of the Y input sign. The conditional multiplicand does not support SIMD operation.

G. Multiplier 305 Carry Save Adder Tree

Figure 17:
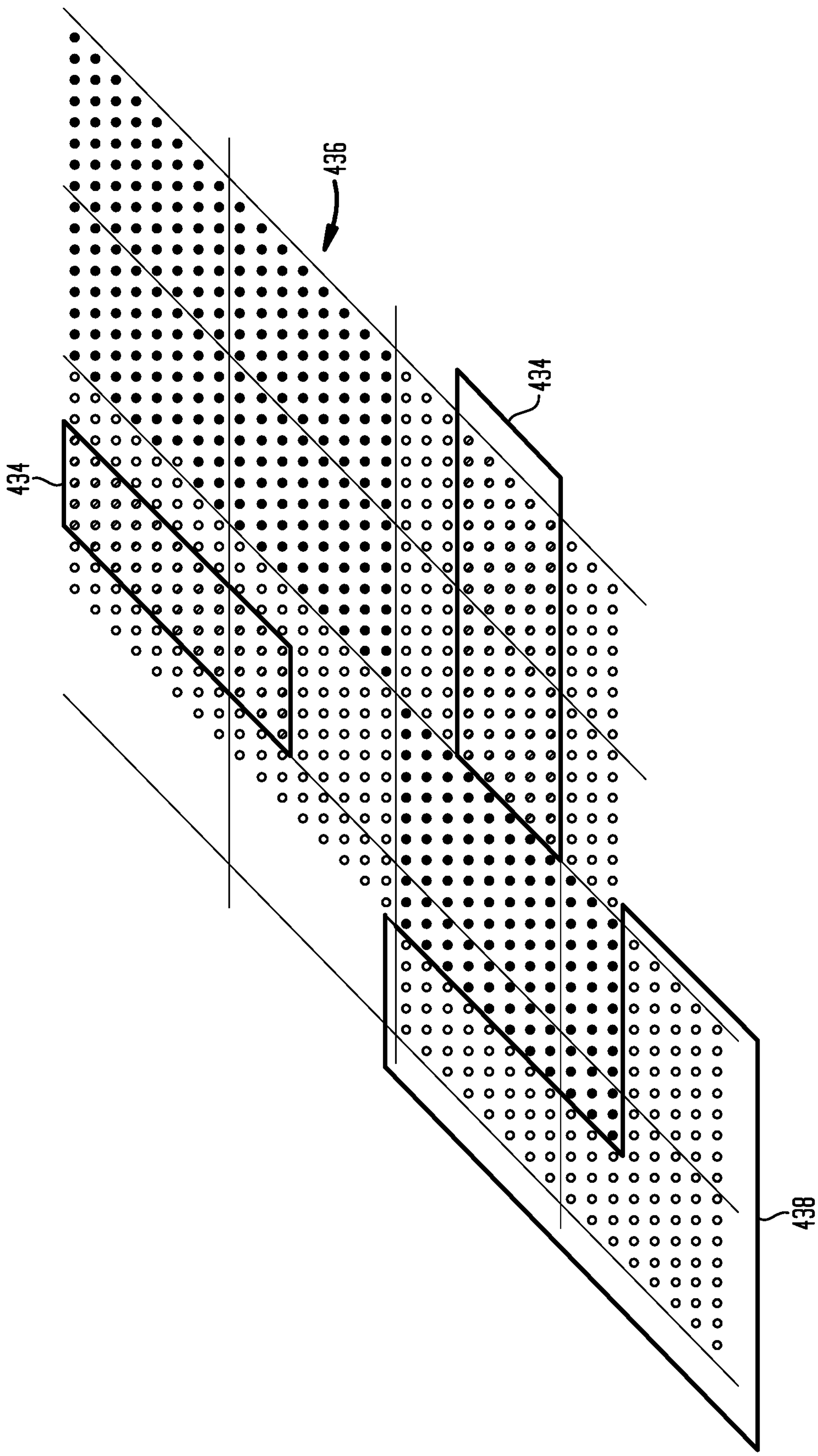

FIG. 17 is a dot diagram for 27×27 multiplier with pruned 32 bit SIMD extension. Multiplication is done in a manner similar to the long-hand multiplication taught in grade school, except it is done using binary radix rather than decimal radix. Long-hand multiplication is actually two distinct operations: generation of the partial products and accumulation of those partial products. A partial product is generated for each pairing of the individual digits of the multiplicand and multiplier. The resulting partial products are weighted by the sum of the weights of the digits used for that partial product. Since the weights of the digits in the multiplicands are powers of the number system radix, the weighting is accomplished through positional shifts. These shifts are represented by inserting the appropriate number of zeros to the right of the partial product. The shift, p, for each partial product is equal to the sum of the positional shifts, m and n, of the multiplicand and multiplier. In a binary multiplier the 1 bit partial product is the same as a logical AND (only the 1*1 combination is not a multiply by zero). For an N bit by N bit multiplier, there are N2 one bit partial products, each the result of a unique pairing of bits from the multiplicand and multiplier. FIG. 17 depicts a 27×27 multiplier augmented to accommodate the pair of 16×16 SIMD multipliers discussed above. Each dot in this diagram represents one 1×1 partial product. The dots are arranged so that dots with the same product weight are aligned vertically in columns. This layout is reminiscent of the partial products in long-hand multiplication where each line is one digit of the multiplier times each digit in turn of the multiplicand (there are no carries to the next digit in this case since each product is only 0 or 1).

A property of integer addition is the adds can take place in any convenient order. A simple multiplier construction could just add the rows with the illustrated shifts and come up with the correct answer. That approach however is not optimal for speed or area as it involves a carry propagation across each row as the previous sum is added. Instead, we sum the columns, postponing the row carry until the final add. Groups of bits with the same weight are summed together using full and half adders (and in most libraries there are technology dependent higher order tally adders, typically called compressors that can improve performance and reduce area).

The full adders reduce 3 input bits with the same weight to a sum and carry output. The carry output has a weight one greater than the sum output. The advantage of column adding is the carry propagates towards the output instead of across the rows, however the product can only be reduced to a pair of vectors (one pertaining to the sums one to the carries, hence the name carry-save). The sum of those vectors is the multiplier product. In this design, the product is left in carry-save form until after the accumulator in order to maintain performance and minimize area.

There are several algorithms for generating optimal trees. One of the trees known for minimal propagation delay and gate count is the Dadda tree. Traditionally, the Dadda tree is comprised of only full adders and half adders, however it can be modified to use higher order compressors if the technology library contains such compressors that reduce area and/or improve propagation delay compared to using discrete full and half adders. In most cases there is advantage to using higher order compressors. For the sake of discussion and illustration, this specification uses traditional Dadda tree construction. The circuit designer is free to use higher order compressors and alter the tree structure in order to reduce the footprint for the flexible multiplier.

The dot diagram of FIG. 17 is enhanced somewhat to illustrate the design of the partial product weight shifting between 27×27 and SIMD modes. The larger rhombus 436 on the right is the 27×27 multiply. It is extended on the left and bottom (most significant bits) to accommodate the pruned 32×32 SIMD multiplication previously discussed. That extension 438 indicates those partials are borrowed from elsewhere. The borrowed dots 434 are for SIMD. These occupy two regions, one is 5 rows high with 16 bits per row near the bottom center of the illustration, the other is 11 rows with 5 bits per row near the top left of the array. These two moved together vertically produce the same shape as the extension dots 438. The black filled dots represent partial products that are common to both the SIMD and 27×27 mode, and the unfilled dots are ones that are disabled (forced to zero) for SIMD mode.

Figure 18:
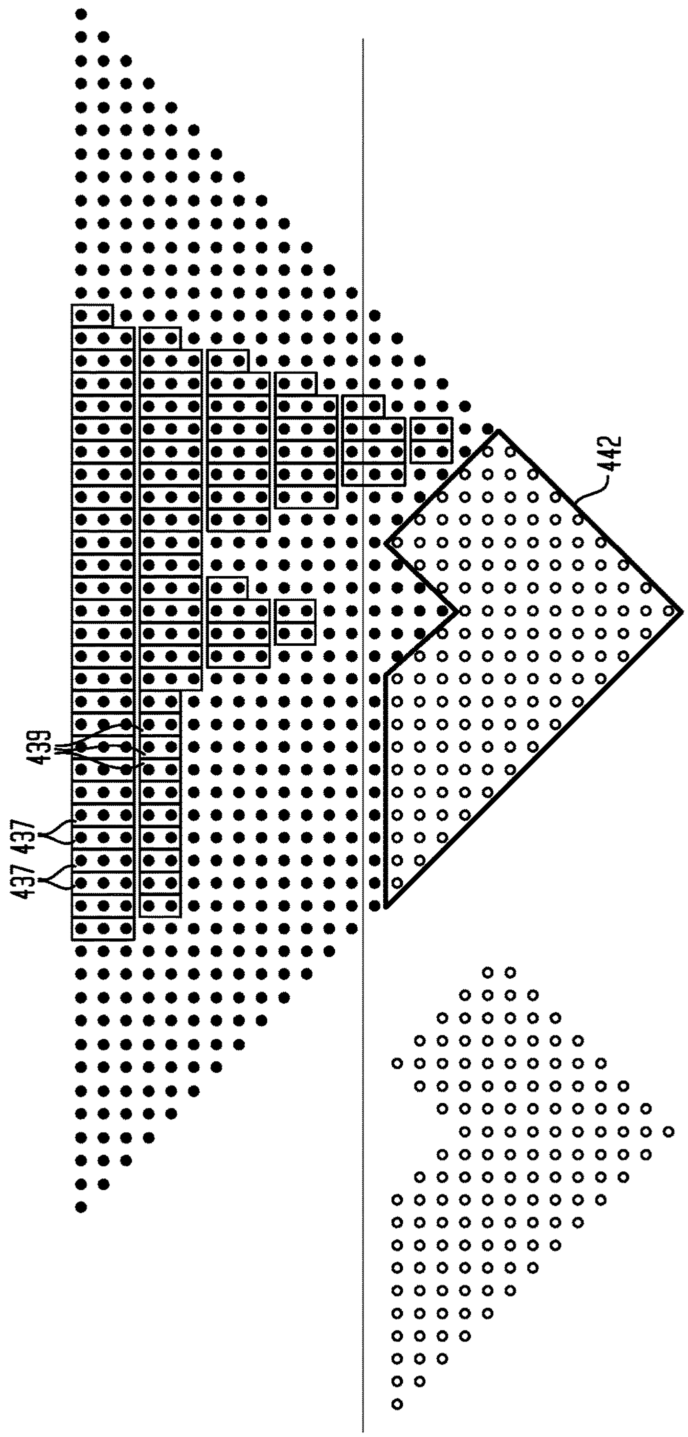

FIG. 18 is a rearranged dot diagram with first layer Dadda adders. In FIG. 18, the dot diagram of FIG. 17 is rearranged by top justifying the columns of the 27×27 multiplier. The dots representing the borrowed partial products (442) are moved to the bottom of the corresponding columns, and the dots corresponding to the SIMD extension, shown with blue fill are separated from the rest of the array vertically, but still in the correct columns for the weighting. The layout of the extension is left in a layout the same as the partial products (442) borrowed region here to emphasize the similarity of the borrowed and extended regions. For the Dadda Tree reduction, the partial products (442) dots are treated as not there so that the mobile partial products are combined in a separate tree. The Dadda algorithm minimizes the layers by seeking to reduce the number of rows to a specific number of rows per iteration or layer. The sequence of row targets for 3:2 adders is 19, 13, 9, 6, 4, 3, 2. At each iteration, full and half adders are placed in columns to reduce the number of entries in the column. Each adder has one output in the column the adder is in, and one output that goes to the column to its left in the next level. When counting the number of rows, there is a row for each adder in the previous column, a row for each adder in the current column and a row for each uncovered dot in the current column. The dots in FIG. 18 represent the inputs to the Dadda layer, with the boxes 437 covering 3 dots are full adders, and those boxes 439 covering 2 dots are half adders. The adders represent the adders in this layer. Uncovered dots just fall through to the next layer. It should be noted that the extension tree is already no more than 10 dots per column so this first iteration simply passes the entire extension through unchanged (i.e., the extension begins on a later layer).

Figure 19:
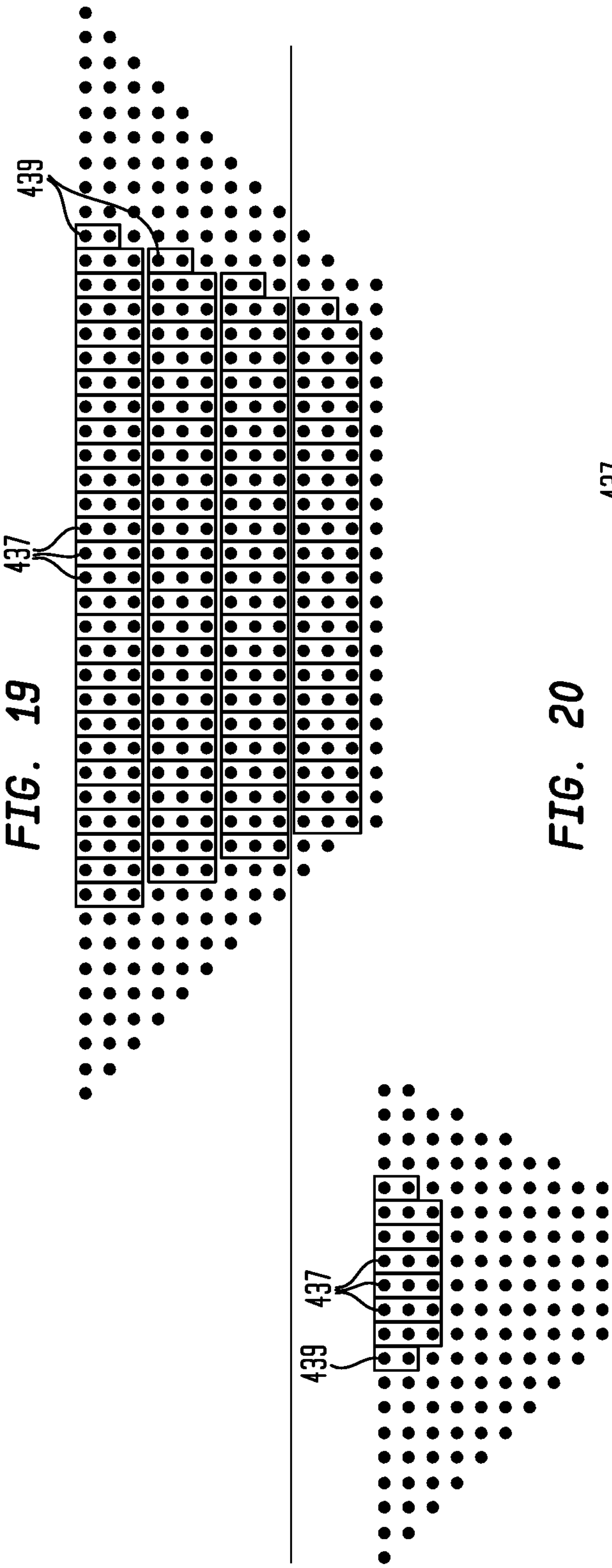

FIG. 19 is a dot diagram of a second layer Dadda tree for a flexible multiplier 305. The next layer has in each column a dot for each uncovered dot in the previous layer, a dot for each carry in from the column to the right (a carry in for each adder in the column to the right of the previous layer), and a dot for the sum output of each adder in that column in the previous layer. FIG. 19 shows the rows reduced by the first layer to have a maximum of 13 dots per column. The extension array is the same as the previous layer except the columns have been top-justified for clarity in the reduction process. This iteration reduces the output to 9 rows.

Figure 20:
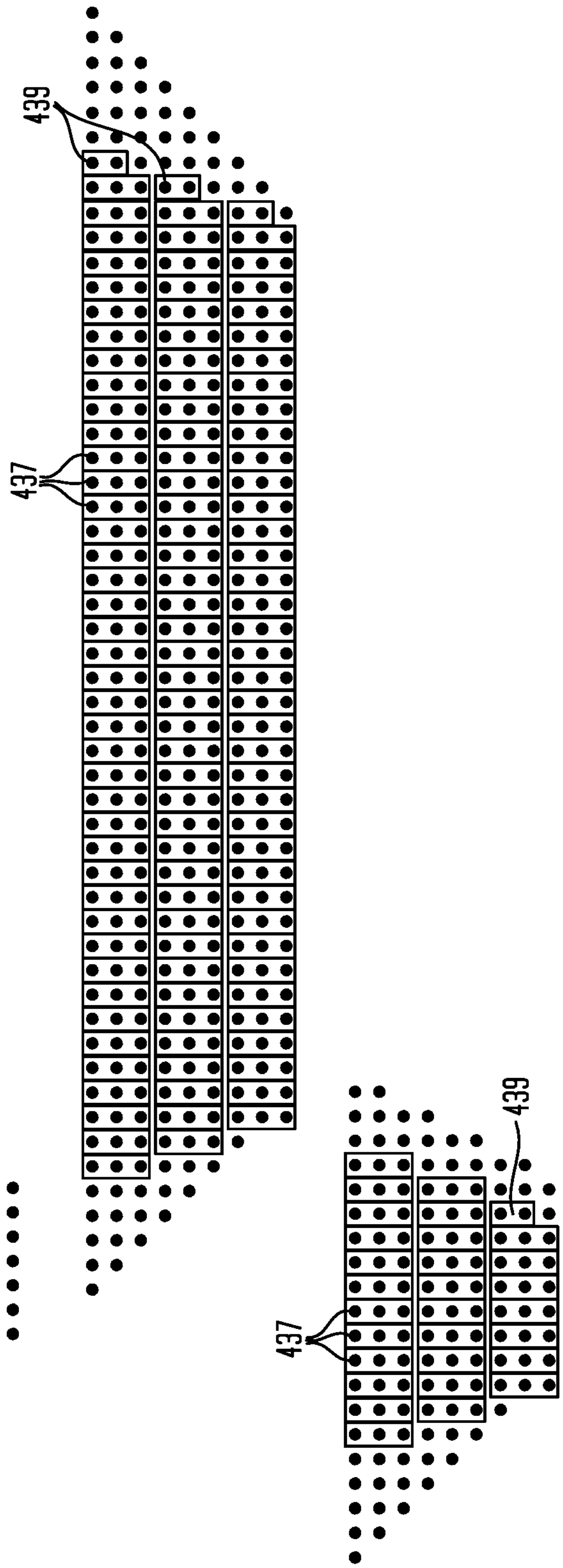

FIG. 20 is a dot diagram of a third layer Dadda tree for flexible multiplier. The next layer of the tree shows the rows reduced to 9 rows, and the target for this layer is 6 rows. This third layer is shown in FIG. 20.

Figure 21:
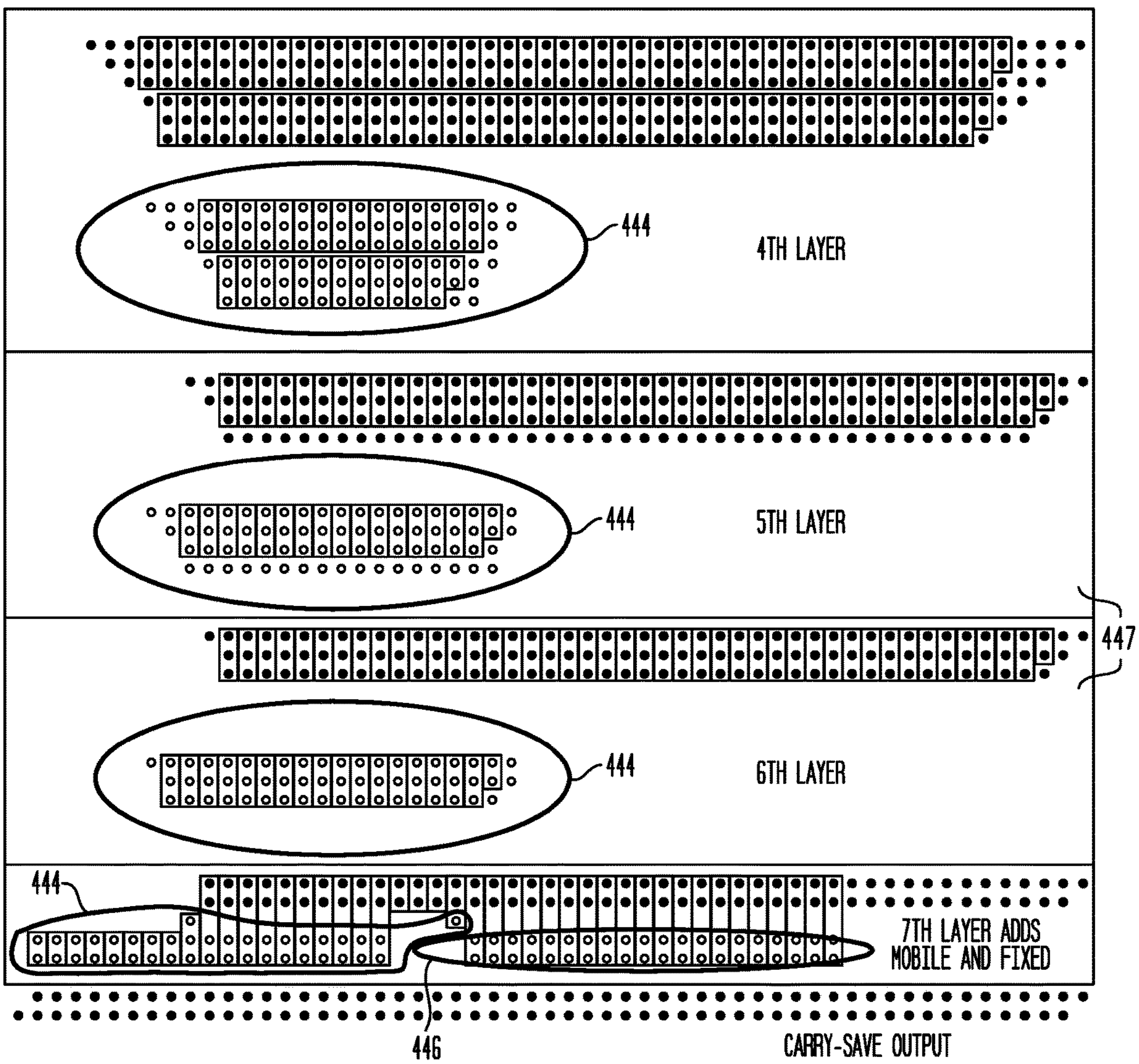

FIG. 21 is a dot diagram of remaining layers of a Dadda tree for the flexible multiplier 305. FIG. 21 shows the remaining layers to get to two rows at each output. The two rows 447 are the output from the 27×27 multiplier 305 without the mobile partial products, the dots 444 are the output of the tree for the mobile products, shown in the alignment for the SIMD extension, and the dots 446 indicate the alignment of the mobile products for 27×27 multiplication. One additional layer of 4:2 compressors is used to combine the stationary tree with the mobile tree. The mobile tree is wired to both locations via gating to select which connection is made. The adder for the mobile product only requires 4:2 compressors in the columns occupied by the two images of the extension tree, plus a full adder in the column immediately to the left of the left most columns of each group 4:2 compressors and half adders in the columns to the left of those, shown by areas shaded in gray on the outputs. The reason for the full adder to the left is the 4:2 compressors have an additional carry out and carry in. The added green dot is for the carry out from the 4:2 compressor chains. The adder tree does not show the additional layer of adder (a 4:2 adder) and XOR for selectable inversion to add the combined sign correction and negation vector. The RAE circuit 300 has the freedom to substitute another tree structure algorithm and to use higher order compressors in the actual design. The traditional Dadda tree results in a 7 layer tree including the adder to combine the mobile and stationary tree parts. The mobile tree is only 6 layers deep including the output adder, so the input selection and output steering gates needed to move the mobile partial product (which are in the path of the mobile tree) do not contribute to the longest propagation path which is through the 7 layer stationary tree.

A plain 27×27 multiplier using traditional Dadda is also 7 layers, so there is no performance penalty for the mobile tree. Depending on the vendor library, the Dadda tree can be improved by using higher order compressors. For example, the fifth and sixth layers of the tree in FIG. 21 can be easily replaced with one layer using 4:2 compressors. The 4:2 compressors have 5 inputs, 4 equally weighted inputs, a carry in from another on the same level, a carry out to another on the same level and a sum and carry output to the next level.

Figure 22:
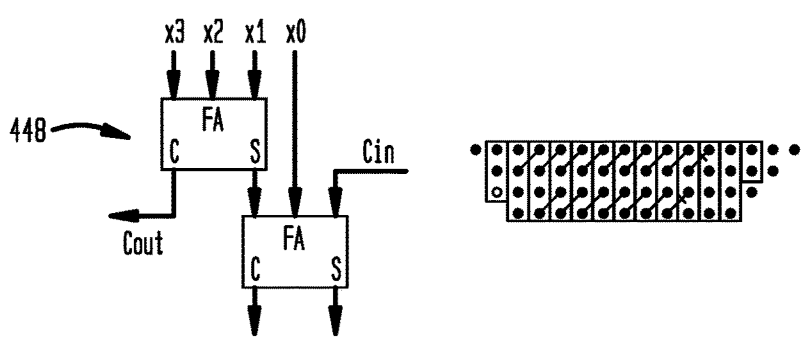

FIG. 22 illustrates an equivalent circuit 448 to 4:2 compressor and segment of layer 5 showing use of 4:2 compressors to perform layer 5 and layer 6 (447) in one stage. The combination of the carry out and carry is a jog to the next column then propagates to the next layer with similar delay to the other inputs. FIG. 22 shows the equivalent circuit for a 4:2 compressor using full adders 448 (abbreviated "FA" in the various Figures). While that does not appear to have any advantage over two layers of full adders, there circuit level implementations of a 4:2 compressor that are both faster than and smaller than cascaded full adders in most libraries.

The multiplier 305 may also be constructed from a pruned 32×32 comprising the 27×27 multiplier extended with the 16×16 SIMD extension as a fixed rather than movable extension. The mobile extension constitutes approximately 14% of the carry-save adder array, so appears to be a preferable implementation. However, layout concerns may make the fixed pruned 32×32 take up less silicon area after considering added input and tree switching involved, even though the gate count is higher. The circuit designer is allowed leeway in selecting the multiplier construction for minimum area. Additionally, product term optimization such as booth encoding has not been considered in this specification, however such optimizations are permissible provided the overall function is maintained and the optimization results in a smaller physical footprint.

5. Multiplier Shifter-Combiner Network 310

Figure 23:
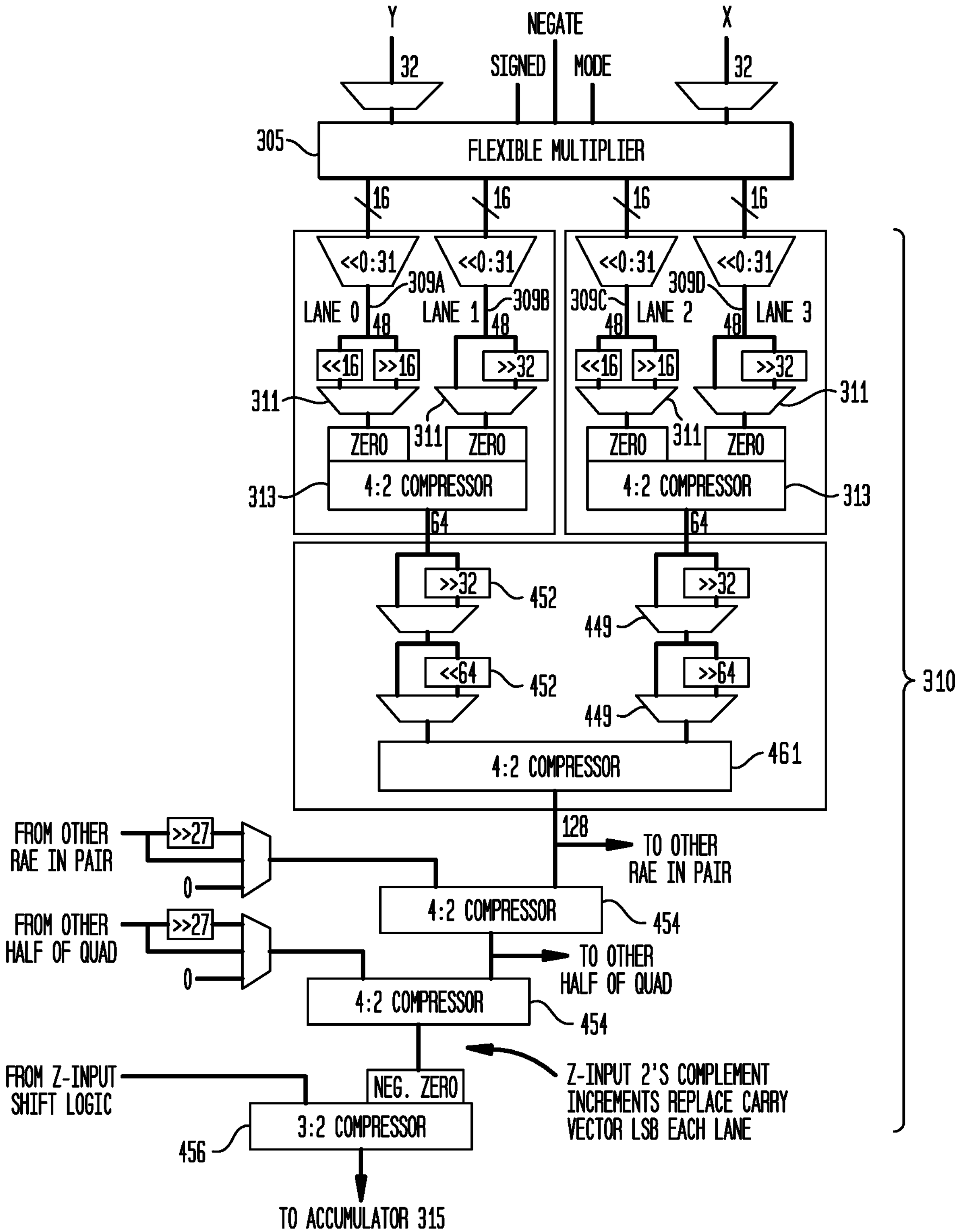

FIG. 23 is a logic and block diagram of a post-multiply multiplier shifter-combiner network 310 (carry-save format throughout). The multiplier 305 is followed by a multiplier shifter-combiner network 310 that is designed primarily to left-shift the mantissa by up to 32 bits in order to convert to a system with a radix 32 exponent. Using a radix 32 exponent simplifies the dynamic alignment shifting inside the critical accumulator loop. This multiplier shifter-combiner network 310 also serves to spread out the SIMD lanes 309 (illustrated as four SIMD lanes 309A, 309B, 309C, 309D) when in one of the SIMD modes to allow room for accumulation and alignment shifting. The multiplier shifter-combiner network 310 also includes the capability to separately align SIMD lanes and sum them for a single clock sum of the SIMD products within a RAE circuit 300 and also sum the sums of products from the four RAEs 300 in a RAE circuit quad 450.

The multiplier shifter-combiner network 310 also provides for right shifting the 32-bit aligned products by multiples of 32 bits to facilitate summation with the additive Z input for a fused multiply-add as well as align products with product sums from other RAEs 300 in the same RAE circuit quad 450 for the larger sums of products. The structure of the post-multiply tree is depicted FIG. 23. As illustrated, the multiplier shifter-combiner network 310 comprises a plurality of multiplexers, shifters, and compressors (illustrated and discussed in greater detail below, along with additional multiplier shifter-combiner network 310 embodiments 310A, 310B).

In summary, the multiplier shifter-combiner network 310 performs the following functions:

1. Converts floating point products to radix-32 exponent (left shift by value of 5 lsbs of exponent);
2. Forces multiplier product(s) to zero when either multiplicand is a de-normal or excess right shift;
3. Additional right shift by 0, 32, 64 or 96 bits to complete floating point alignment to other addends;
4. SIMD lane expansion to 128 bits (4 32-bit lanes, 2 64 bit or 1 128 bit) lanes 309 to match accumulator 315;
5. Sign extend 2's complement products to width of lane;
6. Sum SIMD lanes for SIMD dot product mode;
7. Add sums of products from other RAEs in for dot product mode;
8. Combine RAE circuit 300 partial products for single cycle 32×32 and double precision multiplies; and
9. Ability to place 64 bit product in upper, middle or lower positions of 128 bit to support INT64 multiply.

For floating point products, the multiplier shifter-combiner network 310 converts the data to a radix-32 exponent format by left shifting the mantissa a number of bits equal to the five least significant bits of the exponent. Once that is done the five least significant exponent bits can be discarded and only the remaining exponent bits are used downstream.

The multiplier shifter-combiner network 310 takes care of summing products and Z-input addends before the accumulator. When operating in dot product modes products from all SIMD lanes, and sums from other RAEs 300 in the same RAE circuit quad 450 are also added to the sum. For floating point operations, the summing requires all addends to have the same alignment, which means all should have identical exponents. The exponent logic 335 determines the maximum radix-32 exponent out of all the addends and then right-shifts each addend by the multiple of 32 bits indicated by the difference between that exponent and the maximum exponent. The exponent logic 335 also takes care of determining the excess right shift needed to align the product and Z-input to each other and to products from adjoining RAE units when they contribute to a sum of products.

The quarter precision and half precision exponents are 4 and 5 bits respectively, so the radix-32 exponent pre-shift completely aligns the mantissa for those cases; no further alignment shifts are necessary to sum products before the accumulator 315. In these cases, the mantissa to the accumulator 315 is treated as an integer and the accumulator is operated in integer mode. The final adder/round/saturate logic can leave that as an integer or convert back to a floating point format.

The Z-input 375 is combined with the sum of products last in order to support functions that require simultaneous sums or differences of a common sum of products and an independent Z input. The FFT butterfly is an example of this, using Z±(A*cos+B*sin). A negation and zero control is added between the sum of products and the Z input adder to permit this and to also allow the use of the Z-input 375 with the accumulator 315 when the product is used to feed a sum of products in an adjacent RAE 300. The modes that have more than 5 exponent bits (double and single precision IEEE and BFLOAT16) require additional shifting to equalize the exponents. When the additional shifting is required, each of the addends with smaller exponents are right shifted (and rounded to nearest even according to IEEE standard). The right shift distance is computed using the excess exponent (the exponent left over after conversion to radix 32 exponent) as the number of 32 bit right shifts. If the number of right shifts is greater than 3, the addend is zeroed. Additionally, there is a mode-dependent fixed bias required to align the output radix point to the correct position for the output format. These three shift amounts (conversion left shift, alignment right shift and bias shift) are summed to determine the net shift for each addend, and that net shift is recoded to the shifter controls. The net shift determination for each addend is computed and converted to shift controls in the exponent logic block 335. There are up to 8 addends for single precision (4 RAE, each with a Z input and a product), or 12 addends for BFLOAT16 where there are two products and one integer addend per RAE 300).

Figure 24:
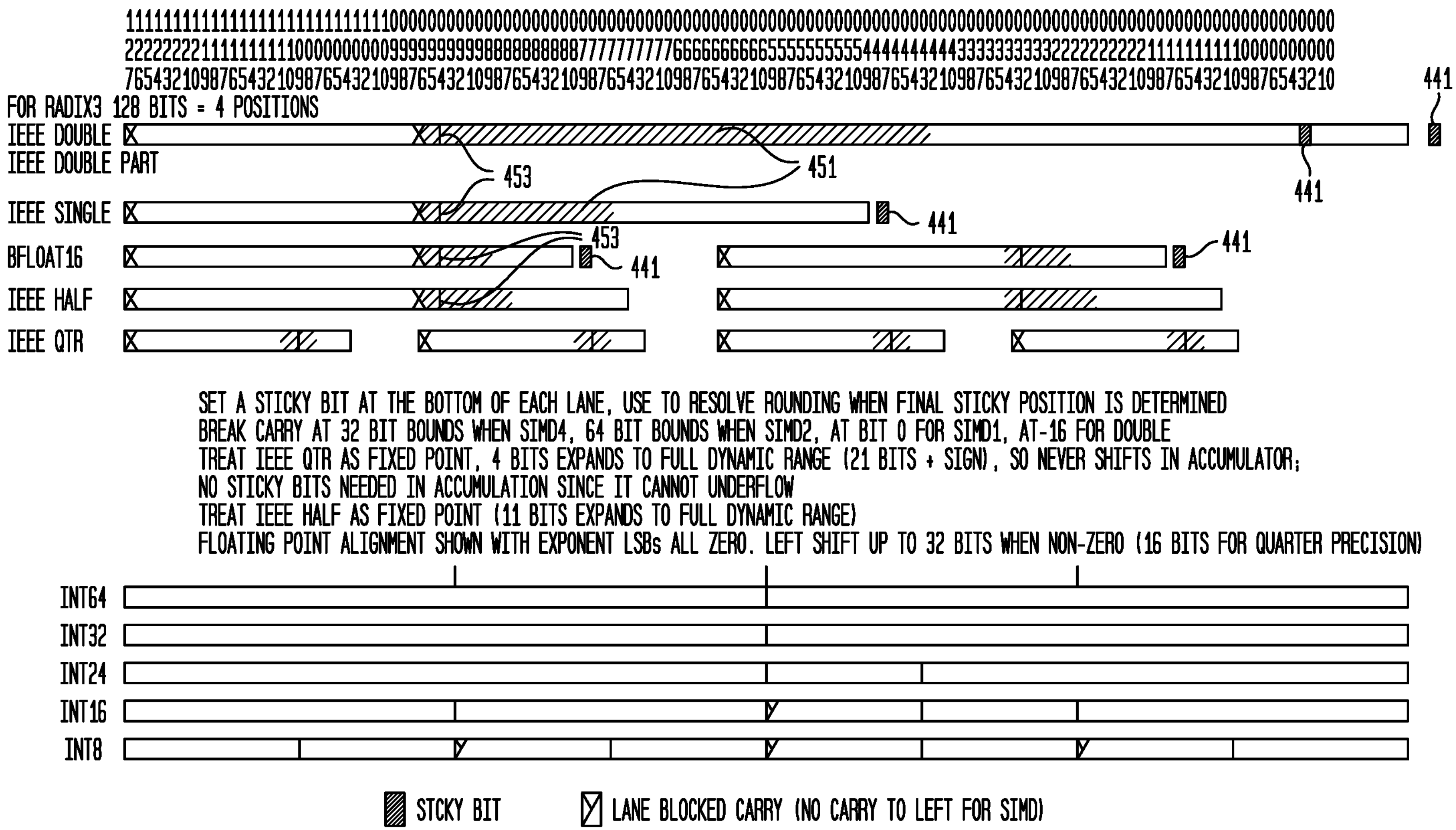

FIG. 24 shows the alignment of the multiplier products for each mode to the 128 bits of the accumulator 315. The multiplier product width is indicated by the shaded cells, with cells 451 corresponding to the multiplier input width. The cells 441 indicate location of sticky bits in un-fused accumulator. For this design the accumulator and adders have sticky bits below the 128-bit width. The lines 453 between cells indicate location of the radix point for floating point when aligned to 32 bit bounds. The cells labelled "X" indicate sign for floating point. The cells labelled "Y" in the integer section indicate locations of carry blockers.

The dot product sums within a RAE circuit 300 as an ALU accumulate to a larger SIMD lane, and are aligned to 32 bit bounds by the shift network. For half and quarter precision floating point, there at most 5 bits exponent, so the shift to 32-bit bound represents the full representable range, thus no further shifting or processing of the exponent is necessary for those modes. Bfloat16 has an 8 bit exponent, and therefore requires additional shifting to align products for the sum of products in dot product mode. The exponent logic selects one of the BFLOAT16 dot product modes (the number pair in the name indicates the additional right shift of the upper and lower lanes respectively) based on the difference between that lane's upper 3 exponent bits and the maximum exponent upper 3 bits in the RAE circuit 300, RAE circuit pair 400 or RAE circuit quad 450 depending on mode.

These additional BFLOAT16 modes shift one or both lanes right by 0 or 32 bits, or if larger differential zeros the lane. The maximum exponent (3 msbs) in each RAE circuit 300 should be shared with the other RAEs 300 in the RAE circuit quad 450 in order to resolve the shifts. The resolution happens in parallel with the multiplies in order to be in time to shift the products. The single precision dot product requires similar inter-RAE 300 exponent processing to determine if 32-bit shifts are required to align before summing. For this reason, provisions for single>>32, single>>64 and single>>96 have been added to the function table for the combiner/shifter network. As with the BFLOAT dot products, the single precision dot product also requires resolution of upper exponent bits between RAE ALUs in order to pre-determine the additional shift.

In order to match IEEE standard rounding, the shift-combiner will also need to incorporate rounding, guard and sticky bits for the single and bfloat dot modes in addition to the 128 accumulator bit width (these get passed into the accumulator's rounding bits too). The other dot modes treat the fully expanded floating point as integers, so there are never any bits shifting off the right side of the adder tree except in the double, single, and bfloat dot modes.

The floating point modes that retain floating point (double, single and bfloat) in the accumulator need to be shifted down 3 or 4 bits in each lane to allow for growth in the pre-accumulate. The accumulator 315 is adjusted accordingly to maintain proper 3-bit alignment. Also, pre-adds are set lsb in lane as sticky bit for floats when shifting pushes any '1' bits off right end.

Table 9 describes the flexible Multiplier 305 output configurations, together with the multiplier shifter-combiner network 310. The multiplier shifter-combiner network 310 logic receives its primary input data from the pruned 32 bit/27 bit flexible multiplier 305. The input is 64 bits in carry-save format (two 64 bit vectors whose sum is the multiplier product). The data is segregated into four 16 bit lanes 309 which are combined as needed to create two 32 bit lanes or one 64 bit lane. Each combined lane is negated or sign-extended for negative products using the multiplicand signs and the negate control to determine the output sign. The content of the multiplier output depends on the multiplier mode as tabulated in Table 9.

TABLE 9

Flexible Multiplier Output Configurations

| Mode | Description |
|---|---|
| 27 × 27 | Multiplier output is 54 bits in bits 53:0<br>Two's complement output is sign extended to 64 bit width. Double precision combines four 27 × 27 multipliers by right shifting the 27 partial lower partial<br>product by 54 bits and the middle partial products by 27 bits each before summing the four 27 × 27 partial products to create a 54 × 54 product. Products<br>are in carry-save form, thus two 54 bit vectors. |
| 24 × 24 | Same as 27 × 27 except input bits 26:24 for both inputs are zero<br>output is in bits 47:0 (two 48 bit vectors in carry-save form)<br>Signed operation sign extends to 64 bit output width |
| Two 16 × 16 | Multiplier is arranged as two 16x16 multipliers.<br>Lower multiplier input is X and Y bits 15:0, output on bits 31:0<br>Upper multiplier input is X and Y bits 31:15, output on bits 63:32<br>Floating point formats zero upper N bits of each input, so upper 2*N bits of product are also zero.<br>Signed operation sign extends to width of each sub-multiplier width. |
| Four 8 × 8 | Multiplier is arranged as four 8 × 8 multipliers.<br>Lane 0 input is X and Y bits 7:0, output on bits 15:0<br>Lane 1 input is X and Y bits 15:8, output on bits 31:16<br>Lane 2 input is X and Y bits 23:16, output on bits 47:32<br>Lane 3 input is X and Y bits 31:24, output on bits 63:48<br>Floating point formats zero upper N bits of each input, so upper 2*N bits of product are also zero.<br>Signed operation sign extends to width of each sub-multiplier width. |
| 32 bit extension | Multiplier is arranged as a pruned 32 × 32 multiply with the 24 × 24 partial product associated with X(23:0) * Y(23:0) removed.<br>When left shifted by 16 bits and summed with a 24 × 24 unsigned multiplier the combination makes a 32 × 32 multiplier |

The configuration contains SIMD controls which in turn set the carry blocking for each lane as appropriate. The static shift/zero controls for the inputs from other RAE s are also contained within the controls input. The following static configuration controls are included or decoded: (a) 1 bit sign-extend control, one for each of 4 lanes; (b) 2 bit multiplier SIMD size select control for first layer 4:2 compressor; (c) 2 bit accumulator SIMD size select control for remaining layers of compressors; (d) 2 bit shift/zero select for other RAE 300 in pair input; (e) 2 bit shift/zero select for input from other half of quad; and (f) 2 bit negate/zero control for sum of products at input to Z-input adder. The negate and zero controls are dynamically controllable using the suffix (and/or conditional flag) input 380 logic.

The shift controls for each shift selector are set by the exponent logic 335 block which uses exponent values and configuration to compute the appropriate shift settings for each shift selector selection shown in the block diagram in FIG. 23. The zero-ize control for each lane also comes from the exponent logic 335 that uses the exponent value and configuration to determine if and when lanes are zeroed (zeroed for de-normal or zero multiplicand or right shift beyond the 128 bit accumulator). The following shift controls are included here:

1. 5 bit 0:31 bit left shift control, one set for each of 4 lanes 309. Lane is left shifted by the number of bits specified in the 5 bit unsigned binary control
2. 1 bit 0/32 bit right shift control, one for each of 4 lanes. ‘1’ causes shift, ‘0’ passes data unmodified.
3. 1 bit zero-ize control, one for each of 4 lanes. ‘1’ forces lane to zero, ‘0’ passes data unmodified.
4. 1 bit 0/32 bit right shift control, one for each of 2 double lanes. ‘1’ causes shift, ‘0’ passes data unmodified.
5. 1 bit 0/64 right shift control for most significant 32 bit lane. ‘1’ causes shift, ‘0’ passes data unmodified.
6. 1 bit 0/64 left shift control for least significant 32 bit lane. ‘1’ causes shift, ‘0’ passes data unmodified.

The Z-axis addend from the Z-input shifter 330 block’s arithmetic output is a 128 bit sum vector and a 4 bit carry vector comprised of the 2’s complement increments for each of four 32 bit lane of the Z input. The carry vector bits replace the carry inputs to the LSBs of each active lane that are blocked from the previous bit position from the 4:2 compressor stage 454 on the products data path preceding the 3:2 compressor 456 that adds the Z input. When lanes are joined, that carry vector LSB comes from the carry out of the next lower lane. The Z-input 375 is disabled by turning off the arithmetic output in the Z-input shifter 330 block, which forces the output to be zero.

The input from the other RAE 300 in the linked pair of RAEs 300, and the output to that same RAE 300 are both 128 bit wide signals in carry-save format (two 128 bit vectors). The input has a selector that selects between un-shifted and right shifted by 27 bits data. That selector also has a selection to zero the input when a link from the other RAE 300 is not desired. The input shift mux is controlled by the decoded configuration word. The sum from the Z-input adder is the output to the other RAE in the pair. That signal from the Z-input adder is also summed with the input from the other RAE 300. These connections are always single lane since dot product mode pre-combines SIMD lanes into one value before the output to other RAEs 300.

The input from the other half of the RAE circuit quad 450, and the output to the other half are also 128 bit wide signals in carry-save format (two 128 bit vectors). The input has a shift mux that selects between un-shifted and right shifted by 27 bits data. That mux also has a selection to zero the input when a link from the other half of the quad is not desired. The input shift mux is controlled by the decoded configuration word. The sum from the RAE circuit 300 pair adder is the output to the other RAE 300 in the pair. That signal from the RAE pair adder is also summed with the input from the other half of the quad to form the accumulator output. These connections are always single lane since dot product mode pre-combines SIMD lanes into one value before the output to other RAEs 300.

The output to the accumulator 315 is also a 128 bit output in carry-save form (two 128 bit vectors). The output is segregated into two 64 bit lanes or four 32 bit lanes for SIMD operation. The one or two lane accumulator outputs may be floating point values, so there are accompanying accumulator exponent outputs for two lanes from the exponent logic 335. The upper lane exponent also serves as the exponent for single lane, including double precision, so it is a 6 bit radix 32 exponent. The lower lane, used only for BFLOAT16 SIMD mode has a 3 bit radix 32 exponent. The accumulator 315 output also has a data valid output to the accumulator that is a delayed copy of the AND of the multiplicand data valids and the Z-input addend data valid. The data valids of disabled inputs are ignored unless no inputs are valid.

The post multiply shift-combiner circuit operation and dynamic control inputs are controlled by a configuration word sourced in part by the exponent logic block 335. The configuration sets up lane carry blockers and the static shift/zero selects for inputs from other RAEs 300. The dynamic controls set shift distance for each lane and for the shifters in the lane combination and alignment process. The 64 bit input from the multiplier is expanded to 128 bits, and for floating point modes, a shift offset is also introduced to properly align the floating point values(s) in the 128 bit word and an exponent shift left shifts the mantissa further convert to a radix 32 exponent.

For SIMD modes, each lane is doubled in width from the multiplier output. The shifting of each input lane varies depending on mode, and that shift distance is the base to which the exponent radix shift is added. The lane expansion to get the proper lanes and exponent=zero alignment is illustrated in Table 10.

The output from the multiplier has 16 bits spacing between each 16 bit lane going into the shifters. When lanes are combined for wider lanes, the lanes are shifted to close the gaps. In the case of the SIMD dot products, all of the lanes are shifted to the position of the least significant lane of the output and summed. For the dot 4, each lane is sign extended before the summing. For dot 2, each input lane is also sign extended to 32 bits before summing.

TABLE 10

Shift-Combiner Input to Output Alignment by Mode

| Output | Input | outputs | | | | | | |
|---|---|---|---|---|---|---|---|---|
| bit rng | align | 4 lane | 2 lane | single | Int32 | double | Dot4 | Dot 2 |
| 127:112 | | | | | | | | |
| 111:96 | 63:48 | 63:48 | | | | 63:48 | | |
| 95:80 | | | 63:48 | 47:32 | | 47:32 | | |
| 79:64 | 47:32 | 47:32 | 47:32 | 31:16 | | 31:16 | | * * |
| 63:48 | | | | 15:0 | 63:48 | 15:0 | | |
| 47:32 | 31:16 | 31:16 | | | 47:32 | | | |
| 31:16 | | | 31:16 | | 31:16 | | | |
| 15:0 | 15:0 | 15:0 | 15:0 | | 15:0 | | * * * * | * * |

The lane shifts are computed by summing the lane exponent 4 or 5 lsbs with a mode-dependent shift bias. The low five bits of that sum directly control the initial 0:31 shift. The upper bits of the biased exponent are added to the excess shift distance from the excess shift logic for lanes 1 and 3 and then that sum is recoded to the shift controls for the multiplexers in the combiner stages. FIG. 25 tabulates the shift distance for each lane and for each second level shifter by mode. Some of the modes in FIG. 25 have additional refinements to the mode. The floating point dot 4 sums can be mapped to quarter precision or half precision alignment in the left most output lane for that size, which requires different shift biases. The BFLOAT dot modes take into account the excess alignment shift needed to equalize the radix-32 exponents. The two numbers indicate the relative right shift of the upper and lower lane as determined by the exponent logic.

The amount of shift varies on each 32 bit lane depending on the exponents. Similarly the single and double have different shift settings for the four possible 32 bit shift distances that result in non-zero right shifted data when adding to the Z input or other RAE's. Those too require a modulation of the shift settings controlled by the exponent difference from the maximum exponent, and therefore have separate line entries in the table. The INT64 has three shift settings to support the four cycle the shift-add accumulation of the partial products. The 64×64 multiply sequencer should sequence through those shift settings in concert with the multiplier sequencing.

The block diagram in FIG. 23 shows the architecture of the multiplier shifter-combiner network 310. The circuit has separately controlled shifters for each lane 309 to do the lane shift indicated in the shifter. Lanes 0 (309A) and 2 (309C) have a left shift range of −16 to 47 bits into a 64 bit bus. Lanes 1 (309C) and 3 (309D) have a −32 to 31 bit left shift range. Each lane shifter comprises a series of six 2:1 muxes (316 in FIG. 26) arranged so that each either passes data un-shifted or shifts left by the power of 2 that is one greater than the previous stage. The last stage has a bias built in so that the even lane last stage shifts 16 bits either right or left, and the odd lane last stage shifts right by 32 bits or does not shift. The output of the last stage is gated to force the lane output to zero when the zero control is asserted. The first stage is 16 bits wide, which is the sixteen bits from the multiplier lane, plus the most significant bit and gated off for unsigned and duplicated twice.

The subsequent stages are wider by the amount of bit shift, with the input most significant bit duplicated to fill the output width (that input bit is the gated extended sign from the input). The widths of the stages are 18, 20, 24, 32, 48, and 64 bits respectively. The outputs of those lane shift networks feed into a pair of 64 bit 2:1 compressors (muxes 311), one for the two low order lanes and the other for the two high order lanes. When used for SIMD dot modes, the shift distances of the two lanes are set so that the lanes overlap and get summed in the 4:2 compressor 313 (data is all in carry-save form throughout the shift-combiner). In that case, the signs are extended to the 64 bit width. For other modes, the shifted data including appropriate sign extension does not overlap, so the sum is the same as if OR gates were used to combine the two lanes. The 1st compressor stage does not need bits to handle overflow, as the bus width gets extended to twice the maximum sum for dot modes.

Figure 26:
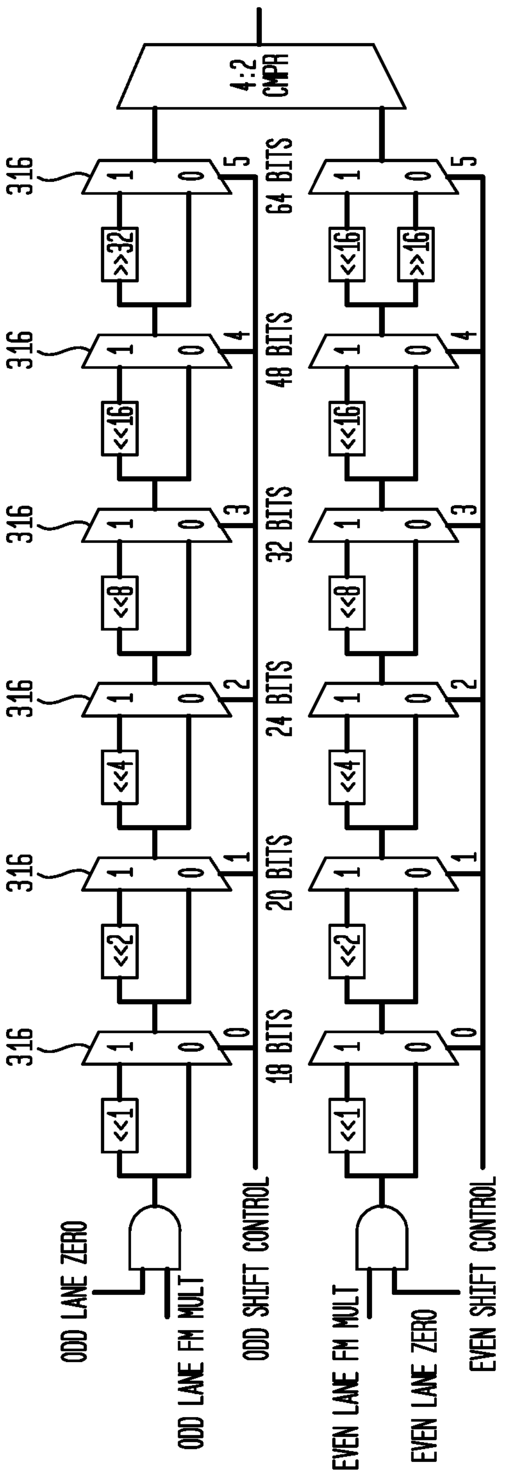
Figure 27:
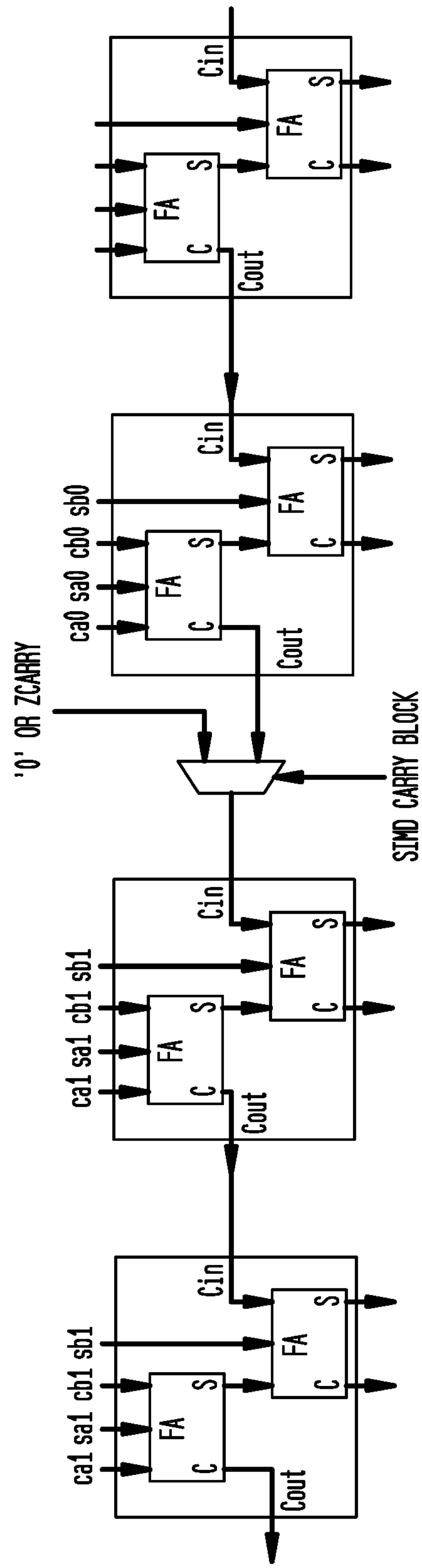

FIG. 26 is a block diagram illustrating lane shift and first compressor circuit detail. FIG. 27 is a block diagram illustrating added logic to a 4:2 compressor for lane carry blocking. A second layer of shifters 452 also controlled by the exponent logic, shifts the two combined lanes separately by multiples of 32 bits. The low order lane's shift range is −32 to 64 bits left shift. The high order lane's shift range is −96 to 0 bits left shift. Those shifts are done using two cascaded 2:1 muxes 449 as shown in FIG. 24. The data path width is sign extended to 96 bits with a gated duplicate of the sign bit for both the upper and lower lane at the input to the first shifter, which either passes the data unchanged or left shifts it by 32 bits on both lanes. The lanes are controlled independently. The input is expanded to 128 bits at the input to the second level shifter; the lower lane is sign extended to 128 bits, the upper lane is zero extended on the right to 128 bits. This compressor also does not need overflow bits because the dot combination doubles the lane width. The output of the shifted lanes is summed using a 128 bit 4:2 compressor 461. That compressor 461 output then has the shifted Z=input, then the sum from the other RAE 300 in the RAE circuit pair 400, then the sum of the other half of the RAE circuit quad 450 added to it in turn by a series of 4:2 compressors 454. The Z input uses a 3:2 compressor 456, as its carry vector is just the four lane carry bits. Each compressor in the shift-combiner has gating to block the carries across lane boundaries that are activated when SIMD lanes are in effect. The carry gating on the second level compressor connects to the carry-ins from the Z input when SIMD blocks the internal carries. FIG. 27 shows the added logic for lane carry blocking. The compressors used to combine addends require 3 additional bits on the least significant end to implement guard, round and sticky bits to conform with the IEEE rounding for the fused arithmetic.

Figure 28:
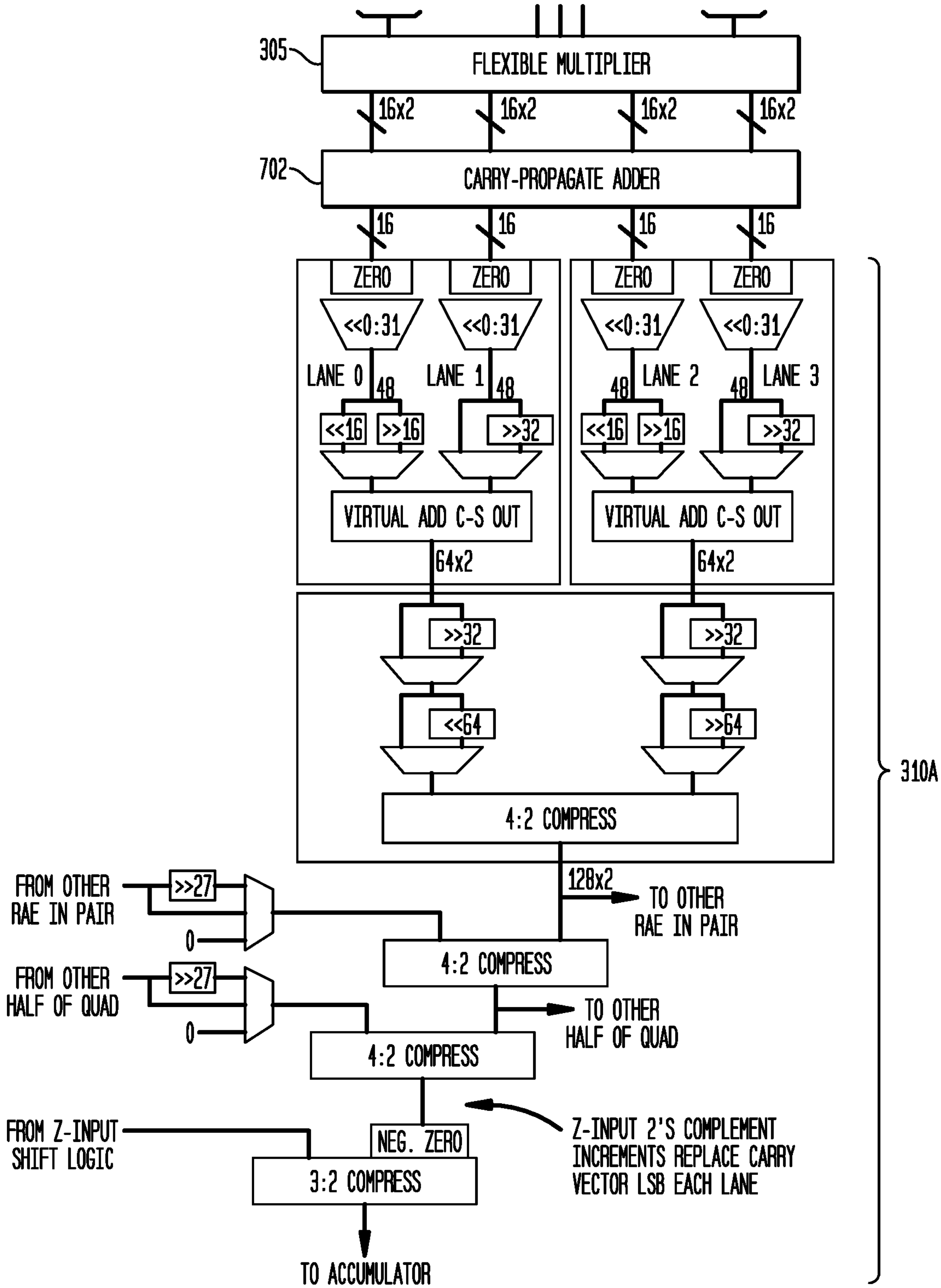
Figure 29:
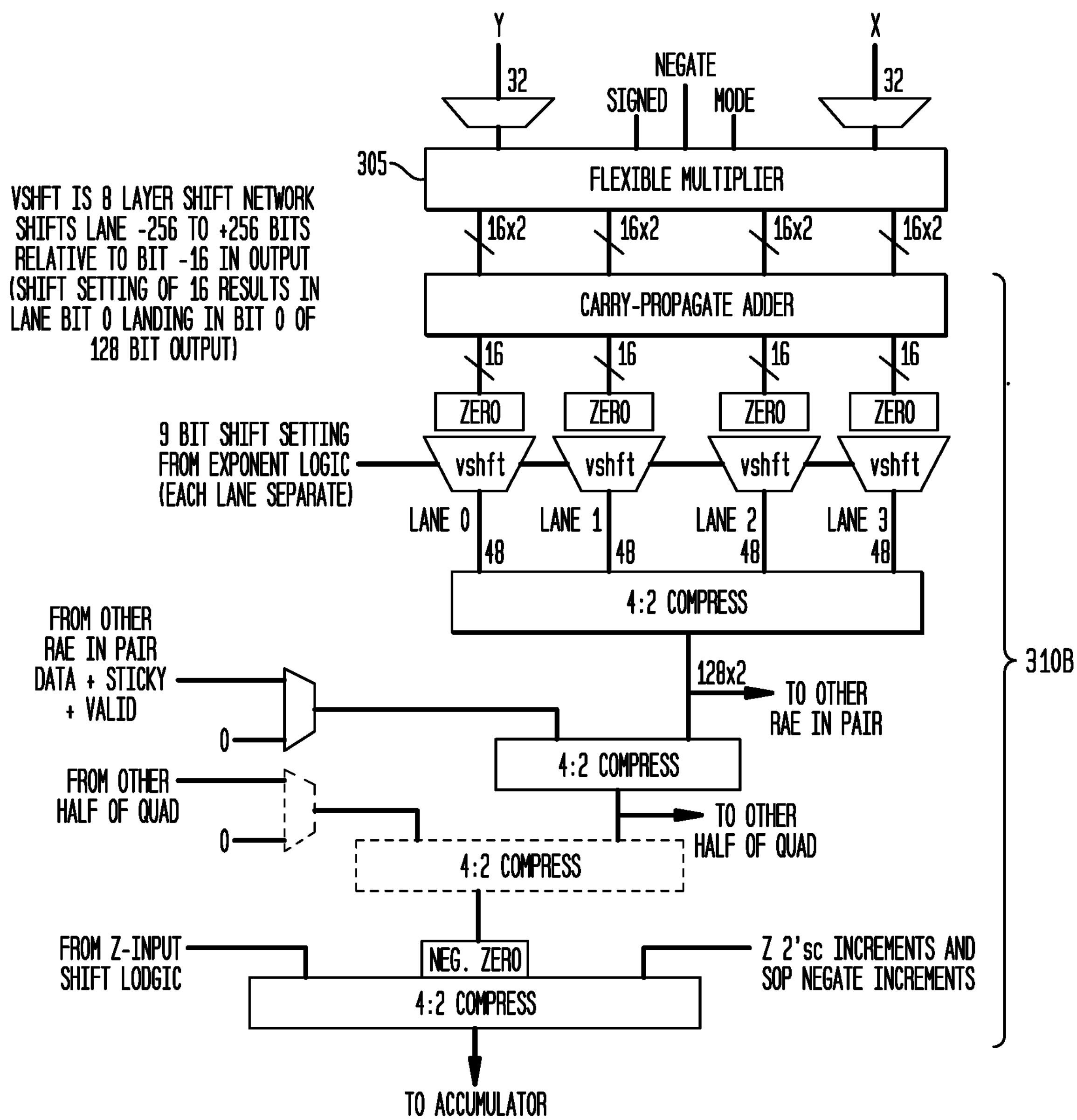

FIG. 28 is a block diagram illustrating an alternative embodiment of the multiplier shift-combiner network 310A. A possible alternative construction adds a carry-propagate adder 702 at the multiplier 305 output (with carry block gating for each lane) to resolve the carry-save format of the multiplier tree to a non-redundant 2's complement (single 64 bit vector) representation. This eliminates the duplicated shift trees in the first layer that would be necessary with carry-save outputs, saving many 2:1 multiplexer instances. The first stage 4:2 compressors used to sum the lane pairs are also eliminated, since the two single vector shifted lanes together represent a carry-save pair. This eliminates many 4:2 compressor instances. As long as the added carry-propagate adder architecture occupies less logic and still meets timing, this should save a significant amount of silicon area. The logic after the first level remains the same. Also the lane zeroing can be pushed back to the multiplier output where the data path is narrower. FIG. 29 is a block diagram illustrating another alternative embodiment of the multiplier shift-combiner network 310B.

6. Z-Input Shifter 330

Figure 30:
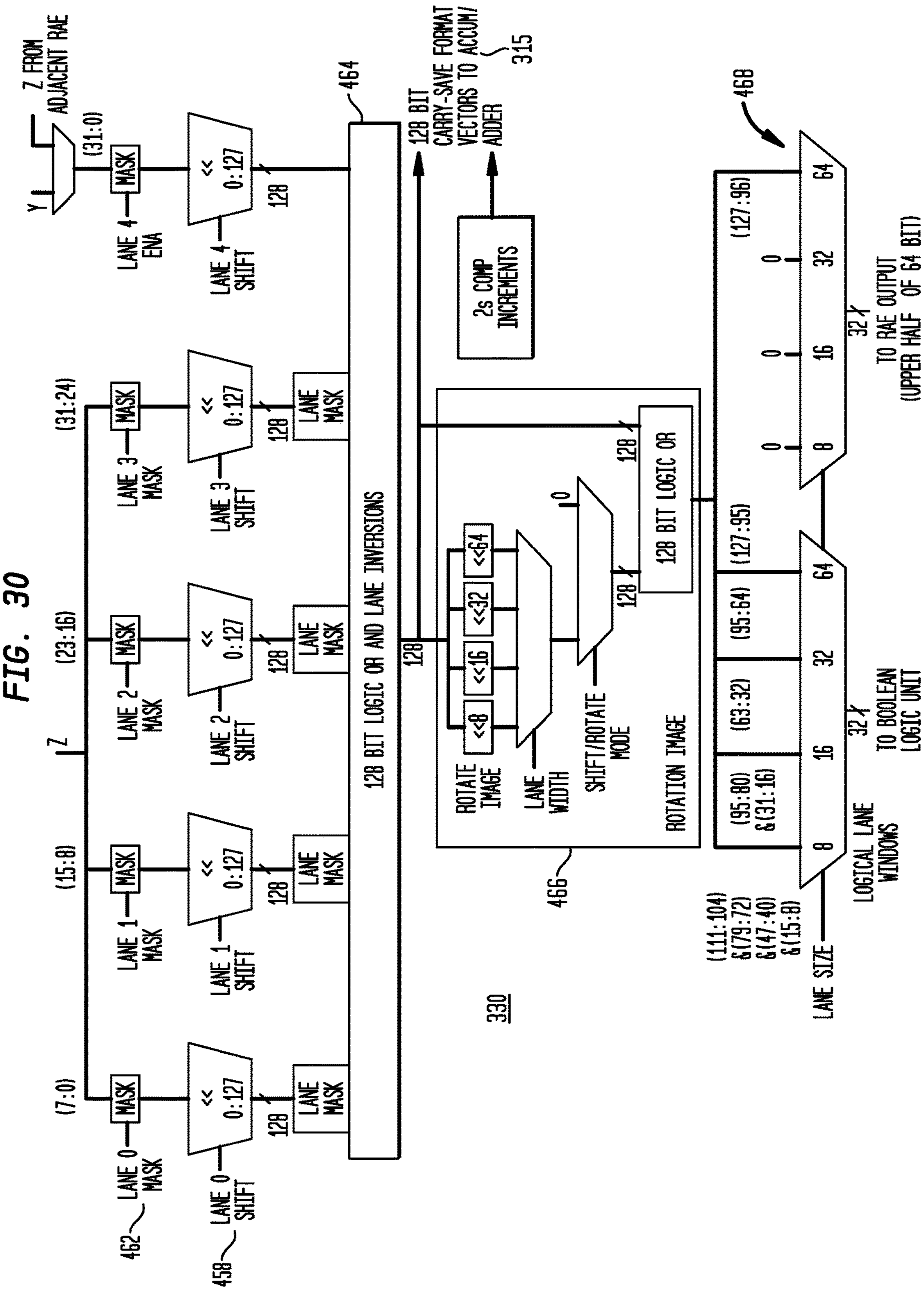

FIG. 30 is a block diagram illustrating Z-input rotate/shift logic 330 data path. The RAE 300 includes a third 32 bit Z-input 375 that serves as an additive input to the accumulator/adder as well as an input to the Boolean logic circuit 325 and compare circuit 320. This Z input is expandable to 64 bits by concatenating either the adjacent RAEs 300 (other RAE 300 in a pair) Z-input 375 or this RAE 300's Y input 370 to the Z input 375. The selection of the extension source is controlled by the RAE 300 mode configuration. The Z-input 375 is conditioned by a shift network designed to perform the alignment shifts to match the multiplier product alignment. That shift network is also used by the required Boolean shift/rotate functions for word sizes of 8, 16, 32 or 64 bits. The Boolean logic circuit 325 input is also connected to one of the compare block inputs for the min-max compare and sort. The Z-input 375 and Z-input rotate/shift logic 330 supports 1, 2 and 4 lane SIMD operation for both arithmetic and logical operations. The Z-input rotate/shift logic 330 associated with the Z-input 375 accomplishes the following functions:

1. Recover hidden bit for floating point inputs for each SIMD lane;
2. Zero output data when a denormal (exponent=0) input is presented for floating point modes;
3. SIMD lane expansion to 128 bits (4 32 bit lanes, 2 64 bit or 1 128 bit) lanes to match adder;
4. Convert floating point sign-magnitude to 2's complement mantissa;
5. Sign extend 2's complement outputs to width of lane;
6. Integer logical shift and rotate operations on 8, 16, 32 and 64 bit lanes;
7. Ability to place 64 bit input in upper, middle or lower positions on 32 bit bounds of 128 bit;
8. Selectively zero, invert, or negate arithmetic outputs by lane;
9. Selectively zero or invert logical outputs by lane;
10. Absolute value;
11. Convert floating point to radix-32 exponent (left shift by value of 5 lsbs of exponent);
12. Additional right shift by 0, 32, 64 or 96 bits to complete floating point alignment to the multiplier; and
13. Lane reordering (8 bit lanes).

The typical Z-input 375 is 32 bits in one of the following formats: single precision floating point, SIMD-2 half precision floating point, SIMD-4 quarter precision floating point, SIMD-2 BFLOAT-16, 32 bit integer, SIMD-2 16 bit integers, or SIMD-4 8 bit integers. The integers may be either signed or unsigned. The logical shift/rotate operations and input to the Boolean logic circuit 325 and compare 320 blocks are valid only for unsigned integers. Other formats can pass through, but should be treated as unsigned integer in this block for the logic modes.

The Z-input 375 may be extended to 64 bits by concatenating either the Y input 370 of this RAE or the Z input 375 of the other RAE 300 in the RAE pair to the left of this input so that the extension becomes the most significant 32 bits of the 64 bit input. The 64 input may be signed or unsigned integer or IEEE double precision floating point. When used as 64 bit, the most significant 12 bits of the extension are the double precision floating point sign and exponent. The extension is treated as integer for the logical operations and output. The extension input may also be concatenated so that the extension becomes the least significant 32 bits by adding an offset of 64 to the shift bias for the 4 primary lanes and −64 to the shift bias for lane 4. The hidden bits and exponent mask bits need to be swapped high and low as well. Since the double exponent logic resides in the high x*high y RAE, this extension swap is necessary to have the Z input split match the x or y input split.

The configuration input sets the shift or shift bias for each lane, selects masks, sets operating mode, selects logical shift, rotate or zero and inversion for logic output, sets signed or unsigned, negate, absolute value, and zero for arithmetic output. The negate and zero may also be controlled by the internal condition flag or Z sign. The configuration input sets the shift or shift bias for each lane, selects masks, sets operating mode, selects logical shift, rotate or zero and inversion for logic output, sets signed or unsigned, negate and zero for arithmetic output.

The shift distance for integer formats is controlled by either bits in the configuration or by external shift controls applied through the RAE's X input 365. When X input is selected, the 32 bit X value is segregated into four eight bit shift controls corresponding to each 8 bit input lane. The least significant 7 bits in each control lane corresponds to the shift distance and the 8th bit is the lane disable. When the SIMD mode is set to 4, the four lanes in the X control correspond 1:1 to the four lanes of the Z input. When SIMD mode is set to 2 or 1, shift sharing is enabled using the control lane associated with the most significant byte of the SIMD lane (control bits 15:8 control the lower 16 bit lane, bits 31:24 control the upper 16 bit lane, and bits 31:24 control all the lanes for single lane SIMD. Similarly, the control word fixed shift settings are also a 32 bit word partitioned the same way. For floating point operations, the X shift adds to the floating point exponent, allowing a means to increment or decrement the exponent. A shift value of zero (which is the sum of the shift control and the shift bias for the lane) causes data in the accompanying lane to be placed with its least significant bit in bit 0 of the 128 bit internal word. Non-zero shift values left-shift the data so that the LSB of the input ends up in the bit of the 128 bit internal word equal to the sum of the shift control and the shift bias. The dynamic controls are produced by the exponent logic 335 and configuration.

The arithmetic output is the Z input to the post-multiply shift-combiner 310 logic. This output is 128 bits wide 2's complement in carry-save form (two 128 bit vectors). The output is formatted to match the accumulator input (note this is different than the multiplier SIMD mode when in dot and complex product modes). The output may be a single 128 bit lane, two 64 bit lanes, or four 32 bit lanes. Four lane output is strictly signed or unsigned integer (quarter precision and half precision IEEE floats are fully expanded to integer with the left shift by the 5 lsbs of exponent). Two lane SIMD is two independent BFLOAT16's for the BFLOAT16 SIMD multiply-add-accumulate, or are signed integers otherwise. The BFLOAT16 output is left shifted to zero the 5 least significant bits of the exponent at the accumulator. The single 128 bit lane is a single or double precision float left shifted to a radix 32 exponent, and then right shifted by multiples of 32 bits as needed to align to other addends, or is a 128 bit signed integer. The arithmetic output 128 bit sum vector is the shifted, masked, and passed, inverted or zeroed Z-input. The carry vector output contains only the +1 two's complement increment at the least significant bit position of each lane. The other bits are implied zero, so the carry vector has only four non-zero bits. The carry vector bits replace the always zero least significant bit output from the multiplier shifter stage preceding the z-input adder in the shift-combiner network.

The logical output of the Z-input rotate/shift logic 330 is a 32 (64 bit when extended) logical shift output that connects to the Boolean logic circuit 325 and to the compare logic 320. This is the shifted and masked Z input with a second image of the shifted input shifted by the lane width and optionally ORed with the Z input shifted data in order to accomplish the rotates. This output may be inverted (for shift only, not for rotate) or zeroed. There is no 2's complement increment on the logical output, in order to avoid an expensive carry-propagate adder for the increment. The logic output is intended for signed or unsigned integer input only. Signed integer input should not be used for rotate or lane reassignment operations, as the sign extension interferes with proper operation for those functions. Signed inputs for shifting results in sign extended shifted data. Unsigned input does not extend the sign for shifts. Unshifted data will pass through from the input to the logical output unchanged (the shift distance is biased by the width of the input lane, so zero shift input results in a right shift by the width of the lane resulting in zero or extended sign). The X, Y and Z-input data-valid flags are not used internally by the Z-input logic.

The Z-input operation and sources of dynamic inputs are controlled by a configuration word sourced in part by the exponent logic 335 block. The configuration selects input masks for floating point, sign-extension, shift-distance or source for shift-distance, lane masks, invert/negate control or it's source, rotate/shift function select, lane disables, arithmetic and logic output enables (disabled output forced to 0), selection of logic window, exponent source select for each lane, exponent input masks, and shift bias.

FIG. 31 shows the Z-input 375 configuration by mode.

Data path controls may also be provided in the RAE circuit 300, such as:

1. Input mask—The input mask zeros masked bits to filter exponent and sign bits out of the shift data for floating point modes. It may also be used as the means to zero lanes for zero exponent or lane disable (there are several points in the data path where lanes may be zeroed, entry point is at the discretion of the designer). The input mask is set by the SIMD mode and input format.
2. Hidden bit—The hidden bit forces '1' bits in the positions for floating point hidden bits when floating point formats are selected. The hidden bit gets overridden by the lane zeroing. Hidden bit depends on SIMD mode and input format.
3. Sign extend—There is a sign extend control for each 8 bit input lane. When set, it causes the shifter network to sign extend in that lane to the width of the 128 bit shifter. When lanes are combined to make 16, 32 or 64 bit input lanes, only the most significant lane should have the sign extend set. Sign extend should only be used for signed integer modes, and should be used in conjunction with the lane mask appropriate to the SIMD mode to contain the sign extension in the lane. Sign extension control is set by SIMD mode and input format=signed.
4. Shift Distance Source—The shift distance source control selects whether the shift distance is sourced by the configuration bits or the RAE X input.
5. Configuration Shift Distance—sets fixed shift distance for each lane when shift distance source is set to configuration. The shift distance is added to the shift bias and exponent shift for each lane to arrive at the lane's shift distance. The configuration shift distance is ignored when shift distance source is set to X input.
6. Shift Bias—The value of the 7 bit shift bias for each lane is added to the shift distance and exponent shift to arrive at the total shift setting for each 8 bit lane.
7. Floating point align—the floating point align indicates the source for the additional multiple of 32 bit right shifts for alignment of double, single and bfloat modes. This is set by the floating point format
8. Shift Sharing—the shift sharing selects which lane controls shift for each 8 bit lane. This allows shift controls to be shared by multiple 8 bit lanes so that the shift setting does not have to be duplicated in each lane.
9. Lane Mask Select—the lane mask selects between fixed 32 bit lane masks applied at the output of each lanes' shifter. Selections are off, 2 lane or 4 lane. This is set by SIMD mode and overridden for lane reassign function.
10. Negate/Invert—A source select selects the source for the negate/invert, and a bit for each lane controls the 32 bit output lane. Source is common to all lanes, and includes settings for configuration word, negate flag, and msb of lane in X. When the lane source is '1' the lane is inverted and the lane carry bit is asserted on the arithmetic output if arithmetic output is enabled. The lane inverts controls follow the shift sharing selection for the source lane. The carry out is asserted only for the least significant lane when multiple lanes are combined per SIMD mode.
11. Rotate/Shift Mode—a single configuration bit sets whether the rotate image is combined with the shift image for the logical output. A '1' indicates rotate mode. Rotate setting does not matter if logic output is disabled.
12. Rotate Width—The rotate lane width is set to the lane width selected by the SIMD and 64 bit extension.
13. Arithmetic and Logic Enables—two bits individually enable the arithmetic and logical outputs. A '1' value enables the output. The output is forced to zero and the corresponding data valid out is held at zero if the output is disabled.
14. Logic Window—The logic window setting selects one of four windows that select which bits are output on the logical shift/rotate output. The setting is determined from the logic output SIMD.
15. Exponent Masks—The exponent masks select the number of bits passed from the Z or Y input to the exponent logic for each lane where more than one exponent width applies.

The mask is selected by the floating point format. There are 14 modes encapsulating the format, SIMD and function, plus the rotate select, output enables and shift distance in a minimum control input. The double precision mode should have the exponent logic in the RAE that is handling the upper*upper partial product in order to have access to the exponent bits from each multiplicand. This requires the 64 bit extension to be appended on the low half of the 64 bits and the 4 local lanes in the high half of the 64 bit Z input. This also puts the exponent masks in the proper position. The shift distances are modified to accomplish this. The double HL reversed mode reflects this.

Referring to FIG. 30, the Z-input rotate/shift logic 330 comprises a variable 0-127 bit left shifter 458 for each of 5 input lanes. Four of the lanes have 8 bit inputs corresponding to the 4 lane SIMD. Lanes are combined for 2 lane and single lane operation. The 5th lane is a 32 bit wide lane connected to the extension input for 64 bit operations. The shifter is preceded by masks 462 that change depending on mode, intended for masking out exponent and sign bits for floating point at input. The shifted data lanes are combined with logic OR gates 464, and inverted for negation or sign magnitude conversion to a negative two's complement output. The inversion is done per 32 bit arithmetic output lane. The 32 bit arithmetic lanes map into 8 bit lanes for the logical output.

The selectively inverted output forms the sum portion of the carry-save formatted output to the arithmetic. The carry vector for that output contains the increments for each lane's 2's complement completion as needed. The sum of the carry and save outputs is the 2's complement representation of the shifted Z input in each lane, negated if the negation control is set. If the zero control is set, the output is forced to zero. Zero is asserted for floating point inputs with exponent equal to zero, or in response to a zero-ize configuration control for each lane. The Z-input logic pipeline latency matches the multiplier and post-multiply shift/combiner network latency from inputs to the Z-input to the shift/combiner. The Z shifters are zero based so that when shift is 0 LSB of lane input maps to bit 0 of the 128 bit output for all lanes. Zero basing the inputs permit us to right shift lanes with addition of another mask between shifter and OR combiner, and also allows for arbitrary reordering and combining lanes (e.g. two quarter precision and one half precision lane), or split processing for mantissa and exponent.

Each lane has masks 462 that replace floating point sign and exponent bits with zeros and assert the hidden bit at the input to the shifters. These mask values by lane and by mode are detailed in Table 11 with '1' bits corresponding to input bits that are forced to zero. The sense of the mask bits may be inverted for convenience in the implemented design. Also not shown in that table is a zero-ize control that forces the mask to all '1's which in turn forces the lane data to zero. The zero-ize is asserted if a lane is deselected, and also when the floating point exponent appropriate to the mode and lane is zero. The mask generation is part of the Z-input exponent and control logic.

The Z-input SIMD mode is not necessarily the same as the multiplier SIMD mode. For SIMD dot products and complex multiply modes, the multiplier combiner reduces the number of lanes and results in a different mode at the Z-input and accumulator than that of the multiplier. The floating point modes require the assertion of the hidden bit that is part of the IEEE and Bfloat formats. The hidden bit is asserted in the relevant lane(s) when a floating point mode is selected. The hidden bit is always '1' except when forced to zero by a zero exponent or the force lane to zero configuration control. The hidden bit vector is tabulated by mode in Table 12. The input mask logic is masked<=(hidden OR (Z-in AND NOT mask)) and NOT zeroize.

TABLE 11

Z-input shift logic input Masks by Mode

| Z-Mode | Lane 4 mask | Lane 3 mask | Lane 2 mask | Lane 1 mask | Lane 0 mask |
|---|---|---|---|---|---|
| double | 0xFFF00000 | 0x00 | 0x00 | 0x00 | 0x00 |
| Double HL reversed | 0x00000000 | 0xFF | 0xF0 | 0x00 | 0x00 |
| Single | 0xFFFFFFFF | 0xFF | 0x00 | 0x00 | 0x00 |
| Half | 0xFFFFFFFF | 0xFC | 0x00 | 0xFC | 0x00 |
| Quarter | 0xFFFFFFFF | 0xF8 | 0xF8 | 0xF8 | 0xF8 |
| BFfloat16 | 0xFFFFFFFF | 0xFF | 0x00 | 0xFF | 0x00 |
| INT64 | 0x00000000 | 0x00 | 0x00 | 0x00 | 0x00 |
| INT32 | 0xFFFFFFFF | 0x00 | 0x00 | 0x00 | 0x00 |
| INT27 | 0xFFFFFFFF | 0xF8 | 0x00 | 0x00 | 0x00 |
| INT24 | 0xFFFFFFFF | 0xFF | 0x00 | 0x00 | 0x00 |
| INT16 | 0xFFFFFFFF | 0x00 | 0x00 | 0x00 | 0x00 |
| INT8 | 0xFFFFFFFF | 0x00 | 0x00 | 0x00 | 0x00 |

TABLE 12

Z-input shift logic input hidden bit by Mode

| Z-Mode | Lane 4 mask | Lane 3 mask | Lane 2 mask | Lane 1 mask | Lane 0 mask |
|---|---|---|---|---|---|
| Double HL | 0x00000000 | 0x00 | 0x10 | 0x00 | 0x00 |
| Single | 0x00000000 | 0x00 | 0x80 | 0x00 | 0x00 |
| Half | 0x00000000 | 0x04 | 0x00 | 0x04 | 0x00 |
| Quarter | 0x00000000 | 0x08 | 0x08 | 0x08 | 0x08 |
| BFfloat16 | 0x00000000 | 0x00 | 0x80 | 0x00 | 0x80 |
| All INT modes | 0x00000000 | 0x00 | 0x00 | 0x00 | 0x00 |

Figure 32:
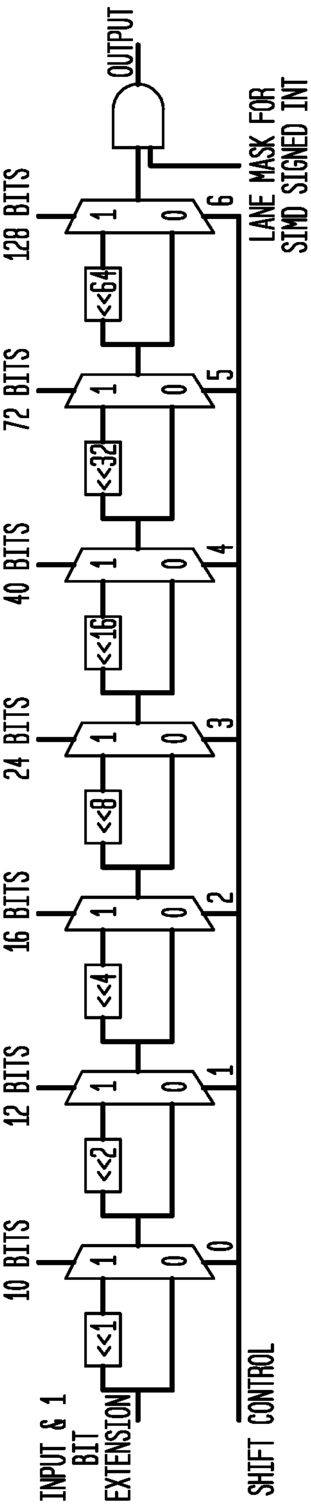

FIG. 32 is a block diagram illustrating shift network 458 construction. The shift networks on each lane expand the lane to 128 bits, and left shift the lane data by 0 to 127 bit positions based on the 7 bit control for each lane that originates in the Z-input exponent logic. Zero bits are shifted in on the right to fill as bits are shifted left. The shifter for each lane is 7 layers of 2:1 muxes, each one shifting by a power of two that is one greater than the previous shifter. The smallest shifts are done first to minimize the width of the shift networks.

The construction of the shift network 458 is illustrated in FIG. 32. The width of the first stage is input width plus 1, width of the second stage is input width+1+2, third is input width+1+2+4 and so on. The width of any stage is capped at 128 bits so that bits that shift past the 128 bits are lost. The inputs for lanes 0-3 are 9 bits each (8 bits plus extension for sign extend), lane 4 has a 32 bit plus sign extension input (used for 64 bit only). The shift control is a function of mode, the exponent on each lane for floating point modes, and for the Z-axis shift control. The shift controls come from the Z-input exponent logic. For signed integer mode, the shift network 458 should also sign-extend the input to the width of the lane. In order to do this, the width of each stage of the shifter is increased by one bit, and that extended bit is duplicated in the 2k most significant bits on the un-shifted input to the next mux. The first layer mux sets that extra bit to duplicate the most significant bit for signed integer mode, and sets it to '0' otherwise. For 2 lane and 1 lane signed integer, only the most significant lane of the lanes combined to make the wider lane gets its sign extended; the lower order 8 bit sub-lanes have their extended input bit set to '0'.

The output of each shift network 458 lane requires a lane mask to keep outputs within the lane, otherwise sign extension will propagate to the next most significant lane, and right shifting for floating point alignment will underflow into lower lanes. The bit ranges that pass data for each lane for the SIMD modes is tabulated in Table 13 below. Ranges outside the bit range shown are forced to zero when the mask is enabled. Lane masking is required for arithmetic modes. It can be disabled for logical modes to allow for lane reordering. It needs to be applied for logical mode if signed integers are used for arithmetic shifts. Lane reordering is only legal with unsigned inputs, as the sign extension requires lane masks to constrain the sign extension but lane reordering moves the lane data outside of the lane mask.

TABLE 13

Lane Masks for arithmetic Lane Blocking

| mode | Lane0 | Lane1 | Lane2 | Lane3 | Lane4 |
|---|---|---|---|---|---|
| SIMD 2 | 63:0 | 63:0 | 127:64 | 127:64 | none |
| SIMD 4 | 31:0 | 63:32 | 95:64 | 127:96 | none |
| All others | 127:0 | 127:0 | 127:0 | 127:0 | 127:0 |

The leftmost bit in the input lane is interpreted as the sign bit for both floating point and signed integers, and as a data bit for integers (this bit is masked out to the shifters for floating point formats but used by the exponent logic block to control negation and two's complement conversion).

The 128 bit output from each lane's shift network is logically ORed with the 128 bit outputs of all the other lane shifters to form a single 128 bit composite output (from 464). A shifter setting of zero for all lanes will place the data for each lane with the least significant bit at bit 0 of the output. The shift values on each lane are biased in the exponent logic block to impart differing shifts to each lane and prevent lane overlaps for arithmetic operations. The OR logic also includes a selectable inversion for each 32 bit lane of the output which inverts all the bits of the associated output lane (i.e., performs 1's complement on the lane data). The inversion is also controlled from within the exponent block as a function of mode and sign bit. For arithmetic use, the inversion forms part of the 2's complement operation, which is completed by sign-extending and adding 1 at the arithmetic output. The output of the lane combination and inversion logic goes to the arithmetic output and to the rotate image logic for the logical output. Lane reordering is disallowed for arithmetic outputs because the inversion and 2's compliment logic for each lane is controlled by the same lane(s) of the input. FIG. 33 illustrates bit alignment by mode.

The arithmetic output of the Z-input rotate/shift logic 330 connects to the post multiply shift/combiner network 310 where it is summed with the product or sum of products computed in the same RAE 300. The arithmetic output is 2's complement signed data in each lane represented in carry-save format, that is as a pair of 128 bit vectors whose sum in each lane is the 2's complement value to be added to the sum of products from the multiplier. The number of lanes depends on the accumulator SIMD mode, which may or may not be the same as the multiplier SIMD mode. Lanes are 32 bits for SIMD-4, 64 bits for SIMD-2 or 128 bits for single operation. The sum vector is the shifted Z-input with inversion (if invert is selected) for each lane. The carry vector comprises the +1 to complete the 2's complement in each lane. All other bits of the carry vector are always zero, so those are not physically implemented allowing the connection to the post-multiply shift/combiner network to be single ended plus a 1 bit increment for each lane. The increment is done with the carry vector to avoid having to propagate a carry at the Z-input logic's arithmetic output.

The rotation image 466 OR's a copy of the shifted data, left shifted by the input SIMD lane width to the shifted data so that the data is two concatenated copies. The logic output is windowed (468) so that the data in the window appears rotated as the concatenated data is shifted through the window. The bit positions in FIG. 33 are shown for zero shift. Shifting moves the lane inputs up the shifted number of bits so that as left shift is added the bits shifted out of the top of the window appear to reenter at the bottom of the window. When shifting is selected rather than rotation, the red legend data is set to zero instead of the offset shifted image so zero shift results in no data in the window, and as the shift distance increases the upper bits show in the low end of the window and for a maximum shift only the LSBs remain at the top of the window. Rotation mode requires unsigned inputs because the rotated image, when OR'ed with the sign extension gets masked by the sign extension.

The logic output re-merges the SIMD lanes to the original sized lanes by selecting out only bits within lane windows depending on the mode. The selection is via a 4:1 mux that selects windows for 4×8 SIMD, 2×16 SIMD, 32 bit or 64 bit outputs. The upper 32 bits are disabled to zero when not in 64 bit mode.

Figure 34:
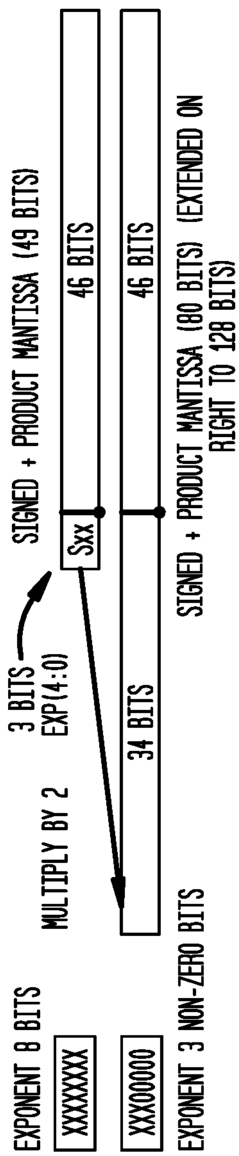

FIG. 34 is a block diagram illustrating floating point format conversion to radix32 from IEEE single precision. The floating point modes require handling of the floating point exponents, as well as manipulation of the mantissa data path according to exponent values. The exponent for a product of two floating point values is the sum of the exponents of the multiplicands. For floating point addition, each addend should have the same exponent in order to be summed. When the addend exponents are unequal, the addend with the smaller exponent is right shifted by the number of bits represented by the difference of the exponents. After right shifting, both addends share the larger exponent and can be summed. When there are more than two addends to sum, the maximum exponent among the addends should be determined and then all the addends with smaller exponents need to be right shifted by a number of bits equal to the difference in exponents.

In order to minimize the amount of shifting inside the accumulator 315 loop, the RAE 300 uses an unconventional internal format where the floating point numbers are pre-shifted by up to 31 bits to the left convert to a radix-32 exponent. The adjustment to the exponent to counter the left shift zeros out the 5 least significant bits of the exponent, which are then discarded and all downstream alignment shifts are in multiples of 32 bits. This modification significantly reduces the complexity of the exponent compares and the shift logic inside the critical accumulator loop at the expense of a wider accumulator. Additionally, having sums occur before the accumulator 315 requires additional shifting logic ahead of the accumulator 315, and since there are more than two addends, each path needs its own shifter. The conversion to the radix-32 exponent is illustrated in FIG. 34 and is performed by the exponent logic circuit 335.

7. Exponent Logic Circuit 335

Figure 35:
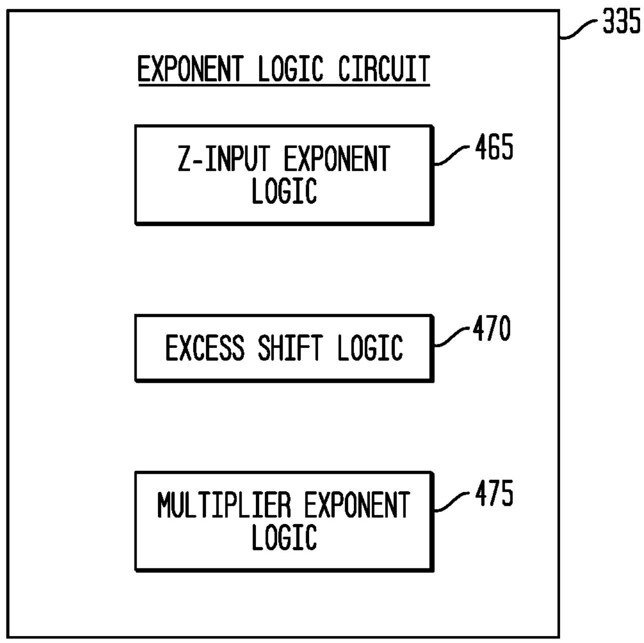

FIG. 35 is a block diagram illustrating an exponent logic circuit 335, which comprises Z-input exponent logic 465, excess shift logic 470, and multiplier exponent logic 475, each of which is described in greater detail below. In a representative embodiment, the accumulator 315 includes its own exponent logic.

This RAE circuit 300 also supports dot product modes that sum multiple products from as many as four RAEs 300 and the associated additive inputs. The summation of those products requires finding the maximum exponent out of all the addends and calculating the difference between each exponent and that maximum to determine the right shift distance for each addend's mantissa. IEEE half and quarter precision values are converted to integers by the radix-32 exponent conversion, so no exponent processing other than the conversion shift and a shift bias to properly align the result in each lane is necessary. The accumulator 315 estimates the redundant sign bits and left shifts by a multiple of 32 bits when possible to do so without overflow, and the accumulator's exponent is decremented accordingly (accumulator exponent is the left most bits after stripping off the 5 lsbs). The post-accumulator final adder, rounding and normalization stage (340) renormalizes the accumulated sum and appends the normalizing shift distance to the accumulator's exponent value to reconstitute the IEEE or Bfloat full exponent as part of the normalization.

The exponent logic circuit 335 is the exponent processing in front of the accumulator 315. The functions of the exponent logic circuit 335 can be summarized as: summing multiplier exponents, compensating for exponent bias; converting all floating point inputs to radix-32 exponents by left shifting; finding a maximum excess exponent among all addends (excess is the radix-32 exponent), including exponents from other RAEs 300 in the RAE circuit quad 450; calculating a shift distance for each addend as 32 times the difference from maximum; adding a mode dependent shift bias for correct output alignment; generating shifter settings for Z-input shifter 330 and multiplier shift-combiner network 310 shifters; and detecting zero exponents, force mantissa and exponent out to zero (convert de-normals to zero).

The excess shift logic 470 is the logic that finds the maximum exponent, including the links to the other RAEs 300 in the RAE circuit quad 450. The multiplier exponent logic 475 includes the summation of the multiplicand exponents and the derivation of the shift network controls for the shift-combiner's shifters. The Z-input exponent logic 465 calculates the shift controls for the Z-input shifter 330.

De-normalized inputs are replaced with zero (a zero exponent forces the data path to zero). In the rare cases de-normalized numbers are needed, the compare block 320 and other logic in the RAE 300 may be used to detect de-normals and direct an alternate processing path using integer multiplies and adds to process de-normals according to the IEEE standard.

The 32 bit X, Y and Z inputs 365, 370, 375 are input to the exponent logic circuit 335 in order to have access to the floating point exponents and signs. These include multiple sets of exponents for the SIMD modes.

Each RAE 300 outputs its local maximum 3 bit radix-32 exponent as a 7 wire bar code signal. The 3 bit exponent is converted to turn on the number of consecutive wires indicated by the 3 bit code. These 7 wires are connected to each of the other three RAEs 300 in the RAE circuit quad 450 (not separately illustrated). These share the maximum exponents of each RAE 300, or for double mode transmit the resolved excess shift to all RAEs 300 in the RAE circuit quad 450.

The shift controls for the 6 layer shifter and zero gate for each lane of the multiplier shifter-combiner network 310 is generated by the exponent logic circuit 335. The four shift controls for the second level multiplier shifters are also generated by the exponent logic circuit 335. The shift controls for the 7 layer shifter and zero gate for each lane of the Z-input shifter 330 is generated by the exponent logic circuit 335. The four shift controls for the second level multiplier shifters are also generated by the exponent logic circuit 335.

The configuration of the exponent logic circuit 335 generally includes the following controls: Z integer shift/rotate distance; Z shift source control (X input, configuration, exponent); numeric mode (SIMD lanes, Float format); exponent masks (set by numeric mode and SIMD); and enable controls for lanes and neighbor RAE 300 inputs.

The excess shift logic 470 determines the number of 32 bit right shifts required for each addend. The Z-input and product are summed for the general case of a fused multiply-add operation. This summation occurs before the accumulator 315 and before the outputs of neighboring RAE 300 product trees are combined. For clarity, the excess logic is discussed for both the Z-input exponent logic 465 and product addends.

The excess shift refers to the right 32 bit shifts required to align addends in order to complete the sum. Modes with more than 5 bit exponents require the excess shift logic to determine how much each addend needs to be right shifted. The excess shift logic 470 should first determine the maximum exponent out of all the addends. Then for each addend, its exponent is subtracted from the maximum to determine the amount of right shift that should be applied to it.

There are up to 8 addends with 8 bit exponents that need to be combined (Single precision Dot Product of four fused multiply-adds, each with a floating point Z addend). While the Z-inputs are added to the sum after the adjacent RAE 300 products, all of the products summed should be shifted to the same weighting and the Z input for each needs to be similarly weighted. Therefore, the exponent logic circuit 335 looks at all active Z inputs even though adjacent RAE Z inputs do not contribute to the local sum.

This requires communication between the 4 RAEs 300 in a RAE circuit quad 450 to determine the maximum exponent.

The Bfloat16 mode has two floating point values each with an independent 8 bit exponent per FPMAC. For the BFLOAT dot product, the two products and one Z-input addend from each FPMAC are summed, requiring up to 12 addends with exponents. BFLOAT without the dot product does not allow fused sum of neighboring RAE because the inter-RAE exponent connections do not support two exponents.

Finally, double precision floating point permits a single fused multiply-add using four RAE cores joined together. The modes using excess exponent shifts are summarized Table 14 below.

TABLE 14

| Mode | Exp msbs | Other RAE exp | Z lanes | |
|---|---|---|---|---|
| Double | 6 | Yes* | 1 | Max of Z ext, HH mult, distribute shift to all RAE In HH |
| Single | 3 | no | 1 | Max of mult, Z local only |
| Bfloat16 SIMD | 3 | no | 2 | 2 lanes local only max of Z/mult per lane |
| Half SIMD | 0 | no | 2 | Integer on 32 bound |
| QTR SIMD | 0 | no | 4 | Integer on 16 bound |
| Single Dot | 3 | yes | 1 | Max of 4 RAE, Z plus 1 single product per RAE |
| Bfloat dot | 3 | yes | 1 half | Max of 4 RAE, Z + 2 lanes bfloat per RAE 1 lane Z full width expanded from bfloat in |
| Half dot | 0 | No | 1 half | Integer expanded from single lane halfZ |
| Qtr dot | 0 | No | 1 qtr | integer expanded from single lane quarter Z |

Figure 37:
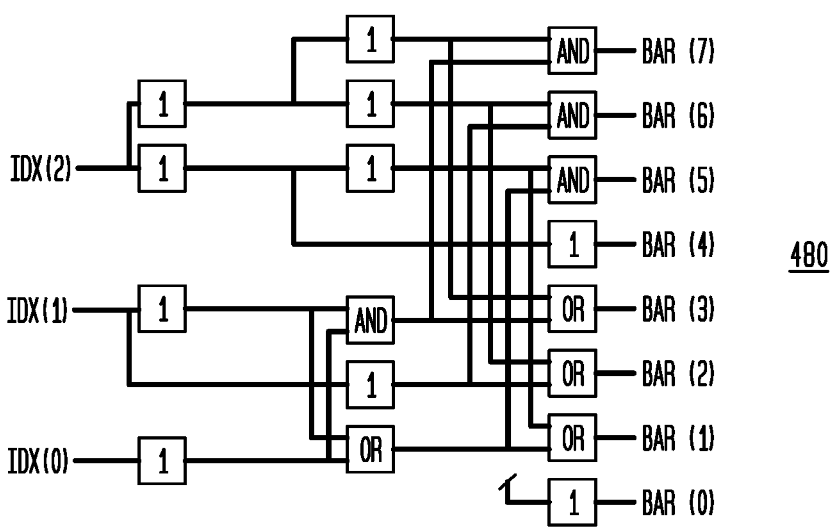
Figure 36:
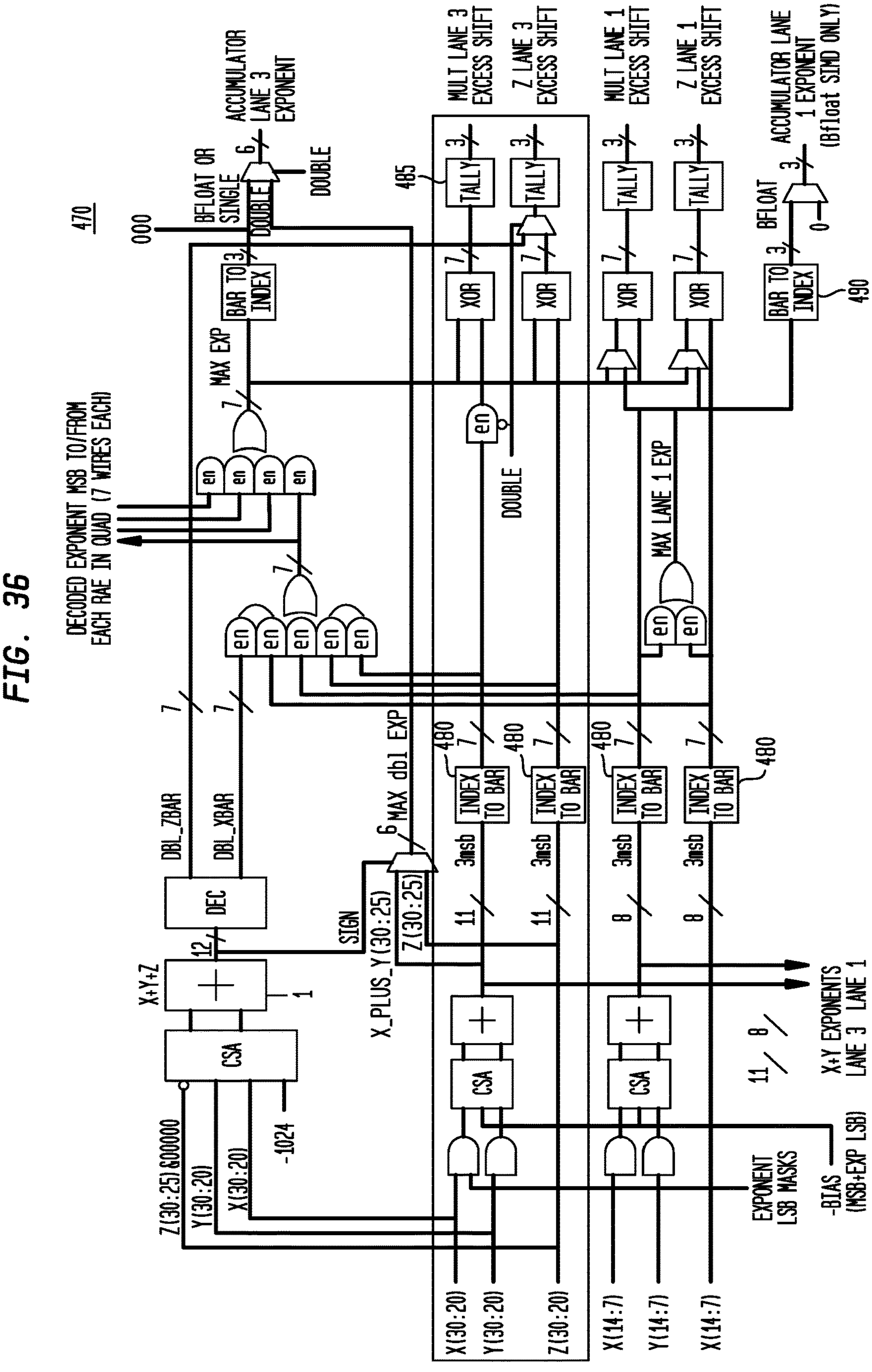
Figure 38:
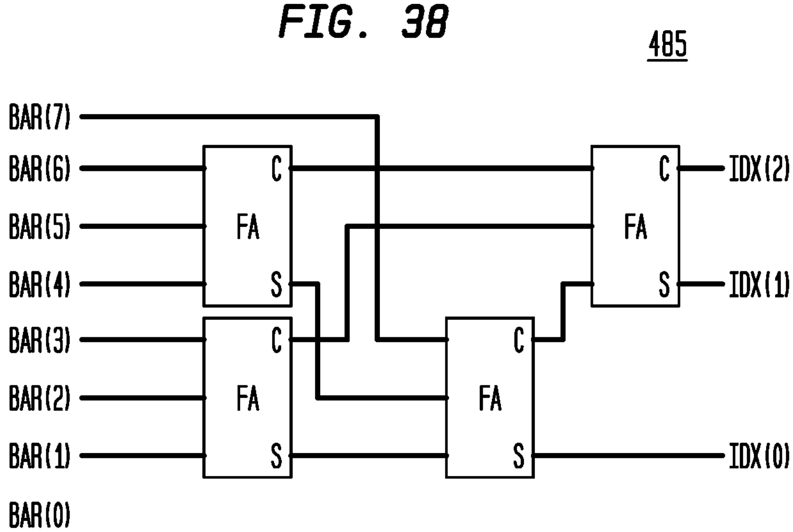
Figure 39:
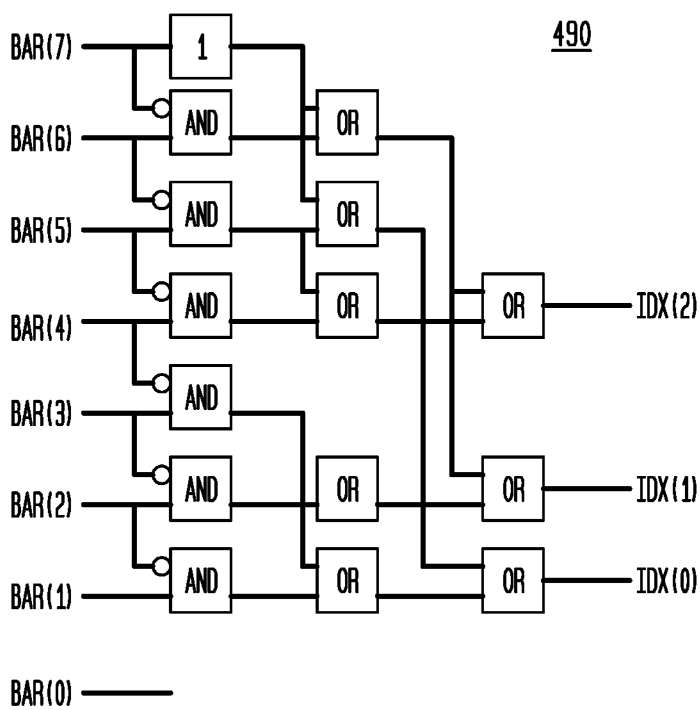

FIG. 36 is a block diagram illustrating excess shift logic 470 for the Z-shifter 330 and multiplier shifter-combiner network 310. FIG. 37 is a block diagram illustrating a 3 bit index to 8 bit bar circuit 480 with 2 input×fanout-2 (2×2) gates, and the illustrated "1's" are buffers. FIG. 38 is a block diagram illustrating a tally circuit 485 for converting XOR difference of bars to index using full adders. FIG. 39 is a block diagram illustrating an 8 bit bar to 3 bit index circuit 490 with 2 input×fanout-2 (2×2) gates.

The excess shift logic 470 contains the 12 addend process as its center-piece, and logic is added for the special processing required by the double precision's wider exponent and unique distribution requirements. An additional stripped down copy of the large addend process is used for the second BFLOAT16 lane for the SIMD mode. The excess shift logic 470 simplifies the task of comparing up to twelve 3 bit excess exponents by converting each 3 bit exponent into an 8 bit bar representation (the bar representation is similar to a one-hot decode, except that in addition to the one-hot bit, all bits lower than the decoded bit are also turned on). This is a less complicated decode than a one hot and has advantages for this design. To find the maximum exponent, the top 7 bits of each bar are bit-wise ORed (the least significant bit of the bar is always '1' so it is discarded). The highest bar prevails over shorter bars and corresponds to the maximum exponent. The OR tree is broken up into a local 3 input by 8 bit OR to pre-combine the one or two product exponents and the Z-input exponent from within the RAE 300. The OR is constructed from AND-OR-INVERT gates 471 so that each input to the OR has a gate for shutting off any selected input(s). The 7-line local maximum is transmitted to each of the 3 other RAE's in the RAE circuit quad 450 over dedicated 7 bit connections between the RAEs 300.

Each RAE's receiver has three 7 bit inputs from the other RAEs 300 plus an internal 7 bit input from itself. These are ORed together in each RAE 300 so that each holds a duplicate of the maximum bar. The RAE combining structure is also AND-OR-INVERT gates so that the inputs from other RAEs can be blocked at the input to this RAE (which allows the RAEs to be used with independent sums or in pairs with independent sums). The maximum exponent bar is then separately bit-wise exclusive-ORed with each of the local BAR sources. The exclusive OR output has '1' bits only on bar bits that are different than the maximum. A count of the '1' bits indicates the difference between the exponents for that addend. That difference is recovered as a binary index using a 7 bit tally-add to count up the one bits (which are contiguous, but can be anywhere in the 7 bit field) using tally circuits 485.

The maximum actual shift is 3 32 bit shifts or 96 bits. Beyond that, the addend is just zeroed because the shift is 128 bits or more. The value of the tally adder's two least significant bits correspond to shifts of 0, 1, 2 or 3 32 bit shifts. The remaining tally adder bit, if '1' zeros the addend. Because the difference is the maximum minus the local exponent, it is always a non-negative shift.

The difference max-Z is the excess shift for the Z input, and similarly the difference max-Product is the excess shift for the product. These excess shifts are applied to the relevant shifter networks via an encoding block to control the added right shift. The maximum bar is also decoded into an index representing the maximum exponent, which is used by the accumulator as the exponent for the accumulator input. While a tally-adder 485 could also be used to decode the accumulator exponent, the output is always a bar, so the decoding is simple and without the full adders of the tally-add. The second bfloat lane has a stripped down local-only version of the same excess logic to find the maximum of the lane 1 Z input and product. There are no links outside the RAE for this second maximum, so it is only a local OR of those two addend excess exponents. The maximum value is converted to a binary exponent for the accumulator and the excess shift distances are calculated the same as for the primary.

The logic for the double precision is different because it has 6 bit instead of 3 bit excess exponents, it only has two addends (z-input and product; there is no dot mode for doubles). The double is unique because the multiplier is distributed over the 4 RAEs and so it needs to distribute the product excess shift to the other RAEs 300 in the RAE circuit quad 450. The double precision excess logic resides in the same RAE 300 that contains the product of the most significant X and Y bits, as that is where the exponent for both is found. Additionally, the Z input logic uses the input extension, but that has to be the least significant half in order for the Z input logic to reside in the same RAE as the High order inputs. Both the X and Y inputs are taken up with the multiplicands, so the Z extension input is taken from a neighboring RAE's Z input. The bias for the extension to be on the least significant bits of the Z shifter is modified in the Z input for this special case (double reversed HL).

The double excess logic uses a carry-save adder feeding a 12 bit final add to perform X+Y−Z to find the difference between the product and addend exponents. This is done in a separate adder rather than having the delay and added area of two layers of look-ahead adders to get a fast (X+Y)−Z. The 12 bit difference includes an added sign bit to discern which is larger. The 12 bit sum is fed into a decoder that directly re-encodes the 12 bit binary into a pair of saturating 5 bit BAR values for excess product shift and excess Z input shift. The truth table for the decoder is tabulated in Table 15. Each bar value is '0' padded on the left to an 8 bit bar and the least significant bit is not computed to arrive at a 7 bit bar similar to those used for the maximum in the primary excess circuit. The product bar is wired into the local AND-OR-invert maximum so that it has a path to the distribution to other RAEs 300.

For double mode, the other inputs to the AND-OR-INVERT are disabled so that the product excess shift is output unchanged. On the receiving end in each RAE, only the input from the RAE computing the double excess is enabled. The double mode turns off the other input to the lane 3 excess shift logic so that the product excess shift is decoded to the correct shift. In the RAE containing the operating double excess difference logic, the Z excess bar is wired within the same RAE to directly to the Z-excess shift tally adder via a multiplexer to allow that to also be directly translated to the z shift distance.

The MSB of the difference adder output is used to select either the sum of multiplicand exponents X_PLUS_Y or the Z exponent six most significant bits to be used as the accumulator exponent. A MUX controlled by the double mode selects between that max double exponent and the decoded max exponent from the primary excess logic discussed above (that exponent is zero extended on the left by 3 bits to use the same exponent logic in the accumulator for both double and single precision).

TABLE 15

Excess Shift Double Shift Decoder Truth Table

| bits 11:8 | bits 7:5 | x bar | z bar | action |
|---|---|---|---|---|
| 0 1 x x | x x x | 0 | F | Z + 3 < X force Z to zero |
| 0 x 1 x | x x x | 0 | F | |
| 0 x x 1 | x x x | 0 | F | |
| 0 x x x | 1 x x | 0 | F | |
| 0 0 0 0 | 0 1 1 | 0 | 7 | Z + 3 = X shift Z right 96 bits |
| 0 0 0 0 | 0 1 0 | 0 | 3 | Z + 2 = X shift Z right 64 bits |
| 0 0 0 0 | 0 0 1 | 0 | 1 | Z + 1 = X shift Z right 32 bits |
| 0 0 0 0 | 0 0 0 | 0 | 0 | Z = X no shifts |
| 1 1 1 1 | 1 1 1 | 1 | 0 | Z = X + 1 shift X right 32 bits |
| 1 1 1 1 | 1 1 0 | 3 | 0 | Z = X + 2 shift X right 64 bits |
| 1 1 1 1 | 1 0 1 | 7 | 0 | Z = X + 3 shift X right 96 bits |
| 1 1 1 1 | 1 0 0 | F | 0 | Z > X + 3 force X to zero |
| 1 x x x | 0 x x | F | 0 | |
| 1 x x 0 | x x x | F | 0 | |
| 1 x 0 x | x x x | F | 0 | |
| 1 0 x x | x x x | F | 0 | |

Figure 40:
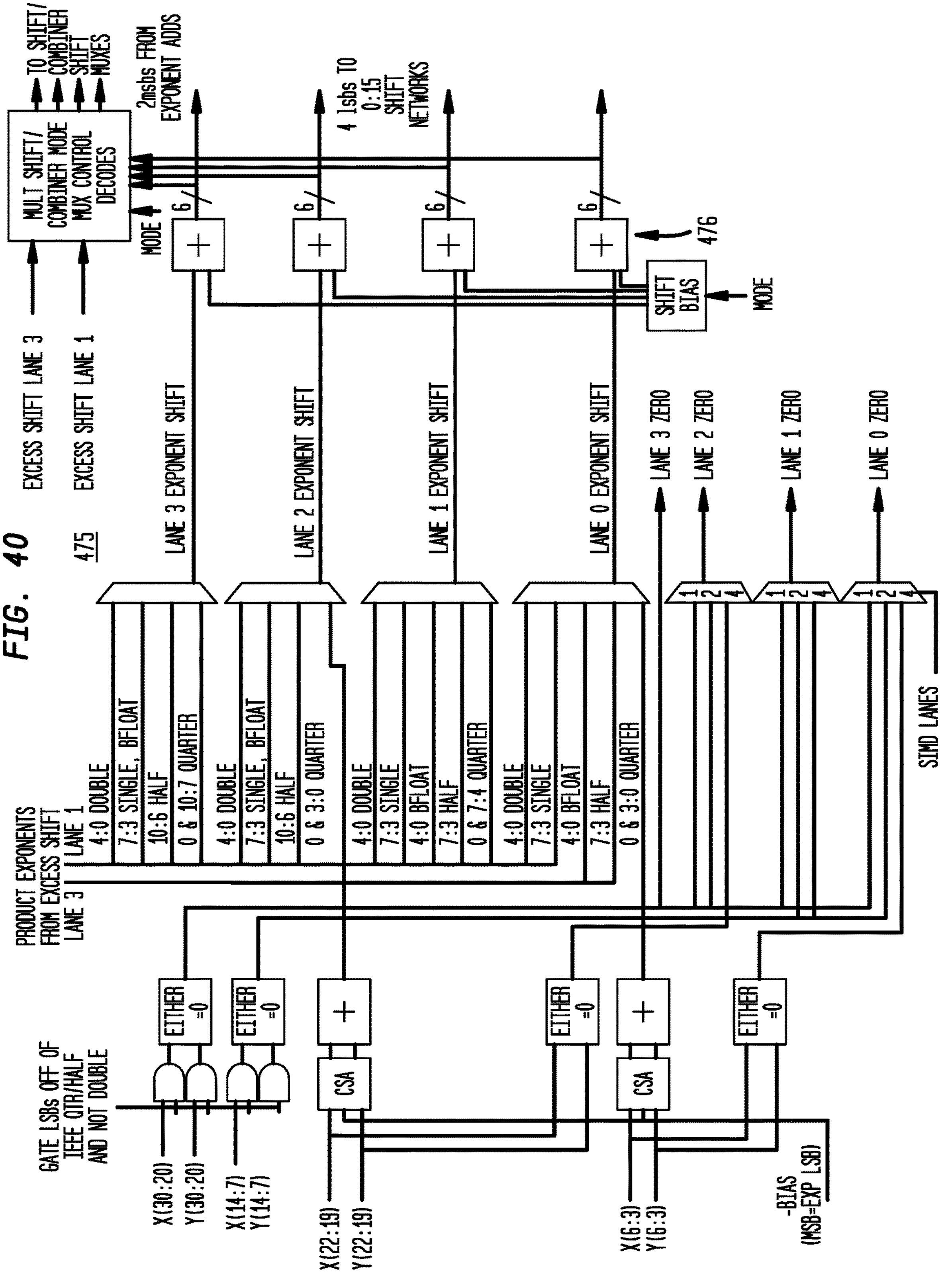

FIG. 40 is a block diagram illustrating multiplier (and shift/combiner) exponent logic 475. A separate product exponent should be maintained for each SIMD lane. The product exponent is the sum of the multiplicand exponents for that lane. Additionally, each multiplicand exponent should be checked to see if it is equal to zero, and if either one in the lane is zero, that lane's product is to be zeroed out since de-normals are treated as zeros. Each lane's exponent adder 476 may also be extended by one bit in order to detect an exponent overflow. If implemented, the exponent overflow can be directed out the RAE's suffix (and/or conditional flag) output 405 for use in generation of infinities using additional resources.

The least significant product exponent bits for each lane are added to a mode specific bias stripped off and provided to the shift-combiner logic to control the exponent pre-shift. For modes where multiple products and/or Z-input addends are summed (dot and complex multiply), the maximum product exponent should be selected, and then each product should be right shifted by the difference between its exponent the maximum exponent to align the mantissas.

The computation of the maximum exponents is discussed in the previous section on excess shift computation. The shift to align the mantissas is a right shift by a multiple of 32 bits. Shifts of 128 bits or more underflow the adder width, so the addend or product is replaced with zero when the excess shift exceeds 3*32 bits. The maximum radix 32 exponent is passed on to the accumulator as the exponent of the sum of products and addends. FIG. 40 shows the multiplier exponent logic 475, which is described in further detail below.

There are four separate exponents maintained for each RAE 300 in order to accommodate all the SIMD modes. Four lane modes use all four of the exponents, two lane modes use two of these (lanes 1 and 3), and the remaining modes use only one (lane 3) of the exponents. Double precision floating point format has an 11-bit exponent and uses only the lane-3 exponent logic. Single precision floating point has an 8 bit exponent and also uses only the lane 3 exponent logic with the 3 LSBs disabled by masking to 0 leaving 8 bits active. Bfloat16 is 2 lane SIMD with 8 bit exponents. It uses lane 3 with 3 lsbs masked for the upper lane and the 8 bit lane 1 exponent for the lower lane.

Half precision also is 2 SIMD lanes and uses lane3 and lane 1, however the half precision exponent is 5 bits, so all but the most significant 5 bits for these lane exponents are masked for half precision, and there is no excess shift possible. Quarter precision is four lane SIMD with a four bit exponent. The lane0 and lane 2 exponents are only used for quarter precision, so the exponent logic for those lanes is fixed at 4 bits. The lane1 and lane 3 exponents are masked to use only the 4 MSBs in each of those lanes for quarter precision. As with the half precision IEEE format, there are no excess shifts possible since the exponent is less than 6 bits.

There is also zero detection logic for each multiplicand exponent, masked to match the current mode exponent width. If either of the multiplicand exponents for the lane is zero or the excess shift is greater than 3*32, a force lane zero signal is generated. A set of multiplexers select the appropriate force zero signal to apply to each lane by SIMD mode.

A second set of multiplexers select out the appropriate 5 LSBs from the appropriate product exponent(s) to control the radix 32 shift in each lane. The multiplier product is not renormalized before the accumulator, therefore there is also no need to adjust the product exponents. The mantissa data path width accounts for the extra bit left of the radix point, as well as for growth when summing products.

The lane shifts are computed by summing the lane exponent 5 lsbs with a mode-dependent shift bias. The low four bits of that sum directly control the initial 0:15 shift. The upper bits of the biased exponent are added to the excess shift distance from the excess shift logic for lanes 1 and 3 and then that sum is recoded to the shift controls for the multiplexers in the combiner stages.

The shift distances for the post-multiply shift-combiner are tabulated in FIG. 25 (in which E4, E5 refers to 4 and 5 LSBs of a product exponent, respectively; a negative shift is a right shift, positive shift is left; "zero" indicates the lane is forced to all '0's; and "0" indicates zero shift). It should be noted that the shift distance is affected by mode, exponent LSBs and in some modes by the difference between the exponent associated with the shifter and the maximum exponent of the summed values.

Figure 41:
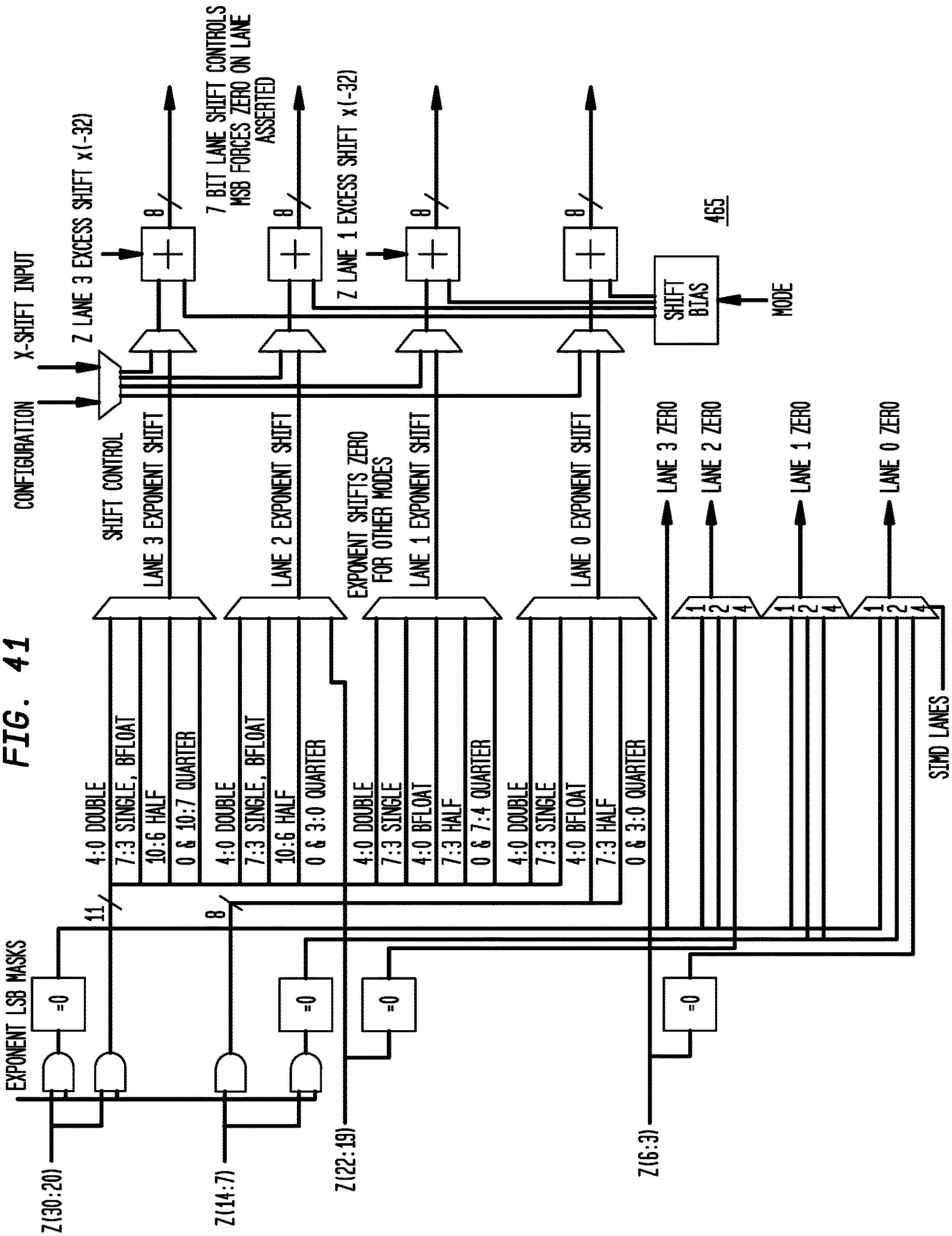

FIG. 41 is a block diagram illustrating Z-input exponent logic 465. The Z shifter 330 should align the Z inputs with the shifted multiplier sums of products in each lane in order to sum the product and Z component. The multiplier 305 products are pre-shifted to an exponent that is a multiple of 32 in order to eliminate the least significant 5 exponent bits. Similarly, the Z-input exponent logic 465 pre-shifts the Z input data to eliminate the 5 least significant exponent bits using the 5 exponent LSBs to effect the shift. A mode-dependent shift bias is added to the shift in each lane to effect the correct shift to place the mantissas properly in the lane. The exponent logic also has the input for the integer shifts specified either from the configuration or the X-input.

The modes that have more than 5 exponent bits (double and single precision IEEE and BFLOAT16) require additional shifting beyond the pre-shift to align the Z input to the multiplier. The additional shift is determined by the excess shift logic, discussed previously in the exponent excess shift section. The excess shift, multiplied by −32 is added to the biased shift to arrive at a 0:127 bit shift distance for each lane. The shift bias by lane, tabulated by mode is detailed in FIG. 29A. The shift sum is 8 bits with the extra msb used to detect a shift that exceeds the 0:127 bit shift range. That shift overflow is used to force the lane to zero when it is shifted more than 127 bits.

The exponent logic also has a compare to zero circuit for each input lane's exponent to detect the zero exponent. For lanes 1 and 3, the exponent LSBs are masked depending on mode to select 11, 8, or 5 bit exponents. Lanes 0 and 2 are either no exponent or a 4 bit exponent only. The exponent equal zero detects for each lane are selected by mode selectors to generate the zero lane logic, whose output is combined with the shift overflow for the lane (not shown) to generate a force lane zero signal for each lane.

8. Accumulator 315

Figure 42:
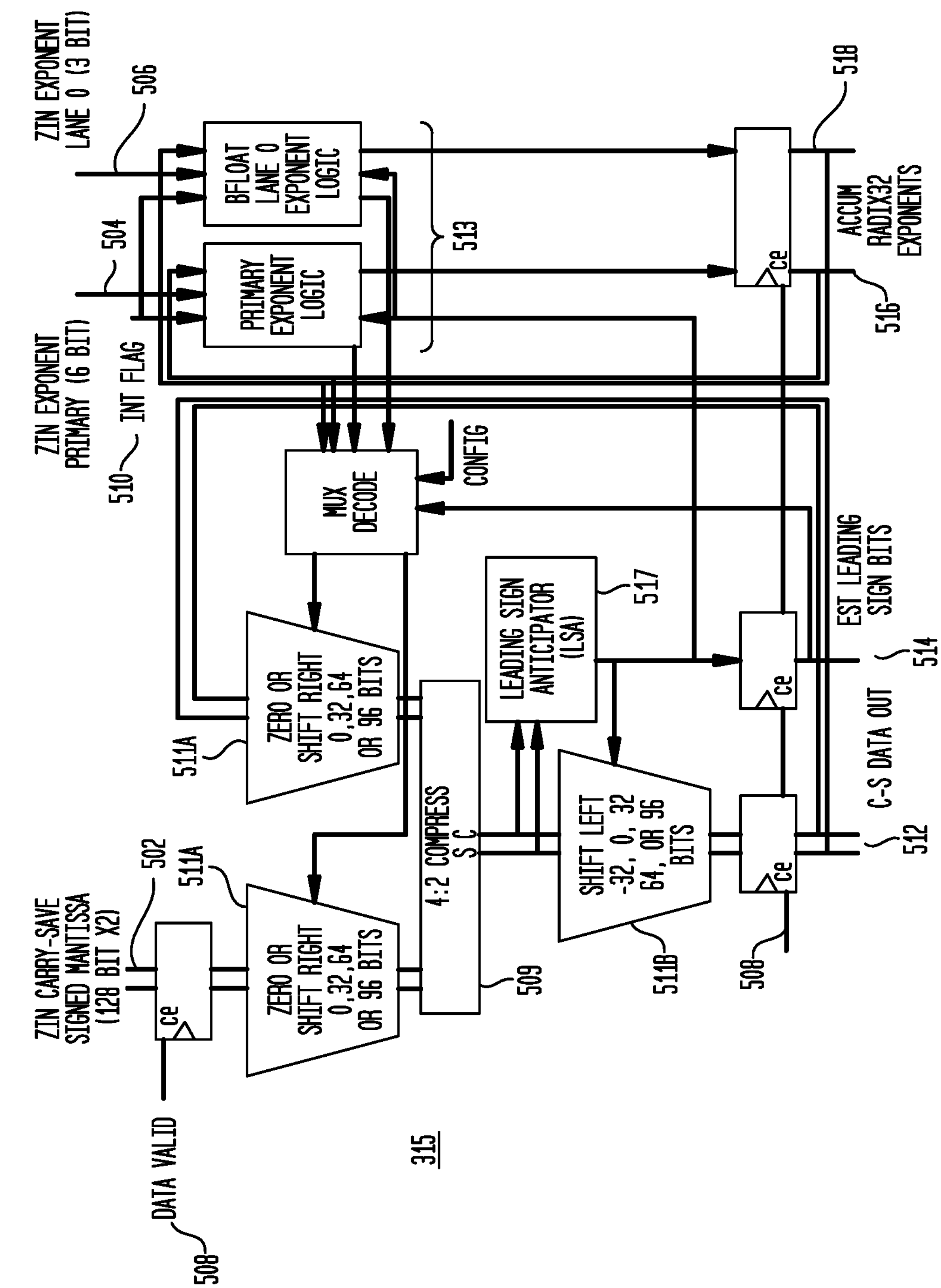

FIG. 42 is a block diagram illustrating an accumulator 315. The accumulator 315 is a fused 128 bit accumulator designed to accumulate sums of products presented by the multiplier-shifter-combiner network 310. The accumulator 315 is multi-mode, offering various floating and fixed point formats, and supports one, two and four lane SIMD operation.

The accumulator is a registered adder with one input fed by its previous output and the other by the multiplier shift-combiner network 310 logic (which is the sum of the Z input and products from this RAE 300 multiplier 305 and attached RAE 300 multiplier products) arranged to sum successive inputs. The accumulator 315 input, output and internal data path is in carry-save format. The accumulator 315 supports one 128 bit, two 64 bit or four 32 bit integer arithmetic lanes, or either one 128 bit (IEEE double or single) or two 64 bit (Bfloat16) floating point lanes. The accumulator 315 includes the accumulator exponent arithmetic 513 and shifters 511 to support radix-32 exponents (shifts by multiples of 32 bits). The shifters 511 are responsible for renormalizing 32 bit left shifts as well as for right shifts by multiples of 32 bits on the smaller of the multiplier input (Z input) or the accumulator feedback in order to align the radix points for addition.

In summary, the accumulator 315 operates to:

1. Sum successive inputs in a chosen format;
2. Support integer accumulation in one 128 bit, two 64 bit and four 32 bit lanes;
3. Support IEEE double and single precision floating point accumulation (one lane);
4. Support two lanes BFLOAT16 floating point accumulation;
5. Right shift floating point previous accumulated sum or Z-input by multiple of 32 bits (shift the one with the smaller exponent) to align radix points in preparation for addition;
6. Segregate lanes when operating in 2 or 4 lane modes with carry blockers and shift blockers as appropriate;
7. Compute and maintain accumulator exponent for each floating point lane. Exponent is radix32 exponent, which is 3 bits except for doubles when it is 6 bits;
8. Left shift accumulator output by multiple of 32 bits to renormalize radix32 value (and adjust accumulator exponent accordingly);
9. A single register delay around accumulator loop with 1 GHz timing;
10. Floating point right shifts should set auxiliary rounding bits in each lane to support round to even;
11. Extra bits on left should keep adder overflows and be sensed to effect a right shift and exponent increment to correct overflow for floating point;
12. Integer overflow should be detected and latched with sign and passed to final adder logic for integer saturation logic;
13. Zeroize either Z input or accumulator feedback when right shifts exceed lane width;
14. Initialize accumulator by forcing feedback input to zero concurrent with first valid input on Z input;
15. Allow for fused multiply-add (no accumulator) by holding Initialize condition for all inputs;
16. Provide Leading Sign Anticipator output to final adder. Leading sign anticipator indicates n or n−1 repeated sign bits (used to control internal shifts by multiples of 32 bits and to control finer shifts in final adder);
17. Accumulator Z input and output are registered; and
18. Convert integer to float, 1, 2 or 4 lanes (when attached to final add logic)

Referring to FIG. 42, for fixed point operation, the accumulator shifts are all forced to zero shift and the exponent register is ignored or unused. When the initialize flag is '1', the accumulator feedback's shift right logic forces the feedback accumulator value to '0', allowing the accumulator to copy the value present at the Zin input in 2's complement carry-save form. When initialize is '0', the current value of the accumulator output register is fed to the right input to the 4:2 compressor 509, unshifted where it is added (in carry-save form) to the unshifted Zin input data, and the carry-save sum is returned to the accumulator register. If the add results in an overflow into the extra MSBs, overflow flags for the offending lanes are set and remain until the accumulator is initialized again. Fixed point operation permits 2 (64 bits each) and 4 (32 bits each) lane SIMD modes in addition to the default 128 bit single lane mode. For multiple lanes, the 4:2 compressor 509 has carry-blocking gates between each lane and an auxiliary MSB attached to each lane to detect overflows. The input shifters 511A are always set to zero shift for fixed point accumulation. The output shifter 511B may be used at discretion of the designer for selecting one of the four 32 bit fields for output if timing and functional requirements can be met in order to reduce logic gate count.

The accumulator uses a Radix-32 exponent to simplify the shift logic within the critical accumulator loop. The incoming data is pre-shifted to the left up to 31 bits so that the low order five exponent bits become zero. Those zeroed exponent bits are dropped, leaving only the exponent bits to the left. all alignment and normalizing shifts within the accumulator are done in multiples of 32 bits. This implementation reduces the layers of shifters within the accumulator and also considerably reduces the accumulator's exponent logic, helping to close timing. The IEEE half and quarter precision formats (which have five and four exponent bits respectively) are effectively converted to integers by the radix-32 exponent translation that takes place in the shift-combiner and Z-shift logic. For these two formats, the accumulator is operated in the appropriate integer mode. The accumulator design omits SIMD Bfloat, as that mode is a special case requiring considerable extra hardware. The accumulator floating point mode is always single lane, double precision which is rounded down to single precision at the final adder when single precision is selected. For integer modes, the accumulator may be operated as a single 128 bit lane, two SIMD 64 bit lanes, or four SIMD 32 bit lanes. Floating point additions require the radix point for both addends be the same. That implies that one of the addends should be shifted relative to the other until the exponents for both match. The design selects the adder (4:2 compressor on diagram) input with the smaller exponent for right shift by the number of 32 bit shifts necessary for alignment. Each 32 bit right shift corresponds to adding 1 to the exponent associated with that input. The exponent logic computes the direction and distance of the required shift and causes the shift logic to right shift the smaller input by the correct multiple of 32 bits. For shifts of 128 bits or more, the smaller input is shifted off the 128 bit width of the adder, so larger shifts zero the input instead of shifting it. Shifting also sets added IEEE round, guard, and sticky bits at the lsb end of the 128 bit accumulator to support the IEEE round to nearest even mode. For floating point 2 lane SIMD (used only for BFLOAT16), the 3 bits for rounding are appended onto both lanes' LSBs. When the signs of the two addends are opposite one another, it is possible for the accumulator result to have more leading sign bits than either of the inputs. If the number of leading sign bits is large enough to allow a left shift without loss of sign, the output shifters left shift the data by a multiple of 32 bits to eliminate excess leading sign bits, thereby renormalizing in a radix-32 exponent system. The accumulator exponent is decremented by the number of 32 bit shifts to adjust the exponent for the left shift. The exponent logic is 8 bits wide; 6 bits (11-5 bits) to accommodate IEEE double exponents, and an additional two bits to detect exponent overflow and underflow.

The accumulator 315 has 3 additional bits on the left sufficient to absorb an overflow (additional bits also exist in latter stages of the multiply shift-combiner logic chain). If an overflow into those bits occurs, the accumulator output shift performs a right shift by 32 bits and attendant increment of the accumulator exponent to fix the overflow. The accumulator 315 does not support SIMD floating point, as Half and Quarter precision IEEE are converted to integers by the radix-32 exponent conversion. We have opted to not support Bfloat16 SIMD by the accumulator in order to substantially reduce the accumulator complexity. For floating point SIMD-2 (BFLOAT16 only), the extra MSBs are appended to both lanes. For the floating point SIMD-2 mode, the lane blocker at bit 64 in the 4:2 compressor is activated to prevent lane 0 from affecting the sum in lane 1, and the shifters all require additional gating to replace data shifted from the low lane to the high lane with 0's and data from the high lane to the low lane with extended sign.

The accumulator 315 has signed mantissa and primary and secondary exponents (to support SIMD-2) along with data valid from the multiplier-shift-combiner network 310. It also has configuration, initialize accumulator flag, reset and clock inputs, all common to all SIMD lanes. Block outputs include accumulated data, primary and secondary exponents, estimated leading sign bit count, and accumulator data valid flag.

The Zin Signed Mantissa input 502 portion is presented in carry-save form (two 128 bit vectors (actually extended 3 bits at lsb of each SIMD-2 lane, and TBD bits at msb of each SIMD2 lane and TBD bits at msb of each SIMD4 lane). The input is registered at the entry to the accumulator logic, and that register is clock-enabled by the data valid input signal. The Zin mantissa may be one 128 bit lane, two 64 bit lanes, or 4 32 bit lanes, with auxiliary extensions for IEEE rounding at lsbs and extended sign for overflow detection/correction at the msbs of each lane. The data is signed 2-s complement expressed in carry-save form.

The 6 bit Zin primary exponent input 504 is the radix 32 exponent corresponding to the 11 bit IEEE double exponent. It is also used as a 3 bit radix-32 exponent for IEEE singles and the upper lane (lane 1) for SIMD-2 BFLOAT16. The exponent is excess-127 converted to radix 32 for BFLOAT and IEEE single and excess-1023 for IEEE doubles, also converted to radix-32. The exponent may be extended by one bit to assist in detection and treatment of exponent underflows and overflows.

The 3 bit Zin secondary exponent input 506 is the radix 32 exponent corresponding to the 8 bit BFLOAT exponent corresponding to Lane 0 when floating point SIMD-2 mode is selected. The secondary exponent input is ignored for all other modes, however, the designer may require primary exponent be duplicated on secondary input for other modes in order to simplify the logic inside accumulator critical timing loop. The exponent may be extended by one bit to assist in detection and treatment of exponent underflows and overflows.

The accumulator logic holds its current state except when the Zin data valid 508 is asserted '1'. The '1' condition indicates the input data on the Zin mantissa, and exponents are valid for the selected mode. If the initialize flag is '1' concurrent with the Zin data valid, the value of Zin is copied to the accumulator register without adding anything (it may get a normalizing left shift of −32, 0, 32, 64, or 96 bits if it has an overflow (right shift) or enough leading sign bits resulting from subtraction in the shift-combiner to allow a normalizing shift. When the initialize flag is '0' concurrent with the Zin Data Valid='1', the data on the Zin inputs is added (with appropriate alignment shifts) to the current value of the accumulator output.

In a representative embodiment, a tlast flag 510 is used to cause the accumulated sum to be output and reinitializes accumulator with next valid input. Tlast is set to '1' for last valid sample of a series of samples accumulated. The accumulator asserts its output data valid when outputting the sum to which that last input sample was added, and then reinitializes with the next valid data input (reinitialize means it loads the zin data without adding anything to it). If Tlast is brought to '1' without data valid also '1', then the accumulator reinitializes on the next data-valid without outputting a data valid.

In an alternative embodiment, an initialize flag 510 causes the accumulator feedback into the adder to be forced to zero so that the value on Zin is copied to the accumulator. The copied value will be renormalized if there is an overflow or more than 31 leading zeros in the data at the input and the mode is floating point. The initialize flag also gates the Accumulator data valid so it is only asserted on the same clock the accumulator is getting written with new initial data. That gating is overridden by the cumsum configuration bit such that there is an accumulator data valid for every valid input.

The 128 bit mantissa portion 512 of the output is presented in carry-save form (two 128 bit vectors). The output may be one 128 bit lane, two 64 bit lanes, or four 32 bit lanes. The data is signed 2-s complement expressed in carry-save form. Data is only valid when accompanied by an Accumulator Data Valid flag. Data output is asserted one clock after data valid in, and the data out is the accumulated value prior to replacing the accumulated sum with the new initial data into the accumulator register.

The estimated leading sign bits output 514 indicates the number of leading sign bits at the accumulator before the internal 32 and 64 bit renormalizing left shifts or the 32 bit overflow correction right shift. This is a coded output indicating the number of repeated sign bits at the accumulator output. The estimate may have an error of one bit, indicating n or n−1 repeated sign bits depending on the distribution of bits between the carry and save vectors. The encoded leading sign bits is used by the final adder logic to renormalize the data and exponent to IEEE format. The final adder logic (340) decodes the data to determine if an additional shift is required to complete the renormalization.

The primary accumulator exponent output 516 is nominally 8 bits excess 127 for IEEE single and bfloat or 11 bits excess 1023 for IEEE double. These are changed to a 12 bit excess 2047 code for all floats to allow for easier detection of floating point overflows and underflows to create exception flags. The 12 bit exponent is converted to a 7 bit radix-32 exponent by the shift combiner and Zinput shift circuits by left shifting the mantissa to zero out the 5 lsbs of the exponent and dropping those zeroed bits. The accumulator exponent output is undefined when the accumulator configuration is not one of the floating point modes.

The secondary accumulator output 518 is the most significant 3 bits of an 8 bit excess-127 exponent used only for the floating point SIMD-2 (BFLOAT16 only) mode. This output is undefined in other modes, however the designer may require these to duplicate the lsbs of the primary exponent output if it simplifies logic in either the accumulator or the final adder. The exponent may be extended by one bit to assist in the detection and treatment of exponent underflows and overflows. The exponent output is also undefined when the accumulator is operating in one of the fixed point modes.

As an option, an accumulator data valid output indicates valid data on the accumulator outputs including the leading sign, mantissa, and exponents when it is a '1' (some of these fields are undefined for some modes). Data is considered invalid otherwise. The accumulator data valid is '1' either 1 or 2 clocks after data valid in depending on configuration, and is gated by the initialize flag and cumsum configuration.

The configuration may include the following controls, for example:

1. SIMD setting sets the number of lanes for fixed point operation 00=1 lane, 10=2 lanes, 11=4 lanes;
2. Float selects fixed or floating point. When floating point, SIMD is internally forced to "00";

3. No accumulate bit equivalent to holding init=1 (passes input to output every cycle);
4. Cumsum bit for cumulative sum, which outputs a data valid each time an input is added to the sum;
5. Cumsum control bit;
6. Format bits (3) set numeric format, fixed/float, number lanes;
7. No accumulate bit (this may be taken care of outside accumulator), equivalent to holding init=1; and
8. Data valid delay bit—may be combined with cumsum.

The cumsum configuration bit, when set causes the accumulator 315 data valid out to be '1' corresponding to every Zin Data Valid. This permits generation of a cumulative sum, such as may be used for counters and integration. If cumsum='0', the data valid is only valid on the clock cycle before the accumulator register is updated with new valid data that arrived concurrent with the Initialize flag='1'. Cumsum needs to also delay data valid out by one clock so that output is accumulated sum after adding newest input. Example format configuration sets floating and fixed point formats and number of lanes are provided in Table 16.

TABLE 16

| code | fixed | Lanes | format |
|---|---|---|---|
| 000 | 0 | 1 | IEEE single |
| 001 | 0 | 2 | 2× Bfloat16 |
| 010 | 0 | 1 | IEEE double |
| 011 | 0 | 4 | illegal |
| 100 | 1 | 1 | INT 128 |
| 101 | 1 | 2 | 2× INT64 |
| 110 | 1 | 1 | illegal |
| 111 | 1 | 4 | 4× INT32 |

The no-accumulate configuration bit forces the accumulator 315 feedback to be always zero when set to '1'. This in effect makes the accumulator a normalizing pass-through for floating point, and a simple pass-through for fixed point. Internally, this is equivalent to forcing the initialize flag to be always '1'. This configuration bit may be eliminated if there is an external means to force the initialize flag to '1' (in the condition flag logic).

Figure 43:
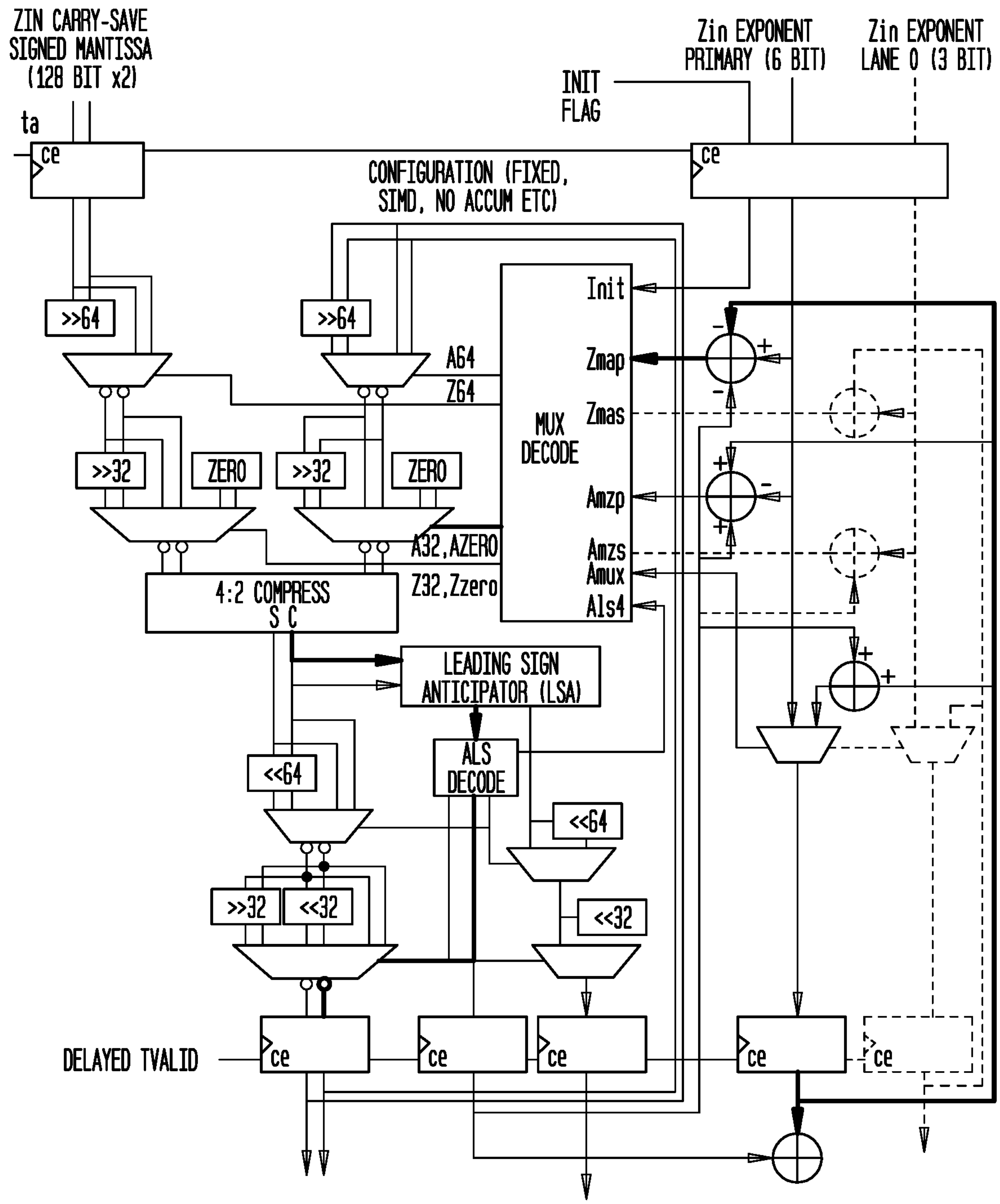

FIG. 43 is a circuit diagram illustrating an accumulator 315, with the exponent for the second lane (Bfloat only) greyed out, and highlighting the critical path. The RAE accumulator 315 uses a radix 32 shift in order to minimize the logic levels inside the critical feedback path from the accumulator output register back through the accumulator to the register.

Figure 44:
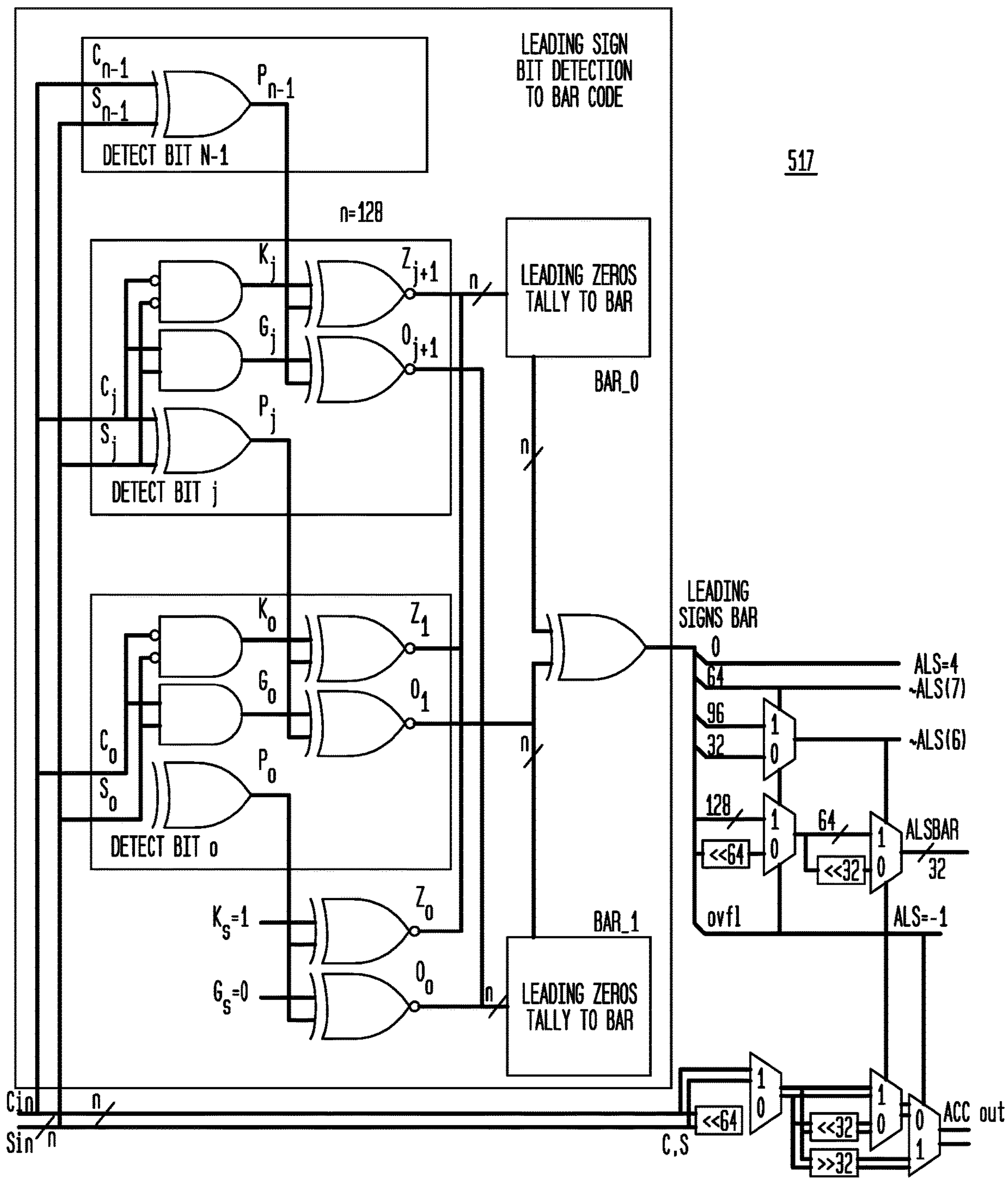
Figure 45:
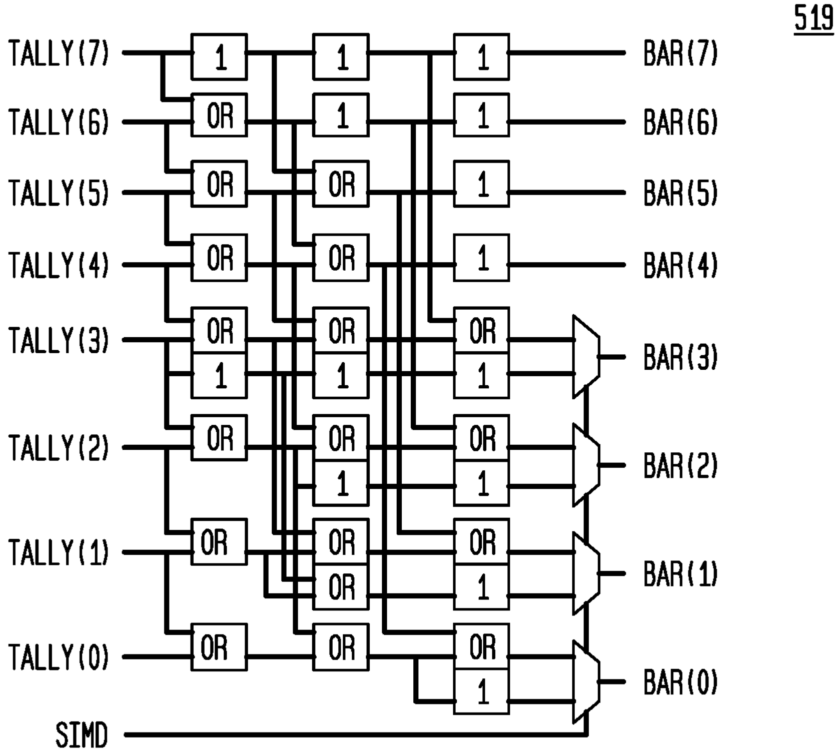

FIG. 44 is a circuit diagram illustrating a leading signs and N*32 shifts circuit 517 used in the accumulator 315. FIG. 45 is a circuit diagram illustrating a tally to bar circuit 519 structure with depth log 2(n) with logic added for SIMD split, also used in the accumulator 315.

9. Boolean Logic Circuit 325

Figure 46:
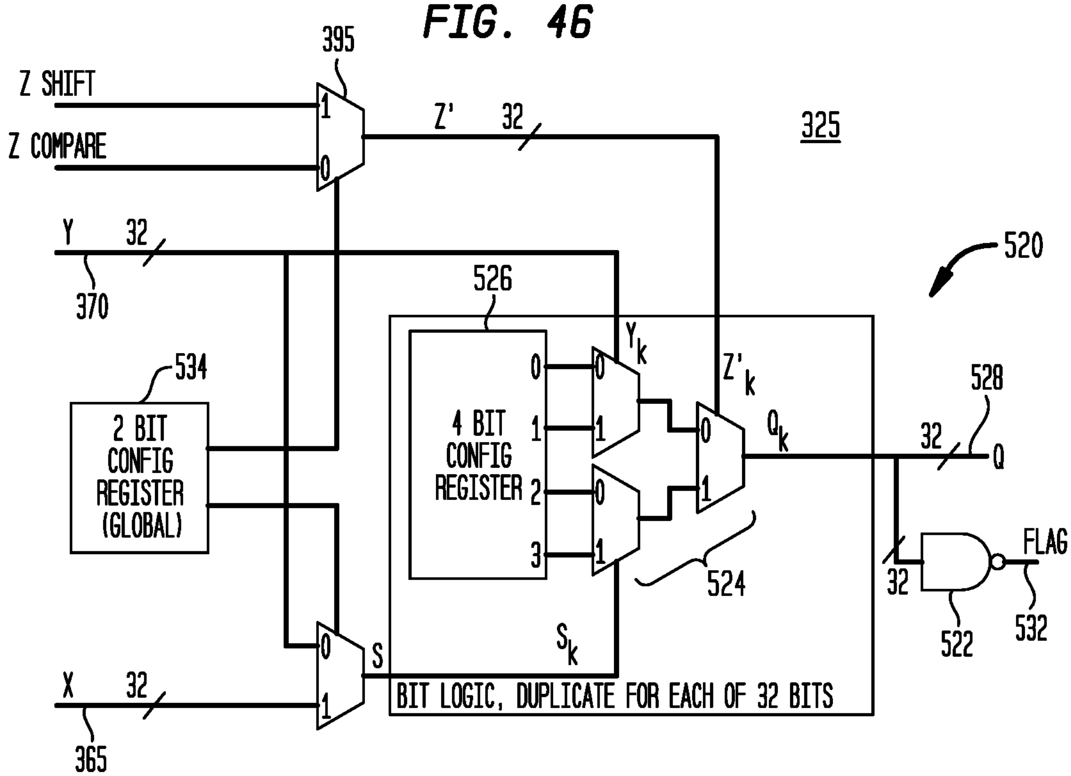

FIG. 46 is a circuit diagram illustrating a Boolean logic stage 520 of the Boolean logic circuit 325, and can have 32 bits configured independently, using a Boolean logic stage 520 for each bit input to the Boolean logic circuit 325. The Boolean logic circuit 325 provides a configurable bitwise Boolean logic circuit 325 used to supplement the RAE 300 ALU functions with a full set of 2 input Boolean functions. Each bit on the 32-bit data path has an independently programmed Boolean logic stage 520 capable of any 2 input Boolean function of the input bits in the same bit position. The Boolean logic circuit 325 also offers a method of providing a bitwise 2:1 select controlled by the X input 365. The 32-bit output is supplemented by a 32 input NAND 522 of the 32-bit output, sent out to the condition flag output logic.

The Z input has connections from the index counter in the compare block 320 via the Z rotator to permit that counter's use as an address generator. That path also has a selectable wired bit-reverse before the Z input shifter for use with FFT's built up from the mixed radix algorithm.

The Boolean logic circuit 325, besides general use, is specifically designed to permit count permutation to generate complex address sequences, including bit-reversed, masked and rotated (in combination of Z shift logic) permutations of an input count, which can also be generated in the RAE 300 by the index counter inside the compare block 320. The Boolean logic is also designed to permit a simple field merge comprising a rotation of one source and the bitwise selection between a rotated and a second fixed source.

The Z input is one of the primary 32 bit inputs to the Boolean logic circuit 325. It is connected through a selector 397 (illustrated as the third data selection (steering) multiplexer 397) to the either Z input shifter 330 output or to the compare block 320 Z output (which doubles as the count output). Since this Boolean logic circuit 325 includes the input selector, there are separate Z-shift and Z-compare inputs on the Boolean logic circuit 325. The bits of the Z input serve as one of the two Boolean variables at each bit in logic mode, or as the select variable for select mode. When Z is '0' the output is one of the two low order register bits, as selected by the Y input 370. When Z is '1', the output is one of the two high order register bits as selected by the Y input in logic mode or the X input 365 in select mode.

The Y input 370 is one of the primary 32 bit inputs to the Boolean logic circuit 325. It is connected to the Y output of the compare block 320 (which can pass the Y input through). The Y input 370 selects the even register bits when '0' or the odd register bits when '1'. The upper two bits (selected when Z='1') are addressed by Y when in logic mode or by X when in select mode. The compare block 320 can be programmed to connect either the Y or Z RAE input to the Y output, so provides a way to do bitwise operations with Z and shifted Z.

The X input to the Boolean logic circuit 325 is an auxiliary input used only when the select mode is set. A one-bit function of X defined by the upper two register bits is selected when Z is '1' and the select mode is set. Otherwise, the X input is ignored.

The configuration interface 524 serves to access the configuration register 526 bits. There are 4 configuration bits for each of the 32 bits of the Boolean logic circuit 325 that independently set the Boolean function for each bit position. There are two additional configuration bits (534) to globally set the mode to normal or select mode and to set input select input from either Z shift or comparator for Z.

The Boolean logic circuit 325 has a 32-bit Q output 528. Each output bit is the result of the Boolean logic function for that bit programmed into the configuration registers. The logic function is modified when in select mode to replace Y with X for part of the select logic inputs. The flag output 532 provides a means to create a one-bit output that is a function of any or all of the X, Y and Z input bits. The flag output is the 32 bit NAND function of the 32 bit Q output.

Configuration of the Boolean logic circuit 325 comprises a 4×32 register file 526 holding the 4 bit logic configuration for each bit slice, and a 2 bit global register 534 with one bit that selects logic (0) or select mode (1) for the entire block, and one bit to select the source for the Z input (0=compare logic, 1=Z-shifter). The 4 bit configuration for each bit slice sets the output values for the four possible combinations of the Y and Z bit inputs to that bit slice when in logic mode. For select mode, the value of the X input is substituted for the value of the Y input when the Z input is '1' when selecting the register content to output. The bit function by register code and mode is tabulated below in Table 17.

For logic mode, the logic for each bit slice is a 4 input selector addressed by the Z and Y bit inputs to the slice. For a 2-input logic function, there are 4 possible input combinations. The Z input has a weight of 2 and the Y input has a weight of 1 for selection of the register bit. By appropriately setting the four configuration register bits, any Boolean function of 2 inputs can be programmed when the mode is set to logic mode.

In select mode, Z selects between 1 bit logic functions of X and Y. For select mode, the first layer high order selector's select input is changed from the Y input to the X input so that the Z input selects the one input function of Y (0, ~Y, Y, or 1) set by registers 0 and 1 when Z='0', or the one input function of X set by registers 2 and 3 when Z='1'.

TABLE 17

| Register content | Logic Mode function | Select mode function |
|---|---|---|
| 0000 | 0 | 0 |
| 0001 | Y NOR Z | Z ? 0: ~Y |
| 0010 | Y AND ~Z | Z ? 0: Y |
| 0011 | ~Z | ~Z |
| 0100 | Z AND ~Y | Z ? ~X: 0 |
| 0101 | ~Y | Z ? ~X: ~Y |
| 0110 | Y XOR Z | Z ? ~X: Y |
| 0111 | Y NAND Z | Z ? ~X: 1 |
| 1000 | Y AND Z | Z ? X: 0 |
| 1001 | Y XNOR Z | Z ? X: ~Y |
| 1010 | Y | Z ? X: Y |
| 1011 | Y OR ~Z | Z ? X: 1 |
| 1100 | Z | Z |
| 1101 | Z OR ~Y | Z ? 1: ~Y |
| 1110 | Y OR Z | Z ? 1: Y |
| 1111 | 1 | 1 |

The Z input is taken after the Z-shift with options to input either the RAE Z input or the compare logic's Z-output (which can connect to the compare logic's index count logic). The Z connection on the input side of the shifter also has a connection for a wired bit reversal of the 32 bit input. This arrangement provides a very flexible address generation capability that can shift or rotate an address field anywhere in the 32 bit range, can selectively mask bits with 0 or 1, or invert count bits. A wired bit reverse preceding the Z-shift also allows for generation of the rotated bit-reversed sequences needed for mixed radix constructed Fast Fourier Transforms. The output of the Boolean logic circuit 325 also has a 32 input NAND gate 522 for aggregating bits to provide a single bit output 532 for uses such as a decode or data dependent condition flag. This may be expanded to provide a four bit output flag each pertaining to the 8 bits in each SIMD lane and a combining network to provide one bit per lane regardless of SIMD size, for example and without limitation.

10. Compare Circuit 320

Figure 47:
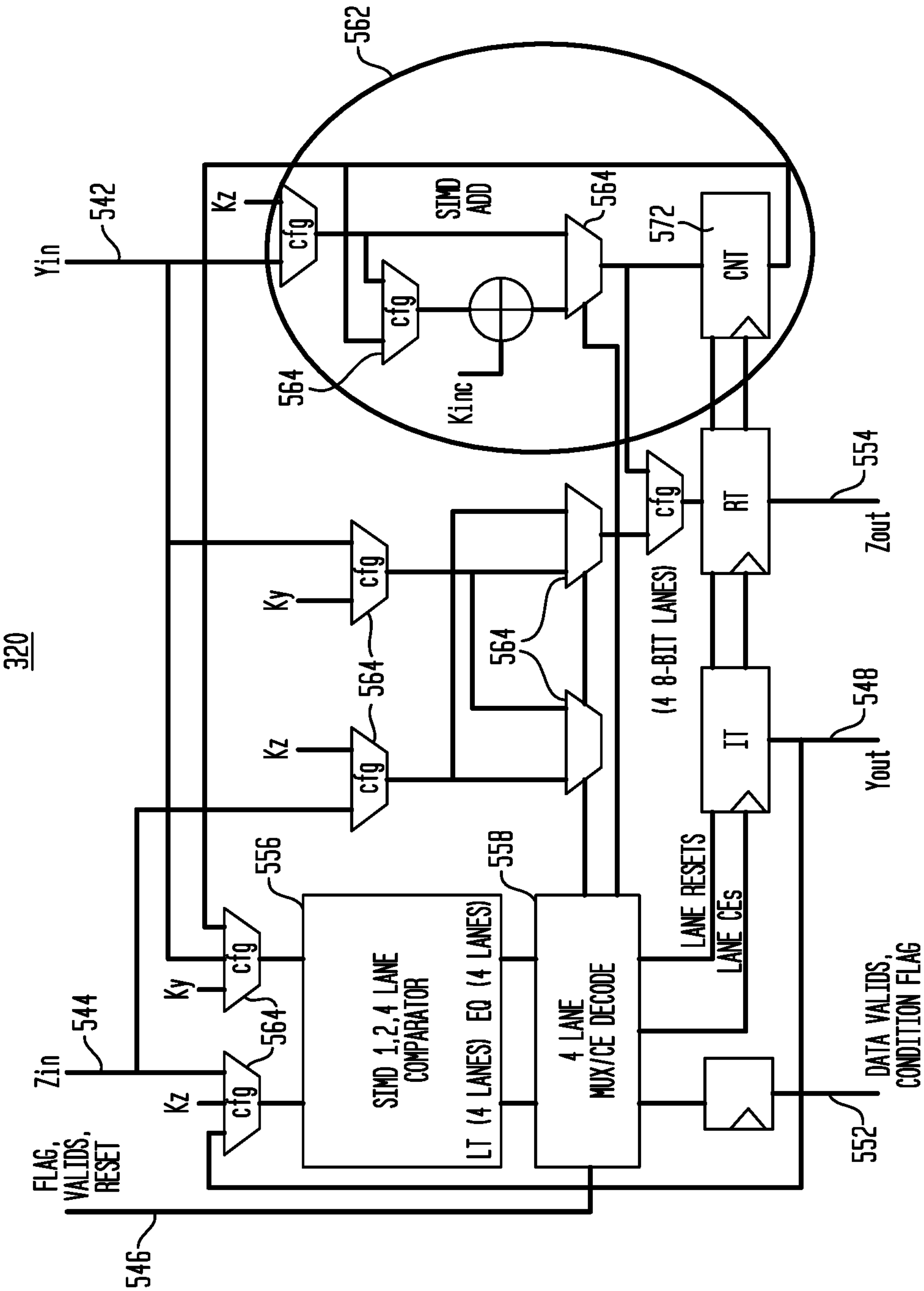
Figure 48:
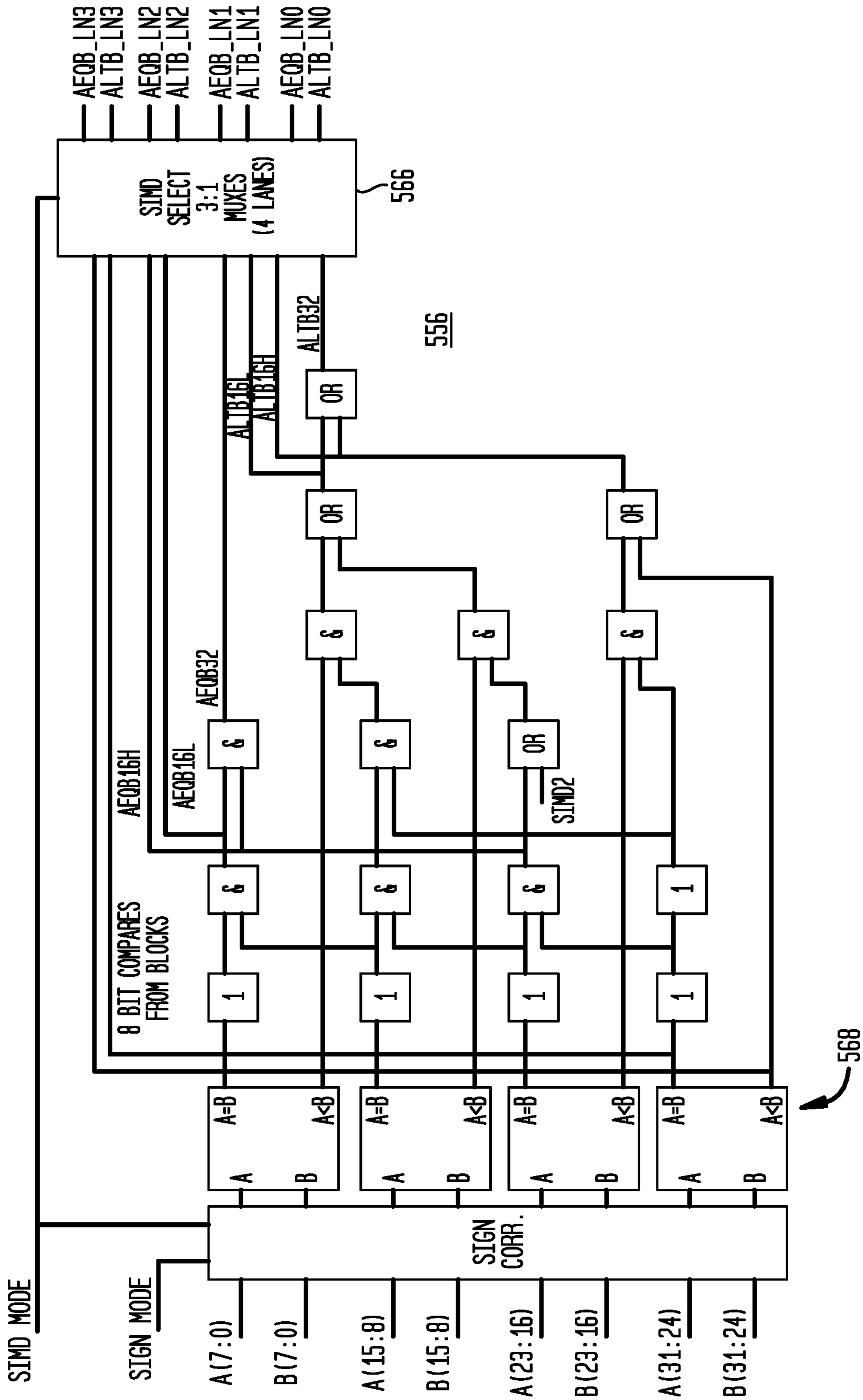

FIG. 47 is a high-level circuit and block diagram illustrating a min/max sort and compare circuit 320 (also referred to more generally as a compare circuit 320). FIG. 48 is a detailed circuit and block diagram illustrating a comparator 556 of a min/max sort and compare circuit 320. The compare circuit 320 adds the ability for the RAE circuit 300 to alter data flow and sequencing based on results of comparison of the inputs, internal index count and internal constants. The compare circuit 320 is separable to support 2 or 4 SIMD lanes using separate compare results for each lane.

This compare circuit 320 performs the following functions:

1. accumulate minimum in stream with index of first occurrence of minimum value;
2. accumulate maximum in stream with index of first occurrence of maximum value;
3. two input sort (with SIMD for 1, 2, 4 lanes), with a swap if larger;
4. a sample count, which can run concurrent with the accumulator 315 and reset at the same time;
5. zero all samples except when current index count matches index input, then it outputs other input;
6. threshold positive: samples larger than threshold pass, those less are replaced with a constant, and count samples above a threshold;
7. threshold negative: samples less than a threshold pass, those larger are replaced with a constant, and count samples below a threshold;
8. pass inputs unchanged (flow-through for input to the Boolean logic circuit 325);
9. pass only inputs meeting compare condition (gated data valid);
10. pass inputs only before trigger condition or after trigger condition;
11. equality and less-than flag outputs (SIMD for 1, 2, 4 lanes); and
12. generate an address count (with the ability to bit-reverse, rotate and mask using rotator and Boolean).

All modes above apply for all supported floating point, and signed and unsigned integers, and for 1, 2 or 4 SIMD lanes in 32 bit data, for example and without limitation. For the SIMD modes, each lane is treated independently in this block, though all lanes should share the same configuration and decoder mapping. When SIMD modes are selected, the 32 bit index count is also partitioned into a like number of SIMD lanes.

The Y input 542 is accompanied by Y_valid (546). A compare is not processed if either valid is '0' unless bypassed (generally when a constant or feedback is selected as an input). The 32 bit Z input 544 is sourced by the Z shifter logical output in order to be able to use the shifter for lane swapping as well as shifts or rotates as part of a fused compare operation. The most significant bit of the input is inverted when signed input is selected in order to properly use the unsigned comparator for signed inputs. The flag input (546) is an additional validation for the compare results, which can be used to terminate a streaming min or max, tag a sample (pass through), reset the counter or a trigger event and other control events. The flag input may be sourced from the FC 200 sequence counter or from a flag output of an adjacent RAE 300. The reset input (546) resets the counter and data output registers regardless of Y and Z valid when asserted '1'.

The Y output 548 is the primary data output. It is data selected from either the Y or Z input or the Y or Z constant registers. Selection of Y or Z source is dependent on the compare result and the programming of the result decode. Selection of live data or constant is independently set for Y and Z by the configuration settings. Y output valid (552)

indicates the Y output is valid to downstream blocks. The Y out valid signal is a programmable function of the compare condition, the input flag and the Y and Z data input valid signals. The programmable decodes also control the clock enable and reset for the Y output register, allowing the output to capture and hold data or count upon compare condition.

The Z Output 554 also has a Z output valid (552). The Z output is a secondary data output whose output is either the opposite of the Y output selection (Y in when Youtput is Zin and vice-versa), or the index count, depending on configuration settings. The Z out valid signal is a programmable function of the compare condition, the input flag and the Y and Z data input valid signals. The programmable decodes also control the clock enable and reset for the Z output register, allowing the output to capture and hold data or count upon compare condition. The condition flag output (552) is an auxiliary control signal that is a programmable logic function of the compare result, flag in, Y and Z data valid inputs, and reset. It can be used by downstream RAEs 300 as a condition flag control, and by the fractal core 200 sequencer to affect the sequencing. Care should be taken to include the pipeline latency when using the flag to control the FC 200 sequencer.

The compare circuit 320 has many modes of operation, which are defined by a set of configuration bits that select connections. The configuration also includes setting of three constant registers. Configuration comprises settings for seven data path selectors, selection of SIMD mode (2 bits), input sign type (2 bits), definition of the compare decode to controls mapping (49 bits), and setting of three 32 bit constant registers. Configuration is divided into configuration and constants. Configuration includes the 7 data path select bits, and the two SIMD mode select bits.

This compare circuit 320 comprises a SIMD magnitude comparator 556, data steering selectors 564 and registers, an adder/counter 562 (with counter 572), and a programmable decoder 558 to control the data and counter paths and registers. The 32 bit comparator 556 has modes for one 32 bit lane, two 16 bit lanes or four 8-bit lanes. It produces ‘Equal-to’ and ‘Less-Than’ outputs for each lane. The decoder 558 decodes the compare condition for each lane and gates it with valid and flag inputs to produce the data steering control for each lane and the counter 572, register flip-flop clock enables and resets for each lane for each of the data output registers and the counter register. The inputs to the comparator 556 may come from the block’s Y and Z inputs, Y and Z constant registers, or the Y output register for Z input or the counter register for Y input. This provides flexibility for generating counts based on compare conditions, ability to accumulate minimum or maximum, count occurrences and other uses.

Referring to FIG. 48, the magnitude comparator 556 determines relative magnitude of its two inputs and uses the result signals (equal and less-than) to control the steering of data in the rest of the block. The magnitude comparator 556 in its basic form compares two 32 bit words and produces two outputs: A equals B and A less than B from comparators 568. The comparator 556 includes partitioning gates to allow it to work as one 32 bit, two 16 bit or four 8 bit arithmetic comparators corresponding to 1, 2 or 4 SIMD lanes within the 32 bit word. A set of eight 3:1 muxes 566 select the compare tree outputs appropriate for each lane depending on SIMD mode. When less than 4 SIMD lanes, the signals output are duplicated and output separately for each 8 bit slice within a SIMD lane. Outside of the comparator and counter 572 logic, the rest of the block treats all data as 4 independent 8 bit lanes. There can be additional optimization available by replacing the 8 bit compares with the continuation of the tree structure down to the 1 bit compare at the input. The input layer is half-adders with one input inverted. Doing so reduces the depth of the tree by one gate layer and requires the addition of blocking gates for the SIMD4 mode similar to the one for SIMD2. The optimized tree has 258 2-input gates not counting buffers and a gate delay of 12 gates, exclusive of the sign correction and SIMD output select. An optimal binary compare’s delay and resource (2 input gate) metrics are $T(n)=2(\log(n)+1)$ and $C(n)=n\log(n)+3n-1$ respectively.

The comparator 556 also has correction for signed two’s complement and sign-magnitude inputs. The comparator 556 assumes both inputs have the same number system. For two’s complement, the comparison incorrectly compares negative values as greater than positive values. This is fixed by inverting the sign bit whenever the number system is two’s complement (regardless of sign). For sign-magnitude, inverting the sign makes negative numbers test correctly as less than positive numbers, but two negative inputs will give the opposite of the expected compare results because increasing the magnitude makes a negative number a greater negative. This is corrected to provide the correct compare results for sign-magnitude by always inverting the sign bit AND also inverting the remaining bits if and only if the sign is negative. This performs a 1’s complement of negative numbers, which maps −0 to −1, −1 to −2 and so on. While the number representation is changed, the change still yields the correct compare result; the negative numbers are decremented by 1 to allow room for the unique −0. The sign correction for each bit is tabulated in Table 18 for each SIMD mode as a function of signed mode. Normalized Floating point values will yield correct compare results when interpreted as sign-magnitude integers using the correction above. De-normal and infinity floating point values will also compare correctly using the sign-magnitude. correction.

TABLE 18

Comparator Input Sign Correction by Mode

| Bit(s) | SIMD1 | SIMD2 | SIMD4 | overall |
|---|---|---|---|---|
| 31 | signed xor 31 | signed xor 31 | signed xor 31 | signed xor 31 |
| 30:24 | sm*31 xor (30:24) | sm*31 xor (30:24) | sm*31 xor (30:24) | (31*sm) xor (30:24) |
| 23 | sm*31 xor (23) | sm*31 xor (23) | signed xor 23 | (SIMD4 ? signed:sm*31) xor 23 |
| 22:16 | sm*31 xor (22:16) | sm*31 xor (22:16) | sm*23 xor (22:16) | ((SIMD4 ? 23:31)*sm) xor 22:16 |
| 15 | sm*31 xor (15) | signed xor 15 | signed xor 15 | (SIMD1 ? sm*31:signed) xor 15 |

TABLE 18-continued

| Comparator Input Sign Correction by Mode | | | | |
|---|---|---|---|---|
| Bit(s) | SIMD1 | SIMD2 | SIMD4 | overall |
| 14:8 | sm*31 xor (14:8) | sm* 15 xor (14:8) | sm* 15 xor (14:8) | ((SIMD1 ? 31:15)*sm) xor (14:8) |
| 7 | sm*31 xor (7) | sm* 15 xor (7) | signed xor 7 | (SIMD1*31*sm + SIMD2*15*sm + SIMD4*7*signed) xor (7) |
| 6:0 | sm*31 xor (6:0) | sm* 15 xor (6:0) | sm*7 xor (6:0) | ((SIMD1*31 + SIMD2*15 + SIMD4*7)*sm) xor (6:0) |

The SIMD select after the comparator selects either four 8 bit compare result pairs, two copies of two 16 bit results (one result for each 8 bit lane, two upper lanes have identical controls, as do two lower lanes) or four copies of the single 32 bit compare signal pair. This is implemented as a pair of 3:1 muxes 566 for each 8 bit lane, using the encoded SIMD setting as the select. Outside of the compare and the counter 572, all data is treated as 4 lane SIMD, with lanes getting duplicated controls when less than SIMD-4.

Figure 49:
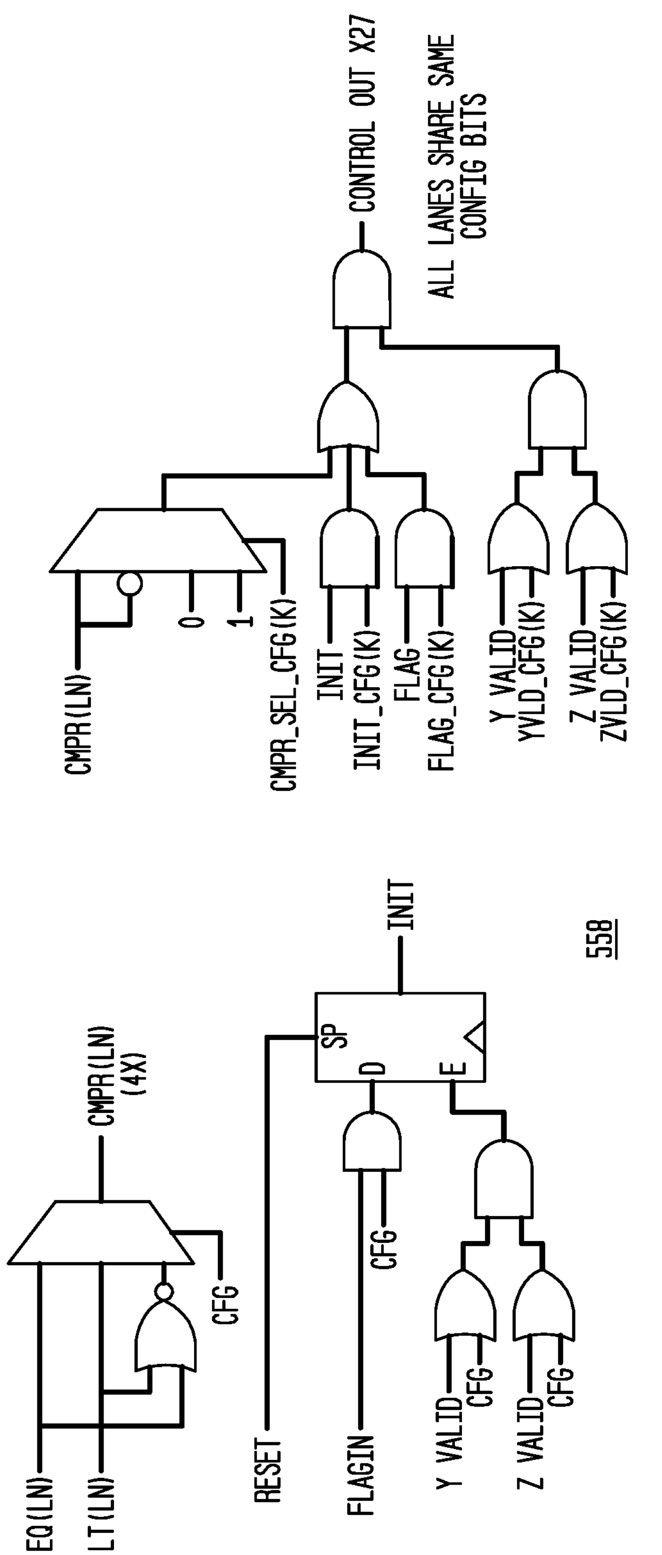

FIG. 49 is a circuit diagram illustrating a decoder circuit 558 (27 controls, 49 configuration bits). The flexibility of the compare circuit 320 depends on the programmability of the decoder 558 that generates the control signals. Inputs to the decoder 558 are the 2 bit compare results for each 8 bit lane, and single bit reset, flag, Y and Z data valid signals from the block input. The controls generated include the data steering muxes by lane, the count bypass mux by lane, the Y, Z and count register clock enables by lane, the count register resets by lane (Z register uses the count register resets when the Z-mux selects counter 572, and Y and Z data outputs do not use reset), and the flag, and Y and Z data valid outputs. The configuration bits for each control output apply to all lanes, but there are separate gating for each lane so that compare results in each lane can separately affect each lane output. There is an INIT signal generated internally that is set when reset input is asserted regardless of data valids, and cleared when the flag input is zero and optionally validated by the input data valids. The INIT is also optionally set again when flag is asserted so that it can be used on the next valid sample as a register initialize at the beginning of a new data block. For most flagged operations, the flag is asserted to mark the end of a block of data, thereby resetting the index counter 572 and/or restarting an accumulated min/max (for example). The comparator generates a 'Less Than' and an 'equal' output for each lane. When lanes are combined, the outputs for the composite lane(s) are duplicated for each 8 bit lane output. The decoder 558 has a global compare select circuit that generates an additional 'greater than' signal and then selects which of the 3 compare results is forwarded to the rest of the decoder. Each control decoder can select the selected compare result or its inverse or '1' or '0' to separately gate each control. The init and flag inputs have enable controls allowing those signals to be logically OR'd with the completely decoded local compare signal and then ANDed with a composite data valid which may be Y or Z or (Y and Z) or '1' to create each local control. The configuration for each local control is shared across all 4 lanes, but using the compare inputs for that lane. Some of the control functions do not use all of the input signals, so those unused inputs are tied to constants that cause them to be optimized out of the design.

Table 19 summarizes the configuration inputs for each control. There are 49 configuration bits associated with the decoder 558 to produce 27 controls (some of which have 4 copies for the 4 lanes). There additional configuration bits to set input sign mode, and SIMD mode.

TABLE 19

| Configuration Bits by Decoder Control | | | | | | | |
|---|---|---|---|---|---|---|---|
| | compare sel | Init en | Flag en | Y ignore | Z ignore | Num cfg bits | Num ctls |
| Steering lane | Cfg* 2 | 0 | 0 | 1 | 1 | 2 | 4 |
| Cnt bypass lane | Cfg* 2 | Cfg | 0 | 1 | 1 | 3 | 4 |
| Yreg ce lane | Cfg* 2 | Cfg | Cfg | Cfg | cfg | 6 | 4 |
| Yreg rst all | 0 | 0 | 0 | 1 | 1 | 0 | 1 |
| Zreg ce lane | Cfg* 2 | Cfg | Cfg | Cfg | cfg | 6 | 4 |
| Zreg_rst lane | Use cnt rst when zmux = cnt, otherwise none | | | | | | |
| Cnt_ce lane | Cfg* 2 | Cfg | Cfg | Cfg | cfg | 6 | 4 |
| Cnt_rst lane | cfg* 2 | cfg | cfg | 1 | 1 | 4 | 4 |
| Flag out | Cfg* 2 | cfg | cfg | Cfg | cfg | 5 | 1 |
| Y valid | Cfg* 2 | cfg | Cfg | cfg | Cfg | 6 | 1 |
| Z valid | Cfg* 2 | cfg | Cfg | cfg | Cfg | 6 | 1 |
| common | Cfg * 2 | | cfg | cfg | cfg | 5 | |

The compare circuit 320 includes a 32 bit adder/counter 562 intended for generating an index count for internal and external use. It can also be set as an adder intended to modulate the threshold in order to introduce hysteresis in the threshold operation. The output of the counter's adder is routed to two identical registers with separate clock enables. One of those is the count register with its output fed back into the counter adder as well as to one input of the comparator logic block for internal use. The second register (the Z output register) is separately clock enabled and is meant to conditionally capture the count for preserving the index of minimum or maximum values in streaming data. One input of the adder 562 is selected from either the Y input or Kz constant or the counter 572 feedback, the other is an increment constant from the block configuration. The index counter's adder is partitioned into SIMD lanes when SIMD operation is selected by gating off the carry between lanes as appropriate to the SIMD mode. The increment constant needs to be adjusted to contain the increment in each lane for 2 and 4 lane SIMD modes. For index counting, the counter 572 is typically incremented by 1 and the count register is clock enabled for valid samples. The counter 572 is reset by the steering logic setting the feedback mux to Yin and the count bypass mux to bypass the adder with clock enable set. That loads the counter register with value of Yin (an additional constant register and mux can be used equivalently rather than depending on correct reset value at Yin). The counter 572 increment can be changed to other than 1 to support counters either shifted up from the lsb, as well as negative counts. For thresholding with hysteresis, the counter 572 feedback is set to select Yin, and the threshold diminished by half the hysteresis dead band width is input to Y and the deadband width is loaded into the increment value constant. The output of the counter 572 is fed to one input of the comparator block so that it gets compared to the index on the Zin port. The counter register mux selects either Yin or Yin+increment for the modified threshold based on the result of the previous compare. Yin for the counter 572 can be replaced with constant Kz using the counter kmux set by configuration. The counter 572 output is via the Z output, which connects via a selectable wired bit-reverse and compare bypass to the Z-input shifter to permit fairly complex address generation by permuting the count through rotations, bit reversal and Boolean logic.

The steering logic includes selectors (muxes) 564 for the comparator input, swap/substitute multiplexors in the data path, output registers with clock enables, and an output select to switch between the counter 572 output or second data path output. It also contains the function and compare result decoder to generate the steering controls for the steering and counter 572 logic. The data path swap/substitute multiplexers are used to swap Z and Y lanes in the sort use case, or to substitute a constant for the data in streaming use cases for the inverse pooling and thresholding operations. In streaming min/max use case, the clock enable on the left register is used to update the register when a new maximum or minimum (depending on use), and a copy of that clock enable enables the capt register to capture the current index count. The output data valid should be qualified by a last sample flag (AXIS-4 TLAST or equivalent) in streaming modes. The multiplexer controls for the clock feedback and register input, left and right select muxes (not the constant muxes) and the register clock enables are controlled in part by the compare results. The remaining multiplexer controls are only affected by block configuration. There are separate configuration controls for the comparator and counter 572 SIMD controls to allow use of the counter 572 independent of the compare and steering if the index is not needed. There may be other use cases possible that are not shown. The multiplexers for the left data path include a selection for input from constant registers, Kx and Ky. This is used to conditionally replace data with a constant value (Kx, Ky default to 0) based on configuration mode and the results of the compare. Similarly, the increment value D at the index count logic is also from a constant register, which defaults to a value of 1. The constants are loaded via a any number of mechanisms (e.g., as part of the configuration word, via some sort of serial constant load interface, or by clock enables via the X, Y, Z inputs, for example and without limitation).

Various use cases include: streaming minimum or maximum with index; two input sort (simultaneous min max of two inputs); inverse max pooling (streaming data is replaced by zero except when the internally generated index count matches the streaming index, in which case the streaming data is pushed through); sample count index generation; data steering; data substitution; address generation, compare flags output; and thresholding with either counting threshold samples or hysteresis.

Figure 50:
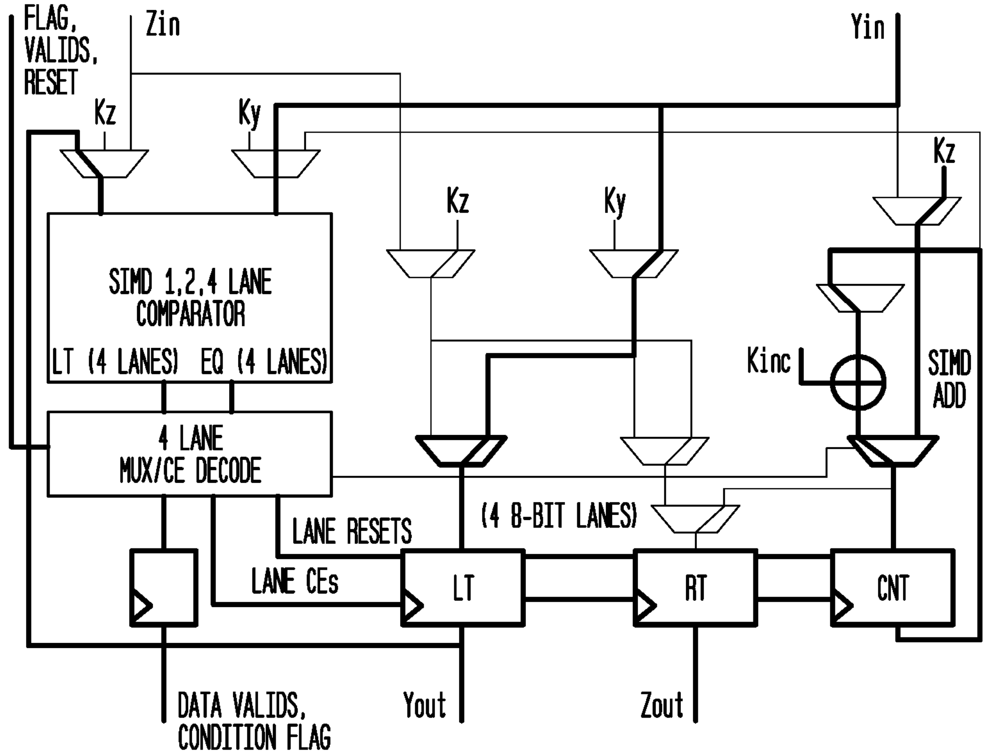

FIG. 50 is a detailed circuit and block diagram illustrating a streaming min/max with index application using compare circuit 320. The compare circuit 320 also performs streaming min or max, comparing the current Y input to the previous min or max held in the Y output register. The Y register is fed back to the comparator Z input, and the new data input on the Y input is fed to the comparator Y input so that the new input is compared to the previous extreme value in the Y register. The count register is enabled for each valid Y input (Y_valid_in='1') so that the count is the number of valid samples (plus initial value) since reset. The steering and count bypass muxes are static for this application (other than for initialization) so Y data and the next count are always present at the Y and Z register inputs respectively. When the new value exceeds the current register value, the clock enables to the Y and Z output registers are turned on to update those registers with the new extreme value and corresponding index count. The last sample should be accompanied by flag input='1' to indicate end of input set. The flag coincident with the Yin valid causes the Yout_valid to go to '1' to validate the accumulated maximum or minimum and the index of that sample at the output. Table 20 summarizes the setup for both the streaming minimum and streaming maximum use case.

The detection of the minimum or maximum requires the data be transmitted to the data register on the first sample of a set regardless of the compare result, and the counter 572 (if used) be set to the initial index value (typically 0, but could also be offset). The initial value for the data register is forced using the init signal out of the decoder, which is set with a reset input or after a validated flag input. This causes the first Y value to be accepted as the initial extrema regardless of the compare result. The count value may be initialized in one of two ways. If initialized to zero, the init signal simply resets the Z and count registers to zero. If non-zero, an alternate method comprising asserting the count bypass to load the counter 572 with Kz when init is asserted is used. The alternate settings for non-zero initial index are shown in the right column in Table 22 for settings that are different than the initial index=0 case. The route following Kz in FIG. 50 show the counter 572 initialization from constants. The lane resets are used instead for initialization to zero by resetting the count registers. The streaming min/max application also works with SIMD data, with each lane maintaining its own extrema value and index. Since the data valid applies to all SIMD lanes, the SIMD processing should have all lanes valid at the same time, and data sets across the lanes all start and end on the same sample for all lanes.

TABLE 20

| Compare circuit 320 Setup for Streaming Min and Streaming Max | | | |
|---|---|---|---|
| Control | Min | max | Non-zero index init |
| Function | | | |
| configuration | Y = min since init<br>Z = count since init | Y = max since init<br>Z = count since init | |
| SIMD | Any | Any | |
| Compare Zin mux | Yout reg | Yout reg | |
| Compare Yin mux | Yin | Yin | |
| Data steering Kz mux | Don't care | Don't care | |
| Data steering Ky mux | Yin | Yin | |
| Counter K mux | Don't care | Don't care | Kz |
| Counter feedback mux | Count reg | Count reg | |
| Z-output mux | counter | counter | |
| Ky | Don't care | Don't care | Don't care |
| Kz | Don't care | Don't care | Initial count value |
| Kinc | 1 | 1 | 1 |
| Decoder | | | |
| Data steering control | Always Y | Always Y | |
| Count bypass control | 0 | 0 | Ydv & init |
| Y register reset | Always '0' | Always '0' | |
| Y register CE | (init \| Y < Z) & Ydv | (init \| Y > Z) & Ydv | |
| Z register reset | Ydv&init | Ydv&init | 0 |
| Z register CE | (init \| Y < Z) & Ydv | (init \| Y < Z) & Ydv | |
| Count reset | Always '0' | Always '0' | 0 |
| Count CE | Ydv | Ydv | |
| Y valid | Flag&Ydv | Flag&Ydv | |
| Z valid | Flag&Ydv | Flag&Ydv | |
| Flag | '0' | '0' | |

Figure 51:
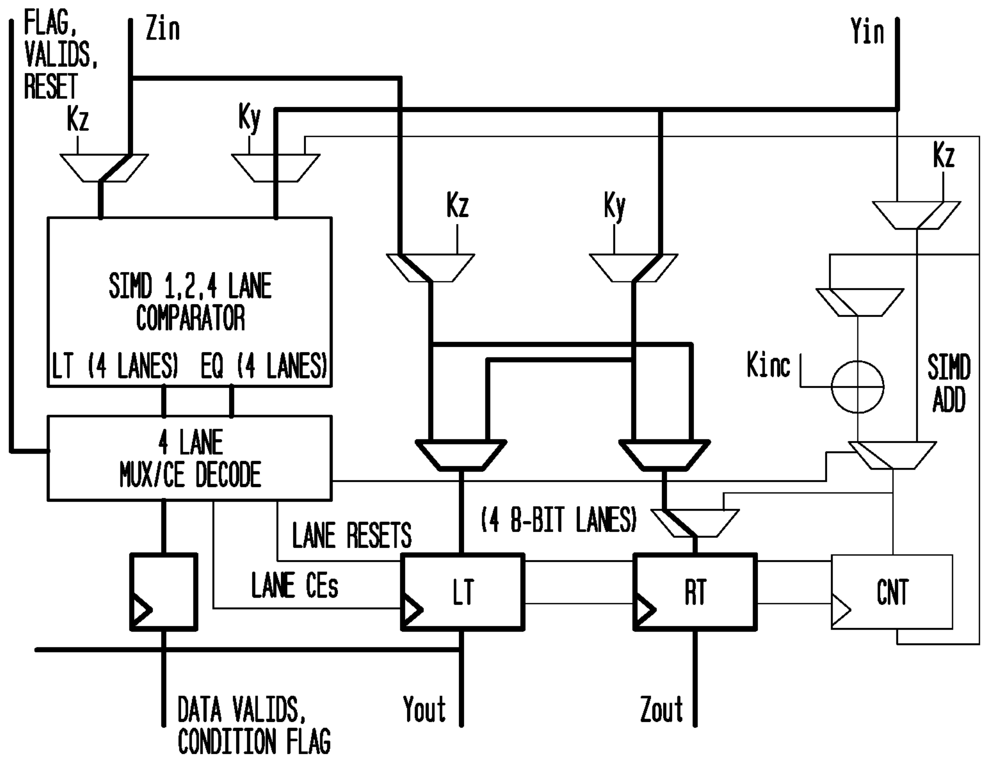

FIG. 51 is a detailed circuit and block diagram illustrating a two input sort application using a compare circuit. The two input sort compares the values on the Y and Z inputs. If Z>Y then it puts Z on the Z output and Y on the Y output. Otherwise, it swaps the data to the opposite outputs. The result is the minimum of the pair is on Y and the maximum on Z. This application supports SIMD operation, when SIMD each lane presents the maximum in that lane on Z and the minimum on Y. With SIMD, all lanes should present and produce data together. The counter 572 is not usable because its output is not visible in this mode. Table 21 shows the setup for the two input sort.

TABLE 21

| Compare circuit 320 Setup for Two Input Sort | | |
|---|---|---|
| Control | 2 input sort | Data pass through |
| Function | | |
| configuration | Y = min<br>Z = max | Y = Y<br>Z = Z |
| SIMD | Any | Any |
| Compare Zin mux | Zin | Don't care |
| Compare Yin mux | Yin | Don't care |
| Data steering Kz mux | Zin | Zin |
| Data steering Ky mux | Yin | Yin |
| Counter K mux | Don't care | Don't care |
| Counter feedback mux | Don't care | Don't care |
| Z-output mux | data | data |
| Ky | Don't care | Don't care |

TABLE 21-continued

| Compare circuit 320 Setup for Two Input Sort | | |
|---|---|---|
| Control | 2 input sort | Data pass through |
| Kz | Don't care | Don't care |
| Kinc | Don't care | Don't care |
| Decoder | | |
| Data steering control | Z =< Y | '0' |
| Count bypass control | Don't care | Don't care |
| Y register reset | Always '0' | Always '0' |
| Y register CE | Always '1' | Always '1' |
| Z register reset | Always '0' | Always '0' |
| Z register CE | Always '1' | Always '1' |
| Count reset | Always '1' | Don't care |
| Count CE | Always '0' | Don't care |
| Y valid | Yvld&Zvld | Yvld |
| Z valid | Yvld&Zvld | Zvld |
| flag | '0' | Don't care |

The decode logic can be set to simply pass the Y and Z data through to the Y and Z outputs (or swap them) as a special case of two input sort. This just requires setting the mux to a fixed value and copying the data valids to the respective outputs. This mode is necessary in some cases to connect Y and/or Z data to the Boolean logic block. If the Z register mux is set to counter, the data pass-thru remains for the Y output and Z output is sourced by the counter 572 logic. The compare logic is not used for pass-through, so is still available for compares with output to the flag in this mode or for use with the index counter 572 when the steering mux is set for pass-through.

Figure 52:
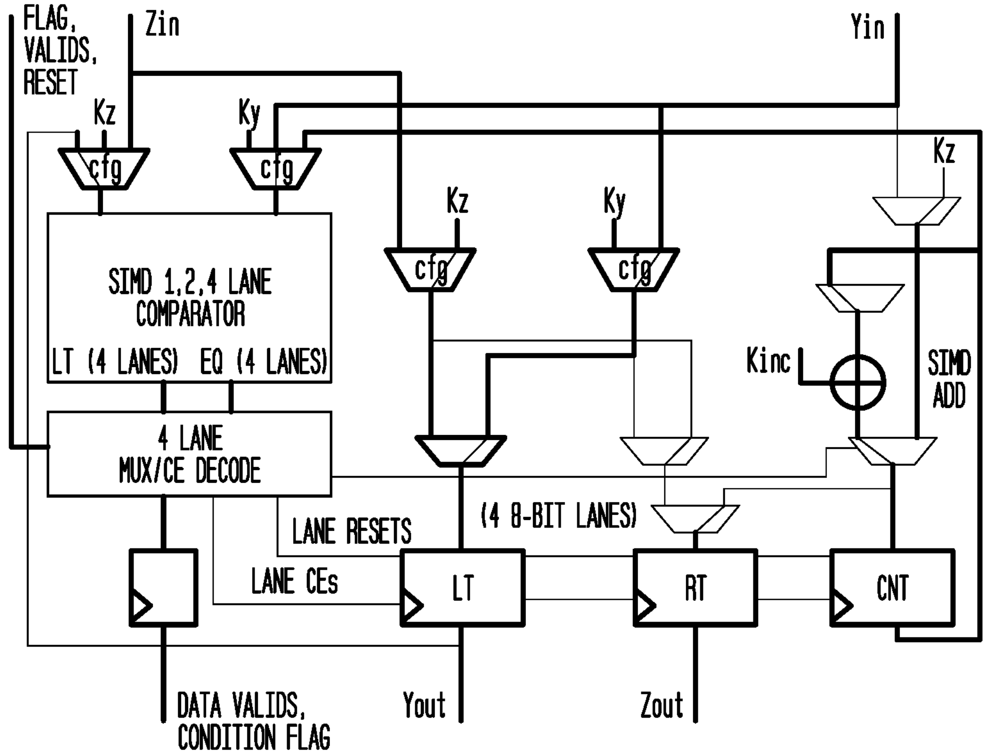

FIG. 52 is a detailed circuit and block diagram illustrating a data substitution application using a compare circuit 320. The compare circuit 320 has a data substitution capability that uses the compare of an input stream to a constant, a second input, or an index count to control substitution of a constant or the second input for the primary input. The compare result can replace the data with a constant or the input from the other stream. The index count is also available as an output. The compare circuit 320 setup options are:

Case 1a: compare Zin to index to substitute Yin or Ky into Z stream;

Case 1b: compare Zin to index to substitute Zin or Kz into Y stream;

Case 2a: compare Zin to constant (Ky) to substitute Yin or same constant (Ky) into Z stream;

Case 2b: compare Zin to constant (Ky) to substitute Zin or constant (Kz) into Y stream;

Case 3a: compare Zin to Yin to substitute Yin or Ky into Z stream;

Case 3b: compare Zin to Yin to substitute Zin or Kz into Y stream;

Case 4a: compare Yin to constant (Kz) to substitute Yin or Ky into Z stream;

Case 4b: compare Yin to constant (Kz) to substitute Zin or Kz into Y stream.

Each of the cases is a different permutation of the input muxes and the polarity of the steering control. The sub-cases for each both have the same setup except for the interpretation of the steering muxes. The counter 572 may be initialized with the register reset or by using the count bypass mux and Kz (or Yin) to initialize to other than zero, as discussed above. In FIG. 52, the compare Yin and compare Zin muxes and steering constant muxes are shown without the configured connection to account for the different modes. The setup for each of the 4 cases listed above is tabulated in Table 22.

Inverse pooling accepts synchronized index and data streams while maintaining a local index count. When the index stream equals the index count, the data value is passed through, otherwise the output data is zero. This function is accomplished by data substitution, case 1 with the Kz constant set to 0, index input on Z and data input on Y. The setup is included in the next to last column of Table 22. The inverse pooling may also be accomplished by fixing the steering mux to output Y on the Youtput, and using the compare result to assert the Y register reset when Zin is not equal to the index counter. This alternate configuration for max pooling may reduce power consumption slightly, while the data substitution method allows the not equal data to be set to other than zero. The alternate setup is included in the last column of Table 22.

TABLE 22

Compare circuit 320 Setup for Data Substitution and Inverse Pooling

| Control | | | | | | |
|---|---|---|---|---|---|---|
| Function | Case 1 Z ? index | Case 2 Z ? Ky | Case 3 Z ? Y | Case 4 Y ? Kz | Inv pool | Inv pool alt |
| configuration | | | | | | |
| SIMD | Any | Any | Any | Any | Any | Any |
| Compare Zin mux | Zin | Zin | Zin | Kz | Zin | Zin |
| Compare Yin mux | count | Ky | Yin | Yin | count | count |
| Data steering Kz mux | * | * | * | * | Zin | Zin |
| Data steering Ky mux | * | * | * | * | Ky | Ky |
| Counter K mux | Don't care | Don't care | Don't care | Don't care | Don't care | Don't care |
| Counter feedback mux | counter | counter | counter | counter | counter | counter |
| Z-output mux | counter | counter | counter | counter | counter | counter |
| Ky | Ky | Y compare | * | * | 0 | Don't care |
| Kz | Don't' care | * | * | Z compare | Don't' care | Don't care |
| Kinc | 1 | 1 | 1 | 1 | 1 | 1 |
| Decoder | | | | | | |
| Data steering control | cmpr | cmpr | cmpr | cmpr | cmpr | Always Y => Y |
| Count bypass control | add | add | add | add | add | add |
| Y register reset | Always '0' | Always '0' | Always '0' | Always '0' | Always '0' | Z/=idx |
| Y register CE | Always '1' | Always '1' | Always '1' | Always '1' | Always '1' | Always '1' |
| Z register reset | reset | Always '0' | Always '0' | Always '0' | Always '0' | init |
| Z register CE | Always '1' | Always '1' | Always '1' | Always '1' | Always '1' | Always '1' |
| Count reset | init | init | init | init | init | init |
| Count CE | Yvld&Zvld | Zvld | Yvld&Zvld | Yvld&Zvld | Yvld&Zvld | Yvld&Zvld |
| Y valid | Yvld&Zvld | Zvld | Yvld&Zvld | Yvld&Zvld | Yvld&Zvld | Yvld&Zvld |
| Z valid | Yvld&Zvld | Zvld | Yvld&Zvld | Yvld&Zvld | Yvld&Zvld | Yvld&Zvld |
| flag | '0' | '0' | '0' | '0' | '0' | '0' |

The data substitution may also be used to threshold data such that data below the threshold is substituted with a constant (typically the threshold value or zero) and data above the threshold is passed. Alternatively data below the threshold can be passed and data above the threshold can be replaced with a constant (such as with saturating). Cases 2 and 4 are in Table 22 with the one input to the compare coming from the Y or Z input and the other set to the threshold constant. Setting the threshold constant in the steering mux logic will provide different flavors of thresholding, listed in Table 23.

The threshold may also be provided via the input not used for data. The index counter 572 may be used to count samples above or below the threshold, to count valid samples, or as an independent event counter 572 using the flag input or the data valid on the unused data input (when threshold is from a constant register).

TABLE 23

Compare circuit 320 Configuration Settings by Threshold Mode

| input | Z | Z | Y | Y |
|---|---|---|---|---|
| Substitute | Below | Above | below | above |
| Case | 2 | 2 | 4 | 4 |
| Zin mux | Zin | Zin | Kz | Kz |
| Yin mux | Ky | Ky | Yin | Yin |

TABLE 23-continued

Compare circuit 320 Configuration Settings by Threshold Mode

| input | Z | Z | Y | Y |
|---|---|---|---|---|
| Steering Z | Zin | Zin | Kz | Kz |
| Steering Y | Ky | Ky | Yin | Yin |
| Compare | Z > Y | Z < Y | Z < Y | Z > Y |

Figure 53:
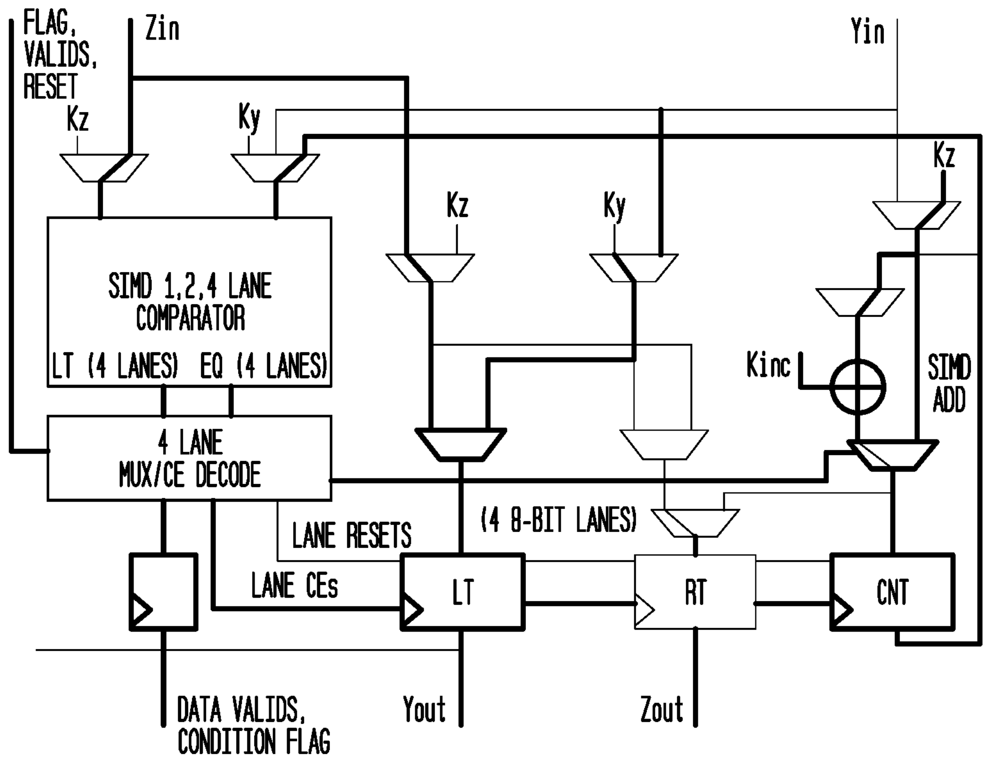

FIG. 53 is a detailed circuit and block diagram illustrating a threshold with hysteresis application using a compare circuit 320. Threshold with hysteresis shifts the threshold a fixed distance away from the nominal threshold in the direction away from the current data value. The purpose is to reduce the chance of signal noise causing a threshold crossing. This is accomplished by using the counter's adder and bypass mux to either add or not add an offset to the threshold depending on the compare result. The counter 572 output is fed to the comparator Y input and data comes in via the Z input. The compare result selects the steering mux as well as the count bypass mux. The values programmed are a threshold and a delta that is the distance between the upper and lower thresholds. The delta can be positive or negative so that the threshold value can be either the upper or lower threshold.

TABLE 24

Compare circuit 320 Setup for Threshold with Hysteresis

| Control | |
|---|---|
| Function configuration | Hysteresis thresh |
| SIMD | Any |
| Compare Zin mux | Zin |
| Compare Yin mux | count |
| Data steering Kz mux | Zin |
| Data steering Ky mux | Ky |
| Counter K mux | Kz |
| Counter feedback mux | k-mux |
| Z-output mux | Don't care |
| Ky | Constant out value |
| Kz | Lo Threshold |
| Kinc | Δ threshold |
| Decoder | |
| Data steering control | cmpr |
| Count bypass control | cmpr |
| Y register reset | Always '0' |
| Y register CE | Zvld |
| Z register reset | Always '1' |
| Z register CE | Always '0' |
| Count reset | '0' |
| Count CE | Zvld |
| Y valid | Zvld |
| Z valid | Zvld |
| flag | '0' |

Figure 54:
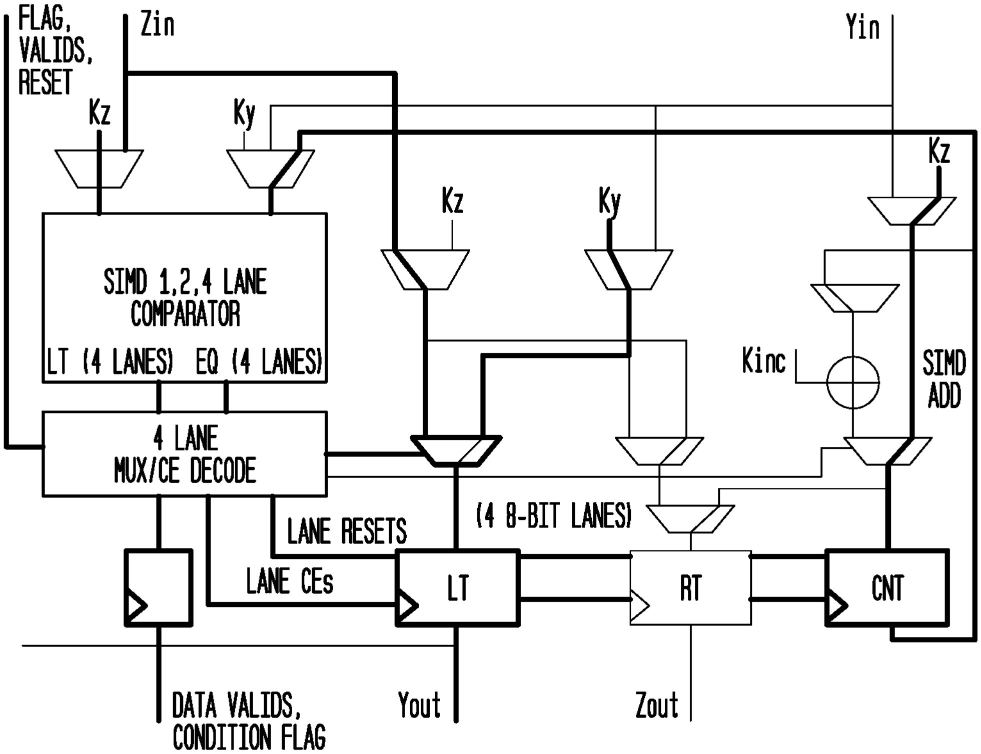

FIG. 54 is a detailed circuit and block diagram illustrating a flag triggered event application using a compare circuit 320. The compare circuit 320 may be set up to wait in one state for a triggering event, then switch states and remain in the second state until a reset input. The general case triggers on the flag input, and is reset to the initial state by the reset input. Since this relies on flag and reset, it is only valid when all lanes trigger and reset on the same trigger. The initial state is with the cnt register reset to zero, which is forced when the reset input is asserted. The count increment constant is set to zero and the Kmux connects to Kz so that the input to the count register is always Kz. Kz can be any non-zero constant. The count register's clock enable is connected to the flag input through the decoder so that the register loads with Kz when flag is asserted. This way the count is zero until the trigger event, at which time it becomes Kz. It remains at Kz until the reset is asserted, resetting the count register to zero. The comparator compares the count value to Kz and the compare output is decoded to control the steering muxes, and/or gate the Y and Z data valids or the flag output. In this way it can start, stop, substitute, swap, or redirect data upon the triggering event. The Z output may be connected to the count register to provide direct connection to the state (0 or Kz), or to the data mux for data steering and swapping applications. The data steering may use constants as long as Kz, if used is not zero.

Figure 55:
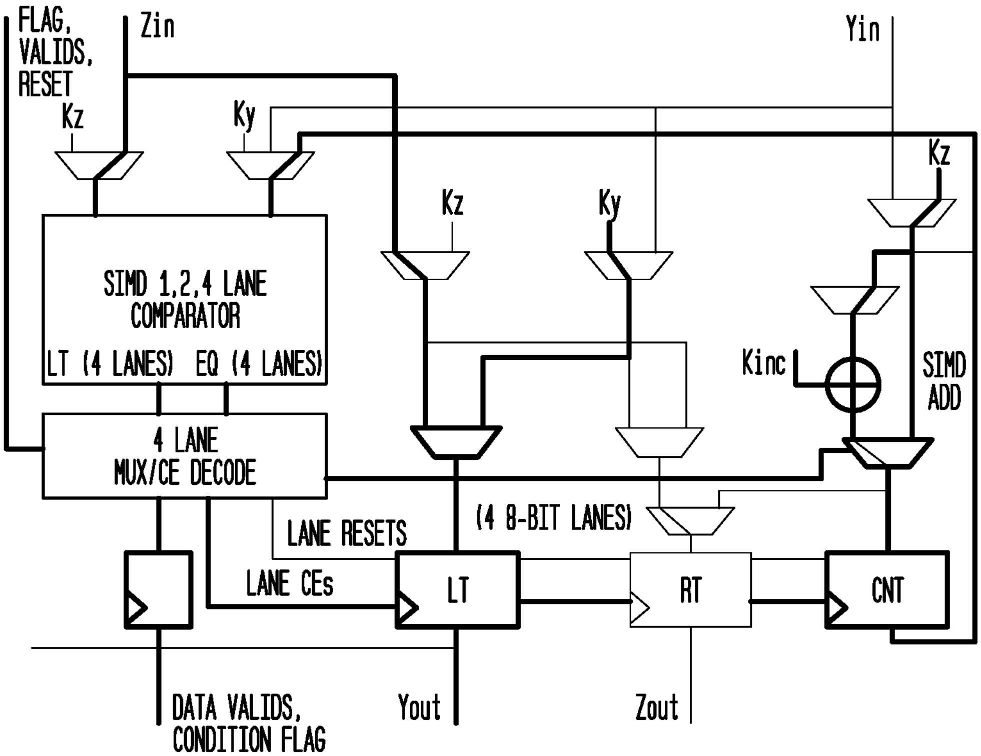

FIG. 55 is a detailed circuit and block diagram illustrating a threshold triggered event application using a compare circuit. The general case requires a flag be generated outside the compare block, which in the case of the trigger based on a compare requires a second RAE 300 to provide the flag. The special case where a threshold crossing is to trigger an event can be implemented in a single RAE 300 compare circuit 320. The latching logic for this takes advantage of the counter 572 set up similarly to the 'threshold with hysteresis' use case, except the thresholds are set to that the trigger event causes the threshold to be moved to either the minimum or maximum representable value, and the compare function is set to be less than the threshold or greater than the threshold respectively so that once the compare condition is met (threshold breached), it is impossible for it to ever be unmet. The compare circuit 320 is reset to the original state by forcing the count bypass control to bypass using the flag or reset input. The compare condition can be used to substitute constant for data (note that Kz is unavailable, as it is used for the threshold unless the threshold is supplied external via Yin), swap data outputs, or steer data with the data valids. The data muxes can also be left stationary and data flow suspended or started using the data valids for both the Z and Y streams. The setup for triggered event is similar to threshold with hysteresis except the Kinc value is specifically set to minimum representable value-threshold so that the sum is the minimum representable value. If the trigger is to happen in response to the signal exceeding the threshold then the sum of Kinc and the threshold set with Kz should be the minimum representable value in the numeric mode (signed, unsigned or sign-magnitude/floating point) and the compare should be Z>=cnt so that the signal can never get smaller than the shifted threshold. If the trigger is to happen when the signal falls below a threshold, then the sum of Kinc and threshold should be the maximum representable value and the compare condition should be Z=<cnt instead so that the threshold once shifted can never be exceeded. The threshold trigger works with the SIMD modes as well, with the caveat that all lanes get reset together.

TABLE 25

Compare circuit 320 Setup for Triggered Event

| Control | | | |
|---|---|---|---|
| Function configuration | Flag trigger | Over threshold | Under threshold |
| SIMD | 1 | Any | Any |
| Compare Zin mux | Kz | Zin | Zin |
| Compare Yin mux | count | count | count |
| Data steering Kz mux | * | * | * |
| Data steering Ky mux | * | * | * |
| Counter K mux | Kz | Kz | Kz |
| Counter feedback mux | k-mux | k-mux | k-mux |
| Z-output mux | * | Don't care | Don't care |
| Ky | Constant out value | Constant out value | Constant out value |
| Kz | Lo Threshold | Threshold | Threshold |
| Kinc | Δ threshold | MinRV-Threshold | MaxRV-Threshold |
| Decoder | | | |
| Data steering control | cmpr | Zin ≥ Count | Zin ≤ Count |
| Count bypass control | cmpr | Zin ≥ Count | Zin ≤ Count |

TABLE 25-continued

Compare circuit 320 Setup for Triggered Event

| | | | |
|---|---|---|---|
| Y register reset | Always ‘0’ | Always ‘0’ | Always ‘0’ |
| Y register CE | Zvld | Zvld | Zvld |
| Z register reset | Always ‘1’ | Always ‘1’ | Always ‘1’ |
| Z register CE | Always ‘0’ | Always ‘0’ | Always ‘0’ |
| Count reset | ‘0’ | ‘0’ | ‘0’ |
| Count CE | Zvld&flag | Zvld | Zvld |
| Y valid | Zvld | Zvld | Zvld |
| Z valid | Zvld | Zvld | Zvld |
| flag | ‘0’ | ‘0’ | ‘0’ |

Figure 56:
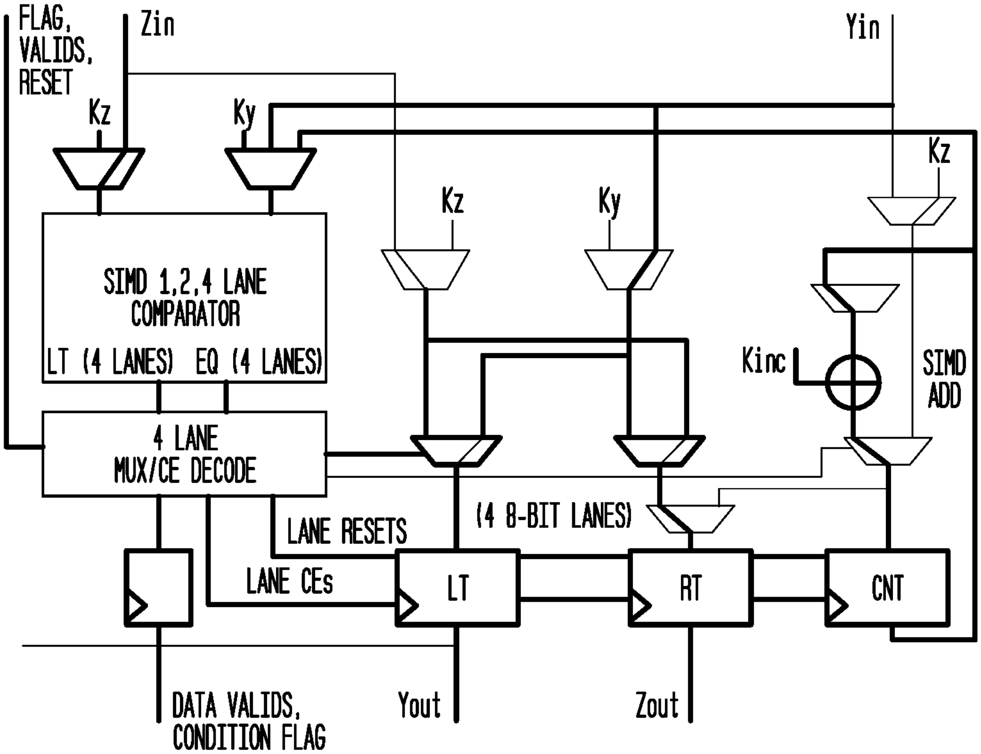

FIG. 56 is a detailed circuit and block diagram illustrating a data steering application using a compare circuit. The control decode allows the data valid for Yout and Zout to be individually controlled by the compare result. By setting the data valids so that one is valid when the compare is true and the other valid when the compare is false, the propagation of the data is directed out of only one output to different connections. There are several ways to set up the configuration to set various compare options:

Case 1: compare Zin to index count to steer Y to Yout or Zout;

Case 2: compare Zin to constant to steer Y to Yout or Zout;

Case 3: compare Zin to Yin to steer Y to Yout or Zout;

Case 4: compare Yin to constant to steer Y to Yout or Zout;

Case 5: compare index count to constant to steer Y to Yout or Zout;

Case 6: use flag input to steer Y to Yout or Zout.

The setup for each of these cases is tabulated in Table 26. The Z path through the data steering is a don’t care since the output Z is connected to is invalid. For power considerations, the Z input can be connected to Kz and the register clock enables can be connected to Yvalid (valids are abbreviated Yv and Zv in the table) so that invalid outputs do not propagate when deselected. The count can be reset using the reset input, which may be validated with the data valid inputs if desired. If Ky is not used in the compare logic, it can be used to initialize the counter 572 as discussed with reference to streaming min/max. Because data steering uses the data valid signals to direct data, it is only available for non-SIMD (one 32 bit lane) operation.

TABLE 26

Compare circuit 320 Setup for Data Steering

| Control Function | Case 1<br>Z ? idx | Case 2<br>Z ? Ky | Case 3<br>Z ? Y | Case 4<br>Kz ? Y | Case 5<br>Kz ? idx | Case 6<br>flag |
|---|---|---|---|---|---|---|
| configuration | | | | | | |
| SIMD | 1 | 1 | 1 | 1 | 1 | 1 |
| Compare Zin mux | Zin | Zin | Zin | Kz | Kz | Kz |
| Compare Yin mux | count | Ky | Yin | Yin | count | Ky |
| Data steering Kz mux | Don’t care | Don’t care | Don’t care | Don’t care | Don’t care | Don’t care |
| Data steering Kv mux | Yin | Yin | Yin | Yin | Yin | Yin |
| Counter K mux | Don’t care | Don’t care | Don’t care | Don’t care | Don’t care | Don’t care |
| Counter feedback mux | counter | Don’t care | Don’t care | Don’t care | Don’t care | Don’t care |
| Z-output mux | counter | Don’t care | Don’t care | Don’t care | Don’t care | Don’t care |
| Ky | Don’t care | Cmpr val | Cmpr val | Don’t care | Don’t care | Don’t care |
| Kz | Don’t care | Don’t care | Don’t care | Cmpr val | Cmpr val | Cmpr val |
| Kinc | 1 | 1 | 1 | 1 | 1 | 1 |
| Decoder | | | | | | |
| Data steering control | cmpr | cmpr | cmpr | cmpr | cmpr | flag |
| Count bypass control | add | Don’t care | Don’t care | Don’t care | add | add |
| Y register reset | Always ‘0’ | Always ‘0’ | Always ‘0’ | Always ‘0’ | Always ‘0’ | Always ‘0’ |
| Y register CE | Always ‘1’ | Always ‘1’ | Always ‘1’ | Always ‘1’ | Always ‘1’ | Always ‘1’ |
| Z register reset | Always ‘0’ | Always ‘0’ | Always ‘0’ | Always ‘0’ | Always ‘0’ | Always ‘0’ |
| Z register CE | Always ‘1’ | Always ‘1’ | Always ‘1’ | Always ‘1’ | Always ‘1’ | Always ‘1’ |
| Count reset | Init&dv | Always ‘1’ | Always ‘1’ | Always ‘1’ | Init&dv | Always ‘1’ |
| Count CE | Zv | Always ‘0’ | Always ‘0’ | Always ‘0’ | Zv | Always ‘0’ |
| Y valid | Zv&Yv&cmpr | Zv&Yv&cmpr | Zv&Yv&cmpr | Zv&Yv&cmpr | Zv&Yv&cmpr | Yv&flag |
| Z valid | Zv&Yv&~cmpr | Zv&Yv&~cmpr | Zv&Yv&~cmpr | Zv&Yv&cmpr | Zv&Yv&~cmpr | Yv&~flag |
| flag | ‘0’ | ‘0’ | ‘0’ | ‘0’ | ‘0’ | ‘0’ |

Figure 57:
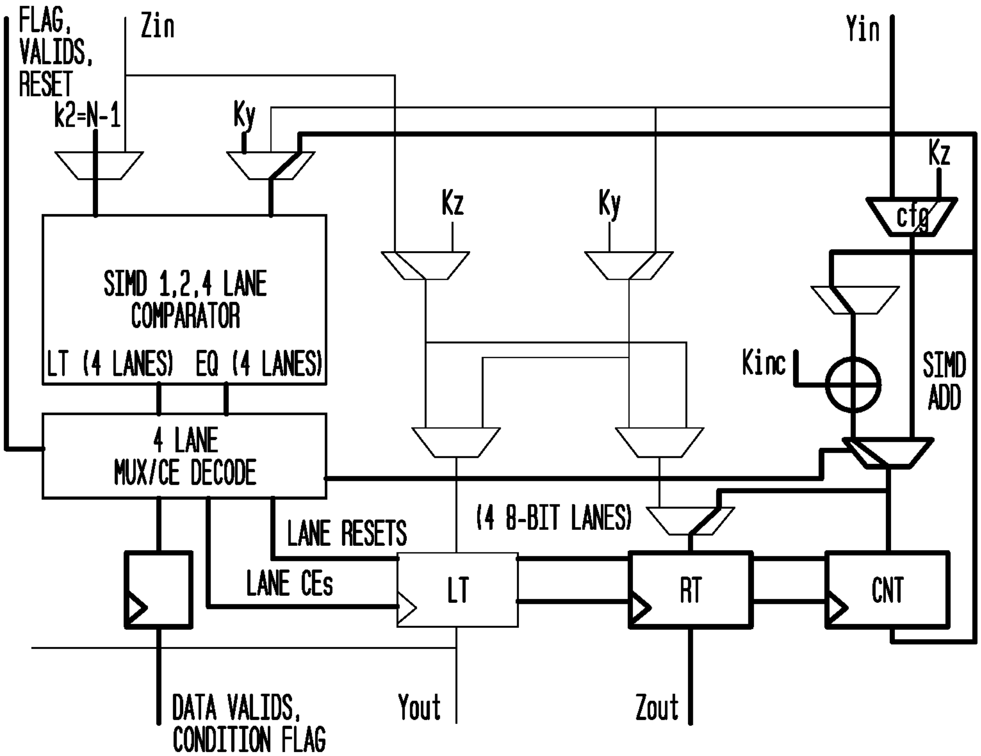

FIG. 57 is a detailed circuit and block diagram illustrating a modulo N counting application using a compare circuit 320. The compare block’s index counter 572 is designed to count samples for a sample index. It can also be used for an address count. The counter increment is set by an increment constant, which can be set to any 32 bit value. The register input is from a selector that selects the count adder or a bypass for input, providing a means to initialize the count to a non-zero value. The counter register and carry is segmented into 8 bit segments to handle 2 and 4 SIMD lanes. The compare circuit 320 is positioned before the rotator and Boolean logic to allow those blocks to manipulate the address count for more complicated sequences including corner-turned and FFT bit-reversed and corner turned addressing. The setup for various use cases of the count logic is tabulated in Table 27.

The basic use is a simple counter (linear count) with an increment value set by the Kinc constant register. For simple count, the Kinc register is set to 1. This can also be set to any 32 bit value to change the increment. The counter's clock enable increments the count when the decoder condition for the count ce are met. The CE can be used to increment on data valid, a compare condition, or flag input or combinations thereof. Simple use uses the register reset to clear the result gates the clock enable so that once the count reaches its terminal count further incrementing the count is disabled until it is reset. The limit counter connections are identical except the counters CE is gated for limit count instead of the reset, as is the case for modulo count. The flag output may be driven by the compare result to provide an external indication of limit count. The compare result can also be used to select or gate data flow from unused inputs and constants (Kz is used for the limit value). The count limit can also be a variable if presented on the Zinput rather than via the Kz constant.

The compare circuit 320 may also be used to synchronously reset the count on the next clock enabled clock when the terminal count is reached, resulting in a modulo N count if the terminal count is set to N−1 and the reset is done by the compare result using the counter's register reset. FIG. 57 illustrates the connections for a modulo-N counter. The modulo may be a variable if N−1 is applied via the Z input rather than through the Kz constant.

TABLE 27

Compare circuit 320 Counter Setup

| Control | | | | | |
|---|---|---|---|---|---|
| Function configuration | Simple count | Limit count | Modulo count | Non-zero reset | Corner-turn |
| SIMD | 1 | 1 | 1 | 1 | 1 |
| Compare Zin mux | Don't care | Zin or Kz (N − 1) | Zin or Kz (N − 1) | Don't care | Kz |
| Compare Yin mux | Don't care | counter | counter | Don't care | counter |
| Data steering Kz mux | Don't care | Don't care | Don't care | Don't care | Don't care |
| Data steering Ky mux | Don't care | Don't care | Don't care | Don't care | Don't care |
| Counter K mux | Don't care | Don't care | Don't care | Don't care | Don't care |
| Counter feedback mux | counter | Don't care | Don't care | counter | Don't care |
| Z-output mux | counter | Don't care | Don't care | counter | Don't care |
| Ky | Don't care | Don't care | Don't care | Don't care | Don't care |
| Kz | Don't care | N − 1 | N − 1 | Reset value | $(N-1)*(2^{bits}+1)$ |
| Kinc | 1 | 1 | 1 | 1 | $2^{bits}+1$ |
| Decoder | | | | | |
| Data steering control | Don't care | Don't care | Don't care | Don't care | Don't care |
| Count bypass control | add | Don't care | Don't care | reset | Don't care |
| Y register reset | Don't care | Don't care | Don't care | Don't care | Don't care |
| Y register CE | Don't care | Don't care | Don't care | Don't care | Don't care |
| Z register reset | Reset* | Reset* | Cmpr&vld | '0' | Cmpr&vld |
| Z register CE | vld | Cmpr&vld | vld | vld | vld |
| Count reset | Reset* | Cmpr&vld | Cmpr&vld | '0' | Cmpr&vld |
| Count CE | * | Cmpr&vld | vld | * | vld |
| Y valid | * | Don't care | Don't care | * | Don't care |
| Z valid | * | vld | vld | * | vld |
| flag | '0' | Cmpr* | Cmpr* | '0' | Cmpr* |

counter to zero. Register reset is a logic function of valid, flag, and reset inputs and compare result that is programmable.

If the counter should be initialized to another value, the reset condition is decoded to switch the counter bypass mux to load the counter register with the value selected by the counter's K mux (Kz or Yinput) when the counter CE is asserted. It should be noted that reset using the bypass mux and Kz might interfere with comparator or steering mux use of Kz, in which case a constant may be supplied by Yin instead. The compare and data steering is not used for linear count. Those portions of the compare block can be used for compare applications that do not interfere with the count logic used.

Figure 58:
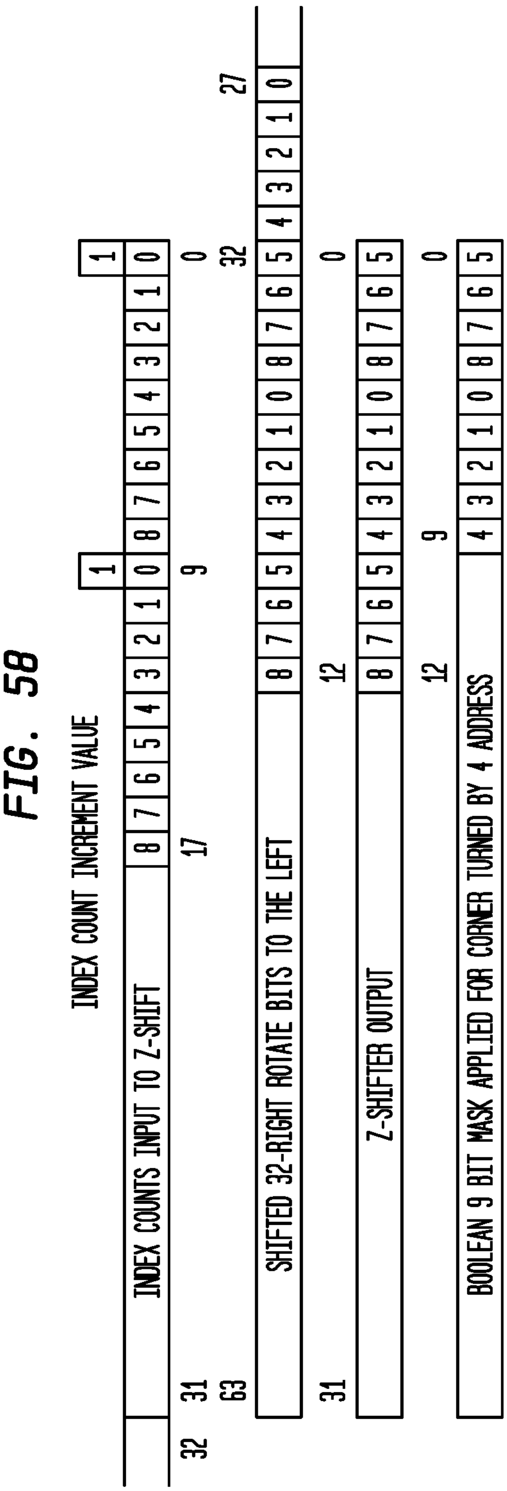

The compare circuit 320 may be used to limit count, freezing the count once the limit is reached. To limit the count, the compare is set to the count limit and the compare FIG. 58 is a block diagram illustrating a derivation of corner-turn address. Corner-turned addressing reorders address for a matrix stored in memory in row major for access in column major order or vice versa. For arrays that have power of two dimensions, the corner turned addressing can be produced by rotating the address bits left by log 2 minor axis dimension (if the rotate field is the same size as the address), which is equivalent of swapping the positions of the bit fields corresponding to rows with those corresponding to columns. For the 8 and 16 bit cases, the z-input shift rotate can be used directly to obtain the rotated address. For the general case, however, the built-in rotation is insufficient because the shift distance to create the rotation is fixed at 8, 16, 32 or 64 bits. In order to rotate, a copy of the address count needs to be placed immediately adjacent to the actual count. The address count can be modified to generate two identical counts in adjacent bit fields provided the count is not allowed to overflow the address width. The modulo count or limit count setup may be used to guarantee that overflow does not occur. Two adjacent counts can be generated by changing the increment to have '1' in each field's lsb, so for a 9=bit address count, the count increment would be 0×0201, shown in the top of FIG. 58. This generates two adjacent counts, one with its lsb at bit 0 and msb at bit 8, and one with its lsb at bit 9 (shown in FIG. 58 as 'index counts input to Z-shift). The count should not be allowed to go past all '1's to prevent overflow of the lower counter into the upper counter's lsb. Using the modulo count setup and setting the limit equal to the two count field each holding the maximum count will result in the appropriate modulo count. This pair of joined counters is then shifted by the Z-shift logic to put the correct rotation of bits in the shift window's least significant bits (the shift window with 32 bit inputs is bits 63:32), and then masking that result with the Boolean logic to discard the bits outside the shift window. The Boolean mask may be used to set upper bits to select a page in memory.

Figure 59:
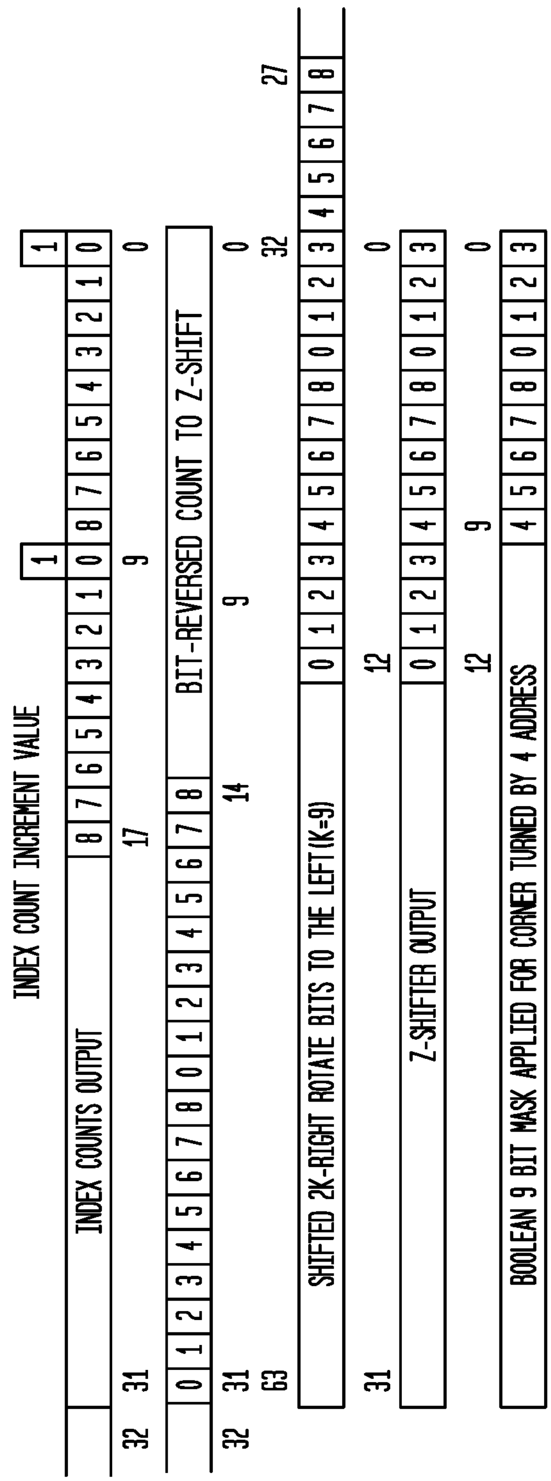

FIG. 59 is a block diagram illustrating a derivation of FFT bit-reverse corner-turn address. The design includes a selectable wired 32 bit bit-reversal between the compare block and the Z-shift logic used to reverse the bit order for bit-reversed addressing in support of Fast Fourier Transforms. The Fast Fourier transform is built up of radix 2 and radix 4 stages that get combined using the mixed radix algorithm.

There is a corner-turn address between each stage, and the stage inputs and outputs are bit-reversed addressing (lsb becomes msb and vise-versa). If the data is stored in memory in natural order, the read and write addressing is a single corner-turn of the bit reversed address at each stage (but a different size for each stage). The addressing is a modification to the corner-turn addressing above to account for the relocation of bits when bit reversing. The setup of the count logic is identical to corner-turned setup, however the 32 bit count output is first bit reversed before the Z-shifter, which puts the relevant bits on the most significant end of the word. The shift distance is adjusted to account for this, and then the remaining steps are the same as those in the corner-turned case. FIG. 59 shows the bit alignments for the derivation.

11. Input Reorder Queues 350 and Output Reorder Queues 355

Figure 60:
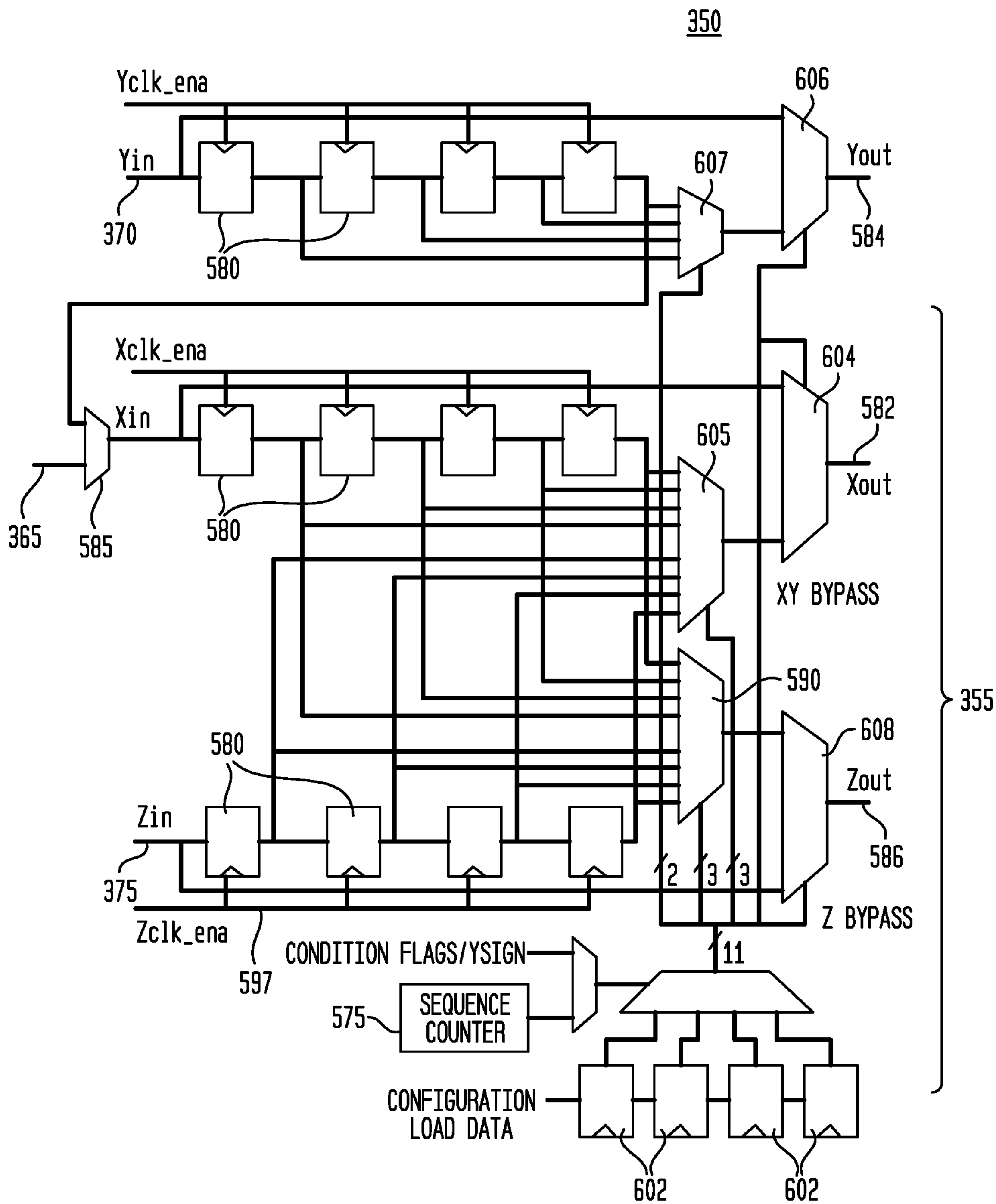

FIG. 60 is a detailed circuit and block diagram illustrating a logic circuit structure for RAE input reorder queues 350 and RAE output reorder queues 355. These RAE input reorder queues 350 serve three primary purposes: (1) they enable reordering of data in time over and redistribute the data between the X and Z inputs; (2) they provide an adjustable delay to assist with pipeline latency balancing, and (3) they enable storing and sequencing a number of constants to be applied to the RAE inputs 365, 370, 375. The reorder capability greatly simplifies data handling for certain algorithms with complex data that needs to be presented as an I/Q pair, but for processing efficiency should be processed I and Q interleaved, two samples at a time. An example of this is the Fast Fourier Transform (FFT) elemental operation known as a butterfly. The two samples of a butterfly follow nearly identical processing (only different by a sign change), so for efficiency sake the I component of both samples is processed interleaved with the Q component of both samples. Other complex arithmetic algorithms also benefit from interleaving I and Q components and processing two samples at a time as well. The reorder queue with a depth of 4 samples is utilized for this application.

The RAE output reorder queues 355, which may be shared by two RAE circuits 300 of the same RAE circuit quad 450, has the identical structure to the RAE input reorder queues 350, except it does not have the Y data path, as illustrated in FIG. 60, and also may not require the conditional multiplicand logic. The inputs to the RAE output reorder queues 355 come from the RAE 300 X outputs 420 (e.g., accumulator 315 output) of the two RAEs 300 in the same half of a RAE circuit quad 450. The output reorder queues 355 allow for swaps between the two RAEs 300 to re-interleave I and Q for FFT, and half-complex multiply, as well as short distance reordering of the sample sequence to as many as the most recent four samples. The inclusion of these RAE output reorder queues 355 circuit in the RAE 300 simplifies algorithm design and layout for algorithms needing IQ or even-odd interleaving and similar operations (e.g. Fast Fourier Transform). In a representative embodiment, there is one set of RAE output reorder queues 355 per pair of RAEs 300.

The adjustable pipeline delay function is a subset of the function offered by the reorder queues. There are applications that require one or more constant inputs to the multiplier. The reorder queue registers 580 are capable of being re-purposed to hold constant values that can be sequenced using the reorder queue sequencer. The constant load mechanism links the 32 bit registers in the reorder queue into a daisy chain (not separately illustrated) such that the constants are entered 32 bits per clock and propagate down the chain so that at the end of 12 clocks the reorder queues are filled with 12 constant values. As long as the data valids are gated off, the values remain in the registers during operation. The output of the last register in the chain is linked in a chain of other constant registers in the RAE 300, including those in the compare block and the Boolean function table in the Boolean logic circuit 325 to allow for sequential loading of the entire chain of constant registers. The constant load chain and write logic is not illustrated in FIG. 60 for clarity. The load data comes in via the Y input. The last Y register is connected via a mux 585 at Xin to the X chain, and the output of the X chain is connected via another 32 bit mux 590 to the Z chain.

The reorder queues have three 32-bit X, Y and Z data inputs corresponding to the RAE 300 inputs 365, 370, 375. Each of the X, Y and Z inputs 365, 370, 375 is associated with a data valid 595, 596, 597, respectively. Data is only considered valid when data valid for the same (corresponding) input is '1'. Data is shifted into the RAE input reorder queues 350 each rising edge of the clock when the corresponding data valid is '1'. When data valid is '0', data on the corresponding input is not transferred into the reorder queue registers 580. The data valids 595, 596, 597 enable the shifting of data into the RAE input reorder queues 350.

The RAE input reorder queues 350 have three 32-bit X, Y and Z data outputs 582, 584, 586, respectively. Data at the output is selected from one of the delay queue registers or the corresponding input, depending on the state of the currently addressed sequencer memory. Data out is accompanied by a data valid out flag to indicate validity of the data. The data valid out is a delayed version of the data valid in, with a programmable delay of up to 4 clocks that corresponds to the intended reordered data delay through the reorder. This may need to collect a certain number of samples and then output in a group with a state machine. The output data valid and sequence counter should be synchronized to the input samples. Data valid out is present even if the queue holds constants, but may be turned off with a configuration bit. A reset flag resets the sequence counter 575 to the 00 state. The sequence count is provided at the output interface for possible use in sequencing instructions or for the condition flag logic (not separately illustrated).

The data output selection from the RAE input reorder queues 350 is determined by contents of four registers 602 addressed by the sequence counter 575. Each of those registers 602 contains 3 bit multiplexer 604, 608 selects for the X and Z outputs, a 2 bit multiplexer 606 select for the Y output, one bit each for the X, Y, and Z bypass selectors, and a 2 bit next state for the sequencer There may be additional bits assigned. The source of programming for the sequencer registers may be loaded as part of the constants load mechanism, in which case it will constitute two 32 bit words, each containing the 13 bits for two sequencer states. In order to retain the 42 bit sequential load chain, the 6 unused bits in each work also have registers, spare bits may be brought out via the sequencer's output selector to the block pins for use as sequencer outputs elsewhere in the RAE 300. The additional configuration includes the conditional multiplicand select, and probably output data valid enables for each data output, and controls for the data valid and flag regeneration The RAE X, Y and Z inputs include small 4 sample reorder queues 610 (illustrated using registers 580) designed to permit independent short distance data reordering on all three inputs and sequenced swapping between the X and Z inputs to support the sequence modification for Fourier Transforms, Complex multiplies, I/Q interleaving and de-interleaving, and similar operations. The registers 580 in the reorder queues 610 may also be loaded with constants and then held to permit cycling of up to four input constants to each of the X, Y and Z RAE inputs 365, 370, 375, which is useful for dot products with constants (used in filters, correlators, etc.). The input reorder logic includes a path for the sign of Y to select or bypass the constant register to facilitate the conditional multiplicand operation where the X input is Xin when Y is non-negative and a constant stored in one of the constant registers if negative. The output selectors for X and Z outputs are 8:1 selectors 605, 590, respectively, followed by a 2:1 bypass select (muxes 604, 608 respectively). Each 8:1 selector selects from the 4 delayed samples on the same or the 4 on the opposite input. The X and Y selections are controlled by two 4 bit values from one of 4 configuration registers selected by a sequence counter 575. The Y input has a similar 4-deep shift register queue with a 4:1 multiplexer 607 to select which queue tap is directed to the output for each sequencer state. This is also followed by a 2:1 queue bypass mux 606 controlled by the sequence counter 575.

Figure 61:
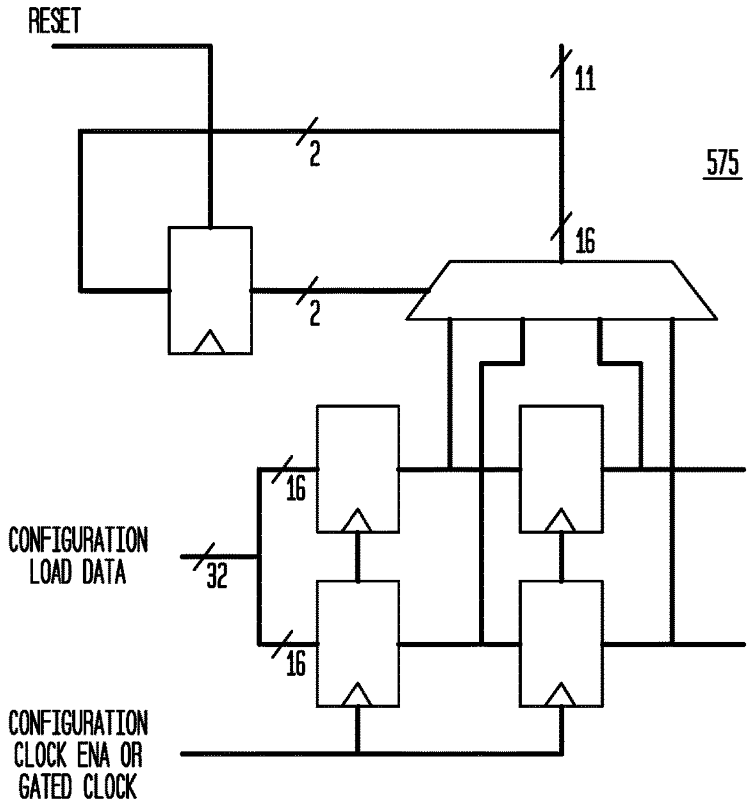

FIG. 61 is a detailed circuit and block diagram illustrating a sequencer 575 logic circuit structure for input and output reorder queues 350, 355. The sequence counter 575 is a non-branching state machine whose next state is determined by two bits in the configuration state registers. Each configuration register is 16 bits, with two written per 32 bit configuration word write. Two of the configuration bits are the next state for the register. Eleven of the selected configuration bits drive the data select multiplexers in the data path as illustrated in FIG. 60. The remaining 3 bits are currently unused, but the registers remain in order to allow configuration data to be propagated sequentially down the chain.

12. Data Packets and Routing Control

Figure 68:
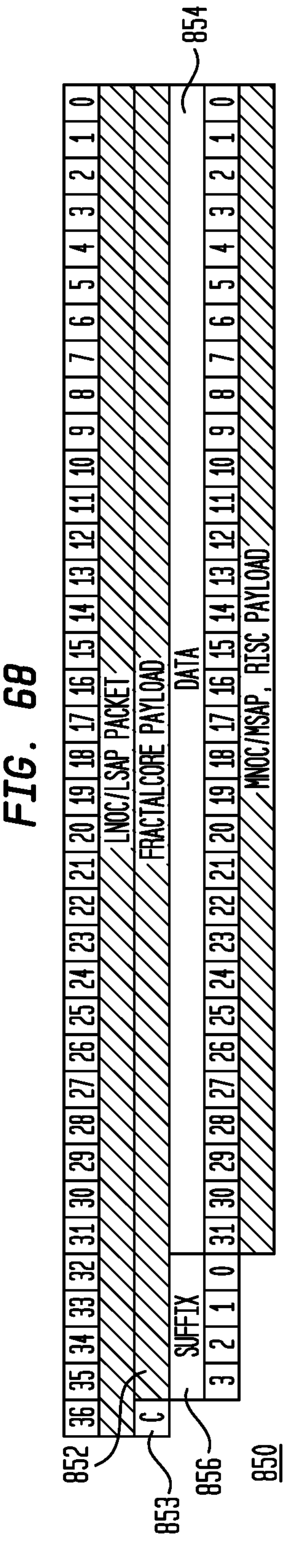

FIG. 68 is a diagram of a representative data packet 850 utilized with the reconfigurable processor. In a representative embodiment, a data packet 850 is 37 bits comprising a computational core 200 36-bit payload 852 and a control bit 853. The payload 852, in turn, comprises 32-bits of data payload 854 and suffix bits as a 4-bit suffix 856. The 32-bit data 854 supports a variety of potential data formats, including integer, floating-point, and SIMD representations, illustrated in FIG. 69. As mentioned above, the suffix 856 is primarily used for zeros compression with the array but also may support other functions such as various flags, conditional operations, carrying the index of operation, etc. The control (data type) bit 853 is used only by the interconnect 120 and is not carried within the computational core 200.

Figure 69:
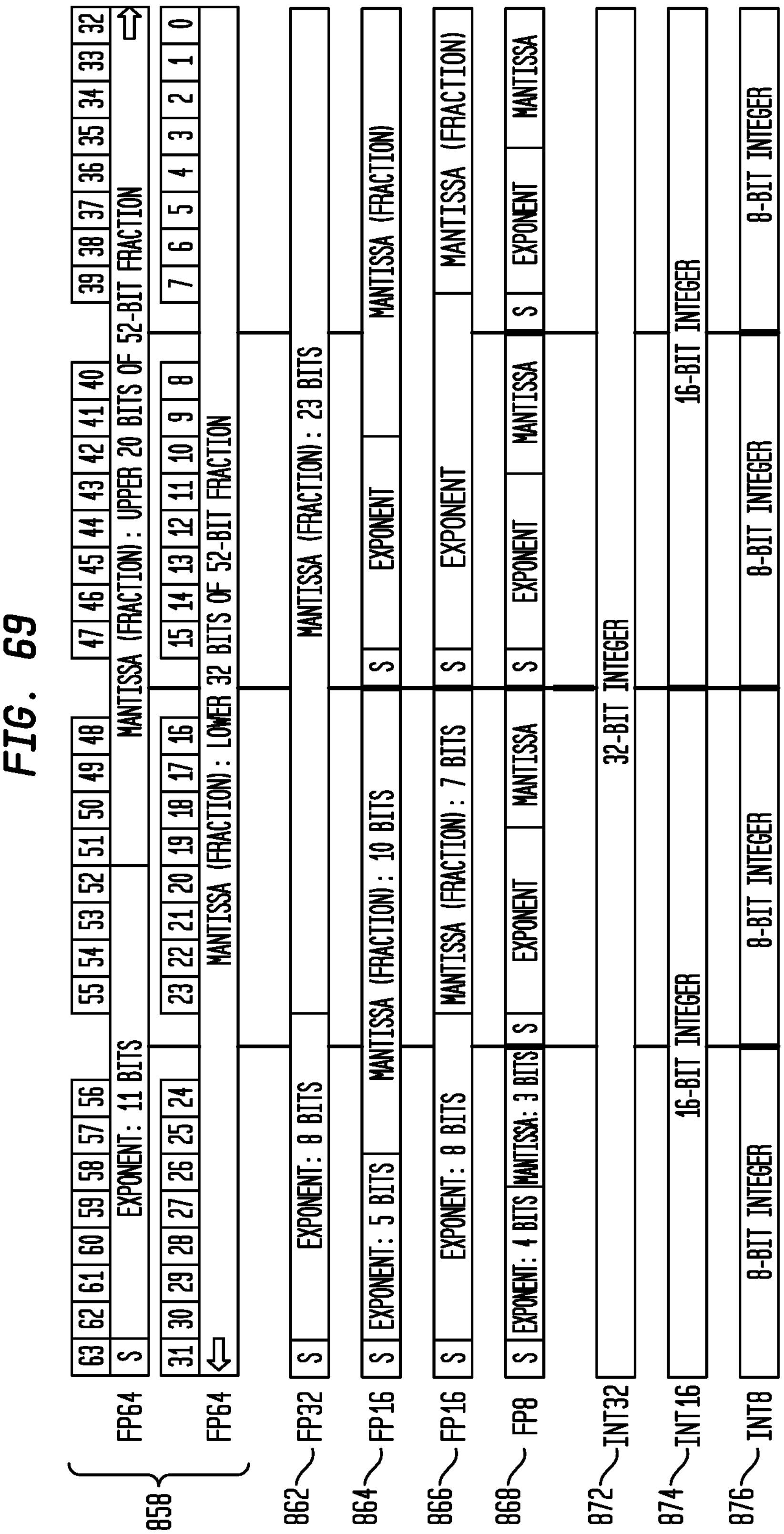

FIG. 69 is a diagram of representative data payload 854 types utilized in a data packet 850 and include, for example and without limitation, 64-bit floating point for IEEE 754 double-precision floating point (FP 64) (in two packets 858); 32-bit floating point for IEEE 754 single-precision floating point (FP 32) (862); 16-bit floating point for IEEE 754 half-precision floating point (FP 16) (864); 16-bit brain floating point for BFLOAT16 (BF 16) (866); 8-bit floating point for IEEE 754 quarter-precision floating point (FP 8) (868), 32-bit integer for signed and unsigned 32-bit integer values (Int32) (872), 16-bit integer for signed and unsigned 16-bit integer values (Int16) (874), and 8-bit integer for signed and unsigned 8-bit integer values (Int8) (876).

Figure 70:
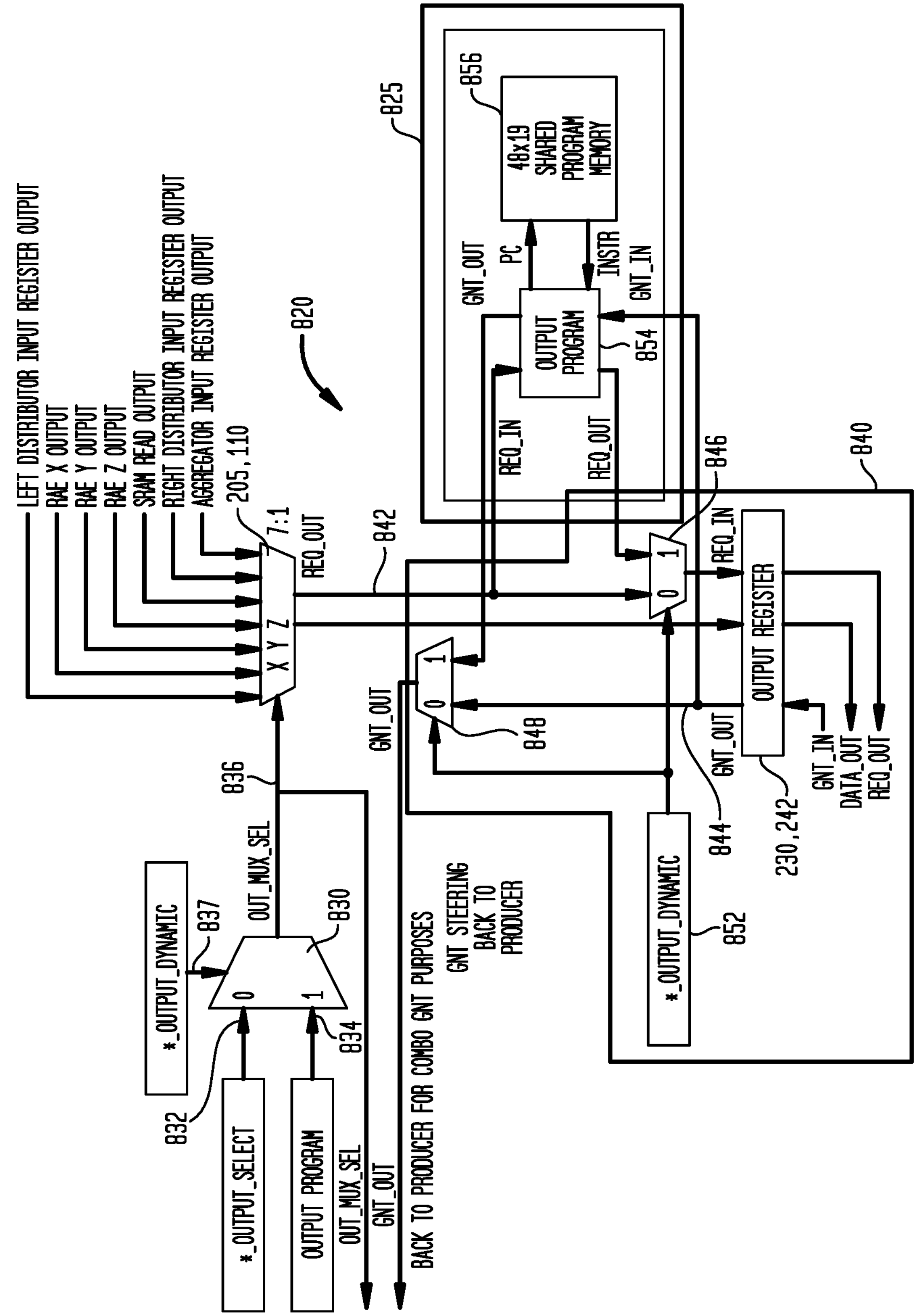

FIG. 70 is a block and circuit diagram of a routing controller 820 utilized in conjunction with the input multiplexers 205 and output multiplexers 110 for data coming into and out of a computational core 200, respectively, and as an option, may also include a program sequencer 825. The routing controller 820 comprises an output selection multiplexer 830 controlled by dynamic output selection which selects a control output 836 from the output selection multiplexer 830 of either a dynamic output selection 832 or a static or programmed output selection 834. The control output 836 in turn is then utilized to select the output of the corresponding input multiplexer 205 or output multiplexer 110 from the inputs available to the corresponding input multiplexer 205 or output multiplexer 110 (from the interconnection networks 120, 220).

As mentioned above, the configurable processor 100 utilizes data flow. As part of this, the data producer asserts a data transmission request signal ("REQ") indicating that it has data to send (842), and the data consumer asserts a data transmission grant signal ("GNT") indicating that it has room to accept the data (844). A data transfer coordinator circuit 840 is utilized to transmit such a data transmission grant signal (GNT), comprising a first data transfer multiplexer 846 which receives the data transmission request signal (REQ) and is controlled by dynamic output selection 852 to pass the data transmission request signal (REQ) to the corresponding input or output register 230, 242, respectively; and a second data transfer multiplexer 848 which receives the data transmission grant signal (GNT) and is controlled by dynamic output selection 852 to pass the data transmission grant signal (GNT) from the corresponding input or output register 230, 242, respectively, back to the requesting data transmitter. An optional program sequencer 825 may be included, which also provides inputs into the first and second data transfer multiplexers 846, 848, respectively, under the control of a program 854 which can access a shared program memory 856 (such as an output program 272, 274, 276).

This request and grant mechanism is also utilized to control the data flow under a wide variety of circumstances, such as to maintain data order when data packets are going to more than one destination. For example, when data is going to be forked to multiple locations, the data transmitter should receive data transmission grant signals (GNT) from each data receiver, prior to transmitting the data. Also for example, when data is going to be merged from multiple sources to a single destination, the data receiver should receive multiple data transmission request signals (REQ) and issue a combined data transmission grant signal (GNT) going to each data transmitter, and each data receiver should receive data transmission grant signals (GNT) prior to transmitting the data. Also for example, when data is going to be switched from multiple sources to a single destination, the data receiver should receive multiple data transmission request signals (REQ) and issue separate data transmission grant signals (GNT) going to each separate data transmitter, and each data receiver should receive a corresponding data transmission grant signal (GNT) prior to transmitting the data. Also for example, when data is going to be steered to a selectable location, the data transmitter should receive a data transmission grant signal (GNT) from the selected data receiver, prior to transmitting the data.

13. Suffix Control Circuit and Zeros Compression/Decompression

Figure 71:
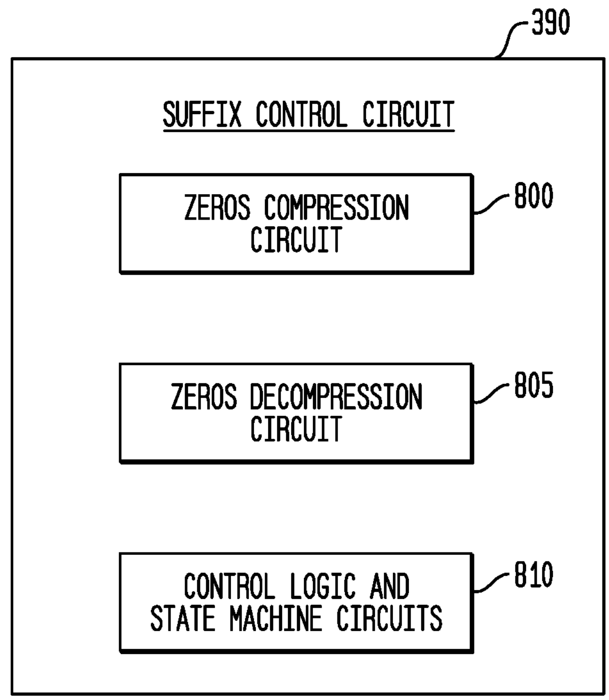
Figure 72:
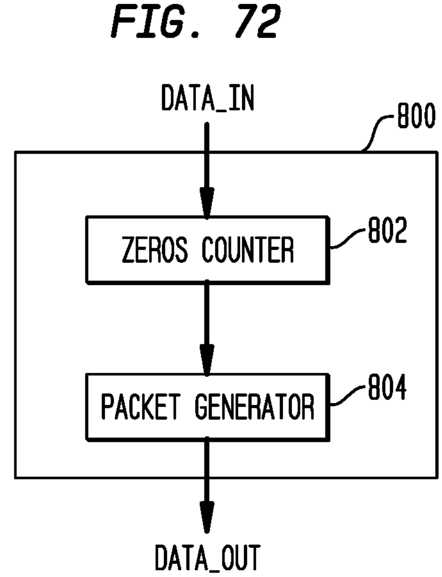
Figure 73:
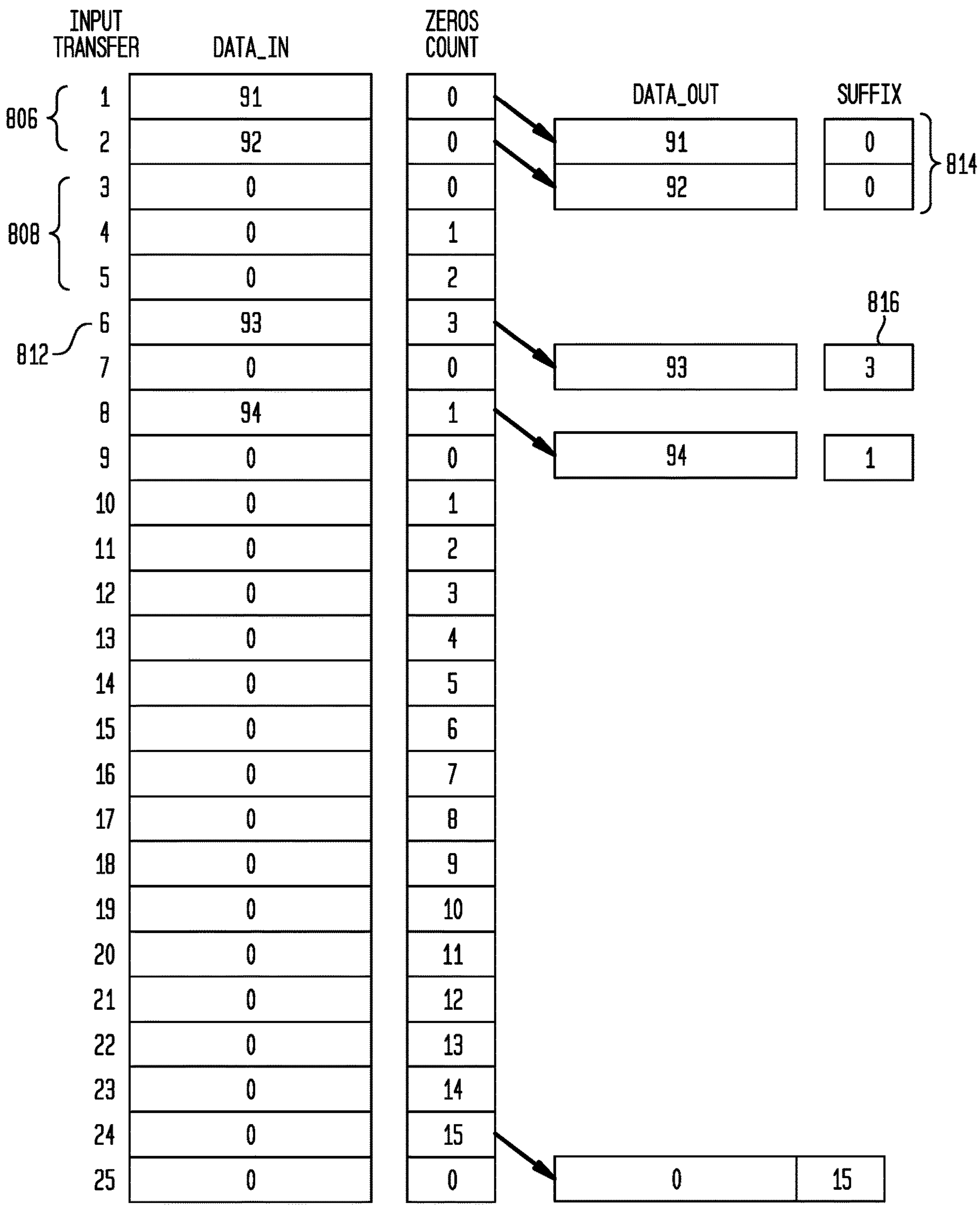
Figure 74:
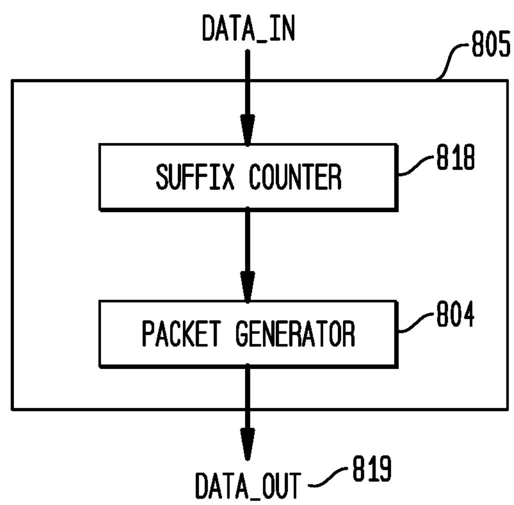

FIG. 71 is a block diagram of a representative embodiment of a suffix control circuit 390. FIG. 72 is a block and circuit diagram of a zeros compression circuit 800. FIG. 73 is a diagram of a representative zeros compression data packet sequence. FIG. 74 is a block and circuit diagram of a zeros decompression circuit 805.

Referring to FIGS. 71-74, in a representative embodiment, a suffix control circuit 390 comprises a zeros compression circuit 800 to perform zeros compression, a zeros decompression circuit 805 to perform zeros decompression, and optionally control logic and state machine circuits 810 to perform other activities with respect to the suffix 856, such as conditional logic, branching, condition flag processing and generating, etc., which may be user determined. In another representative embodiment, such as when the zeros compression circuit 800 and the zeros decompression circuit 805 are implemented in other parts of the computational core 200 (such as illustrated in FIG. 4), the suffix control circuit 390 typically comprises the control logic and state machine circuits 810. The zeros compression circuit 800 comprises a zeros counter 802 and a packet generator 804. When zeros compression is enabled, zeros compression prevents valid zero values from propagating. Instead, each valid zero value is tracked in a zeros count using zeros counter 802. During a stream of zero values, the zeros count increments until it reaches its maximum value of 15. In this case, the next valid data transfer, regardless of value, is propagated on DATA_OUT as a data packet from packet generator 804 (i.e., propagating the original data packet but replacing its suffix bits with the zero count), with the zeros count included in the suffix 856, and the zeros count rolls over or is reset to 0. In a string of non-zero transfers, data propagates normally along with suffix 856 of 0, indicating there were no preceding zero values.

FIG. 73 shows an example data sequence with zeros compression enabled. The first two transfers 806 propagate normally. The values 91 and 92 are sent as data packets (814) on DATA_OUT and the bits of the suffix 856 are set to 0, indicating that there are zero preceding zeros. Input transactions 3 through 5 (808) do not propagate but the zeros count increments for each of the valid input transactions. On input transaction 6 (812), a non-zero value 93 arrives, which then propagates on DATA_OUT (816) with the accumulated zeros count of 3 via the suffix 856. In other words, there were three zero values before the value 93. The zeros count is also reset on any non-zero value. In the illustrated example, the advantage is that 24 input transfers went into the zeros compression circuit and only five output transfers resulted, with no loss of information.

Referring to FIG. 74, the zeros decompression circuit 805 comprises a suffix counter 818 and a packet generator 804. When a data packet arrives having a data payload 854 and nonzero count in the suffix 856, the suffix counter 818 determines the zeros count of the suffix 856, and signals the packet generator 804 to issue that number of data packets having payloads 854 of zeros (on DATA_OUT 819) before sending the actual data payload which arrived in the packet (having the nonzero value in its suffix 856).

As mentioned above, instead of being located within a suffix control circuit 390, the zeros compression circuit 800 and zeros decompression circuit 805 may be distributed throughout the computational core 200, such as including a zeros decompression circuit 805 to receive data from the input multiplexers 205 and decompress any zeros compression, and such as including a zeros compression circuit 800 in advance of the output multiplexers 110 to perform zeros compression prior to the selection and transmission of the output data packets on the various interconnection networks 120, 220.

14. Representative Applications

A RAE circuit 300 can be utilized to generate an interpolated LUT (look up table), using two multipliers 305 (for the multiplications) and two multiplier shift-combiner networks 310 (for the additions), and using memory 150, for example. A brute force method of obtaining the coefficients directly from memory would be prohibitive in terms of memory utilization. Fortunately the function representing the series of coefficients is a smooth function (approximately the sinc function), which makes compressing and generating the coefficients in real time attractive in terms of resource utilization. The coefficient set is approximately the sinc function sampled at intervals of 1/(P*F) where P*F is the length of the filter, P is the poly-phase branch length and F is the FFT size. The coefficients are distributed across the poly-phase branches so that on one branch the successive taps are associated with C(k), C(k+F), C(k+2F), . . . . The coefficients presented to a particular multiplier 305 are consecutive coefficients, so that at multiplier m, the coefficients are C(T*F=m) where T is the tap number and F is the FFT length. This means that the coefficients at any one multiplier 305 are a continuous segment of the sinc function. This permits using an interpolation scheme to reduce the memory requirements for storing the coefficients.

The interpolation scheme used in the design is a quadratic spline generated from quadratic coefficients stored in a small memory (512×72) implemented with a single block RAM per coefficient generator. Rather than storing the coefficients, we instead store the quadratic coefficients for a curve fitted to a neighborhood represented by the most significant bits of the coefficient index. The least significant bits of the index are then applied to the quadratic as the offset from the coefficient position indicated by the most significant index bits. The upper 9 bits address a 512×72 bit memory containing the 3 quadratic coefficients for the curve and the lower 6 bits (for 32768 points) are used to compute the interpolated value y=Ax2+Bx+C. The memory contents are the scaled A, B and C coefficients, which can be found using the Mathlab Polyfit function to fit a quadratic to segments of the filter's impulse response, for example and without limitation.

Figure 62:
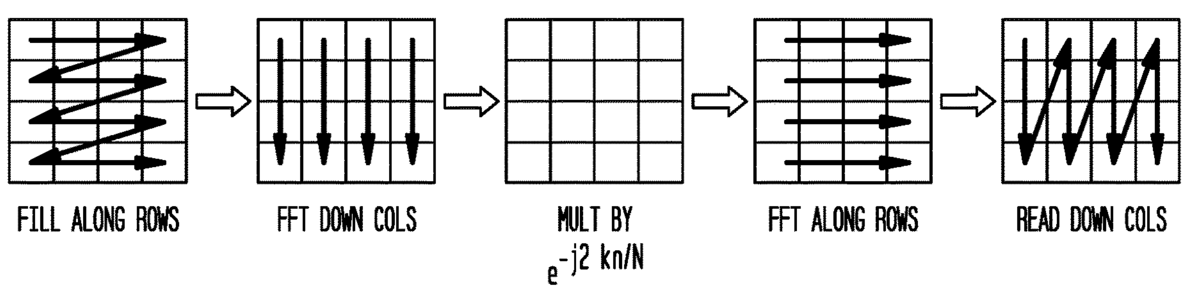
Figure 63:
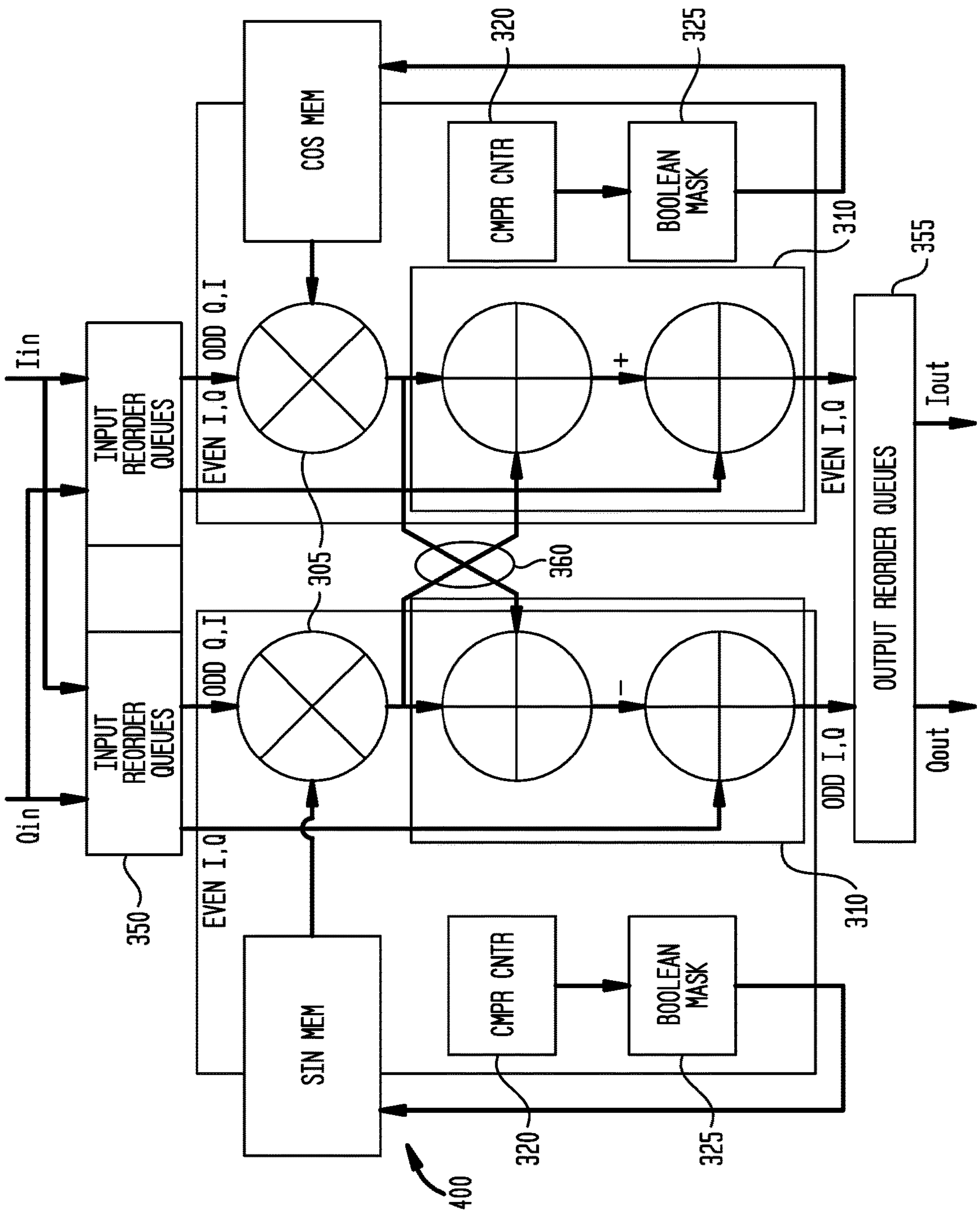
Figure 64:
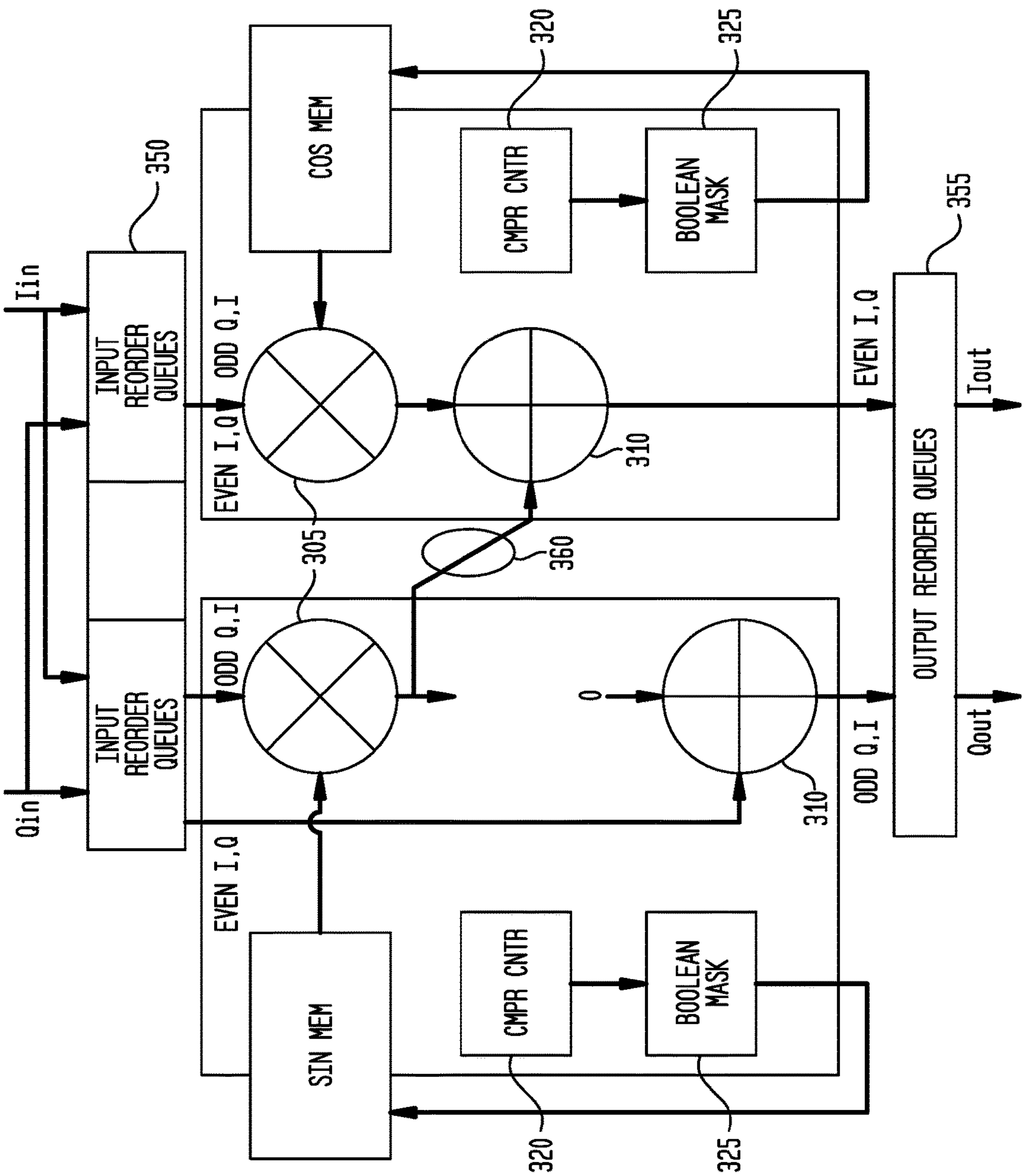
Figure 65:
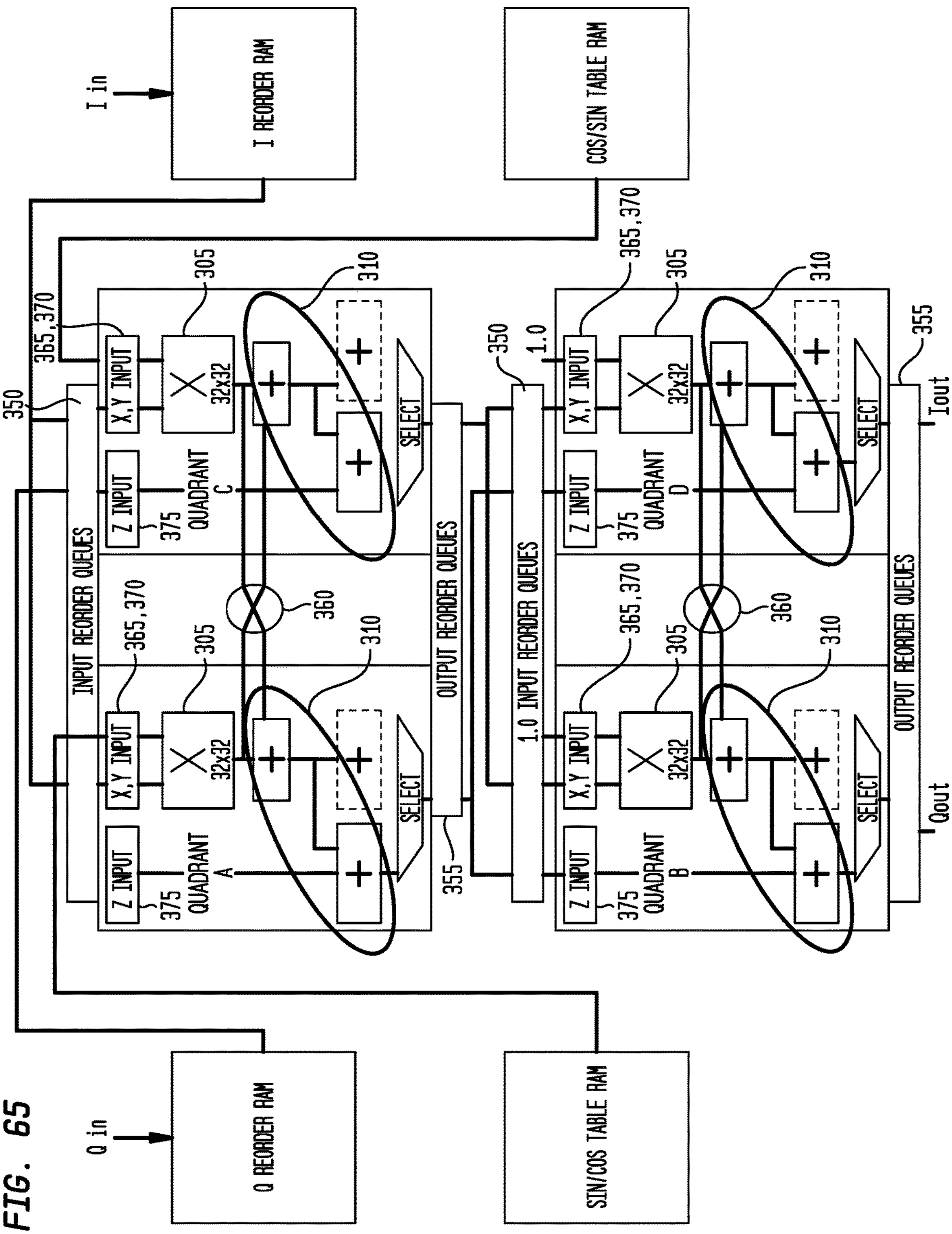
Figure 66:
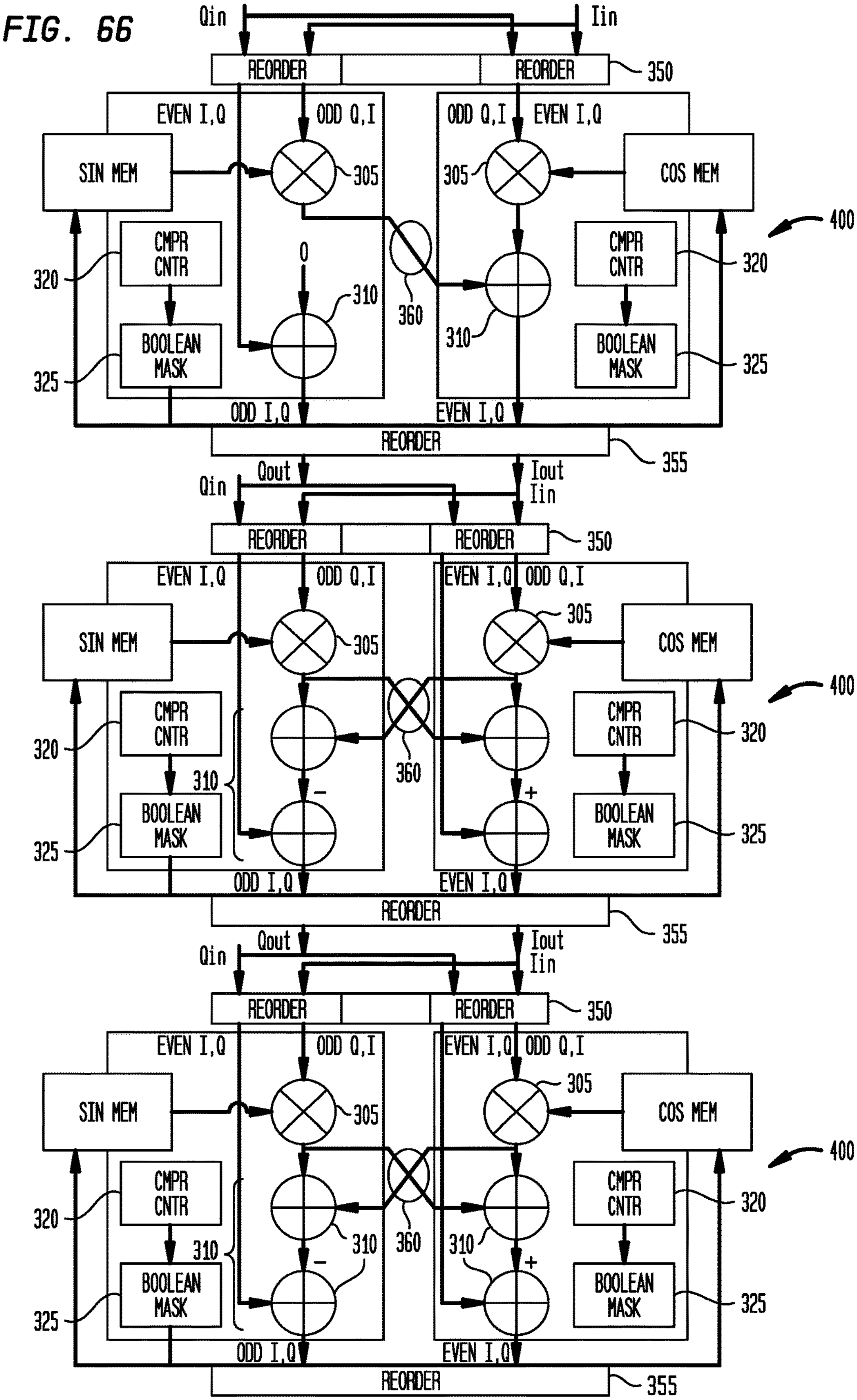

FIG. 62 illustrates a combination of FFTs using a mixed radix algorithm. FIG. 63 is a detailed circuit and block diagram illustrating a RAE 300 pair for execution of a radix 2 FFT kernel. FIG. 64 is a detailed circuit and block diagram illustrating a RAE 300 pair configured for a complete rotator. FIG. 65 is a detailed circuit and block diagram illustrating a RAE circuit quad 450 for execution of a radix 4 FFT (butterfly) kernel. FIG. 66 is a detailed circuit and block diagrams illustrating multiple RAEs 300 cascaded pairs for execution of an FFT kernel and other applications. Referring to FIG. 62, the number of rows equal size of first transform, number of columns is the size of second transform, and rows times columns is the size of the composite transform. A four point (Radix-4) complex FFT kernel plus half of the twiddle rotator may be constructed in a single RAE circuit quad 450, illustrated in FIGS. 63, 64, and 65. The RAE circuit quad 450 processes one FFT point per clock (e.g., a 4 point transform completes in 4 clocks and accepts and outputs one sample per clock). The implementation includes a complex multiply on the input used as a phase rotator when cascading FFT kernels to build larger FFTs. The cascade strategy follows the mixed radix algorithm for combining smaller FFTs for longer transform lengths. Each pair of RAEs 300 use the dedicated pair routing to simultaneously perform the real portion of both the even and odd points in one clock interleaved with simultaneously performing the imaginary portions of both the even and odd points: I=Ie+/−. The radix4 transform is a building block and may be cascaded further, as illustrated in FIG. 66, for example.

The memories associated can be used to store two pages of IQ data for up to a 256 point transform length, and cosine and sine twiddles for a rotator on the kernel input for up to 512 point transform length. The radix4 kernel is a building block for larger transform lengths. Larger Fourier transforms may be constructed from arbitrarily sized small transform "kernels" using the "Mixed Radix" algorithm. The algorithm essentially enters the data into a k×n matrix where k and n are the sizes of the constituent transforms to a kn point transform. The data is entered along the rows first, then the first transforms are applied down the columns. The intermediate result elements are phase-rotated according to their indices in the matrix, then the second set of transforms are applied to each row of the matrix, and finally output is naturally ordered when data is read column-wise. This sequence is shown in FIG. 62.

The mixed radix algorithm can be applied repetitively to build progressively larger transforms, such as illustrated in FIG. 65. For example, a 1K point transform is constructed by making two 16 point transforms, each out of 4 point kernels using the mixed radix algorithm, then combining one 16 point and the remaining 4 point to make a 64 point transform, then combining that 64 point with the remaining 16 point to produce a 1024 point transform. Similarly, implementations may be constructed from 8 and 16 point transforms using the mixed radix algorithm to first create a 128 point transform, then another application of the algorithm to create the 2k transform from the 128 point and a 16 point. The 8 and 16 point transforms can also be created from 2 and 4 point transforms using the mixed radix algorithm. The input and output may be in bit-reversed order.

Figure 67:
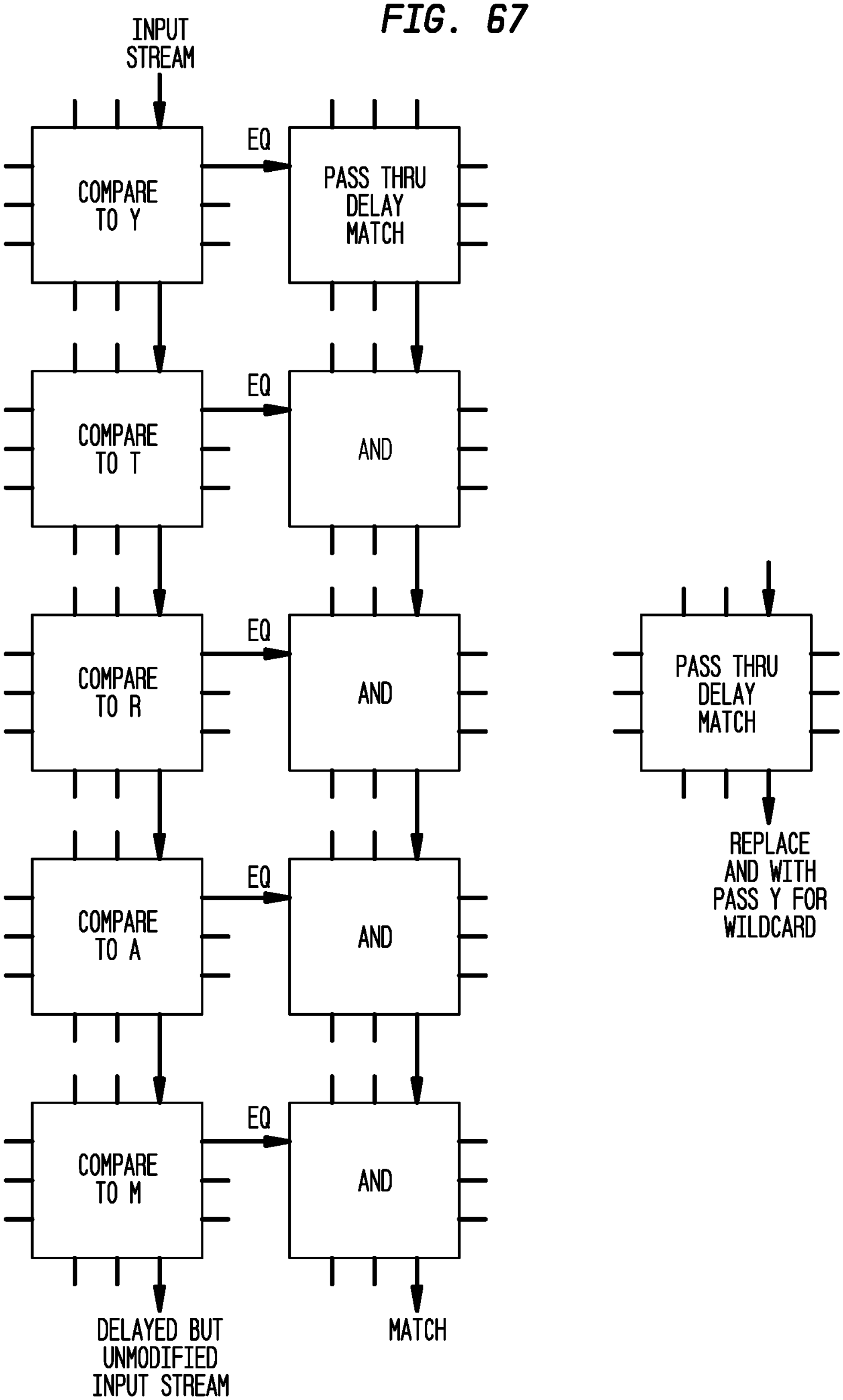

FIG. 67 is a diagram illustrating a string matching use case which also may be implemented using the comparators 320 and Boolean logic circuit 325 of one or more RAE circuits 300, including one or more RAE circuit quads 450, for example and without limitation. Use 1 SIMD4 lane per string, one input per SIMD lane. The input stream can be duplicated in the four lanes to simultaneously search for four different strings. An input delay queue can be used to make the delay through AND one clock shorter than delay through compare.

15. Conclusion

The reconfigurable processor 100 provides high performance and energy efficient solutions for mathematically intensive applications, such as involving artificial intelligence, neural network computations, digital currencies, encryption, decryption, blockchain, computation of Fast Fourier Transforms (FFTs), and machine learning, for example and without limitation.

In addition, the reconfigurable processor 100 is capable of being configured for any of these various applications, with several such examples illustrated and discussed in greater detail below. Such a reconfigurable processor 100 is readily scalable, such as to millions of computational cores 200, has low latency, is computationally and energy efficient, is capable of processing streaming data in real time, is reconfigurable to optimize the computing hardware for a selected application, and is capable of massively parallel processing. For example, on a single chip, a plurality of the reconfigurable processors 100 may also be arrayed and connected, using the interconnection network 120, to provide hundreds to thousands of computational cores 200 per chip. In turn, a plurality of such chips may be arrayed and connected on a circuit board, resulting in thousands to millions of computational cores 200 per board. Any selected number of computational cores 200 may be implemented in reconfigurable processor 100, and any number of reconfigurable processors 100 may be implemented on a single integrated circuit, and any number of such integrated circuits may be implemented on a circuit board. As such, the reconfigurable processor 100 having an array of computational cores 200 is scalable to any selected degree (subject to other constraints, however, such as routing and heat dissipation, for example and without limitation).

16. General Matters

A processor circuit 130 may be any type of processor, and may be embodied as one or more RISC-V or other processors, configured, designed, programmed or otherwise adapted to perform the functionality discussed herein. As the term processor circuit 130 is used herein, a processor circuit 130 may include use of a single integrated circuit ("IC"), or may include use of a plurality of integrated circuits or other components connected, arranged or grouped together, such as controllers, microprocessors, digital signal processors ("DSPs"), parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components, whether analog or digital. As a consequence, as used herein, the term processor circuit 130 should be understood to equivalently mean and include a single IC, or arrangement of custom ICs, ASICs, processors, microprocessors, controllers, FPGAs, adaptive computing ICs, or some other grouping of integrated circuits which perform the functions discussed below, with associated memory, such as microprocessor memory or additional RAM, DRAM, SDRAM, SRAM, MRAM, ROM, FLASH, EPROM or $E^2$PROM. A processor circuit 130, with its associated memory, may be adapted or configured (via programming, FPGA interconnection, or hard-wiring) to perform the methodology of the invention, as discussed above. For example, the methodology may be programmed and stored, in a processor circuit 130 with its associated memory (and/or memory) and other equivalent components, as a set of program instructions or other code (or equivalent configuration or other program) for subsequent execution when the processor circuit 130 is operative (i.e., powered on and functioning). Equivalently, when the processor circuit 130 may implemented in whole or part as FPGAs, custom ICs and/or ASICs, the FPGAs, custom ICs or ASICs also may be designed, configured and/or hard-wired to implement the methodology of the invention. For example, the processor circuit 130 may be implemented as an arrangement of analog and/or digital circuits, controllers, microprocessors, DSPs and/or ASICs, collectively referred to as a "controller", which are respectively hard-wired, programmed, designed, adapted or configured to implement the methodology of the invention, including possibly in conjunction with a memory.

A memory 150, 155, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor), whether volatile or non-volatile, whether removable or non-removable, including without limitation RAM, FLASH, DRAM, SDRAM, SRAM, MRAM, FeRAM, ROM, EPROM or $E^2$PROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. The memory 150, 155 may be adapted to store various look up tables, parameters, coefficients, other information and data, programs or instructions (of the software of the present invention), and other types of tables such as database tables.

As indicated above, a processor circuit 130 is hard-wired or programmed, using software and data structures of the invention, for example, to perform the methodology of the present invention. As a consequence, the system and method of the present invention may be embodied as software which provides such programming or other instructions, such as a set of instructions and/or metadata embodied within a non-transitory computer readable medium, discussed above. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, SystemC, LISA, XML, Java, Brew, SQL and its variations (e.g., SQL 99 or proprietary versions of SQL), DB2, Oracle, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor circuit 130 or computer and executed, including the processor circuit 130, for example).

The software, metadata, or other source code of the present invention and any resulting bit file (object code, database, or look up table) may be embodied within any tangible, non-transitory storage medium, such as any of the computer or other machine-readable data storage media, as computer-readable instructions, data structures, program modules or other data, such as discussed above with respect to the memory 140, e.g., a floppy disk, a CDROM, a CD-RW, a DVD, a magnetic hard drive, an optical drive, or any other type of data storage apparatus or medium, as mentioned above.

The present disclosure is to be considered as an exemplification of the principles of the invention and is not intended to limit the invention to the specific embodiments illustrated. In this respect, it is to be understood that the invention is not limited in its application to the details of construction and to the arrangements of components set forth above and below, illustrated in the drawings, or as described in the examples. Systems, methods and apparatuses consistent with the present invention are capable of other embodiments and of being practiced and carried out in various ways, all of which are considered equivalent and within the scope of the disclosure.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated. In addition, every intervening sub-range within range is contemplated, in any combination, and is within the scope of the disclosure. For example, for the range of 5-10, the sub-ranges 5-6, 5-7, 5-8, 5-9, 6-7, 6-8, 6-9, 6-10, 7-8, 7-9, 7-10, 8-9, 8-10, and 9-10 are contemplated and within the scope of the disclosed range.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A reconfigurable processor circuit comprising:

a first interconnection network;

a second interconnection network;

a processor coupled to the first interconnection network; and a plurality of computational cores arranged in an array, the plurality of computational cores coupled to the first interconnection network and to the second interconnection network, the second interconnection network coupling adjacent computational cores of the plurality of computational cores, each computational core comprising:

a memory circuit;

a reconfigurable arithmetic circuit comprising:

at least one input reordering queue;

a configurable multiplier coupled to the at least one input reordering queue;

a configurable shifter and combiner network coupled to configurable multiplier; and an accumulator circuit coupled to the configurable shifter and combiner network;

and a zeros compression circuit comprising:

a zeros counter configured to count one or more sequential data packets having a zero data payload to generate a zeros count; and a first data packet generator configured, when a next data packet has a nonzero data payload, to encode the zeros count as a suffix in the next data packet.

2. The reconfigurable processor circuit of claim 1, wherein the first data packet generator is further configured to transmit the next data packet having the nonzero data payload on the first interconnection network or the second interconnection network and not to transmit the one or more data packets having the zero data payload on the first interconnection network and the second interconnection network.

3. The reconfigurable processor circuit of claim 1, wherein the first data packet generator is further configured, when the zeros count has reached a predetermined zeros count and the next data packet has either a zero or a nonzero data payload, to encode the predetermined zeros count as the suffix in the next data packet.

4. The reconfigurable processor circuit of claim 1, wherein the zeros counter is further configured to generate the zeros count up to a maximum zeros count, and when the zeros count has reached the maximum zeros count, the first data packet generator is further configured to encode the maximum zeros count as the suffix in the next data packet, the next data packet having either a zero or a nonzero data payload.

5. The reconfigurable processor circuit of claim 4, wherein the zeros counter is further configured, when the maximum zeros count has been reached, to reset the zeros count to zero.

6. The reconfigurable processor circuit of claim 1, wherein the reconfigurable arithmetic circuit further comprises:

a zeros decompression circuit configured to receive the next data packet, the zeros decompression circuit comprising:

a suffix counter configured to determine the zeros count from the suffix of the next data packet; and a second data packet generator configured to generate the one or more data packets having a zero data payload, corresponding to the zeros count, before providing the next data packet having the nonzero data payload.

7. The reconfigurable processor circuit of claim 6, wherein each computational core of the plurality of computational cores further comprises:

at least one input multiplexer coupled to the reconfigurable arithmetic circuit, to the first interconnection network, to the second interconnection network, and to the zeros decompression circuit;

at least one input register coupled to the at least one input multiplexer;

at least one output multiplexer coupled to the reconfigurable arithmetic circuit, to the zeros compression circuit, and to the at least one input register; and at least one output register coupled to the at least one output multiplexer, to the first interconnection network, and to the second interconnection network.

8. The reconfigurable processor circuit of claim 1, wherein the reconfigurable arithmetic circuit further comprises:

a comparator circuit coupled to the at least one input reordering queue, the comparator circuit configured to perform data steering.

9. The reconfigurable processor circuit of claim 8, wherein the comparator circuit comprises:

a single-instruction multiple-data (SIMD) magnitude comparator configured to generate a comparison result from one or more comparisons;

a plurality of registers;

a plurality of steering multiplexers;

an adder or counter configured to generate one or more index counts; and a programmable decoder coupled to the plurality of steering multiplexers, the programmable decoder configured, in response to the comparison result, to generate one or more control signals, of a plurality of control signals, to one or more steering multiplexers of the plurality of steering multiplexers, to control one or more data or counter paths.

10. The reconfigurable processor circuit of claim 1, wherein the configurable multiplier has a plurality of operating modes, the plurality of operating modes comprising a fixed point operating mode and a floating point operating mode, wherein the configurable multiplier has a native operating mode of a 27×27 unsigned multiplier further configurable to process signed inputs.

11. The reconfigurable processor circuit of claim 10, further comprising:

a third interconnection network configured to selectively couple the shifter and combiner network to one or more adjacent reconfigurable arithmetic circuits to perform single cycle 32×32 and 54×54 multiplication, single precision 24×24 multiplication, and single-instruction multiple-data (SIMD) dot products.

12. The reconfigurable arithmetic circuit of claim 10, wherein the configurable multiplier is further configurable to become four 8×8 multipliers, two 16×16 single-instruction multiple-data (SIMD) multipliers, one 32×32 multiplier and one 54×54 multiplier.

13. The reconfigurable processor circuit of claim 1, wherein the shifter and combiner network comprises:

a shifter circuit; and a plurality of series-coupled adder circuits coupled to the shifter circuit;

wherein the shifter and combiner network is configured to shift a multiplier product to convert a floating point product to a product having a radix-32 exponent, and to sum a plurality of single-instruction multiple-data (SIMD) products to form a SIMD dot product.

14. The reconfigurable processor circuit of claim 1, wherein the at least one input reordering queue is configured to store a plurality of inputs, and the at least one input reordering queue further comprise:

input reordering logic circuitry configured to reorder a sequence of the plurality of inputs, to adjust a sign bit for negate and absolute value functions, and to deinterleave in phase (I) and quadrature (Q) data inputs and odd and even data inputs.

15. The reconfigurable processor circuit of claim 1, wherein the reconfigurable arithmetic circuit further comprises:

at least one output reorder queue coupled to receive and reorder outputs from a plurality of reconfigurable arithmetic circuits.

16. The reconfigurable processor circuit of claim 1, wherein the reconfigurable arithmetic circuit has a plurality of inputs, the plurality of inputs comprising a first, X input; a second, Y input, and a third, Z input; and wherein the reconfigurable arithmetic circuit further comprises:

at least one control logic circuit comprising one or more circuits selected from the group consisting of: a compare circuit; a Boolean logic circuit; a Z input shifter; an exponent logic circuit; an add, saturate and round circuit; and combinations thereof.

17. The reconfigurable processor circuit of claim 16, wherein the Z input shifter is configured to shift a floating point Z-input value to a radix-32 exponent value, to shift by multiples of 32 bits to match a scaling of multiplier sum outputs, and wherein the Z input shifter is further configured for a plurality of integer modes including 64, 32, 2×16 and 4×8 bit shift or rotate modes.

18. The reconfigurable processor circuit of claim 16, wherein the Boolean logic circuit comprises an AND-OR-INVERT logic unit configured to perform AND, NAND, OR, NOR, XOR, XNOR, and selector operations on 32 bit integer inputs.

19. The reconfigurable processor circuit of claim 16, wherein the compare circuit is configured to extract a minimum or maximum data value from an input data stream, an index from the input data stream, to compare two input data streams, to swap two input data streams, to put the minimum of the two input data streams on a first output and to put the maximum of the two input data streams on a second output, to perform data steering, to generate address sequences, and to generate comparison flags for equality, greater than and less than.

20. The reconfigurable processor circuit of claim 1, wherein a single reconfigurable arithmetic circuit is configured to perform at least two mathematical computation or functions selected from the group consisting of: one IEEE single or integer 27×27 multiply per cycle; two parallel IEEE half precision, 16-bit brain floating point ("BFLOAT") (BLOAT16), or 16-bit integer for signed and unsigned 16-bit integer values (INT16) multiplies per cycle; four parallel IEEE quarter precision or 8-bit integer for signed and unsigned 8-bit integer values (INT8) multiplies per cycle; sum of two parallel IEEE half precision, BFLOAT16 or INT16 multiplies per cycle; sum of four parallel IEEE quarter precision or 8-bit integer for signed and unsigned 8-bit integer values (INT8) multiplies per cycle; one quarter-precision or INT8 complex multiply per cycle; fused add; accumulation; 64, 32, 2×16 or 4×8 bit shifts by any number of bits; 64, 32, 2×16 or 4×8 bit rotate by any number of bits; 32-bit bitwise Boolean logic; compare, minimum or maximum of a data stream; two operand sort; and combinations thereof;

wherein two adjacent linked reconfigurable arithmetic circuits having a pair configuration are configured to perform at least two mathematical computation or functions selected from the group consisting of: one 32-bit integer for signed and unsigned 32-bit integer values (INT32) multiply per cycle; one 64-bit integer for signed and unsigned 64-bit integer values (INT64) multiply in a 4 cycle sequence using the accumulator circuit to add four 32×32 partial products; sum of two IEEE single precision or two 24-bit integer for signed and unsigned 24-bit integer values (INT24) multiplies per cycle; sum of four parallel IEEE half precision, 16-bit brain floating point ("BFLOAT") (BLOAT16) or 16-bit integer for signed and unsigned 16-bit integer values (INT16) multiplies per cycle; sum of eight parallel IEEE quarter precision or 8-bit integer for signed and unsigned 8-bit integer values (INT8) multiplies per cycle; one half-precision or INT16 complex multiply per cycle; four multiplies and two adds; fused add; accumulation; and combinations thereof; and wherein four linked reconfigurable arithmetic circuits having a quad configuration are configured to perform at least two mathematical computation or functions selected from the group consisting of: two 64-bit integer for signed and unsigned 64-bit integer values (INT64) multiplies in four cycles; two 32-bit integer for signed and unsigned 32-bit integer values (INT32) multiplies per cycle; sum of two INT32 multiplies per cycle; sum of four IEEE single precision or 24-bit integer for signed and unsigned 24-bit integer values (INT24) per cycle; sum of eight parallel IEEE half precision, 16-bit brain floating point ("BFLOAT") (BLOAT16) or 16-bit integer for signed and unsigned 16-bit integer values (INT16) multiplies per cycle; sum of sixteen parallel IEEE quarter precision or 8-bit integer for signed and unsigned 8-bit integer values (INT8) multiplies per cycle; one single precision or 24-bit integer for signed and unsigned 24-bit integer values (INT24) complex multiply per cycle; fused add; accumulation; and combinations thereof.

21. A reconfigurable processor circuit comprising:

a first interconnection network;

a second interconnection network;

a processor coupled to the first interconnection network; and a plurality of computational cores arranged in an array, the plurality of computational cores coupled to the first interconnection network and to the second interconnection network, the second interconnection network coupling adjacent computational cores of the plurality of computational cores, each computational core comprising:

a memory circuit;

a reconfigurable arithmetic circuit comprising:

at least one input reordering queue;

a configurable multiplier coupled to the at least one input reordering queue;

a configurable shifter and combiner network coupled to configurable multiplier; and an accumulator circuit coupled to the configurable shifter and combiner network;

a zeros compression circuit comprising:

a zeros counter configured to count one or more sequential data packets having a zero data payload to generate a zeros count; and a first data packet generator configured, when a next data packet has a nonzero data payload, to encode the zeros count as a suffix in the next data packet, and further configured, when the zeros count has reached a predetermined zeros count and the next data packet has either a zero or a nonzero data payload, to encode the predetermined zeros count as the suffix in the next data packet;

and a zeros decompression circuit configured to receive the next data packet from the first or second interconnection networks, the zeros decompression circuit comprising:

a suffix counter configured to determine the zeros count from the suffix of the next data packet; and a second data packet generator configured to generate the one or more data packets having a zero data payload, corresponding to the zeros count, before providing the next data packet having the nonzero data payload.

22. The reconfigurable processor circuit of claim 21, wherein the data packet generator is further configured to transmit the next data packet having the nonzero data payload on the first interconnection network or the second interconnection network and not to transmit the one or more data packets having the zero data payload on the first interconnection network and the second interconnection network.

23. The reconfigurable processor circuit of claim 21, further comprising:

a third, configurable interconnection network coupled to the shifter and combiner network, the third, configurable interconnection network configured to merge a plurality of reconfigurable arithmetic circuits to perform double precision multiply-adds, single precision single cycle complex multiply, FFT butterfly, exponent resolution, multiply-accumulate, and logic operations.

24. The reconfigurable processor circuit of claim 21, wherein the reconfigurable arithmetic circuit further comprises:

a comparator circuit coupled to the at least one input reordering queue, the comparator circuit configured to perform data steering, the comparator circuit comprising:

a single-instruction multiple-data (SIMD) magnitude comparator configured to generate a comparison result from one or more comparisons;

a plurality of registers;

a plurality of steering multiplexers;

an adder or counter configured to generate one or more index counts; and a programmable decoder coupled to the plurality of steering multiplexers, the programmable decoder configured, in response to the comparison result, to generate one or more control signals, of a plurality of control signals, to one or more steering multiplexers of the plurality of steering multiplexers, to control one or more data or counter paths.

25. The reconfigurable processor circuit of claim 21, wherein the configurable multiplier has a plurality of operating modes, the plurality of operating modes comprising a fixed point operating mode and a floating point operating mode, wherein the configurable multiplier has a native operating mode of a 27×27 unsigned multiplier further configurable to process signed inputs.

26. The reconfigurable processor circuit of claim 21, wherein the shifter and combiner network comprises:

a shifter circuit; and a plurality of series-coupled adder circuits coupled to the shifter circuit;

wherein the shifter and combiner network is configured to shift a multiplier product to convert a floating point product to a product having a radix-32 exponent, and to sum a plurality of single-instruction multiple-data (SIMD) products to form a SIMD dot product.

27. The reconfigurable processor circuit of claim 21, wherein the at least one input reordering queue is configured to store a plurality of inputs, and the at least one input reordering queue further comprise:

input reordering logic circuitry configured to reorder a sequence of the plurality of inputs, to adjust a sign bit for negate and absolute value functions, and to de-interleave in phase (I) and quadrature (Q) data inputs and odd and even data inputs;

and wherein the reconfigurable arithmetic circuit further comprises:

at least one output reorder queue coupled to receive and reorder outputs from a plurality of reconfigurable arithmetic circuits.

28. The reconfigurable processor circuit of claim 1, wherein the reconfigurable arithmetic circuit has a plurality of inputs, the plurality of inputs comprising a first, X input; a second, Y input, and a third, Z input; and wherein the reconfigurable arithmetic circuit further comprises:

at least one control logic circuit comprising one or more circuits selected from the group consisting of: a compare circuit; a Boolean logic circuit; a Z input shifter; an exponent logic circuit; an add, saturate and round circuit; and combinations thereof.

29. The reconfigurable processor circuit of claim 28, wherein the Z input shifter is configured to shift a floating point Z-input value to a radix-32 exponent value, to shift by multiples of 32 bits to match a scaling of multiplier sum outputs, and wherein the Z input shifter is further configured for a plurality of integer modes including 64, 32, 2×16 and 4×8 bit shift or rotate modes.

30. The reconfigurable processor circuit of claim 28, wherein the Boolean logic circuit comprises an AND-OR-INVERT logic unit configured to perform AND, NAND, OR, NOR, XOR, XNOR, and selector operations on 32 bit integer inputs.

31. The reconfigurable processor circuit of claim 28, wherein the compare circuit is configured to extract a minimum or maximum data value from an input data stream, an index from the input data stream, to compare two input data streams, to swap two input data streams, to put the minimum of the two input data streams on a first output and to put the maximum of the two input data streams on a second output, to perform data steering, to generate address sequences, and to generate comparison flags for equality, greater than and less than.

32. A reconfigurable processor circuit comprising:

a first interconnection network;

a second interconnection network;

a processor coupled to the first interconnection network; and a plurality of computational cores arranged in an array, the plurality of computational cores coupled to the first interconnection network and to the second interconnection network, the second interconnection network configured to couple adjacent computational cores of the plurality of computational cores, each computational core comprising:

a memory circuit;

a zeros compression circuit comprising:

a zeros counter configured to count one or more sequential data packets having a zero data payload to generate a zeros count; and a first data packet generator configured, when a next data packet has a nonzero data payload, to encode the zeros count as a suffix in the next data packet;

a zeros decompression circuit configured to receive the next data packet from the first or second interconnection networks, the zeros decompression circuit comprising:

a suffix counter configured to determine the zeros count from the suffix of the next data packet; and a second data packet generator configured to generate the one or more data packets having a zero data payload, corresponding to the zeros count, before providing the next data packet having the nonzero data payload;

and a reconfigurable arithmetic circuit comprising:

at least one input reordering queue configured to store a plurality of inputs, the at least one input reordering queue further comprising input reordering logic circuitry configured to reorder a sequence of the plurality of inputs of the reconfigurable arithmetic circuit and an adjacent reconfigurable arithmetic circuit of an adjacent computational core of the plurality of computational cores;

a configurable multiplier having a plurality of operating modes, the configurable multiplier coupled to the at least one input reordering queue, the plurality of operating modes comprising a fixed point operating mode and a floating point operating mode, wherein the configurable multiplier has a native operating mode of a 27×27 unsigned multiplier further configurable to process signed inputs, and wherein the configurable multiplier is further configurable to become four 8×8 multipliers, two 16×16 single-instruction multiple-data (SIMD) multipliers, one 32×32 multiplier and one 54×54 multiplier;

a shifter and combiner network coupled to the configurable multiplier, the shifter and combiner network comprising:

a shifter circuit; and a plurality of series-coupled adder circuits coupled to the shifter circuit;

an accumulator circuit coupled to the shifter and combiner network;

at least one control logic circuit coupled to the multiplier shifter and combiner network and to the accumulator circuit; and at least one output reorder queue coupled to receive and reorder a plurality of outputs from the reconfigurable arithmetic circuit and the adjacent reconfigurable arithmetic circuit of the adjacent computational core of the plurality of computational cores.

* * * * *